(12) United States Patent
Hatakeyama et al.

(10) Patent No.: US 9,966,227 B2
(45) Date of Patent: May 8, 2018

(54) SPECIMEN OBSERVATION METHOD AND DEVICE USING SECONDARY EMISSION ELECTRON AND MIRROR ELECTRON DETECTION

(71) Applicant: EBARA CORPORATION, Tokyo (JP)

(72) Inventors: Masahiro Hatakeyama, Tokyo (JP); Takeshi Murakami, Tokyo (JP); Yoshihiko Naito, Tokyo (JP); Kenji Terao, Tokyo (JP); Norio Kimura, Tokyo (JP); Kenji Watanabe, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days. days.

(21) Appl. No.: 14/533,974

(22) Filed: Nov. 5, 2014

(65) Prior Publication Data
US 2015/0060666 A1    Mar. 5, 2015

Related U.S. Application Data

(62) Division of application No. 12/937,145, filed as application No. PCT/JP2009/001667 on Apr. 10, 2009, now Pat. No. 8,937,283.

(30) Foreign Application Priority Data

Apr. 11, 2008 (JP) ................................. 2008-103832
Jul. 2, 2008 (JP) ................................. 2008-173994
(Continued)

(51) Int. Cl.
*H01J 37/28* (2006.01)
*H01J 37/244* (2006.01)
(Continued)

(52) U.S. Cl.
CPC .............. *H01J 37/28* (2013.01); *H01J 37/22* (2013.01); *H01J 37/244* (2013.01); *H01J 37/29* (2013.01);
(Continued)

(58) Field of Classification Search
CPC .. H01J 49/0081; H01J 49/0031; H01J 49/004; H01J 49/4265; G01N 30/72
See application file for complete search history.

(56) References Cited

U.S. PATENT DOCUMENTS 7,253,410 B1 *  8/2007  Bertsche ............... H01J 37/026
                                                              250/307
7,566,871 B2 *  7/2009  Hasegawa ............... H01J 37/29
                                                              250/306
(Continued)

FOREIGN PATENT DOCUMENTS

EP    1 635 374 A1    3/2006
JP    54-154345 A     12/1979
(Continued)

OTHER PUBLICATIONS

F. Crocolo, C. Riccardi, Passive Mirror Imaging through a Solid-State Back-Scattered Electron Detector, Microscopy Today, Mar. 2008.*
(Continued)

*Primary Examiner* — Brooke Purinton
(74) *Attorney, Agent, or Firm* — Westerman, Hattori, Daniels & Adrian, LLP

(57) ABSTRACT

A technique capable of improving the ability to observe a specimen using an electron beam in an energy region which has not been conventionally given attention is provided. This specimen observation method comprises: irradiating the specimen with an electron beam; detecting electrons to be observed which have been generated and have obtained
(Continued)

information on the specimen by the electron beam irradiation; and generating an image of the specimen from the detected electrons to be observed. The electron beam irradiation comprises irradiating the specimen with the electron beam with a landing energy set in a transition region between a secondary emission electron region in which secondary emission electrons are detected and a mirror electron region in which mirror electrons are detected, thereby causing the secondary emission electrons and the mirror electrons to be mixed as the electrons to be observed. The detection of the electrons to be observed comprises performing the detection in a state where the secondary emission electrons and the mirror electrons are mixed. Observation and inspection can be quickly carried out for a fine foreign material and pattern of 100 nm or less.

16 Claims, 46 Drawing Sheets

(30) Foreign Application Priority Data

| Feb. 13, 2009 | (JP) | ................................. 2009-031032 |
| Feb. 26, 2009 | (JP) | ................................. 2009-044397 |
| Mar. 12, 2009 | (JP) | ................................. 2009-059206 |

(51) Int. Cl.
  *H01J 37/29* (2006.01)
  *H01J 37/22* (2006.01)
  *H01L 21/66* (2006.01)
(52) U.S. Cl.
  CPC ............... *H01J 2237/24475* (2013.01); *H01J 2237/24585* (2013.01); *H01J 2237/24592* (2013.01); *H01J 2237/2805* (2013.01); *H01J 2237/2806* (2013.01); *H01J 2237/2817* (2013.01); *H01L 22/12* (2013.01)

(56) References Cited

U.S. PATENT DOCUMENTS

| 2004/0089805 | A1 | 5/2004 | Todokoro et al. | |
| 2005/0104017 | A1 | 5/2005 | Kimba et al. | |
| 2006/0011835 | A1 | 1/2006 | Murakoshi et al. | |
| 2006/0169900 | A1 | 8/2006 | Noji et al. | |
| 2006/0210144 | A1* | 9/2006 | Yamaguchi | G06T 7/0006 |
| | | | | 382/149 |
| 2006/0231773 | A1 | 10/2006 | Katagiri et al. | |
| 2007/0040118 | A1* | 2/2007 | Cheng | G01N 23/2251 |
| | | | | 250/310 |
| 2007/0069127 | A1 | 3/2007 | Okuda et al. | |
| 2007/0181808 | A1 | 8/2007 | Murakoshi et al. | |
| 2007/0194229 | A1* | 8/2007 | Okuda | H01J 37/026 |
| | | | | 250/310 |
| 2007/0272857 | A1 | 11/2007 | Hasegawa et al. | |
| 2008/0017797 | A1 | 1/2008 | Cheng et al. | |
| 2008/0073533 | A1* | 3/2008 | Makino | G03F 7/70616 |
| | | | | 250/310 |
| 2008/0237465 | A1 | 10/2008 | Hatano et al. | |
| 2008/0251718 | A1 | 10/2008 | Kaga et al. | |
| 2008/0302954 | A1 | 12/2008 | Phaneuf et al. | |
| 2009/0050802 | A1 | 2/2009 | Noji et al. | |
| 2009/0072164 | A1 | 3/2009 | Ogata et al. | |
| 2009/0090863 | A1 | 4/2009 | Watanabe et al. | |

FOREIGN PATENT DOCUMENTS

| JP | 11-108864 A | 4/1999 |
| JP | 2003-500821 A | 1/2003 |
| JP | 2003-173756 A | 6/2003 |
| JP | 2004-177446 A | 6/2004 |
| JP | 2004-363085 A | 12/2004 |
| JP | 2005-332888 A | 12/2005 |
| JP | 2006-294481 A | 10/2006 |
| JP | 2006-308460 A | 11/2006 |
| JP | 2007-051902 A | 3/2007 |
| JP | 2007-109531 A | 4/2007 |
| JP | 2007-206005 A | 8/2007 |
| JP | 2007-207688 A | 8/2007 |
| JP | 2007-232387 A | 9/2007 |
| JP | 2007-280614 A | 10/2007 |
| JP | 2008267835 A | 11/2008 |
| JP | 2009-087893 A | 4/2009 |
| TW | 200506356 A | 2/2005 |
| TW | 200739652 A | 10/2007 |
| TW | 200739653 A | 10/2007 |
| WO | 00-72355 A1 | 11/2000 |

OTHER PUBLICATIONS

International Search Report of PCT/JP2009/001667, dated Jul. 14, 2009.
Japanese Office Action dated Dec. 25, 2012, issued in corresponding Japanese patent application No. 2010-507179.
Ichinokawa T, "Electron Spectroscopy by Electron Microscope", Electron Microscope, the Japanese Society of Electron Microscopy, Jan. 1981, vol. 15, No. 2, pp. 104-114, w/partial English translation, cited in Japanese Office Action dated Apr. 8, 2014, issued in corresponding Japanese Patent Application No. 2010-054436.
English Translation of Taiwanese Office Action dated Mar. 5, 2014, in counterpart Taiwanese Patent Application No. 98111448. (4 pages).
English Translation of Office Action dated Sep. 29, 2015, issued in counterpart Japanese Patent Application No. 2014-246164 (2 pages).
English Translation of Japanese Office Action dated Jun. 30, 2015, issued in counterpart Japanese Patent Application No. 2013-203667 (2 pages).
English Translation of Japanese Notice of Allowance dated Nov. 4, 2014, issued in counterpart Japanese Patent Application No. 2010-054436 (2 pages).
English Translation of Japanese Office Action dated Apr. 8, 2014, issued in counterpart Japanese Patent Application No. 2010-054436 (3 pages).
English translation of Office Action dated Jul. 19, 2016 issued in counterpart Japanese patent application No. 2015-187508, previously submitted on Aug. 17, 2016 (4 pages).
English translation of Office Action and Search Report dated Jul. 5, 2016, issued in counterpart Taiwanese Patent Application No. 103140021, previously submitted on Aug. 17, 2016 (3 pages).
Office Action dated Dec. 12, 2017, issued in counterpart Japanese Application No. 2016-115096, with English machine translation. (8 pages).

* cited by examiner

[FIG. 1A]
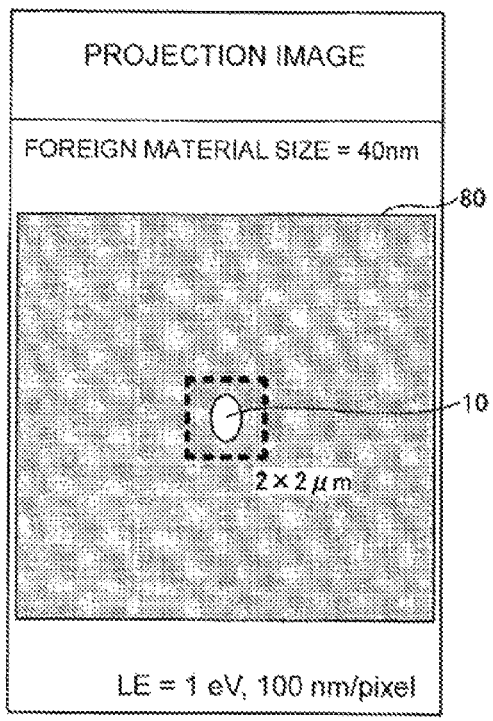
[FIG. 1B]
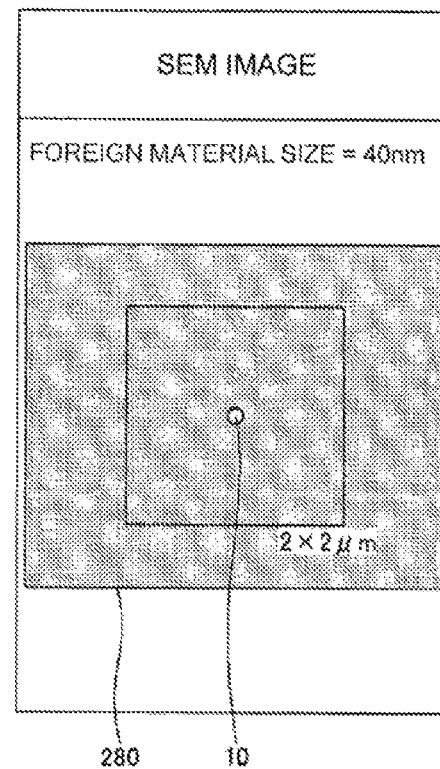

[FIG. 1C]
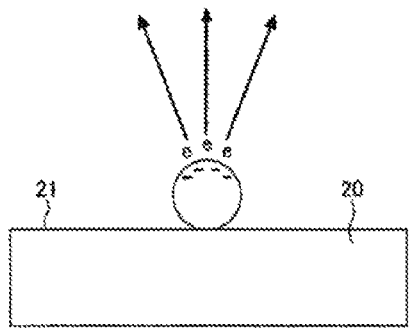
[FIG. 2A]
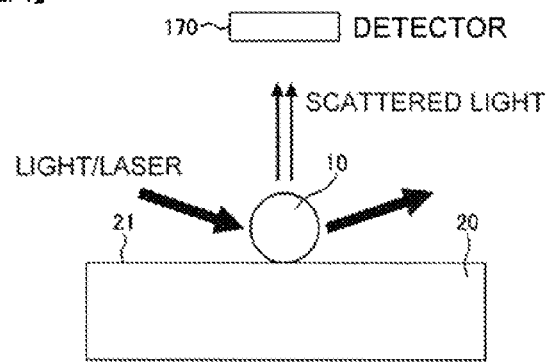
[FIG. 2B]
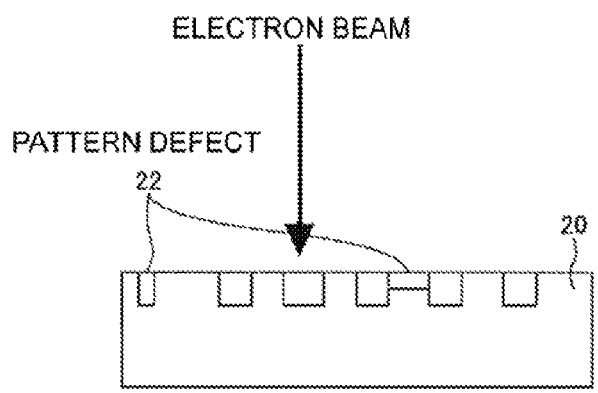
[FIG. 3A]
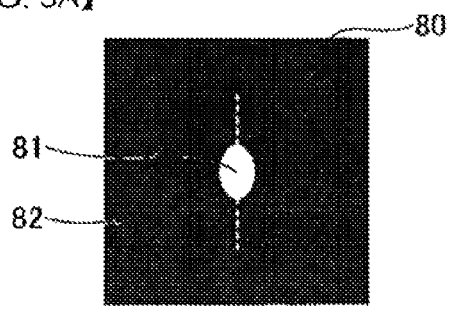

[FIG. 3B]
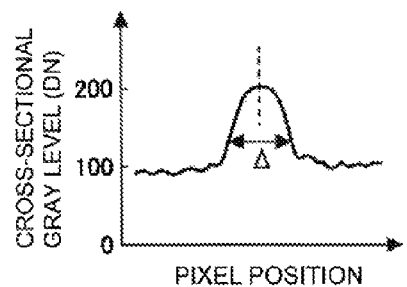
[FIG. 4A]
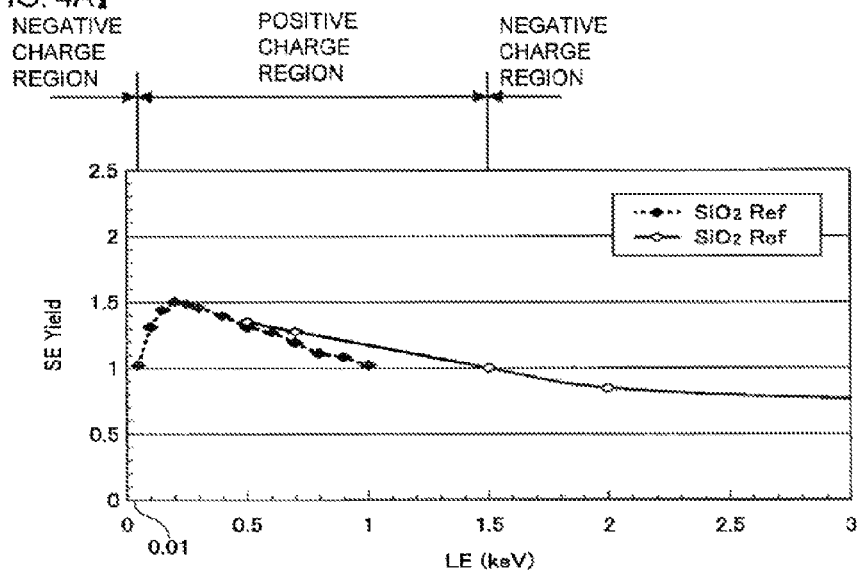
[FIG. 4B]
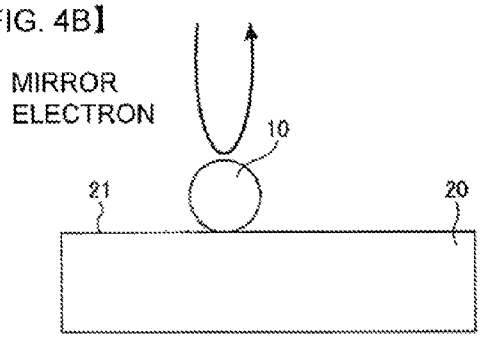

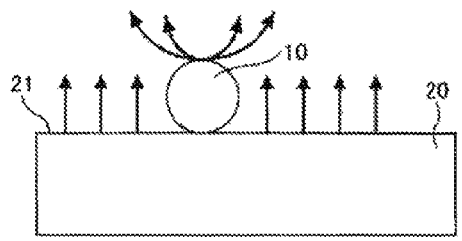
[FIG. 4C] SECONDARY EMISSION ELECTRON
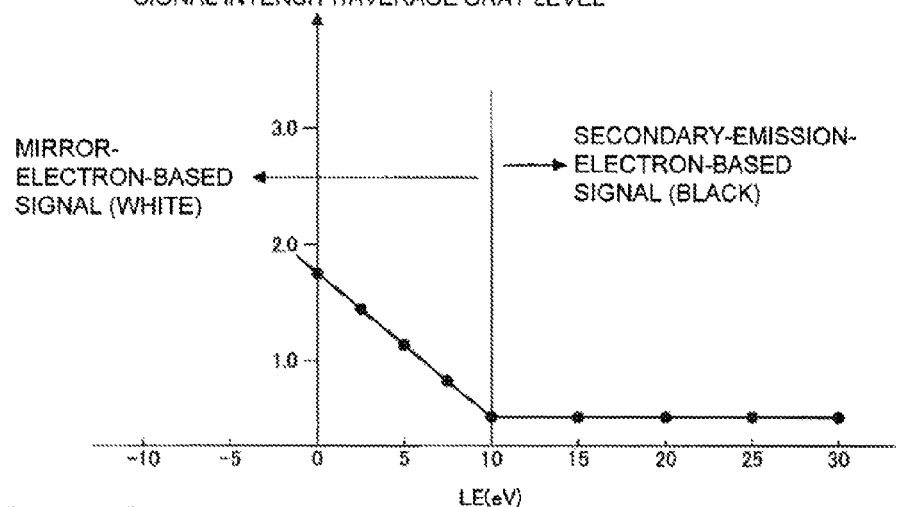
[FIG. 5A]
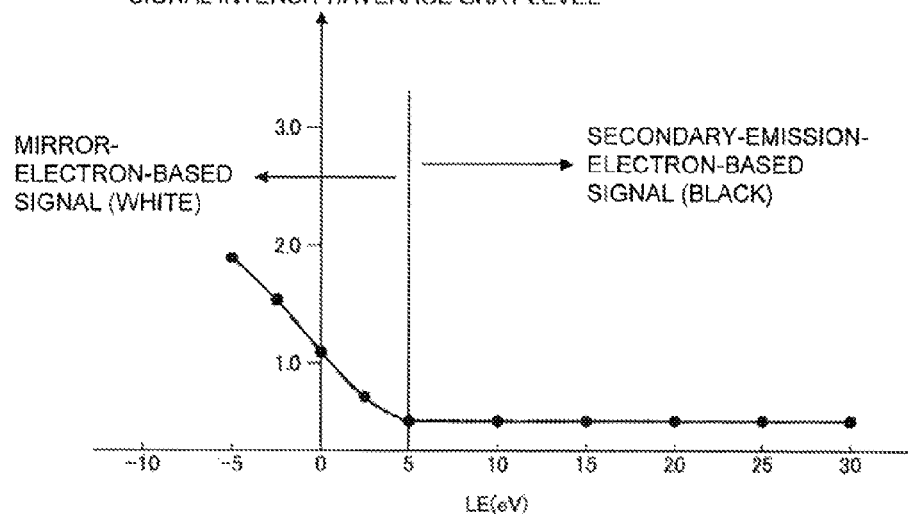
[FIG. 5B]

[FIG. 6]
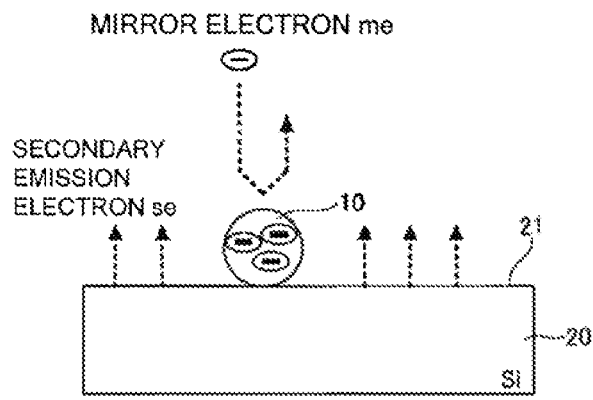
[FIG. 7A]
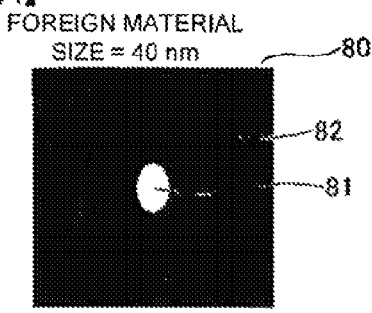
[FIG. 7B]
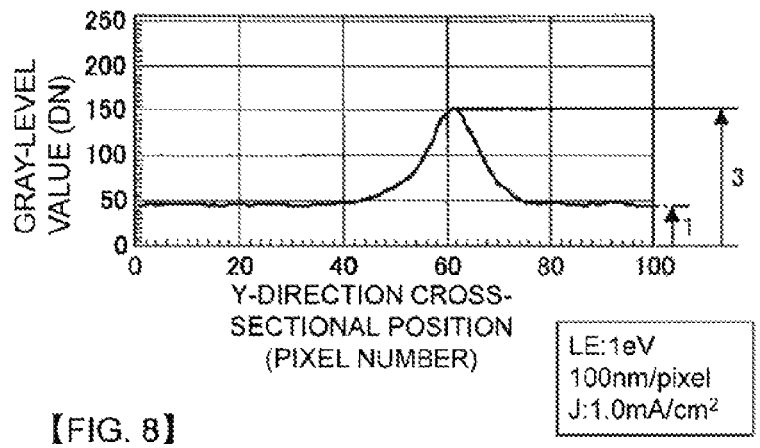
[FIG. 8]
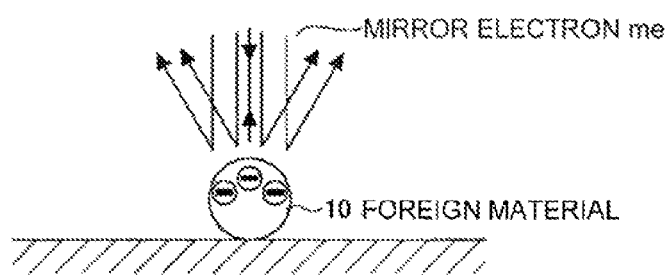

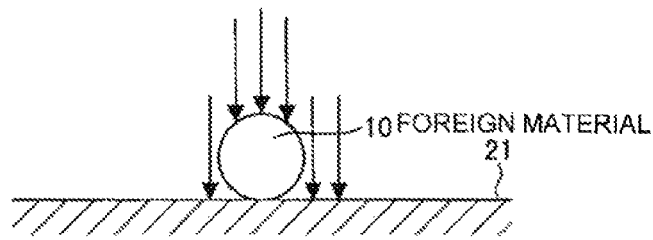
[FIG. 9A]
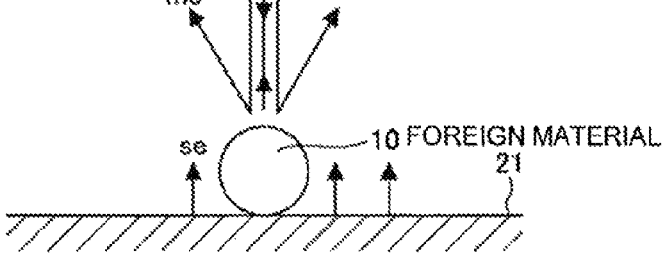
[FIG. 9B]
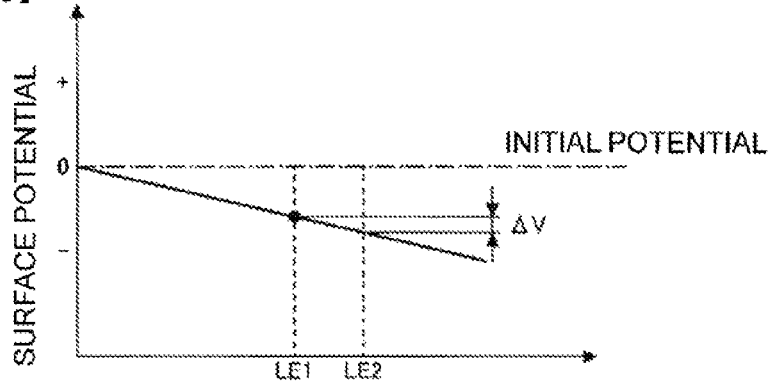
[FIG. 10]
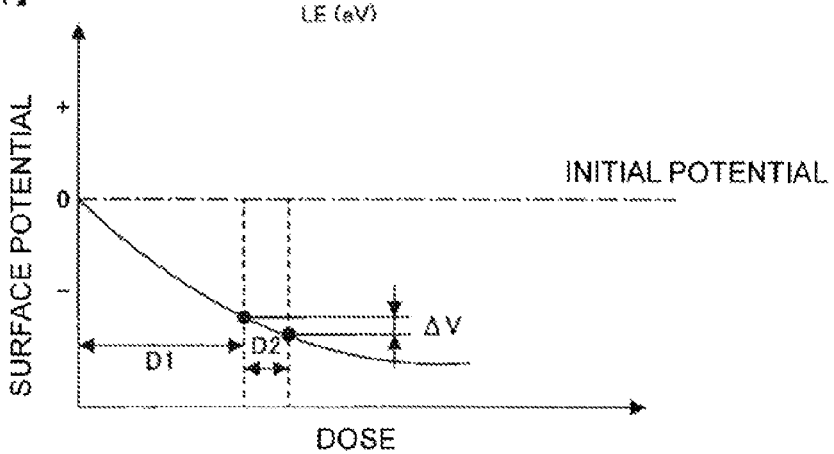
[FIG. 11]

[FIG. 12]
WHEN THE FOREIGN MATERIAL IS REPRESENTED BY SECONDARY EMISSION ELECTRONS (BLACK SIGNAL)
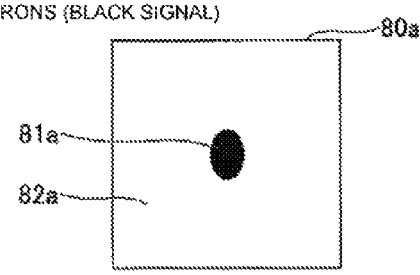
[FIG. 13A]
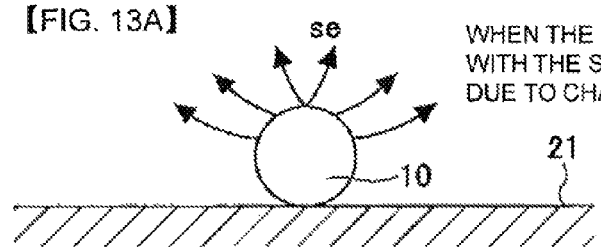
WHEN THE POTENTIAL DIFFERENCE WITH THE SURROUNDINGS IS LARGE DUE TO CHARGING UP
[FIG. 13B]
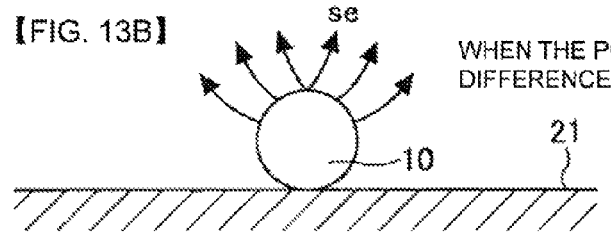
WHEN THE POTENTIAL DIFFERENCE IS SMALL
[FIG. 13C]
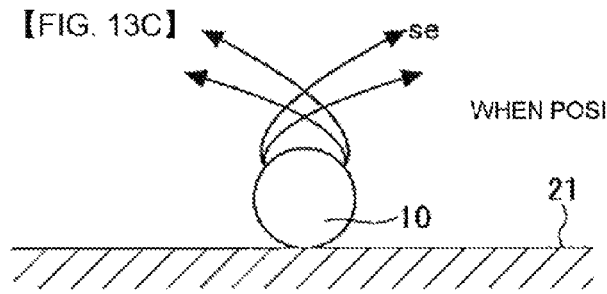
WHEN POSITIVELY CHARGE

[FIG. 14]
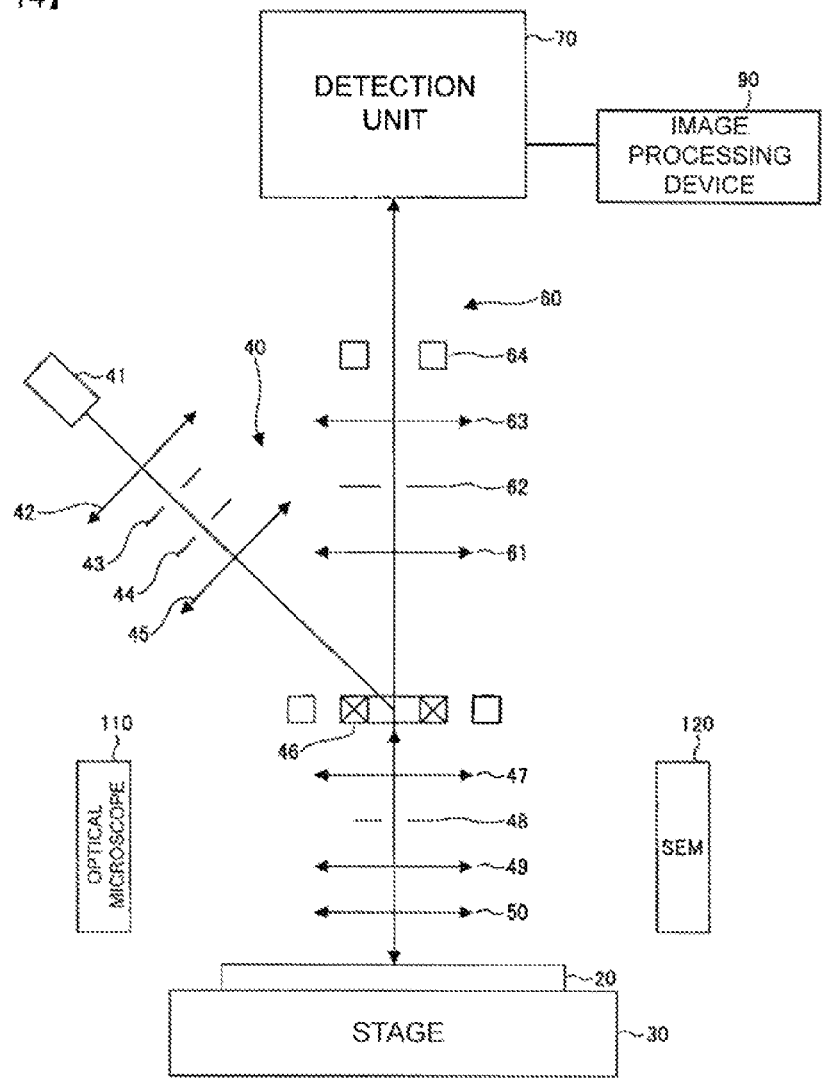
[FIG. 15]
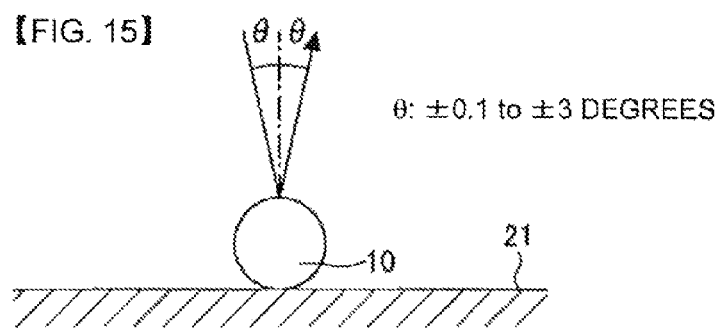
θ: ±0.1 to ±3 DEGREES

[FIG. 16A]
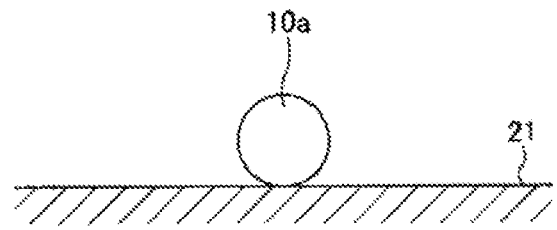
[FIG. 16B]
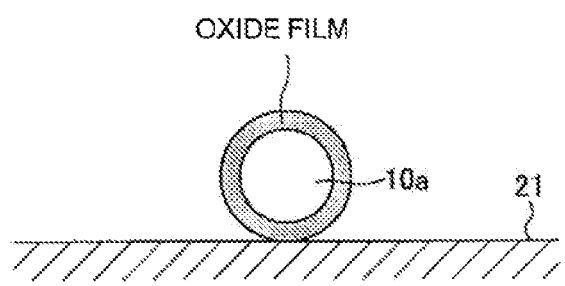
[FIG. 17]
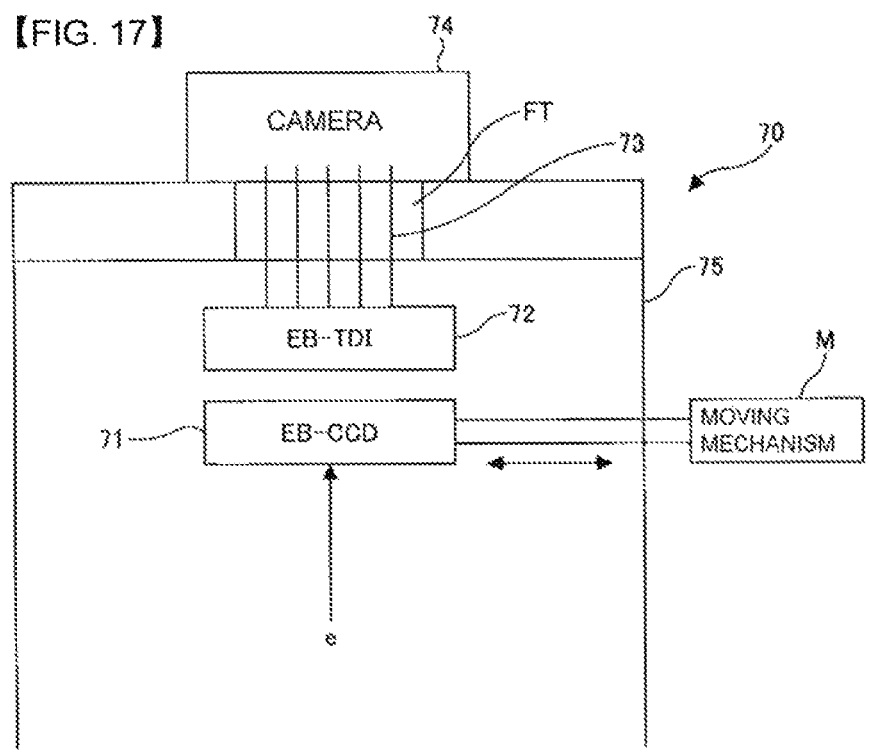

[FIG. 18A]
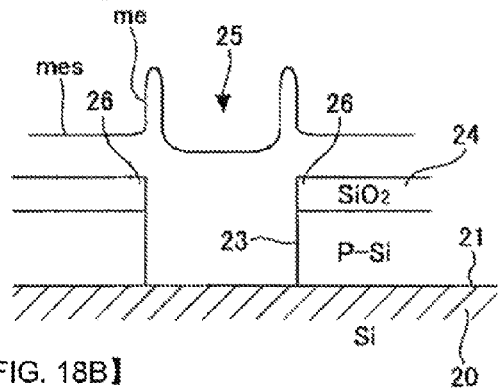
[FIG. 18B]
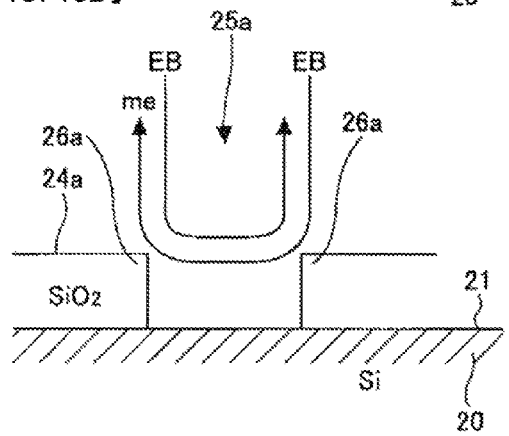
[FIG. 19]
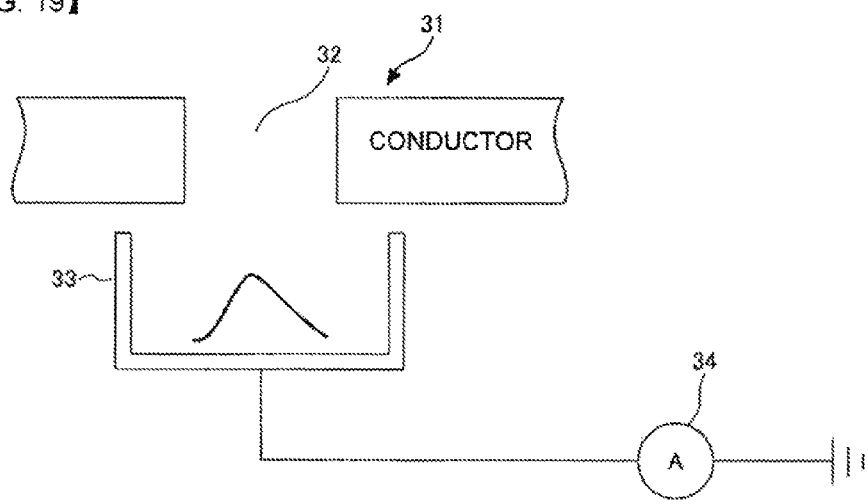

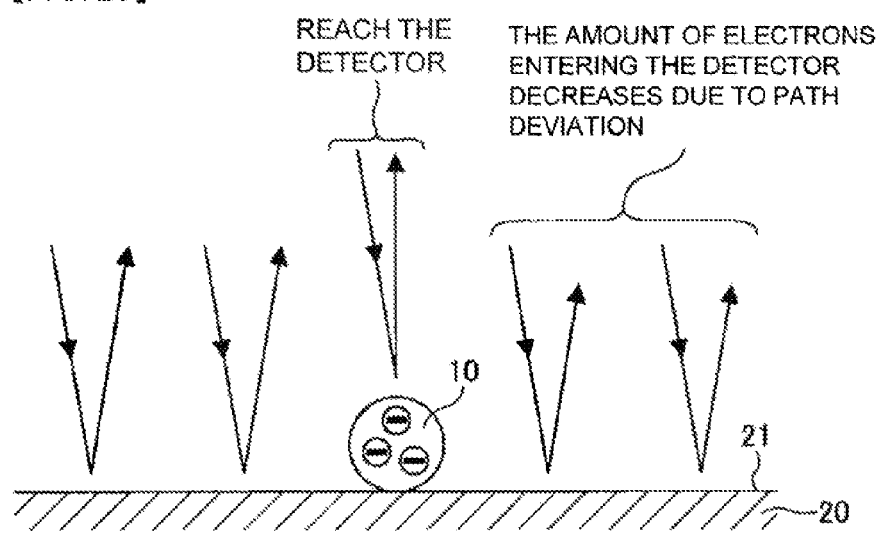
[FIG. 20]

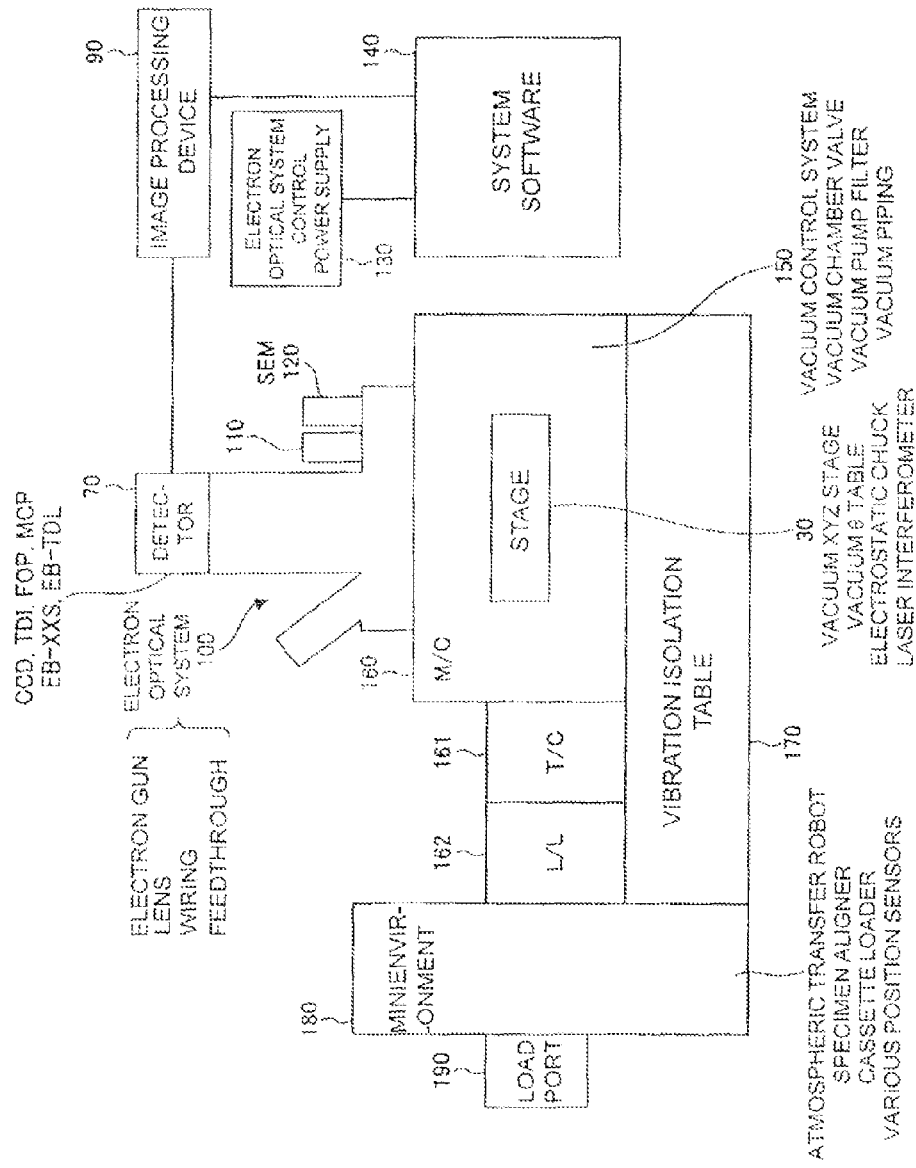
[FIG. 21]

[FIG. 22]
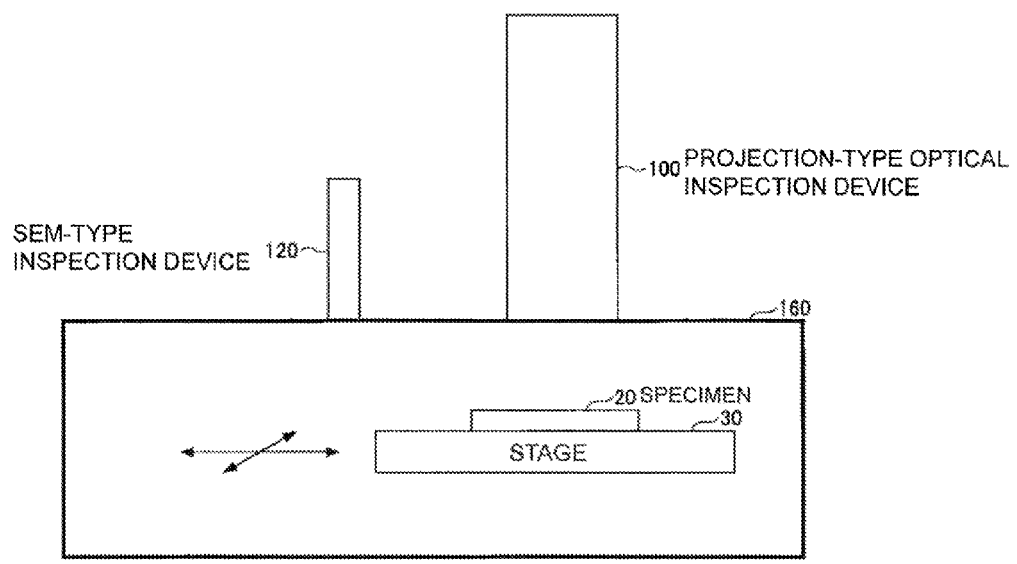

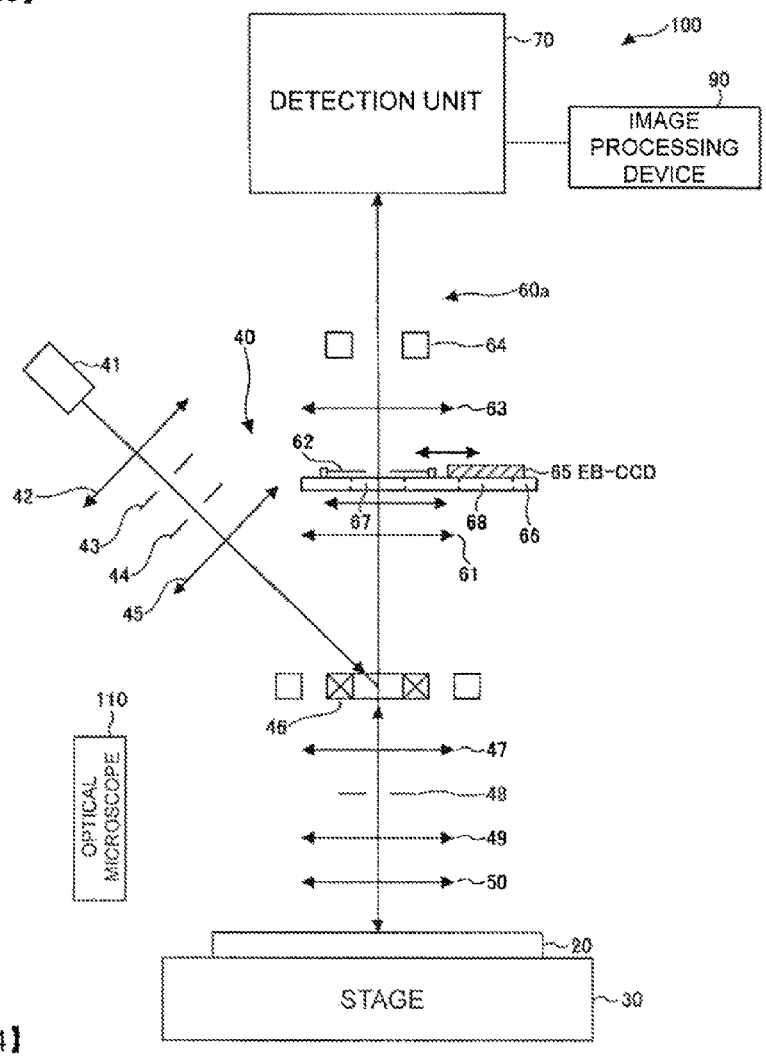
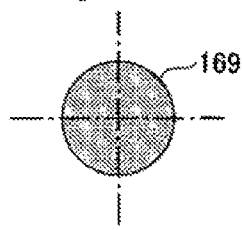

[FIG. 25]
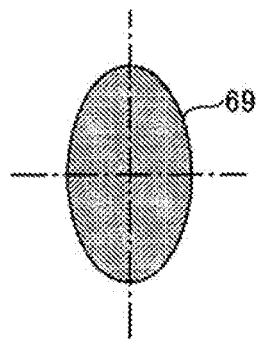
[FIG. 26]
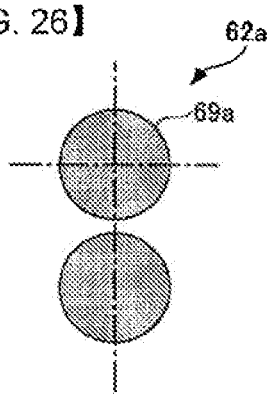
[FIG. 27]
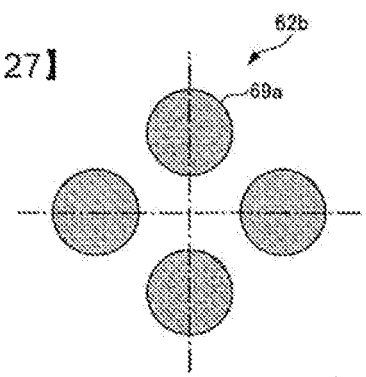
[FIG. 28]
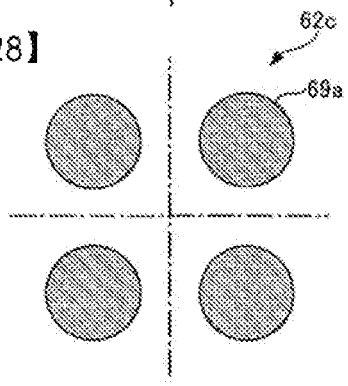

[FIG. 29]
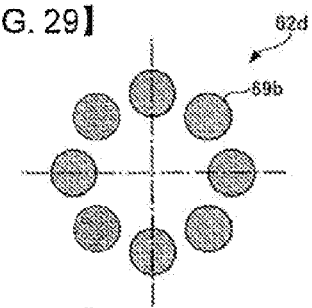
[FIG. 30]
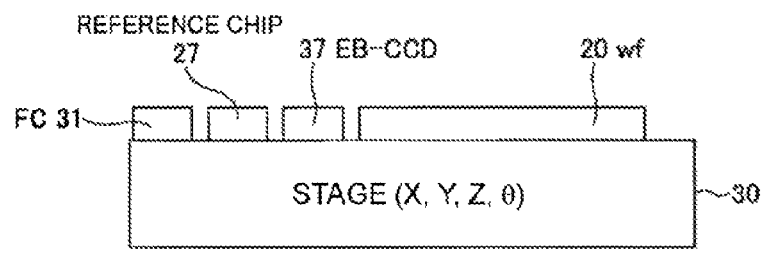
[FIG. 31]
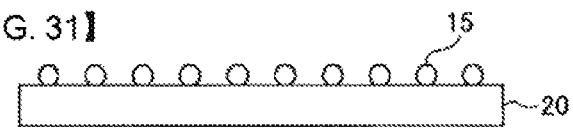
[FIG. 32]
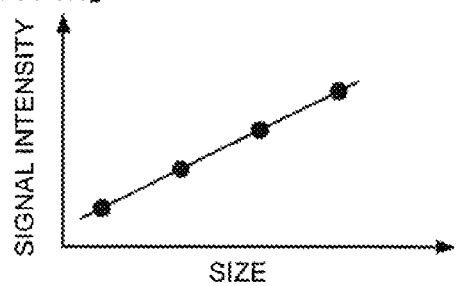
[FIG. 33]
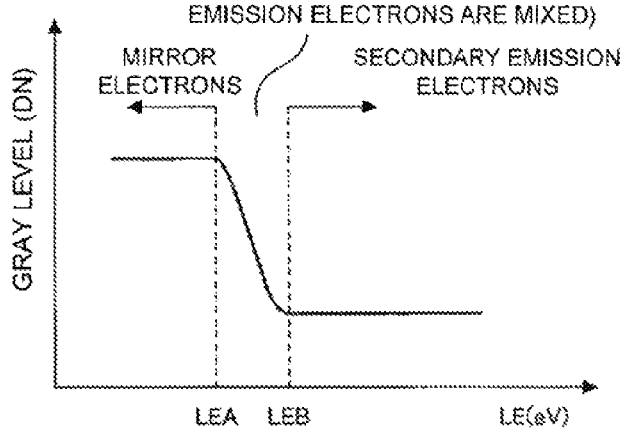

[FIG. 34]
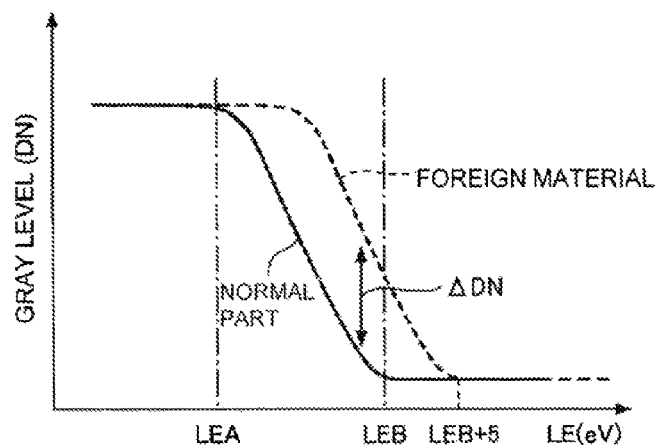
[FIG. 35]
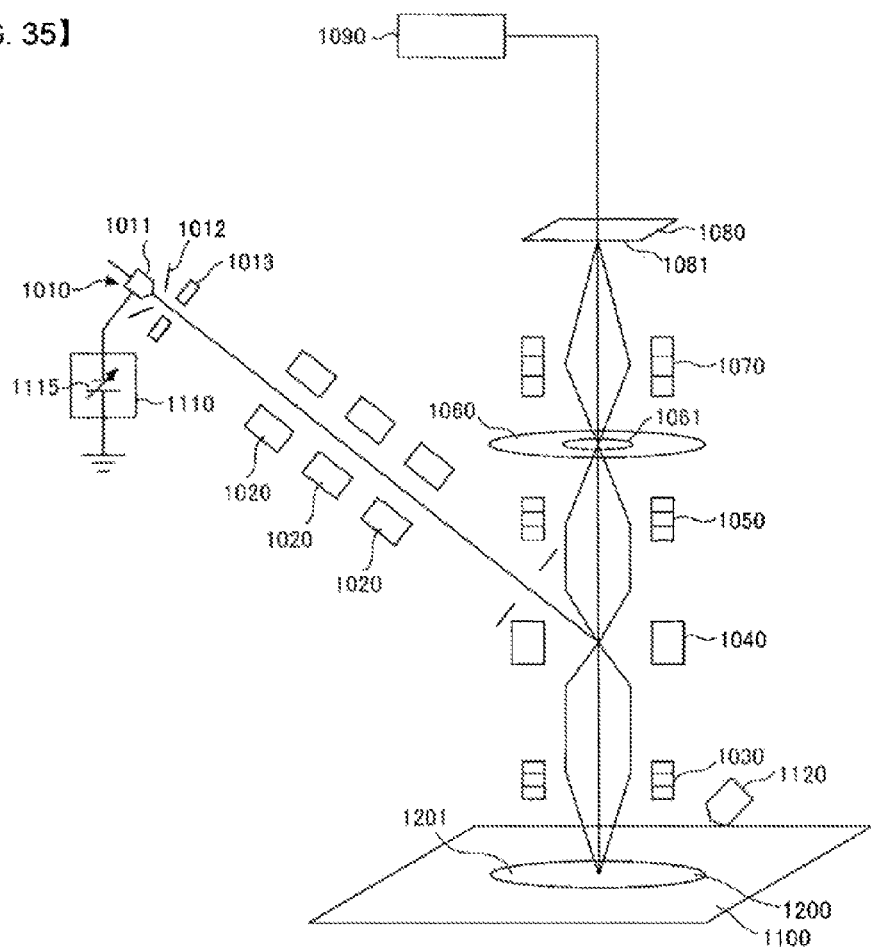

[FIG. 36A]
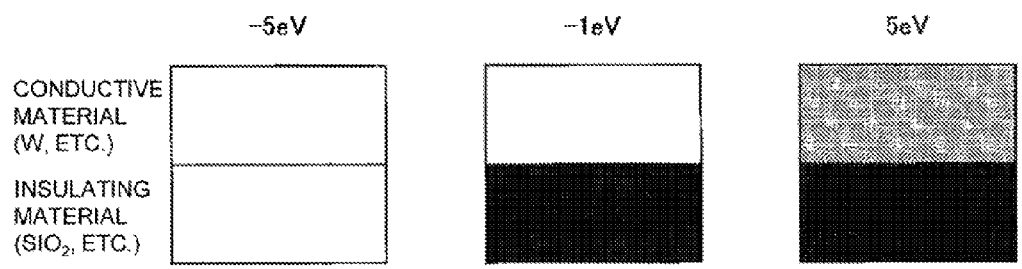
[FIG. 36B]
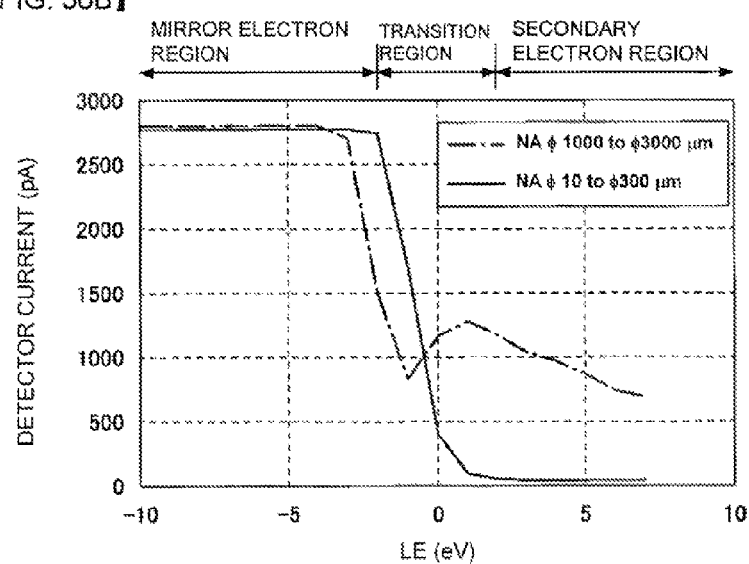

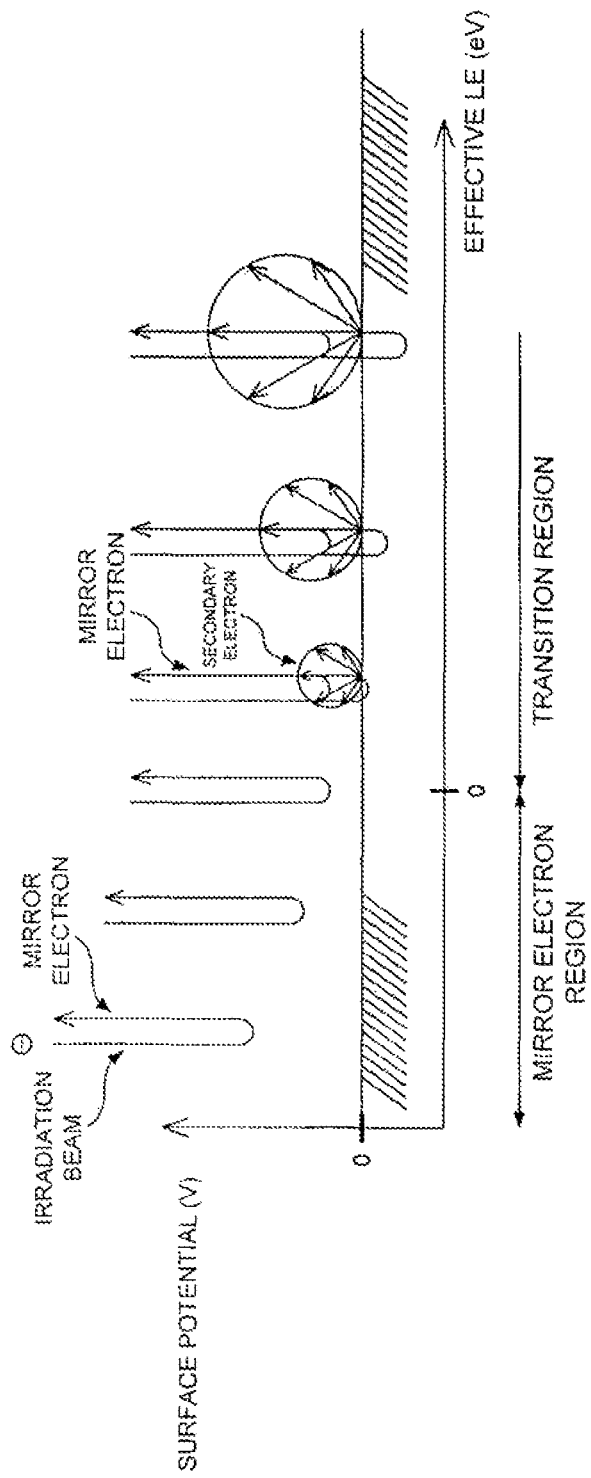

[FIG. 38]
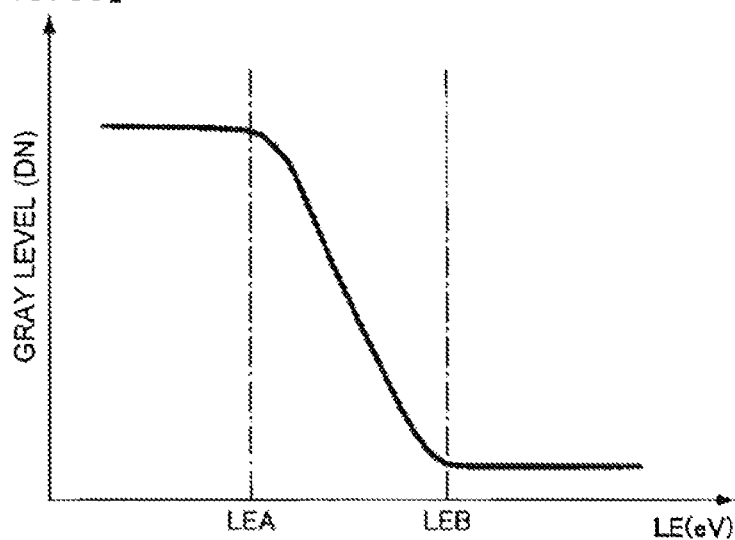
[FIG. 39A]
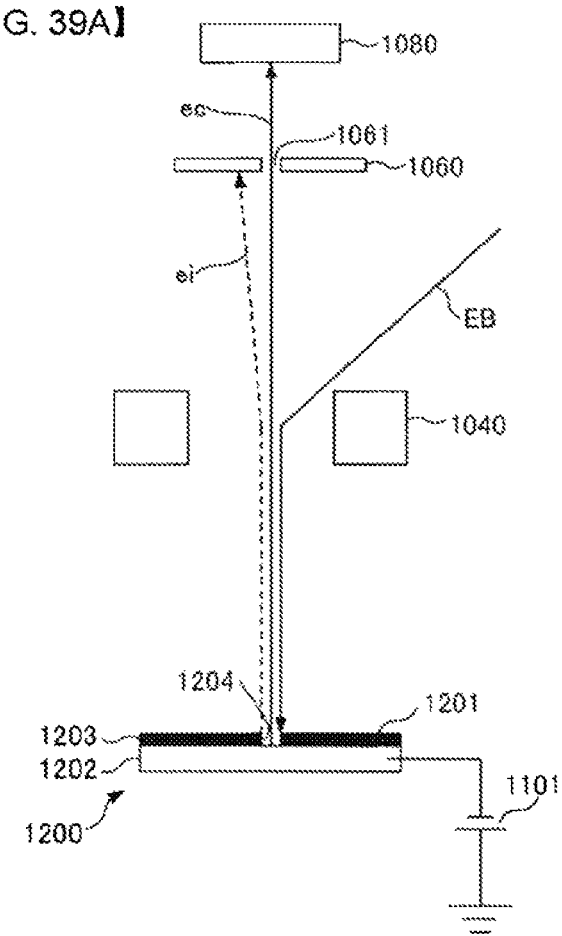

[FIG. 39B]
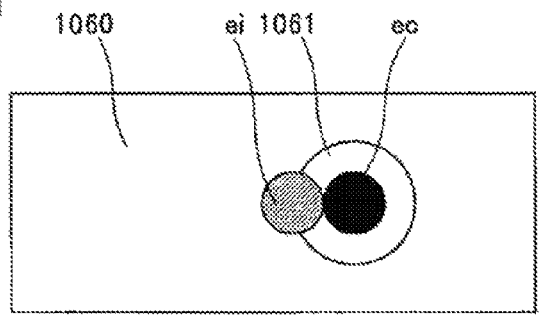
DRAWING OF A MOVABLE NA VIEWED FROM THE BOTTOM
[FIG. 40A]
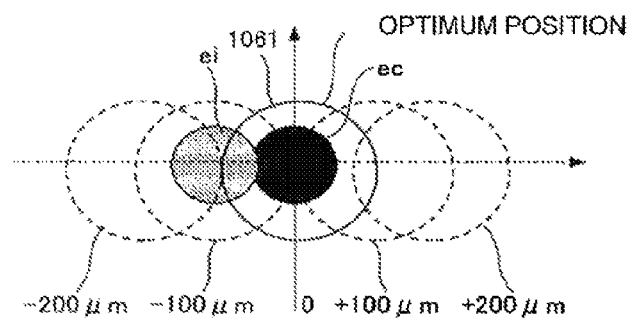
[FIG. 40B]
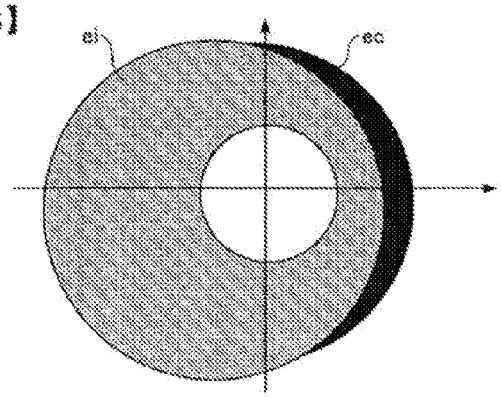
[FIG. 41A]
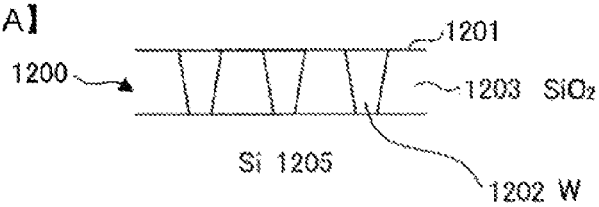
[FIG. 41B]
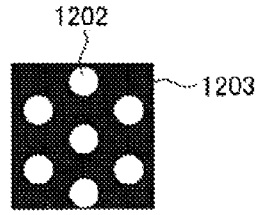

[FIG. 42A]
| LE[eV] | CONDUCTIVE MATERIAL | INSULATING MATERIAL | CONTRAST |
|---|---|---|---|
| 5 | 15 | 10 | 0.3 |
| 2 | 45 | 20 | 0.6 |
| -1 | 200 | 50 | 0.8 |
| -2 | 210 | 190 | 0.1 |
| -5 | 220 | 220 | 0.0 |
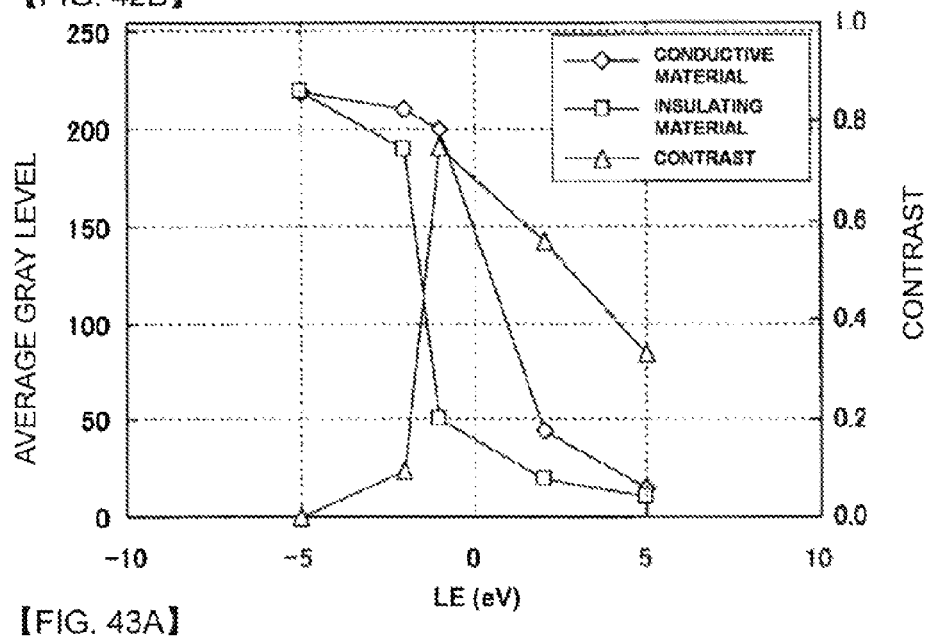
[FIG. 42B]
[FIG. 43A]
| DOSE (mC/cm²) | CONTRAST |
|---|---|
| 0 | 0 |
| 0.2 | 0.1 |
| 0.4 | 0.4 |
| 0.6 | 0.6 |
| 0.8 | 0.7 |
| 1 | 0.8 |
| 1.2 | 0.8 |
| 1.4 | 0.8 |

[FIG. 43B]
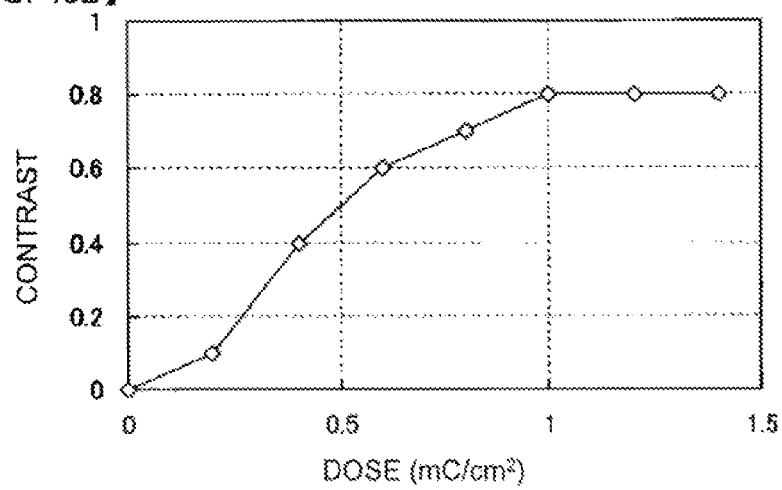
[FIG. 44A]
| NA POSITION (μm) | CONTRAST |
|---|---|
| −150 | 0.3 |
| −100 | 0.4 |
| −50 | 0.6 |
| 0 | 0.8 |
| 50 | 0.6 |
| 100 | 0.4 |
| 150 | 0.3 |
[FIG. 44B]
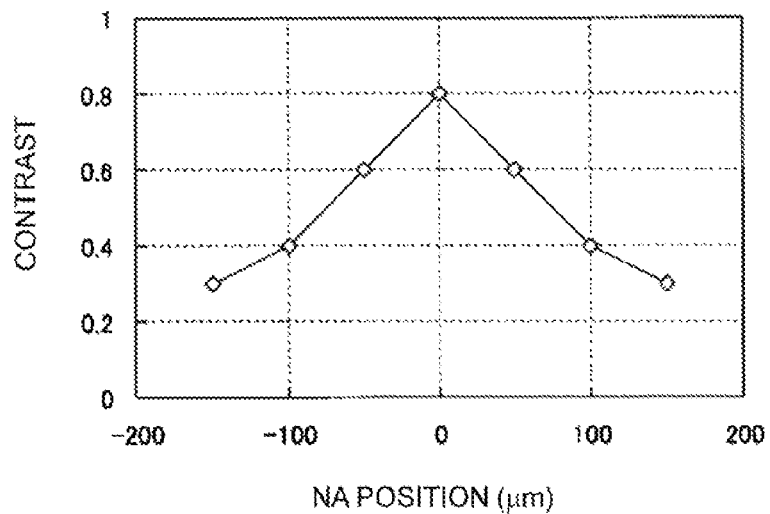

[FIG. 45A]
| AREA RATIO (CONDUCTIVE:INSULATING) | LEEM | SEM |
|---|---|---|
| 1:2 | 0.5 | 0.2 |
| 1:4 | 0.6 | 0.18 |
| 1:6 | 0.7 | 0.16 |
| 1:8 | 0.75 | 0.1 |
| 1:10 | 0.8 | 0.05 |
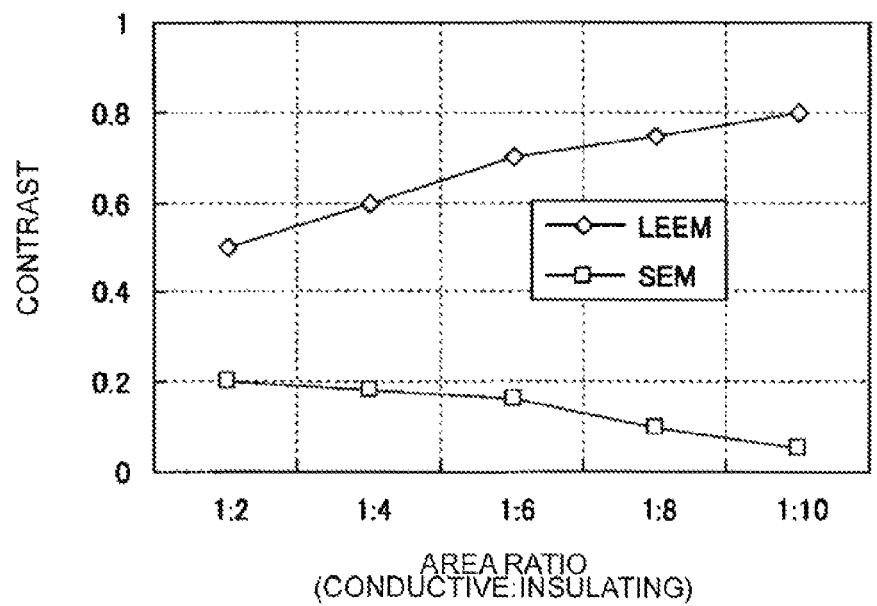
[FIG. 45B]

[FIG. 46]
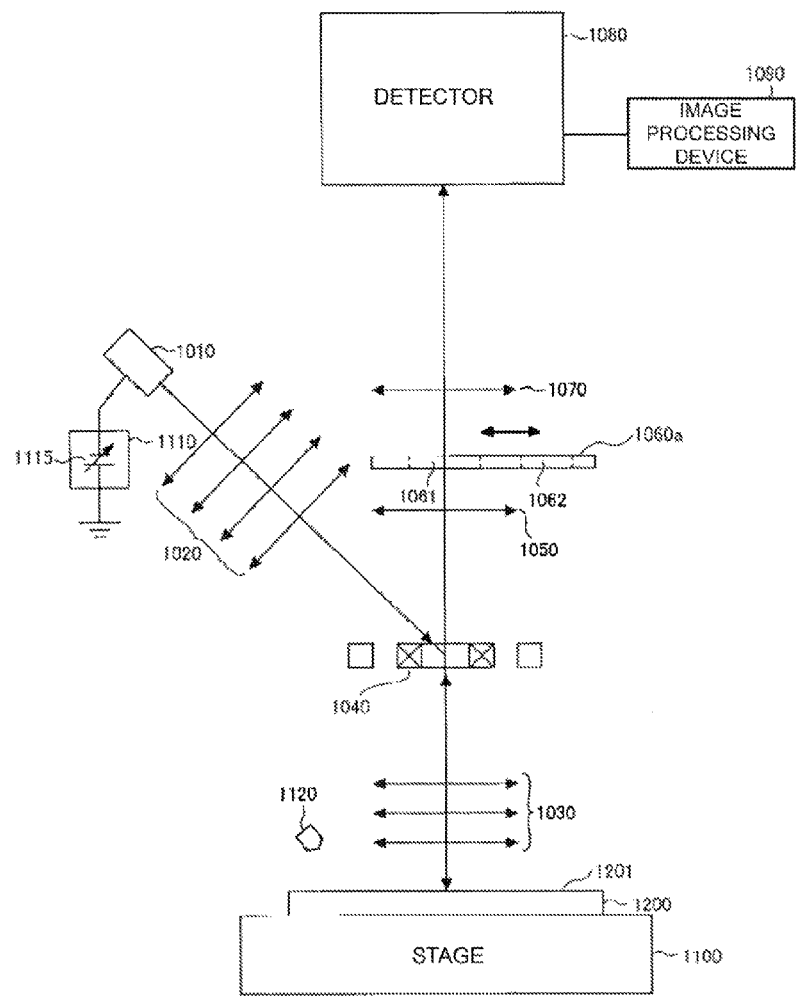

[FIG. 47A]
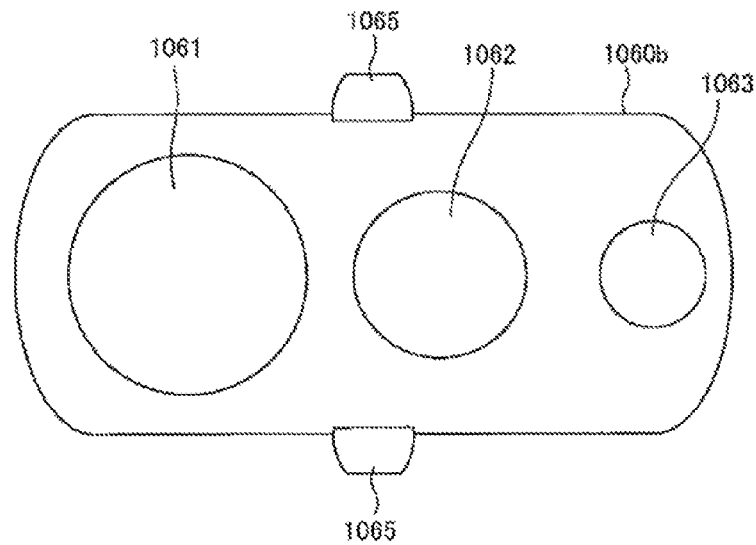
[FIG. 47B]
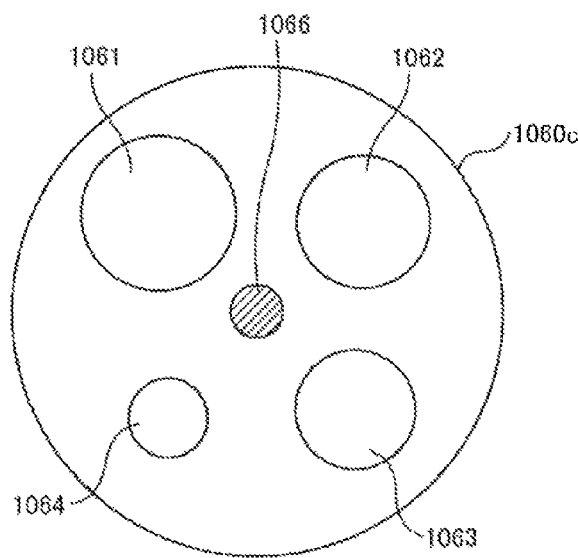

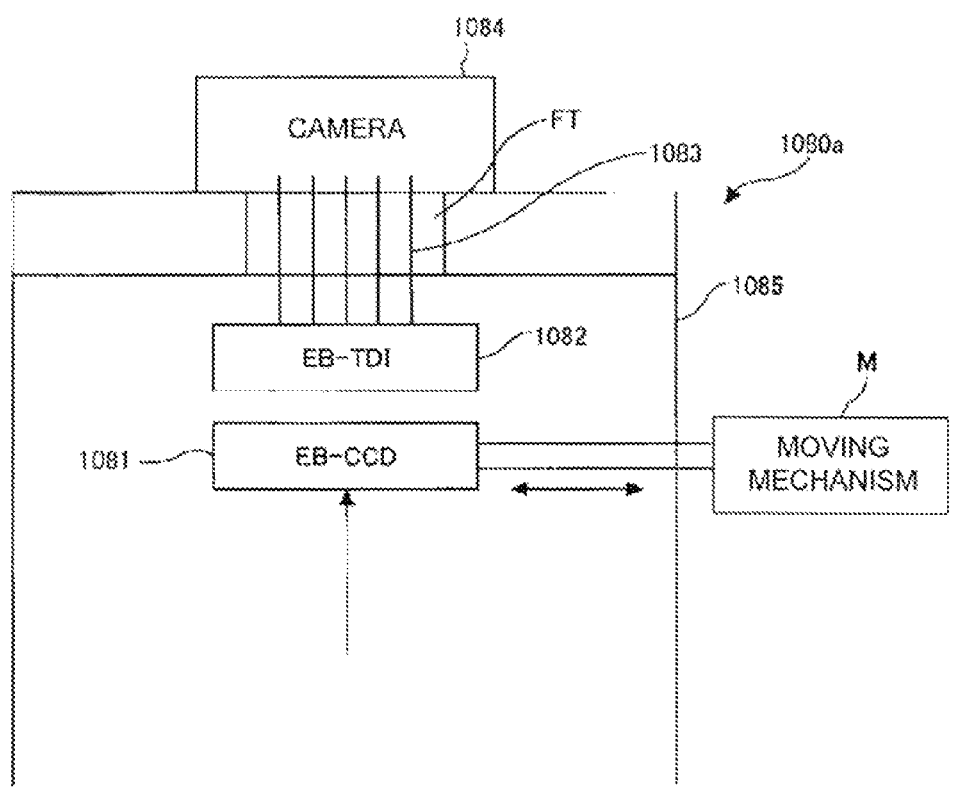
[FIG. 48]

[FIG. 49]
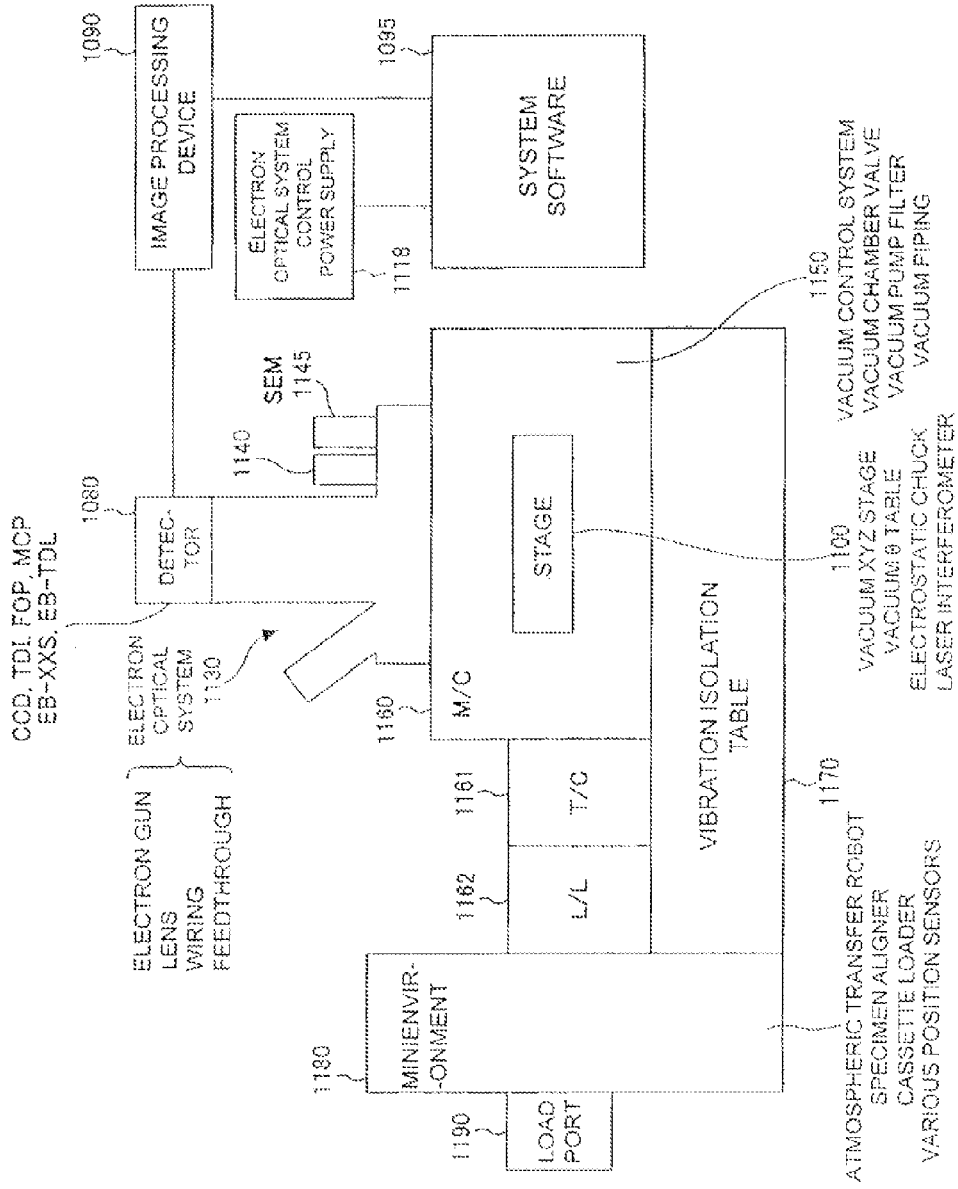

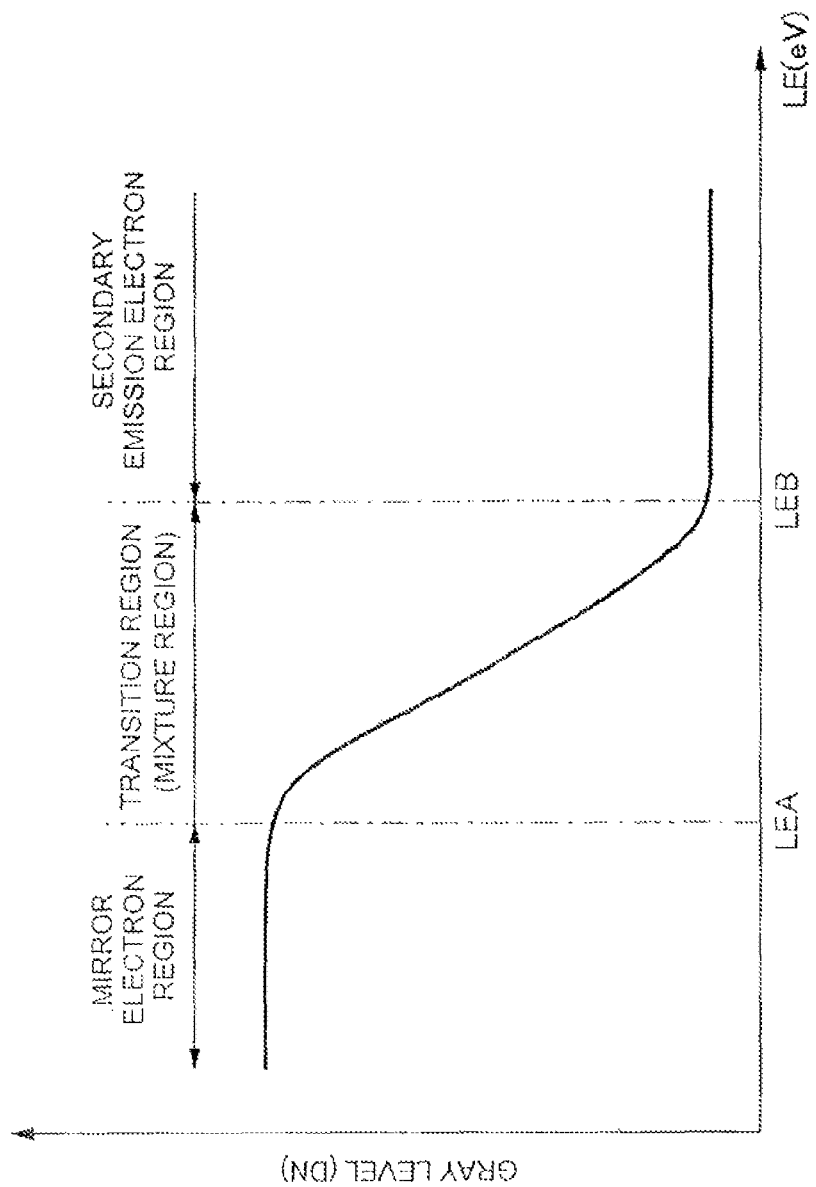
[FIG. 50]

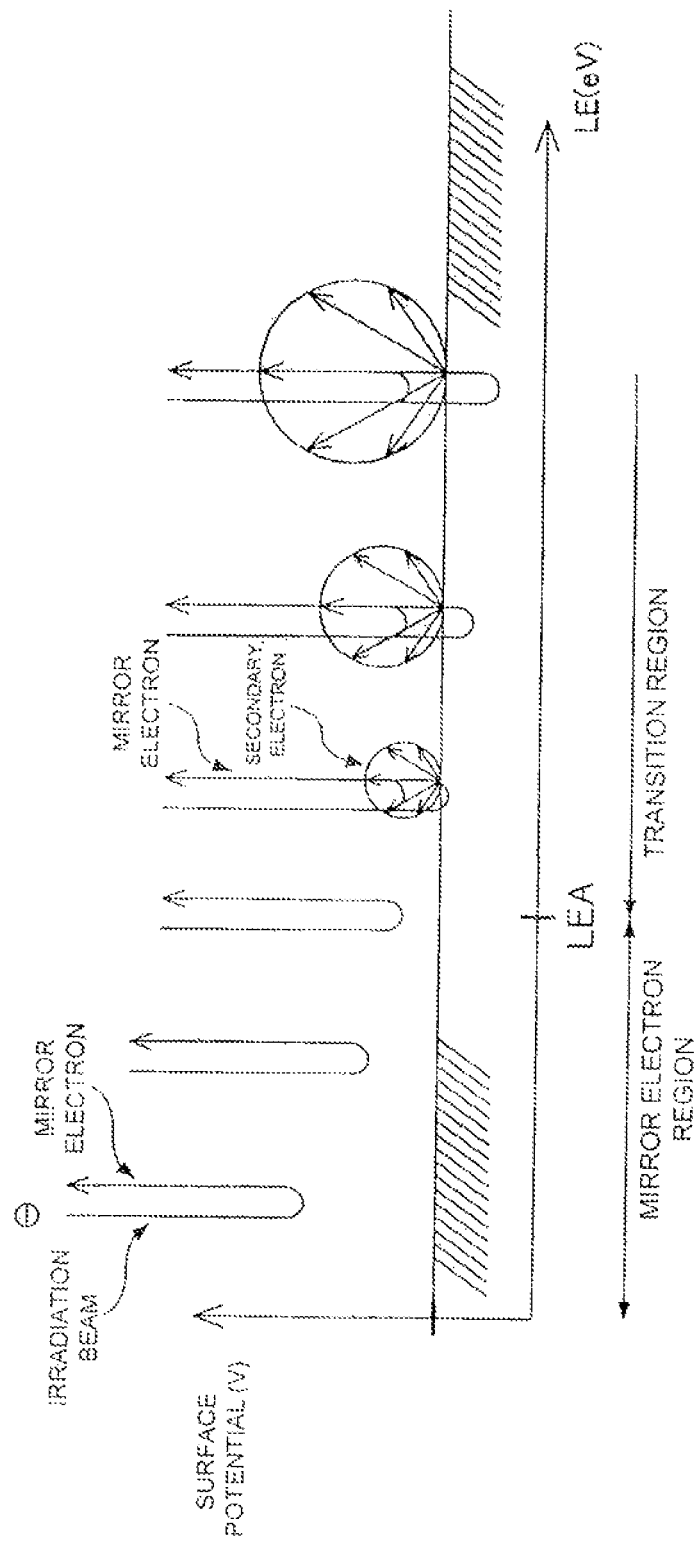

[FIG. 52]
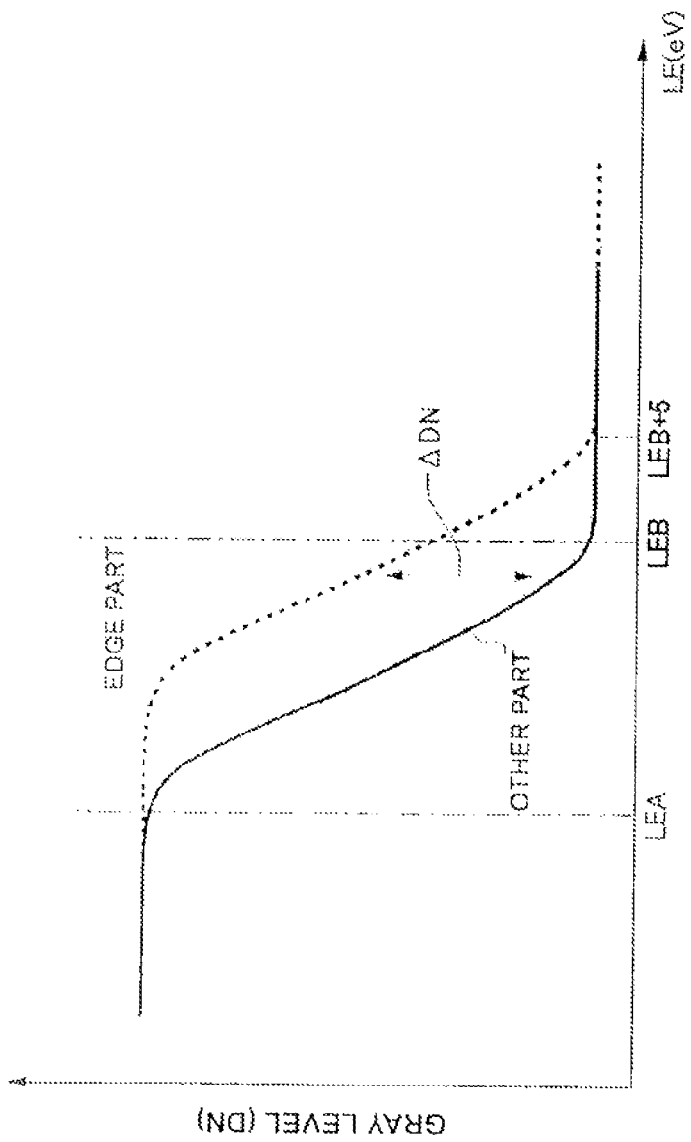
[FIG. 53]
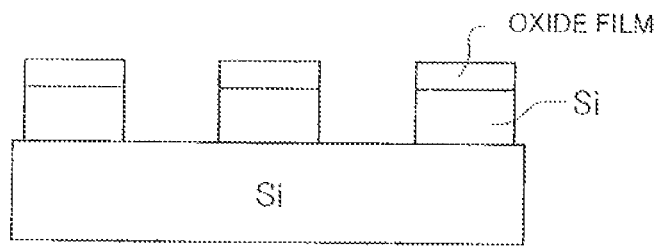

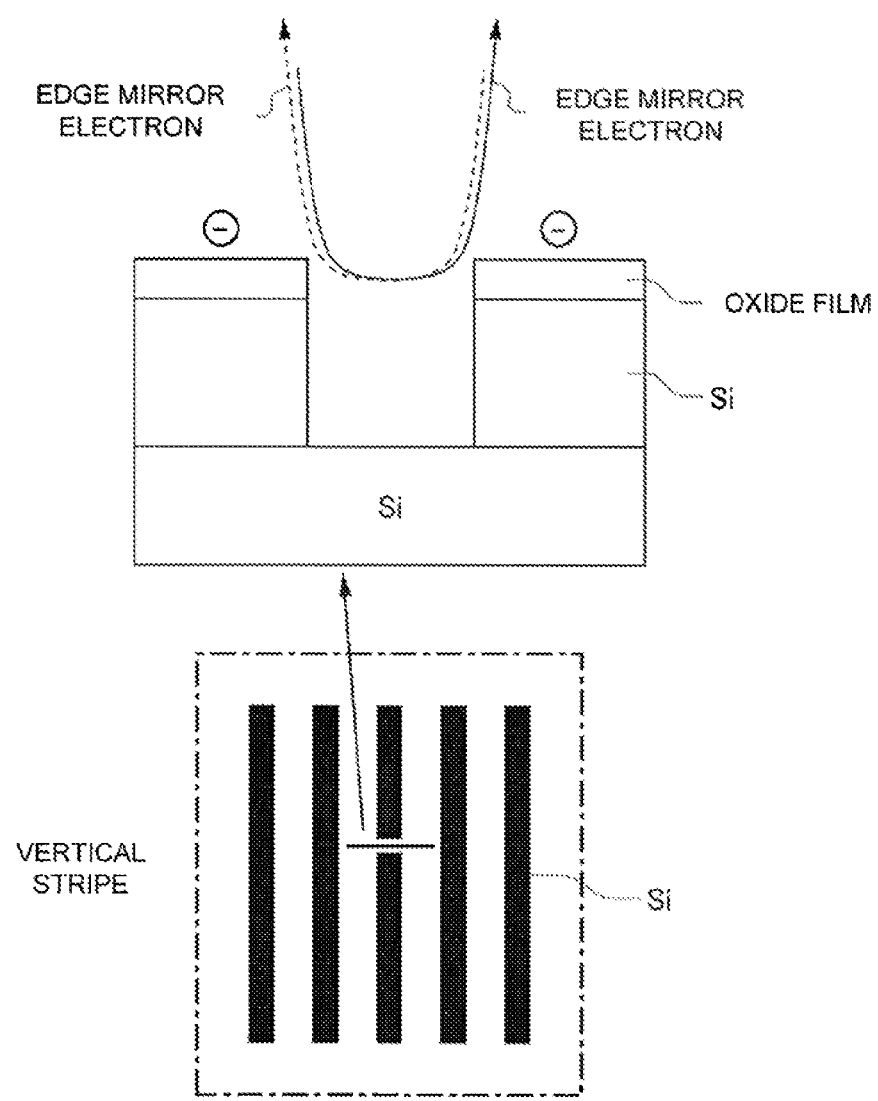
[FIG. 54]

[FIG.55]
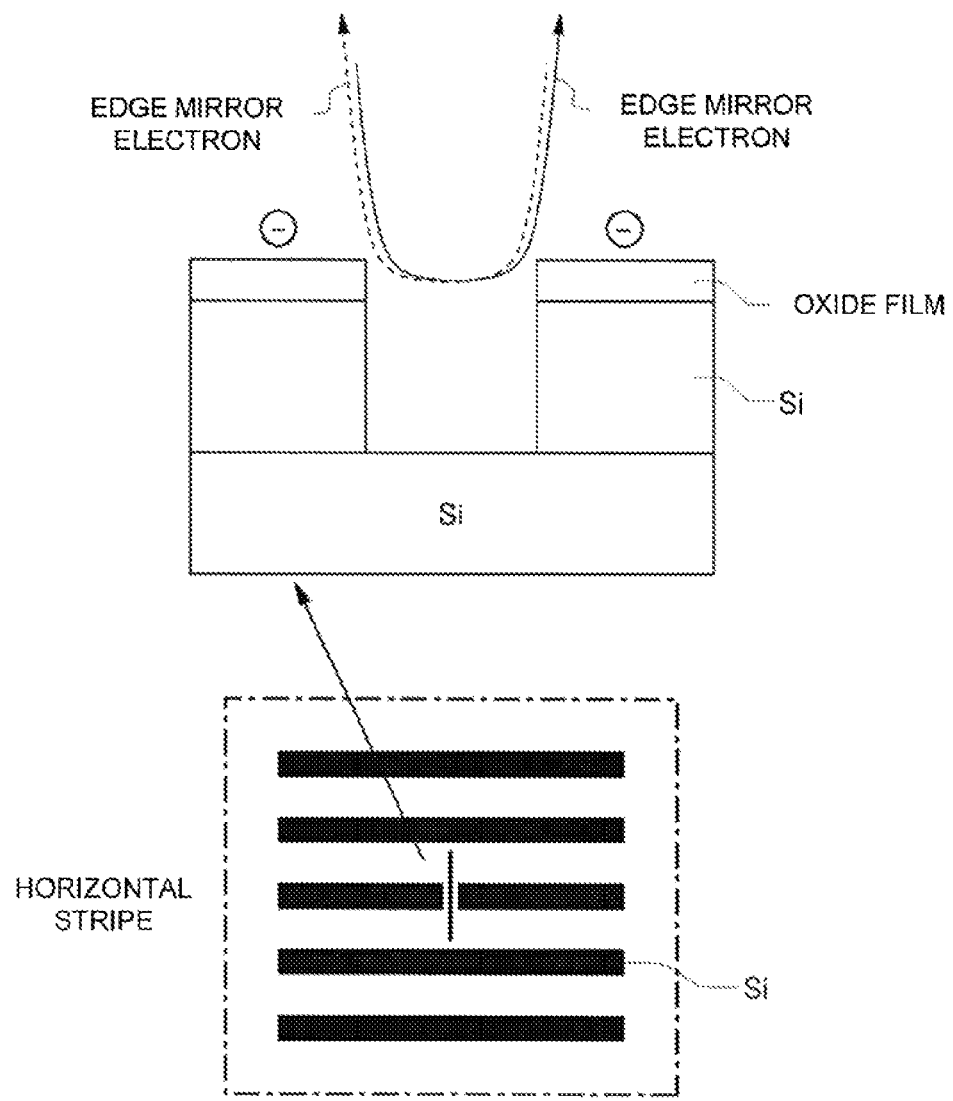

[FIG. 56]
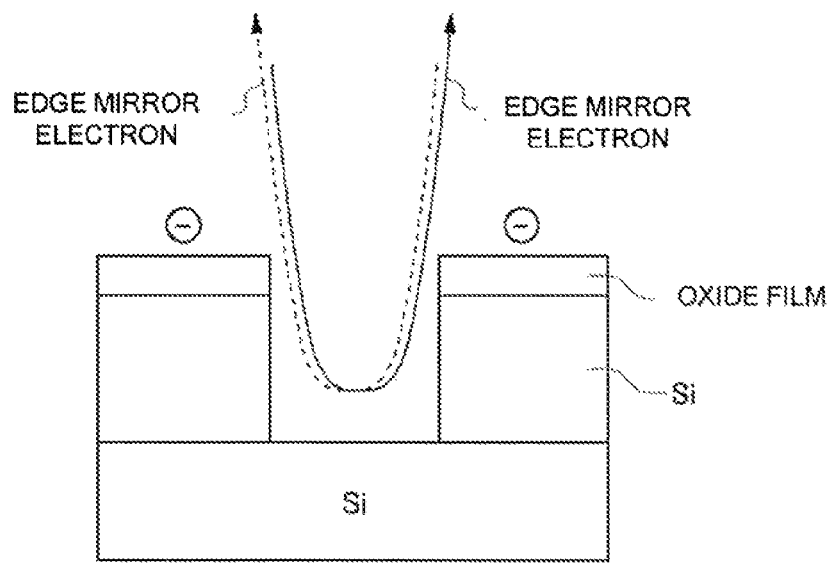
[FIG. 57]
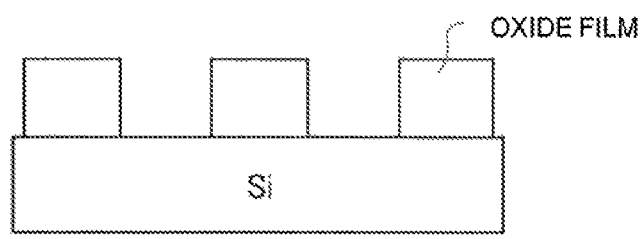

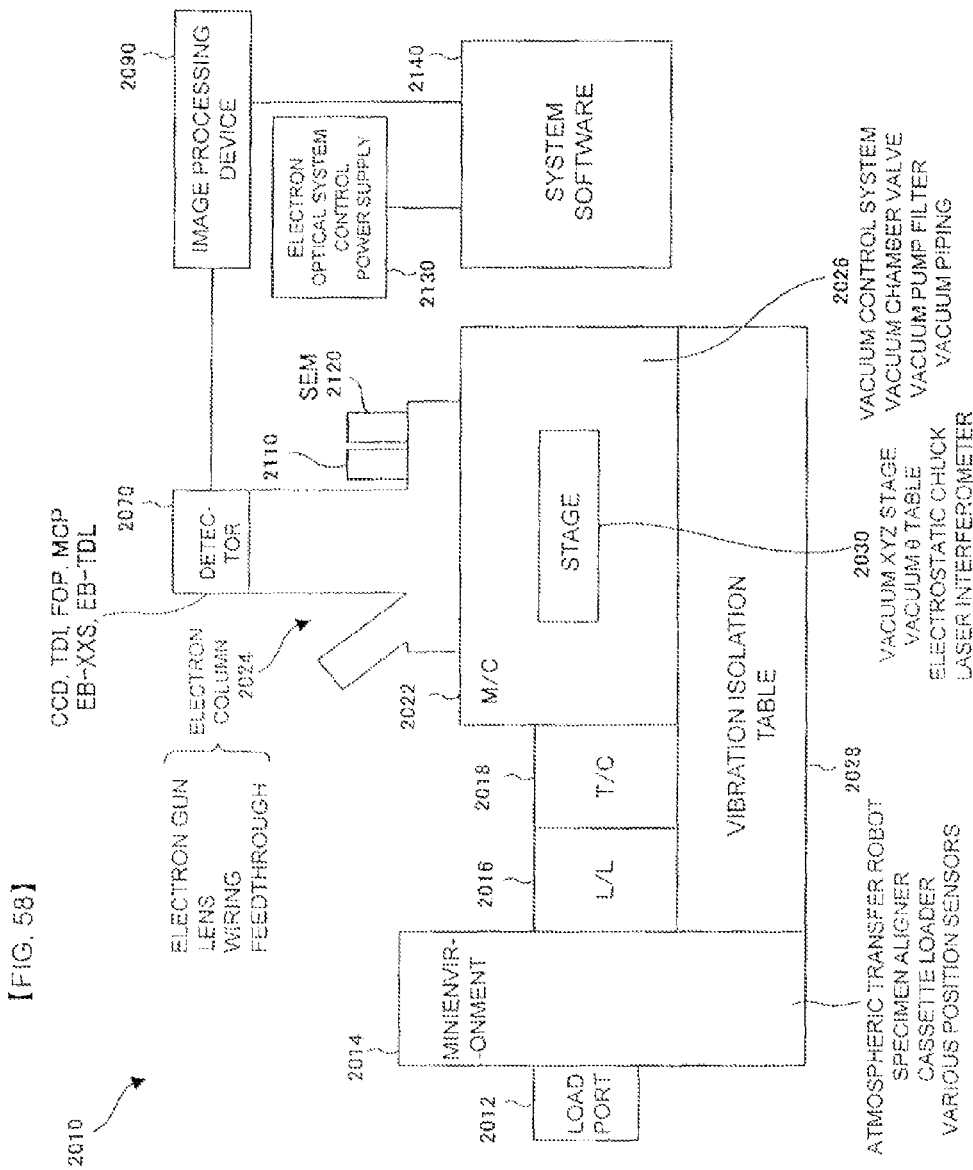

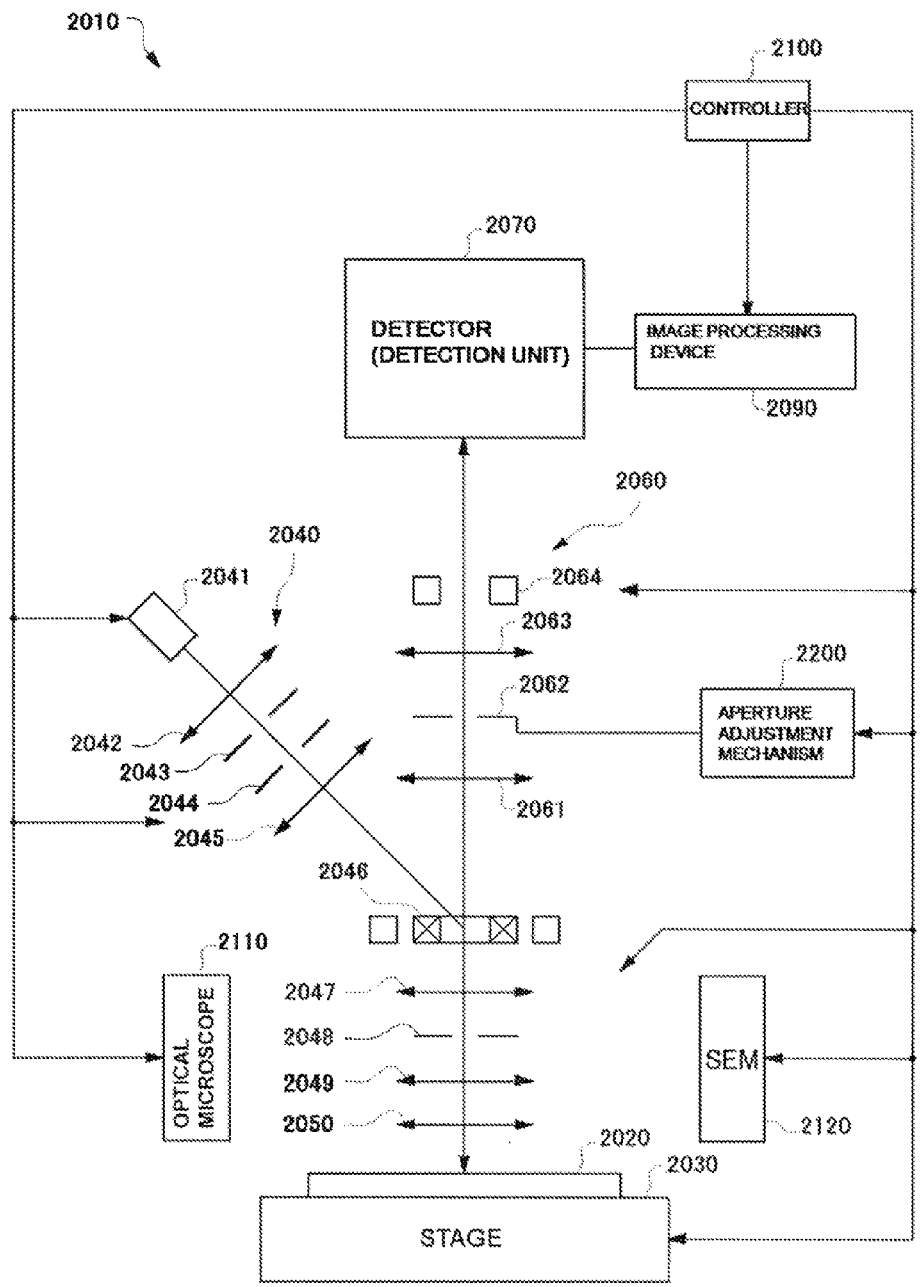
[FIG.59]

[FIG.60]
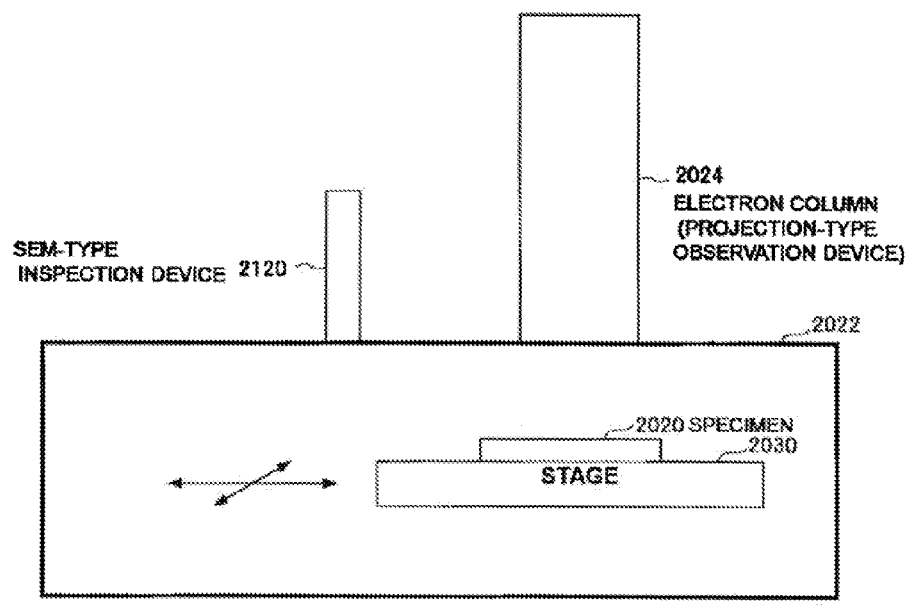

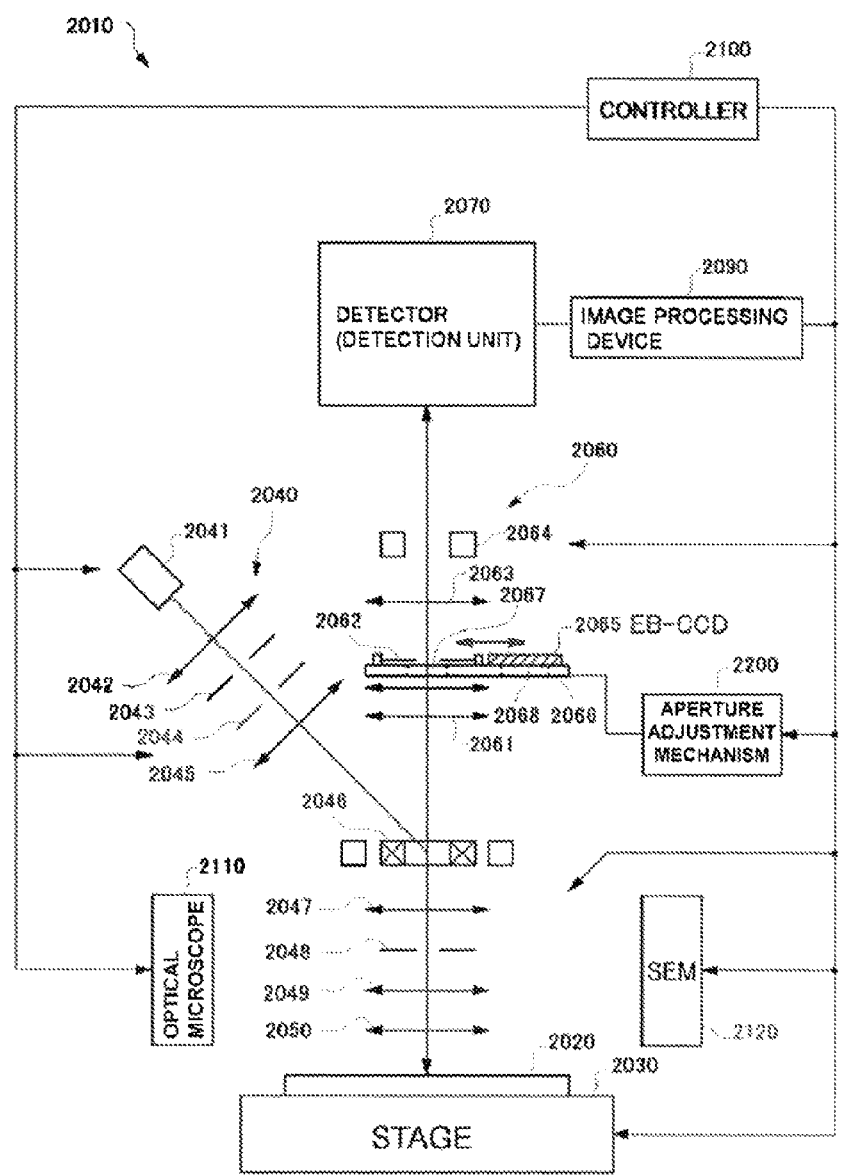
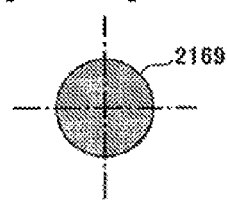

[FIG. 63]
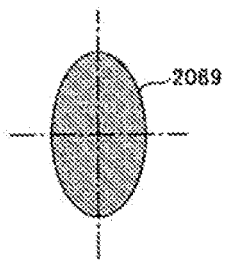
[FIG. 64]
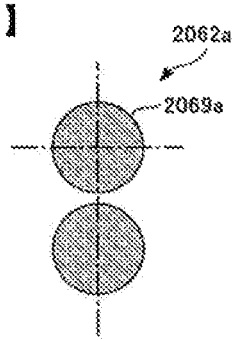
[FIG. 65]
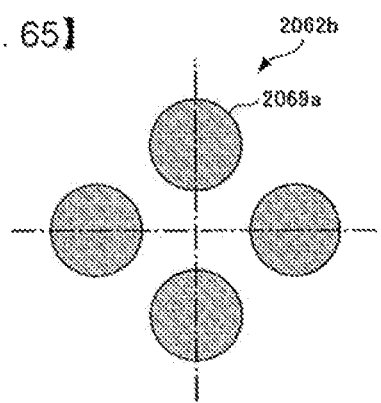
[FIG. 66]
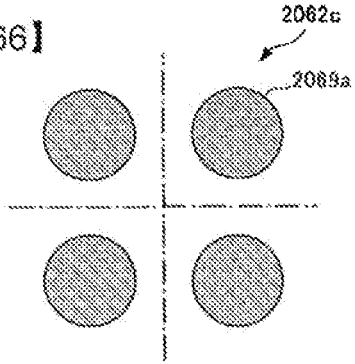

[FIG. 67]
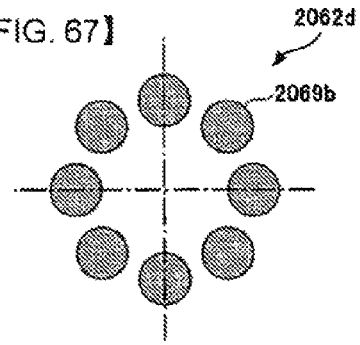
[FIG. 68]
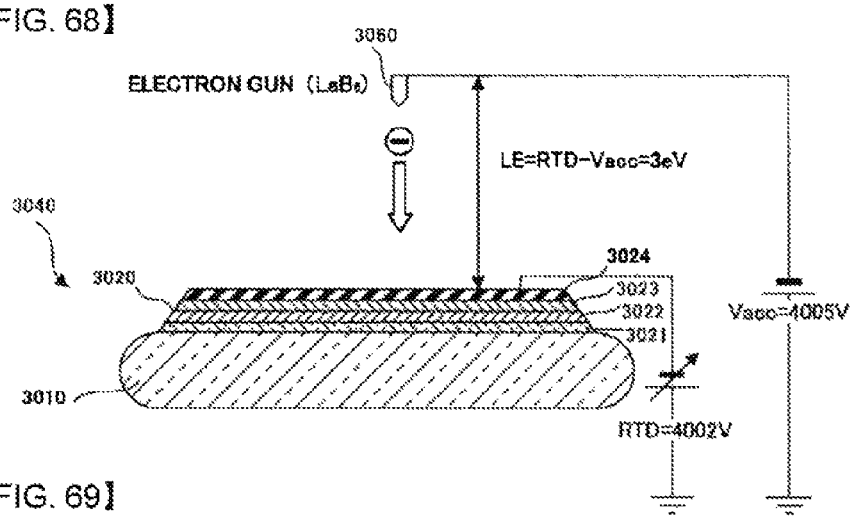
[FIG. 69]
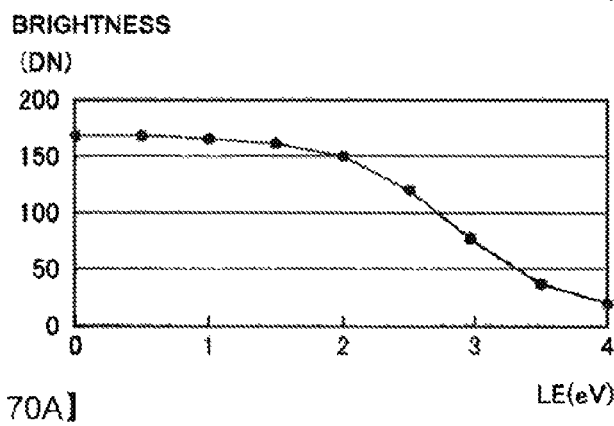
[FIG. 70A]
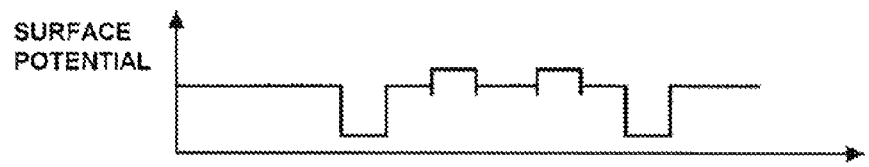

[FIG. 70B]
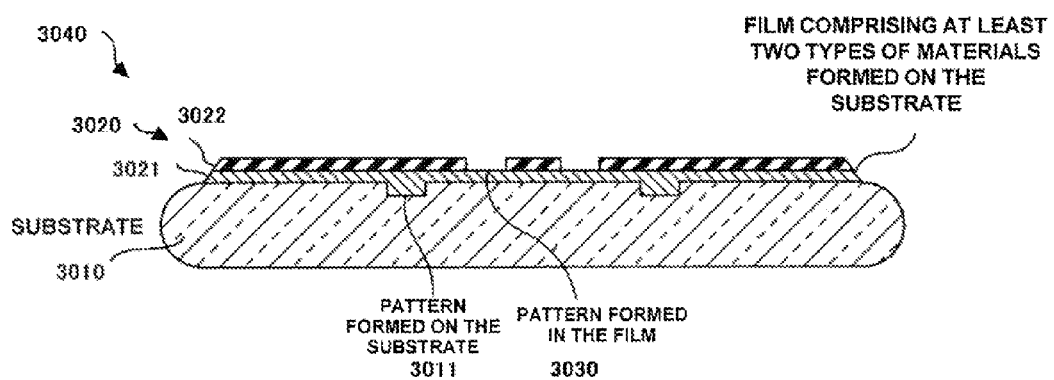
[FIG. 71]
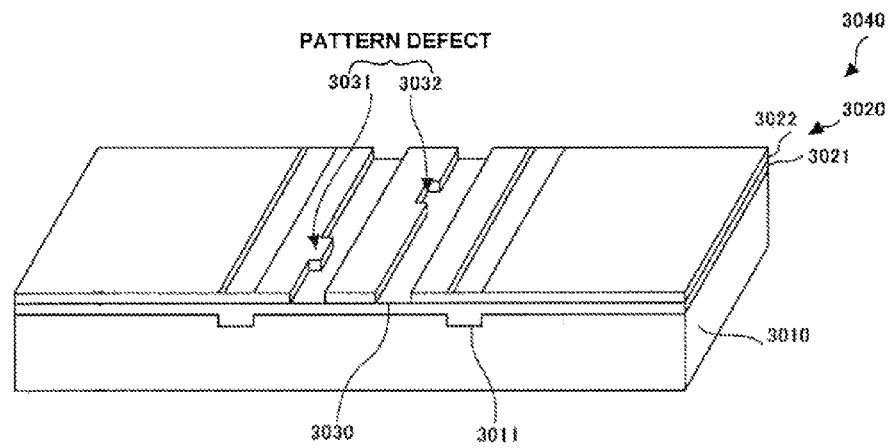

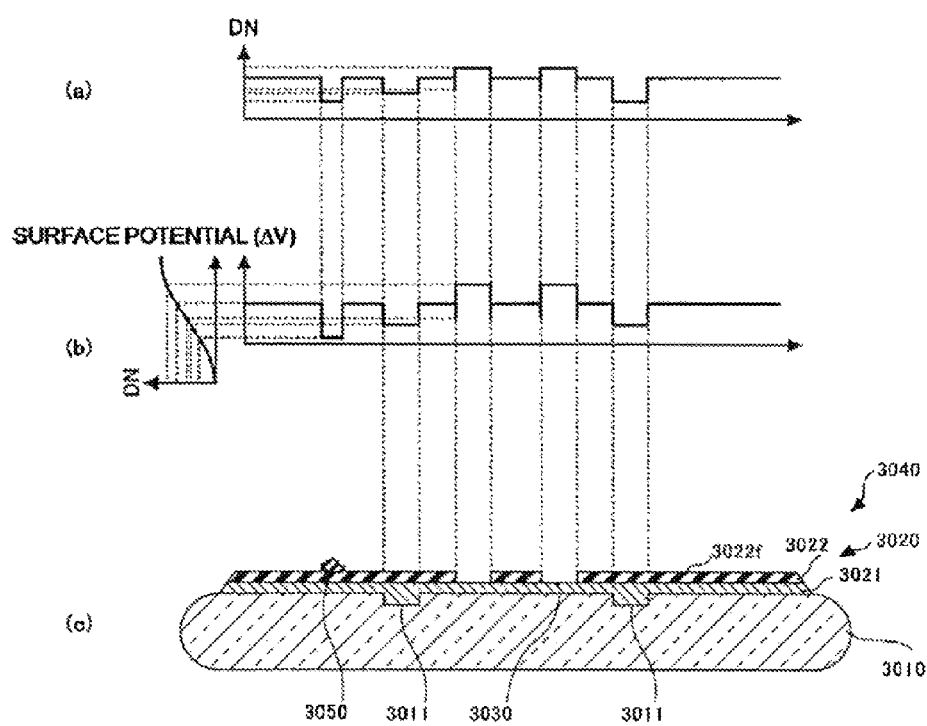
[FIG.72]

[FIG. 73]
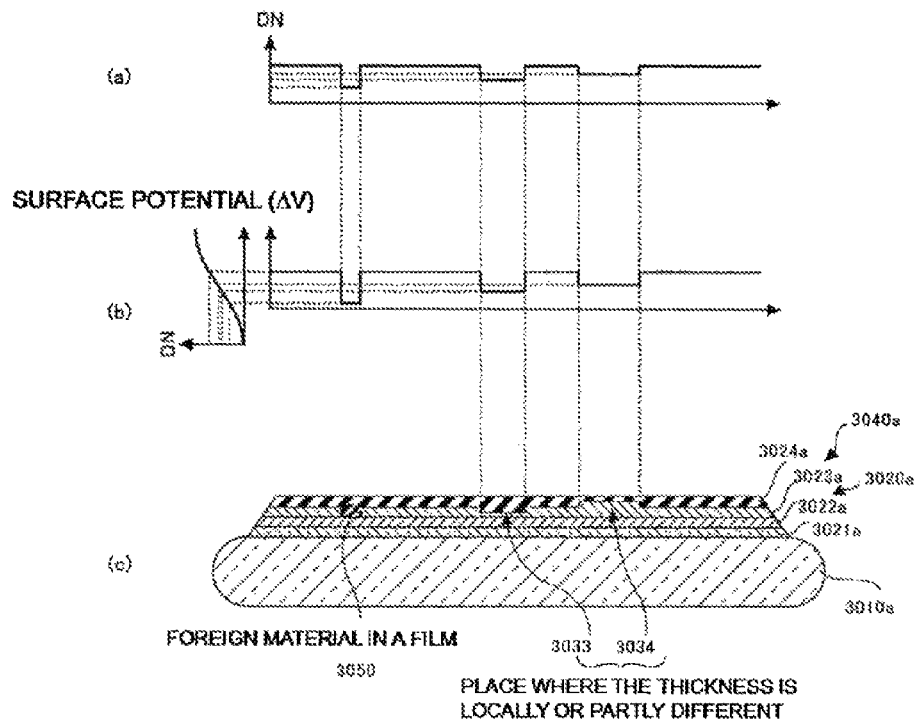
[FIG. 74]
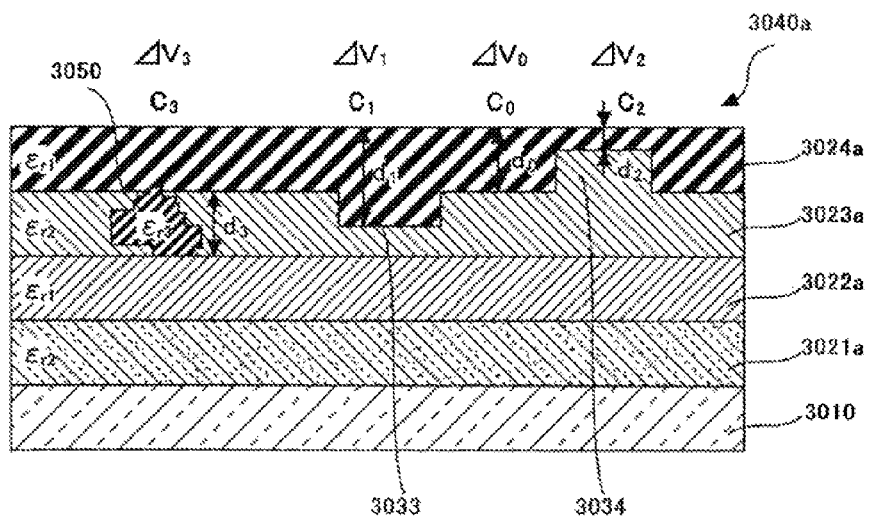

[FIG. 75]
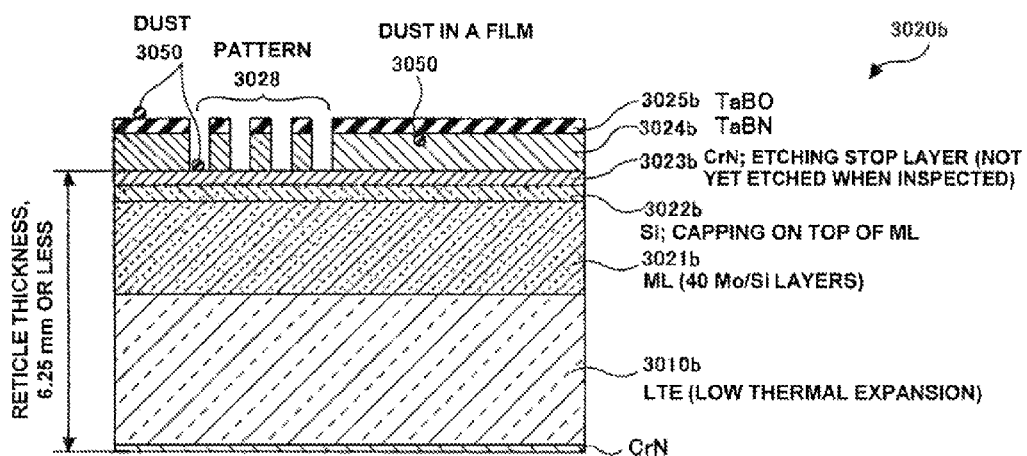
[FIG. 76]
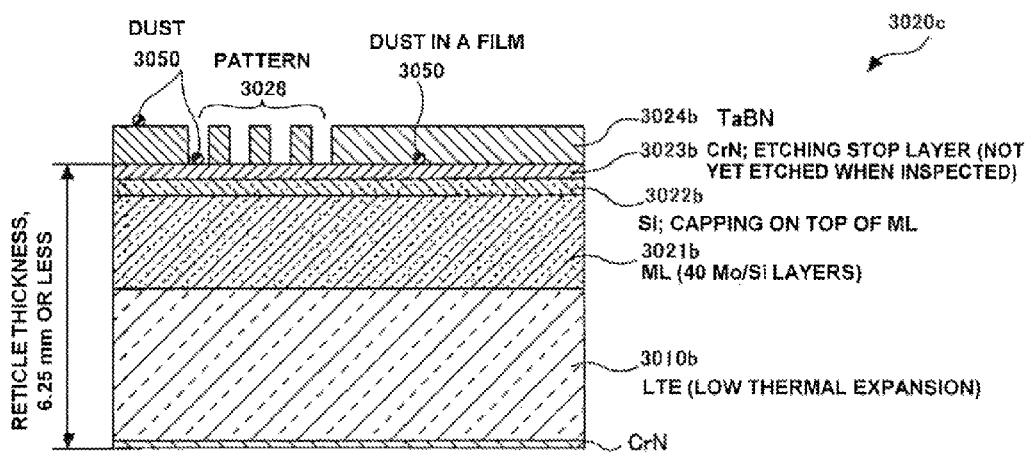

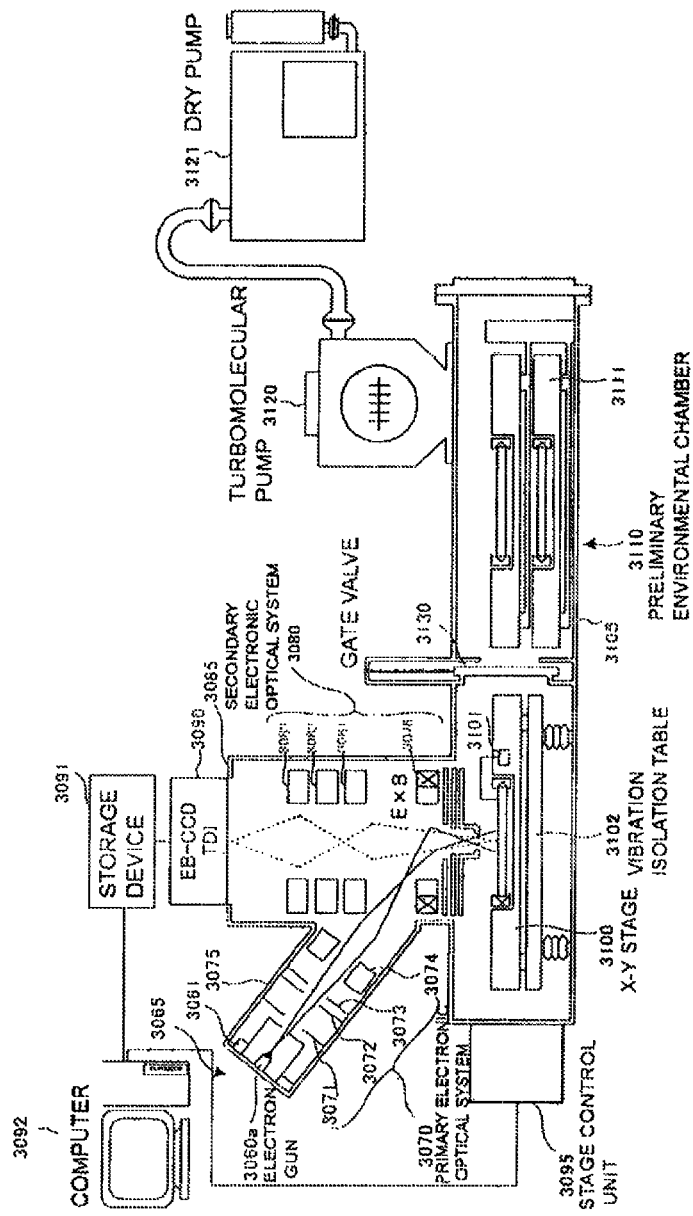
[FIG. 77]

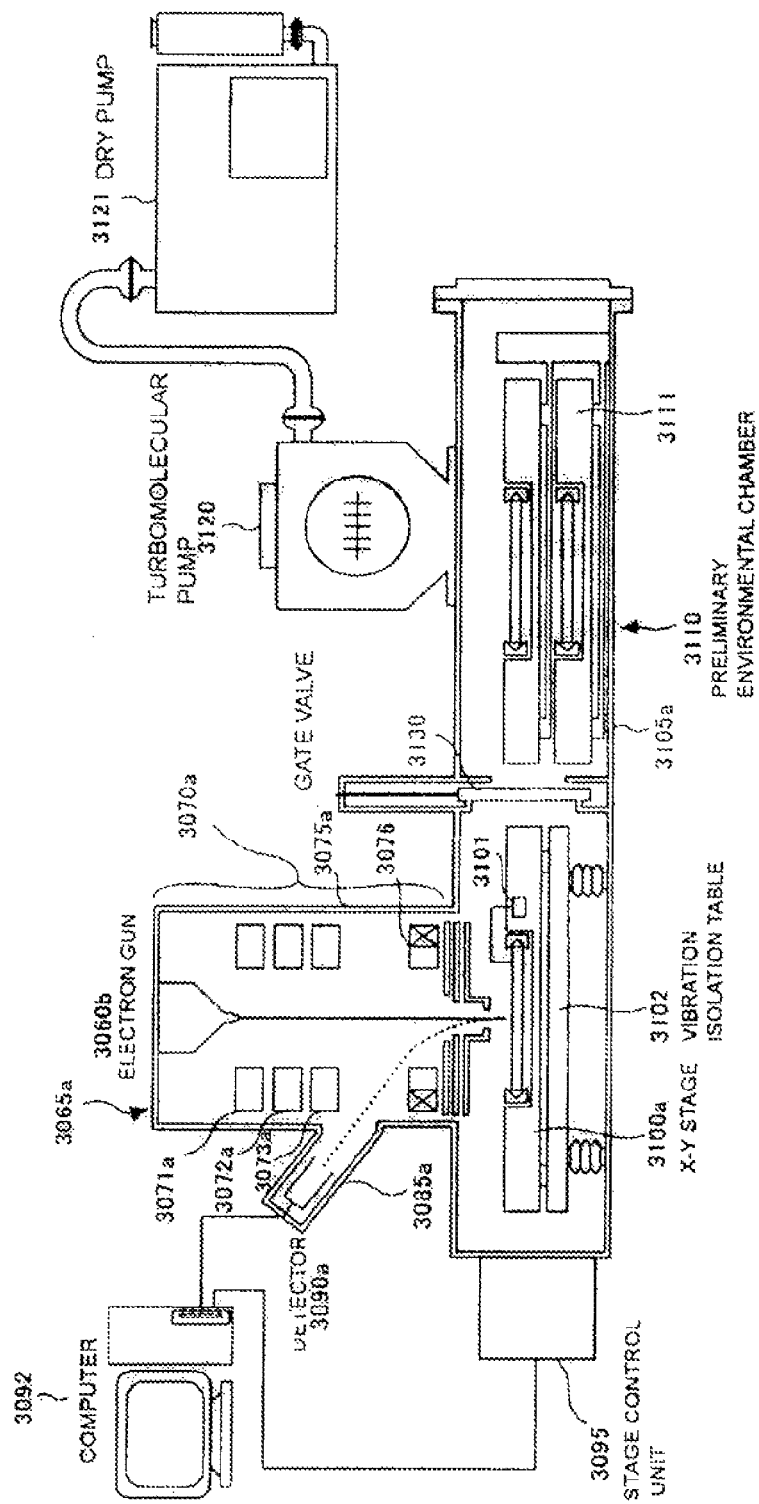
[FIG. 78]

SPECIMEN OBSERVATION METHOD AND DEVICE USING SECONDARY EMISSION ELECTRON AND MIRROR ELECTRON DETECTION

RELATED APPLICATIONS

This application is a Division of application Ser. No. 12/937,145 filed on Jan. 20, 2011, which is a 371 of International Application PCT JP/2009/001667 filed Apr. 10, 2009 and claims priority to the following applications, the contents of which are incorporated herein by reference:
(1) Japanese Patent Application No. 2008-103832 filed on Apr. 11, 2008 in Japan;
(2) Japanese Patent Application No. 2008-173994 filed on Jul. 2, 2008 in Japan;
(3) Japanese Patent Application No. 2009-031032 filed on Feb. 13, 2009 in Japan;
(4) Japanese Patent Application No. 2009-044397 filed on Feb. 26, 2009 in Japan;
(5) Japanese Patent Application No. 2009-059206 filed on Mar. 12, 2009 in Japan.

TECHNICAL FIELD

The present invention relates to a specimen observation method and device for observing a specimen using an electron beam, and in particular to an observation technique using an electron beam with a low landing energy.

BACKGROUND ART

Conventionally, a specimen substrate including a wafer or a mask is observed, for example, in the semiconductor manufacturing field. Optical microscopes and scanning electron microscopes (SEMs) are known as conventional observation devices. The use of a projection-type observation device has also been suggested. A projection-type observation device irradiates with an electron beam of a diameter larger than that of an SEM and acquires a specimen image over a wide area.

By the way, recently, patterns of specimens have become finer and the sizes of foreign materials to be detected have also become smaller. For example, the pattern sizes have become 100 nm or less. It is desired to detect foreign materials of 100 nm or less. Conventional optical microscopes, however, have insufficient resolution and have difficulty in observing such fine objects. SEMs can increase the magnification and can observe even fine objects, but would require an immense amount of observation time. The use of an observation device of a projection type would require short observation time but provide insufficient resolution.

As mentioned above, conventional observation techniques would have a limitation in object size and have difficulty in observing fine-sized objects. It would also not be easy to provide sufficient capability required to observe various objects. The background art will next be described in more detail from four points of view.

[Background 1] (Observation of Foreign Materials)
Electron Beam Inspection Method and Electron Beam Inspection Device In this background art, the present invention relates to an electron beam inspection method and an electron beam inspection device, and in particular to an electron beam inspection method and electron beam inspection device for irradiating a specimen with an electron beam, detecting reflected electrons by means of a detector, and thereby acquiring an image of a foreign material on the specimen surface.

Japanese Patent Laid-Open Application No. Hei 11-108864 discloses a conventional pattern defect inspection device. This conventional device has a means of irradiating a specimen surface with an electron beam emitted from an electron source. An area of a certain square measure is simultaneously irradiated with the electron beam. The conventional device also has: a movable specimen stage for holding a specimen; a means of applying a voltage which causes the electron beam with which the specimen is irradiated to be reflected immediately in front of the specimen surface; a means of forming an image having a certain area from the electron beam reflected immediately in front of the surface; and a means of converting the image to an electrical image signal. With the above-mentioned configuration, the conventional device acquires an image signal of an area of a certain square measure on a specimen surface, compares the acquired image signal to an image signal of another area, and detects a pattern defect.

The above-mentioned conventional device can detect a pattern defect on a specimen surface. The conventional device, however, cannot effectively detect a foreign material present on a specimen surface.

On the other hand, dust or other foreign materials may sometimes stick to the surface of a specimen, such as a semiconductor wafer, during processes. Detection of foreign materials is important for the quality control of semiconductor wafers. However, taking a long time for foreign material inspection is not preferable from a productivity point of view.

It is thus desired to provide an electron beam inspection method and electron beam inspection device capable of quickly and reliably detecting a foreign material on a specimen surface.

[Background 2] (Observation of Insulating and Conductive Areas)
Specimen Observation Device, Specimen Observation Method, and Semiconductor Manufacturing Method Using the Device and Method In this background art, the present invention relates to a specimen observation device, a specimen observation method, and a semiconductor manufacturing method using the device and method, and in particular to a technique for irradiating a specimen surface on which insulating and conductive areas are formed with a low-energy imaging electron beam to acquire an image of the specimen surface.

Published Japanese Translation of PCT International Publication for Patent Application No. 2003-500821 discloses a conventional secondary electron emission microscope. This conventional device first irradiates with a high-energy first beam. The first electron beam, having a collision energy of the order of 1 keV, is a beam suited for parallel multi-pixel imaging. The first beam neutralizes the charge of a sample, or causes a positive charge to accumulate. The conventional device then irradiates with a low-energy beam with a collision energy of 0 eV. The positive charge of the sample surface is compensated, and the surface potential of the sample is fixed to a predetermined voltage value. Secondary electrons are generated in this state. An image can thus be acquired from the secondary electrons without a problem of charge accumulation.

However, the above-mentioned conventional device detects only secondary electrons emitted from the sample, and acquires an image only from the secondary electrons. Secondary electron emission totally follows the cosine law and has a poor straight-advancing characteristic. As a result, it would be difficult to acquire an image with a good signal-to-noise ratio.

In a case where insulating and conductive areas are formed on a sample surface, an image acquired only from secondary electrons does not indicate a very high material contrast between the insulating and conductive areas. Consequently, observation or inspection of the sample surface may be difficult.

For example, suppose that insulating and conductive areas on a sample are unbalanced and the square measure of the insulating area is overwhelmingly larger than that of the conductive area (the area ratio of the insulating area is very large). In this case, an image from secondary electrons would provide a low contrast between the insulating and conductive areas, and therefore the inspection might be difficult.

For this reason, it is desired to provide a technique capable of observing a specimen surface with a high contrast in a case where insulating and conductive areas are formed on the specimen surface.

[Background 3] (Observation of Patterns)

Specimen Observation Method and Device, and Specimen Inspection Method and Device Using the Method and Device In this background art, the present invention relates to a specimen observation method and device for observing a pattern of a specimen using an electron beam, and in particular to a fine pattern observation technique using an electron beam with a low landing energy.

Conventionally, a specimen substrate including a wafer or a mask is observed, for example, in the semiconductor manufacturing field. Specimen observation is performed for structural evaluation, observation under magnification, material evaluation, inspection and observation of an electrical conduction state, or the like. High precision, high reliability, high throughput, and the like are required in inspection of specimen substrates. So, it is desired to provide a specimen observation technique that meets these requirements. Specimen observation and inspection techniques are also important in device manufacturing processes. Specimens are semiconductor materials, LSIs, metallic materials, insulating materials, and the like.

Optical microscopes or electron beam observation devices are conventionally used for observing patterns on specimens. Scanning electron microscopes (SEMs) are known as typical electron beam observation devices. An SEM scans a specimen with an electron beam and thereby allows the observation to be done with a high magnification. An observation technique using an SEM is disclosed, for example, in Japanese Patent Laid-Open Application No. 2004-177446.

Observation devices using projection optical systems have also been suggested as electron beam observation devices. Observation devices of this type are hereinafter referred to as projection-type observation devices. A projection-type observation device irradiates a specimen with an electron beam of a diameter larger than that of an SEM, and generates an image of an area corresponding to the diameter of the electron beam. Such an observation device is disclosed, for example, in Japanese Patent Laid-Open Application No. Hei 11-108864.

By the way, recently, patterns on specimens have become finer, and pattern sizes (width or the like) have reached 100 nm or less. As a result, it has become difficult to observe a pattern and pattern defect of a specimen with conventional observation techniques.

That is, optical observation is limited in resolution by the wavelength of light. If the pattern size is 100 nm or less, the pattern size is smaller than the wavelength of light, so that sufficient resolution cannot be obtained and it becomes difficult to detect a pattern defect.

The resolution of pattern observation and pattern defect inspection using an SEM can be increased by reducing the spot size of the electron beam. Accordingly, even if the pattern size is 100 nm or less, pattern observation can be done and pattern defect inspection can also be done. However, the pixel size requires reducing in order to observe fine patterns, so an immense amount of time is required for the observation. For example, the pixel size of the order of 10 nm is applied in order to detect a defect of 50 nm. In this case, even an inspection performed at 200 Mpps (Mega pixel per second) would take 1.4 hours per square centimeter. The inspection thus requires an immense amount of time and is impractical.

A projection-type observation device is configured to irradiate a specimen with an electron beam of a large diameter and generate an image of a wide area, thereby allowing the observation to be performed in a shorter amount of time than SEMs. However, the device cannot provide a sufficient contrast and sufficient resolution when the pattern size is 100 nm or less.

More specifically, in a projection-type observation device, a primary optical system irradiates a specimen with an electron beam, and a secondary optical system generates an image of secondary electrons emitted from the specimen. The imaging area (beam irradiation area) can be set to tens of micrometers or more, and the observation time is short. However, aberrations of the secondary optical system cannot be sufficiently reduced, and it is not easy to realize a resolution required for observation for the pattern size of 100 nm or less.

In the above-mentioned background, it is therefore desired to provide a technique capable of observing fine patterns.

[Background 4] (Observation of a Specimen in which a Plurality of Films are Formed)

Inspection Method and Inspection Device for a Film-Coated Substrate

In this background art, the present invention relates to an inspection method and inspection device for a film-coated substrate, and in particular to an inspection method and inspection device for a film-coated substrate for inspecting a film-coated substrate using a charged particle beam.

Japanese Patent Laid-Open Application No. 2004-177446 discloses a conventional mask inspection device. This conventional device inspects a mask including a reticle on which a device pattern to be transferred onto a sensitive substrate is formed. The conventional device comprises an imaging means, a storage means, and a comparison means. The imaging means irradiates an object to be inspected with an electron beam, and converts an electron beam transmission image or a secondary electron image (SEM image) of the device pattern to obtain actual image data of the pattern. The actual image data is the object to be inspected. The storage means stores design data of the pattern and reference image data that meets the design criteria. The comparison means compares the actual image data and the reference image data.

The above-mentioned conventional device inspects a mask by comparing image patterns. For this reason, the conventional device can only inspect for the presence or absence of a defect in a device pattern on the mask surface.

Consequently, the conventional device would not be able to inspect the shape under the surface, the presence of a foreign material, and the like.

It is therefore desired to provide a technique capable of detecting the shape of a substrate and the shape of a lower layer film or the like which are present under the surface of a film-coated substrate. It is also desired to provide a technique capable of detecting a foreign material or the like present in a lower layer film or the like.

DISCLOSURE OF THE INVENTION

Problems to be Solved by the Invention

A purpose of the invention made in the above-mentioned background is to provide a technique capable of improving the ability to observe a specimen using an electron beam in an energy region which has not been conventionally given attention as described below.

Means for Solving the Problems

The invention is a specimen observation method for observing a specimen using an electron beam, and the specimen observation method has: an irradiation step of irradiating the specimen with an electron beam; a detection step of detecting electrons to be observed which have been generated and have obtained information on the specimen by the electron beam irradiation; and an image generation step of generating an image of the specimen from the detected electrons to be observed, where the irradiation step comprises irradiating the specimen with the electron beam with a landing energy set in a transition region between a secondary emission electron region in which secondary emission electrons are detected and a mirror electron region in which mirror electrons are detected, thereby causing the secondary emission electrons and the mirror electrons to be mixed as the electrons to be observed, and where the detection step comprises performing the detection in a state where the secondary emission electrons and the mirror electrons are mixed.

The invention is also a specimen observation device for observing a specimen using an electron beam, and the specimen observation device has: a stage for placing the specimen thereon; a primary optical system for irradiating the specimen with an electron beam; a secondary optical system for detecting electrons to be observed which have been generated and have obtained information on the specimen by the electron beam irradiation; and an image processor for generating an image of the specimen from the detected electrons to be observed, where the primary optical system irradiates the specimen with the electron beam with a landing energy set in a transition region between a secondary emission electron region in which secondary emission electrons are detected and a mirror electron region in which mirror electrons are detected, thereby causing the secondary emission electrons and the mirror electrons to be mixed as the electrons to be observed, and where the secondary optical system performs the detection in a state where the secondary emission electrons and the mirror electrons are mixed.

The method or device of the invention may generate an image of a foreign material present on a surface of the specimen. The method or device of the invention may generate an image of the specimen on which an insulating area and a conductive area are formed. The method or device of the invention may generate an image of a pattern formed on the specimen. The method or device of the invention may generate an image of the specimen in which a plurality of films are layered. The invention can improve the ability to observe these objects.

(Aspect of Foreign Material Inspection)

One aspect of the invention relates to an electron beam inspection method. This method irradiates a specimen surface with an imaging electron beam having a predetermined irradiation area, detects reflected electrons by means of a detector, and thereby acquires an image of the specimen surface and of a foreign material on the specimen surface. This method has: a foreign material charging step of charging the foreign material by irradiation with a charging electron beam and forming around the foreign material a potential distribution different from that of the specimen surface; and a magnified image acquisition step of detecting the electrons which are reflected from the foreign material by the imaging electron beam irradiation and reach the detector through a path bent by the effect of the potential distribution, and acquiring a magnified image of the foreign material in which the magnification for the foreign material is increased more than the magnification for the specimen surface.

(Aspect of Observation of Insulating and Conductive Areas)

One aspect of the invention relates to a specimen observation device. This device comprises: an electron beam source for irradiating a specimen surface on which an insulating area and a conductive area are formed with an imaging electron beam; an E×B filter for directing electrons which have obtained structural information on the specimen surface by the irradiation with the imaging electron beam, wherein the E×B filter directs the electrons according to the speed of the electrons which move in a direction opposite to an incident direction of the imaging electron beam and using electric and magnetic fields; a detector for detecting the electrons directed by the E×B filter and acquiring an image of the specimen surface from the detected electrons; and an irradiation energy setting unit for setting the irradiation energy of the imaging electron beam in a transition region in which the electrons include both mirror electrons and secondary electrons.

(Aspect of Pattern Observation)

One aspect of the invention relates to a specimen observation method. This method observes a pattern of a specimen using an electron beam. This method has the steps of: irradiating the specimen with an electron beam; detecting mirror electrons generated by the electron beam irradiation; and generating an image of the specimen from the detected mirror electrons, where the electron beam irradiation step comprises irradiating the specimen with the electron beam with a landing energy adjusted so that when a hollow pattern with edges on both sides is irradiated with the electron beam, irradiation electrons turn around at the hollow pattern to become mirror electrons.

(Aspect of Film-Coated Substrate Inspection)

One aspect of the invention relates to an inspection method for a film-coated substrate. The film-coated substrate has a substrate on which a three-dimensional shape is formed and a plurality of films comprising different materials layered and formed on the substrate, and the film-coated substrate further includes a structure in which a lower layer film is exposed due to a top layer film being removed. This method comprises the steps of: irradiating a surface of the film-coated substrate with a charged particle beam with a landing energy set so as to cause the surface potential to vary among the top layer film located immediately above an area where the three-dimensional shape is formed on the substrate, the top layer film located immediately above an area where no three-dimensional shape is formed on the substrate, and the lower layer film; detecting electrons which have acquired information on the surface potential of the film-coated substrate, and acquiring a potential contrast of the surface of the film-coated substrate; and simultaneously detecting the shape of the top layer film and the three-dimensional shape formed on the substrate, based on the potential contrast.

Advantages of the Invention

The invention can improve the ability to observe a specimen by appropriately setting the landing energy as described above.

There are other aspects of the invention as described below. This disclosure of the invention therefore intends to provide part of the aspects of the invention and does not intend to limit the scope of the invention described and claimed herein.

BRIEF DESCRIPTION OF THE DRAWINGS

FIGS. 1A to 34 are about a first point of view. FIG. 1A illustrates an image to be obtained by an electron beam inspection method according to an embodiment and an outline of the principles thereof, showing an image of a foreign material obtained by a projection method;

FIG. 1B shows an image of a foreign material obtained by a conventional SEM-type foreign material inspection device;

FIG. 1C is a side view showing a state where a foreign material is present on a specimen;

FIG. 2A shows a conventional electron beam inspection method for comparison with the embodiment, showing a conventional optical-type electron beam inspection method;

FIG. 2B shows a conventional SEM-type electron beam inspection method;

FIG. 3A shows an example of a magnified image of a foreign material to be acquired by a foreign material inspection method;

FIG. 3B is an example of a cross-sectional gray level corresponding to FIG. 3A, showing the cross-sectional gray level versus pixel position;

FIG. 4A shows a relation between landing energy and secondary electrons, showing the yield of secondary emission electrons;

FIG. 4B shows a mirror electron;

FIG. 4C shows secondary emission electrons;

FIG. 5A shows an example of a relation between landing energy and "signal intensity/average gray level" of electrons from a specimen;

FIG. 5B shows an example different from that in FIG. 5A;

FIG. 6 is a side view showing a state where a foreign material is irradiated with an electron beam and electrons are generated;

FIG. 7A shows an image of a specimen surface and foreign material for a landing energy LE of 10 eV or less;

FIG. 7B shows an example of the gray-level value of a magnified image of a foreign material, showing a relation between the y-direction cross-sectional position of a foreign material and the gray-level value;

FIG. 8 is a side view showing a state where mirror electrons are generated from a foreign material;

FIG. 9A is a side view showing a state where a specimen surface is irradiated with a charging electron beam, in order to illustrate a mode that enhances generation of mirror electrons;

FIG. 9B shows a state where a foreign material on a specimen surface is irradiated with an imaging electron beam;

FIG. 10 illustrates a foreign material inspection method in which LE2 is larger than LE1;

FIG. 11 illustrates an electron beam inspection method in which LE1 and LE2 are set to be equal to each other;

FIG. 12 shows an image for a case where LE is larger than 10 eV;

FIG. 13A shows a state where secondary emission electrons are emitted from a foreign material, showing the behavior of secondary emission electrons in a state where the potential difference is large;

FIG. 13B shows the behavior of secondary electrons in a state where the potential difference is small;

FIG. 13C shows the behavior of secondary emission electrons in a positive charge region;

FIG. 14 shows a configuration of an electron beam inspection device;

FIG. 15 is a side view showing a state where a foreign material is irradiated with an electron beam at an angle;

FIG. 16A shows a foreign material made of a metallic material;

FIG. 16B is an enlarged view of the foreign material made of a metallic material;

FIG. 17 shows a detector in which an EB-TDI and an EB-CCD can be interchanged;

FIG. 18A illustrates a method of efficiently determining electron beam path conditions, showing a cross-sectional view in a state where a hollow groove is formed on a specimen surface;

FIG. 18B is a cross-sectional view in a state where a hollow groove is formed on a specimen surface;

FIG. 19 is a cross-sectional view showing a Faraday cup;

FIG. 20 illustrates filtering for a case where mirror electrons are generated also from normal part around a foreign material;

FIG. 21 shows a general configuration of a foreign material inspection device;

FIG. 22 shows an example of an electron beam inspection device in which a projection-type optical inspection device and an SEM-type inspection device are installed in one and the same main chamber;

FIG. 23 shows the main chamber and an electron column system in an upper part thereof;

FIG. 24 shows a conventional aperture as a reference example;

FIG. 25 shows an example of the shape of an aperture;

FIG. 26 shows an example of a configuration of an NA aperture having a plurality of holes;

FIG. 27 shows an example of a configuration of an NA aperture having four holes;

FIG. 28 shows an example of another configuration of an NA aperture having four holes;

FIG. 29 shows an example of a configuration of an NA aperture having eight holes;

FIG. 30 is a side view showing a configuration in which a Faraday cup, a reference specimen chip, and an EB-CCD are placed on a stage;

FIG. 31 shows a state where samples are scattered on a specimen;

FIG. 32 shows an example of a relation between the samples and the signal intensity;

FIG. 33 shows a gray-level characteristic versus beam energy in an electron beam inspection method according to the embodiment;

FIG. 34 shows in detail a relation between the landing energy LE and the gray level of an image;

FIGS. 35 to 49 are about a second point of view. FIG. 35 shows an example of a configuration of a specimen observation device according to an embodiment;

FIG. 36A is an example of images of specimens, showing a relation between the irradiation energy of an imaging electron beam and the material contrast;

FIG. 36B shows a relation between the irradiation energy of an imaging electron beam and the detector current;

FIG. 37 schematically shows the difference in angle between mirror electrons and secondary electrons;

FIG. 38 shows a change in the gray level of a specimen surface versus landing energy;

FIG. 39A shows an example of a path of electrons which have obtained structural information on a specimen surface;

FIG. 39B is a partially enlarged view showing the electron path, corresponding to FIG. 39A;

FIG. 40A shows a relation between the spread of the electron path and an optimum position of an NA adjustment aperture, showing an optimum NA aperture position for mirror electrons;

FIG. 40B shows an optimum NA aperture position for secondary electrons;

FIG. 41A is a structure of a specimen in Experiment example 1, showing a cross-sectional structure of a contact plug;

FIG. 41B shows an example of an image of the contact plug structure in FIG. 41A;

FIG. 42A shows a measurement result of a specimen observation method according to Experiment example 1 and, in particular, is a table showing a result from observing the contact plug with the landing energy of the electron beam being varied;

FIG. 42B is a graph corresponding to the measurement result in FIG. 42A;

FIG. 43A shows a measurement result of a specimen observation method according to Experiment example 2 and, in particular, is a measurement result table showing a relation between the dose amount of a charging electron beam and the contrast;

FIG. 43B is a graph corresponding to the measurement result in FIG. 43A;

FIG. 44A shows a measurement result of a specimen observation method according to Experiment example 3 and, in particular, is a measurement result table showing a relation between the position of an NA aperture and the contrast;

FIG. 44B is a graph corresponding to the measurement result in FIG. 44A;

FIG. 45A shows a measurement result of a specimen observation method according to Experiment example 4 and is a measurement result table showing a relation between a specimen surface and the contrast;

FIG. 45B is a graph corresponding to the measurement result in FIG. 45A;

FIG. 46 shows an example of a configuration of a specimen observation device according to another embodiment;

FIG. 47A shows a configuration example of a movable NA adjustment aperture and is a top view showing a slidably movable NA adjustment aperture;

FIG. 47B shows a configuration example of a movable NA adjustment aperture and is a top view showing a rotatably movable NA adjustment aperture;

FIG. 48 shows an example of a preferred structure of a detector;

FIG. 49 shows an example of a general configuration of a specimen observation device;

FIGS. 50 to 67 are about a third point of view. FIG. 50 shows a relation between landing energy and the gray level of a specimen irradiated with an electron beam;

FIG. 51 shows a phenomenon in which mirror electrons and secondary emission electrons are generated in a transition region;

FIG. 52 shows a relation between landing energy and the gray level at an edge part of an uneven structure on a specimen surface;

FIG. 53 shows an example of the uneven structure of a pattern formed on a specimen;

FIG. 54 shows a phenomenon in which mirror electrons are generated at an edge part of the uneven structure when it is irradiated with an electron beam;

FIG. 55 shows a phenomenon in which mirror electrons are generated at an edge part of the uneven structure when it is irradiated with an electron beam;

FIG. 56 shows a phenomenon in which mirror electrons are generated at an edge part of the uneven structure when it is irradiated with an electron beam;

FIG. 57 shows another example of the uneven structure of a pattern formed on a specimen;

FIG. 58 shows a general configuration of a specimen inspection device;

FIG. 59 shows a main part of the specimen inspection device;

FIG. 60 is a part of the specimen inspection device, showing a main chamber, an electron column, and an SEM;

FIG. 61 shows a configuration equipped with an EB-CCD in order to measure the signal intensity at an aperture;

FIG. 62 shows a conventional aperture as a reference example;

FIG. 63 shows an example of the shape of an aperture;

FIG. 64 shows an example of a configuration of an aperture member having a plurality of holes;

FIG. 65 shows an example of a configuration of an aperture member having a plurality of holes;

FIG. 66 shows an example of a configuration of an aperture member having four holes;

FIG. 67 shows an example of another configuration of an aperture member having eight holes;

FIGS. 68 to 79 are about a fourth point of view. FIG. 68 shows a schematic configuration of an inspection device for carrying out a film-coated substrate inspection method according to an embodiment;

FIG. 69 shows the difference in brightness according to landing energy;

FIG. 70A shows the surface potential of the film-coated substrate, showing an example of a potential difference, caused by electron beam irradiation, between a shape formed on the substrate and a shape formed on the film;

FIG. 70B shows a cross-sectional configuration of the film-coated substrate corresponding to FIG. 70A;

FIG. 71 is a perspective view showing an example of a pattern and shape defect formed on the film-coated substrate;

FIGS. 72(a)-(c) show examples of the brightness distribution of an image of, surface potential distribution of, and cross-sectional configuration of the film-coated substrate;

FIGS. 73(a)-(c) show the brightness distribution, surface potential, and cross-sectional configuration of another example of the film-coated substrate;

FIG. 74 is a schematic diagram showing a difference in surface potential caused by a difference in capacitance;

FIG. 75 shows an example of a cross-sectional structure of a multilayer film;

FIG. 76 shows an example of a cross-sectional structure of a multilayer film different from that in FIG. 75;

FIG. 77 shows an example of a general configuration of a film-coated substrate inspection device according to the embodiment; and FIG. 78 shows another example of a general configuration of a film-coated substrate inspection device according to the embodiment.

MODE OF EMBODYING THE INVENTION

Now, the invention will be described in detail. The following detailed description and appended drawings are not intended to limit the invention. Rather, the scope of the invention is defined by the appended claims.

In the invention, as described above, a specimen is irradiated with an electron beam with a landing energy in a transition region. The transition region is between a secondary emission electron region and a mirror electron region. When irradiation is performed with an electron beam, substantially only secondary emission electrons are detected in the secondary emission electron region. Substantially only mirror electrons are detected in the mirror electron region. On the other hand, mirror electrons and secondary emission electrons are mixed in the transition region. The transition region is a region in which the landing energy is very low. The transition region has not been given much attention until now. Giving attention to this transition region, the present inventors have set the landing energy in the transition region, and have thereby succeeded in improving the ability of observation.

Four points of view will be described below.

A first point of view corresponds to [Background 1] described above and relates to observation of foreign materials.

A second point of view corresponds to [Background 2] described above and relates to observation of insulating and conductive areas.

A third point of view corresponds to [Background 3] described above and relates to observation of patterns.

A fourth point of view corresponds to [Background 4] described above and relates to observation of a specimen in which a plurality of films are formed.

The above-described transition region is used in any of these points of view. In the first point of view, for example, the transition region is LE≤10 eV in FIG. 5A, LE≤5 eV in FIG. 5B, or LEA≤LE≤LEB in FIG. 33, where LE is the landing energy. LEA and LEB are the lower and upper limits of the transition region.

In the embodiments, secondary emission electrons generally include secondary electrons, reflected electrons, and backscattered electrons. The term secondary emission electron is also used when these three types of electrons are mixed. Secondary electrons are sometimes described as typical secondary emission electrons. Mirror electrons are electrons which are reflected from a specimen by the effect of the surface potential. That is, mirror electrons bounce back from a specimen without colliding therewith. Expressions such as "be emitted from a specimen," "be reflected from a specimen," and "be generated by an electron beam irradiation" may be used for both mirror electrons and secondary emission electrons.

[First Point of View]

The first point of view relates to observation of foreign materials, and in particular to a technique for inspecting foreign materials.

A purpose of the invention is to provide an electron beam inspection method and an electron beam inspection device capable of quickly and reliably detecting a foreign material on a specimen surface.

An electron beam inspection method according to the invention is for irradiating a specimen surface with an imaging electron beam having a predetermined irradiation area, detecting reflected electrons by means of a detector, and thereby acquiring an image of the specimen surface and of a foreign material on the specimen surface, and the electron beam inspection method has: a foreign material charging step of charging the foreign material by irradiation with a charging electron beam and forming around the foreign material a potential distribution different from that of the specimen surface; and a magnified image acquisition step of detecting the electrons which are reflected from the foreign material by the imaging electron beam irradiation and reach the detector through a path bent by the effect of the potential distribution, and acquiring a magnified image of the foreign material in which the magnification for the foreign material is increased more than the magnification for the specimen surface.

Since this allows an electron beam inspection to be carried out by using the electron beam having a predetermined irradiation area, a wide area can be inspected quickly. Since the magnified image in which the foreign material is magnified more than the surrounding specimen surface is acquired, the foreign material can be detected reliably.

In the invention, the foreign material charging step may comprise negatively charging up the foreign material by the charging electron beam irradiation, and the magnified image acquisition step may comprise setting the landing energy of the imaging electron beam to 10 eV or less, detecting mirror electrons reflected immediately in front of the foreign material, and acquiring the magnified image of the foreign material.

This allows the magnified image of the foreign material to be reliably detected by using mirror electrons which are easily generated in a low landing energy range.

In the invention, the foreign material charging step may comprise increasing the absolute value of the potential of the foreign material by the charging electron beam irradiation.

Consequently, the potential difference between the background specimen surface and the foreign material can be increased, the contrast of the magnified image of the foreign material can be increased, and the electron beam inspection can be facilitated.

In the invention, the landing energy of the charging electron beam may be larger than that of the imaging electron beam.

Consequently, the absolute value of the negative potential of the foreign material can be increased by the charging electron beam irradiation with a high landing energy. As a result, mirror electrons can easily be generated when the imaging electron beam irradiation is performed.

In the invention, the landing energy of the charging electron beam may be smaller than that of the imaging electron beam.

This configuration is suitable when an appropriate landing energy of the imaging electron beam is known. The above configuration can prevent a potential shift of the surface of the foreign material from increasing when the magnified image of the foreign material is acquired by using the imaging electron beam. Consequently, the magnified image can be detected reliably.

In the invention, the charging electron beam and the imaging electron beam may have the same landing energy and dose amounts different from each other.

This allows the charging of the foreign material to be controlled by the dose amount without changing the landing energy of the electron beam. Consequently, the magnified image of the foreign material can be detected by easy control.

In the invention, the imaging electron beam may be made to enter the specimen surface not perpendicularly thereto.

Consequently, the angle of incidence of the imaging electron beam can be adjusted appropriately, and the magnified image of the foreign material can be acquired at a higher resolution.

In the invention, the magnified image acquisition step may comprise setting the landing energy of the imaging electron beam to 10 eV or more, detecting secondary emission electrons reflected by being emitted from the foreign material, and acquiring the magnified image of the foreign material.

This allows secondary emission electrons to be generated from the foreign material to acquire the magnified image of the foreign material based on the secondary emission electrons, so that the electron beam inspection can be carried out.

In the invention, the landing energy of the imaging electron beam may be equal to or more than a maximum landing energy which causes all electrons reflected from the specimen surface to be mirror electrons and be equal to or less than a value of a minimum landing energy, which causes all electrons reflected from the specimen surface to be secondary emission electrons, added with 5 eV.

In other words, in the invention, the landing energy LE of the imaging electron beam may be set as LEA≤LE≤(LEB+5 eV), where LEA is the maximum landing energy which causes all electrons reflected from the specimen surface to be mirror electrons, and LEB is the minimum landing energy which causes all electrons reflected from the specimen surface to be secondary emission electrons.

This allows the electron beam inspection to be carried out by using a landing energy range in which the difference in gray level is large between the foreign material and the surrounding specimen surface. Consequently, the electron beam inspection can be carried out easily and reliably with the acquisition of a high-contrast image. Here the gray level means the brightness of an image, and the difference in gray level means the difference in brightness.

In the invention, the landing energy of the imaging electron beam may be set to a landing energy which: is in a landing energy range in which electrons reflected from the specimen surface are a mixture of mirror electrons and secondary emission electrons, or only secondary emission electrons; is in a landing energy range in which electrons reflected from the foreign material are a mixture of mirror electrons and secondary emission electrons; and maximizes the difference in gray level between the image of the specimen surface and the magnified image of the foreign material.

This maximizes the difference in gray level between the surrounding background and the foreign material. Consequently, the foreign material can be detected in a state where the foreign material is easily detected.

An electron beam inspection device according to the invention comprises: a stage for placing a specimen thereon; a primary optical system for generating an electron beam having a predetermined irradiation area and for emitting the electron beam toward the specimen; and a secondary optical system, having a detector for detecting electrons reflected from the specimen, for acquiring an image of a predetermined visual field area on the specimen, where the primary optical system charges the foreign material by irradiation with a charging electron beam to cause the potential distribution of the foreign material to be different from that of a specimen surface, and then irradiates the specimen with an imaging electron beam, and where the secondary optical system detects electrons which are reflected from the foreign material and reach the detector through a path bent by the effect of the potential distribution, and acquires a magnified image of the foreign material in which the magnification for the foreign material is increased more than the magnification for the specimen surface.

This allows the whole specimen surface to be inspected quickly by the electron beam having an irradiation area of a predetermined size. The foreign material can be detected reliably by magnifying the image of the foreign material larger than that of the surroundings.

In the invention, the primary optical system may charge up the foreign material by irradiation with the charging electron beam and then irradiate the specimen with the imaging electron beam with a landing energy of 10 eV or less, and the secondary optical system may detect mirror electrons reflected immediately in front of the foreign material by means of the detector and acquire the magnified image of the foreign material.

With the use of a low landing energy, this allows the foreign material to be in a state where it easily generates mirror electrons. The use of mirror electrons makes it easy to acquire the magnified image of the foreign material. Consequently, the foreign material can be detected more reliably.

In the invention, at least one of a Faraday cup, a reference specimen chip, and an EB-CCD may be placed on the stage.

This allows the profile of the electron beam to be detected directly, so that the electron beam can be adjusted appropriately.

In the invention, a reference specimen chip may be placed on the stage, and the reference specimen chip may have a circular, crisscross, or rectangular shape pattern.

This allows the beam profile of the electron beam to be adjusted so that mirror electrons are suitably generated. Mirror electrons are suited to detect the magnified image of the foreign material, and the above configuration can generate mirror electrons appropriately.

In the invention, the primary optical system may set the landing energy of the imaging electron beam to 10 eV or more, and the secondary optical system may detect secondary emission electrons which are emitted from the foreign material and reach the detector and acquire the magnified image of the foreign material.

This allows the foreign material to be detected also by causing secondary emission electrons to be generated from the foreign material.

In the invention, the secondary optical system may have an EB-CCD interchangeable with an NA aperture.

This allows the profile of a secondary electron beam going through the secondary optical system to be directly measured. Consequently, an appropriate adjustment can be made.

In the invention, the secondary optical system may have an NA aperture, which may be placed so that the center of the intensity distribution of the mirror electrons coincides with the center position of the aperture.

This allows the NA aperture to be appropriately positioned to detect the mirror electron signal satisfactorily and to cause the detection amount of secondary emission electrons to be relatively small. Consequently, a high-contrast image can be acquired.

In the invention, the secondary optical system may have an NA aperture, and the shape of the NA aperture may be an elliptical shape having the major axis in a direction corresponding to the longitudinal direction of the intensity distribution of the mirror electrons.

Consequently, the aperture of an elliptical shape adapted to the intensity distribution of the mirror electrons can be used. As a result, more mirror electron signals can be detected and a high-contrast image can be acquired.

In the invention, the secondary optical system may have an NA aperture having a plurality of apertures, and the NA aperture may be placed so that the plurality of apertures are located around the center of the intensity distribution of the mirror electrons.

Here the NA aperture is an aperture member, and the plurality of apertures are a plurality of openings provided on the aperture member. In the above-described configuration, the aperture can be placed according to the scattering direction of the mirror electrons, and the mirror electrons can be appropriately detected depending on the intended use and property.

In the invention, the secondary optical system may comprise an NA aperture having a plurality of apertures, and the NA aperture may be placed so that any one of the plurality of apertures coincides with the center of the intensity distribution of the mirror electrons.

Here the NA aperture is an aperture member, and the plurality of apertures are a plurality of openings provided on the aperture member. In the above-described configuration, an effective inspection can be carried out for a foreign material distinctive in the scattering direction. An inspection useful in classifying foreign materials can also be carried out.

In the invention, the secondary optical system may further comprise a moving mechanism for moving the NA aperture.

This allows the NA aperture to be positioned easily by using the moving mechanism.

In the invention, the primary and secondary optical systems may be optical systems whose sensitivity is calibrated by using microspheres of a known size scattered on the specimen.

This allows the sensitivity calibration to be carried out precisely. Consequently, image acquisition can be carried out under good conditions.

The electron beam inspection device of the invention may have: a chamber for containing the stage; and an SEM-type inspection device provided in the chamber, where based on positional information on the magnified image of the foreign material acquired by the detector the stage may be moved and the foreign material may be inspected in detail by the SEM-type inspection device.

Consequently, review inspection for the foreign material can be carried out quickly and precisely, and the foreign material inspection can be carried out quickly and precisely.

Advantages of the Invention

As described above, the invention allows the foreign material inspection to be carried out quickly and allows the foreign material to be detected reliably and easily.

Embodiment of the Invention

Now, the invention will be described in detail. The following detailed description and appended drawings are not intended to limit the invention. Rather, the scope of the invention is defined by the appended claims.

FIG. 1A shows an image to be obtained by an electron beam inspection method according to an embodiment. An outline of the principles of the invention will be described with reference to FIG. 1.

FIG. 1A shows an image 80 of a foreign material 10 obtained by a projection method according to the embodiment. The size of the foreign material is 40 nm. In the image in FIG. 1A, the size of the foreign material 10 mostly covers an area of a pixel size of 2 μm×2 μm. Here the pixel size is an actual size on a specimen corresponding to one pixel of a detector. The pixel size means a minimum unit of the size of a specimen that can be observed. Hence in FIG. 1A the displayed image 80 is magnified to almost as large as 2 μm×2 μm despite the actual size of the foreign material being 40 nm. This means that the foreign material 10 of about 40 nm can be found even if the pixel size is about 1 μm or 1.5 μm large for example.

In FIG. 1A, the landing energy of an imaging electron beam is 1 eV. The pixel size is 100 nm. Conventionally, the pixel size is required to be less than 40 nm when the actual size of a foreign material is 40 nm. In contrast to this, the embodiment can acquire the magnified image of the foreign material 10 that is magnified more than the optical magnification.

FIG. 1B shows an image 280 of the foreign material 10 to be obtained by a conventional foreign material inspection device of an SEM (scanning electron microscope) type. The size of the foreign material is 40 nm. In FIG. 1B, the pixel size is 2 μm×2 μm as in FIG. 1A. It can be seen, however, that the size of the image of the foreign material 10 is considerably small in FIG. 1B compared to that in FIG. 1A.

As seen above, the electron beam inspection method according to the embodiment can acquire an image in which the size of the foreign material 10 is significantly increased, compared to the conventional SEM method. That is, a detection signal from the foreign material 10 is magnified more than the optical magnification. High sensitivity can be achieved even for a foreign material of an ultra-micro size. Furthermore, a foreign material can be detected by using a pixel size that is larger than the actual foreign material.

FIG. 1C is a side view showing a state where the foreign material 10 is present on a specimen 20. In FIG. 1C, the surface of the foreign material 10 is spherical. For this reason, electrons reflected from the surface do not go through a vertical path, but change the path and spread out. This is for the following reason: since the foreign material 10 has a spherical surface, the potential distribution of the foreign material 10 is different from that of a specimen surface 21; so, if the specimen surface 21 is seen macroscopically, the potential distribution of its part where the foreign material 10 is present is distorted; and therefore the electron path changes. This will be described in detail later.

FIGS. 2A and 2B show conventional electron beam inspection methods for comparison. FIG. 2A shows a conventional optical-type electron beam inspection method. In the optical method, the foreign material 10 is detected by a so-called dark-field scattering method. That is, the specimen surface 21 of the specimen 20 is irradiated with light or a laser, and the scattered light is detected by a detector 170. In the conventional optical method, however, the detection sensitivity decreases for ultra-micro foreign materials of a size between 50 and 100 nm or less, organic deposits, or the like. It would therefore be difficult to apply the conventional optical method. A major cause for the sensitivity decrease is considered to be a decrease in S/N ratio due to the foreign material 10 being smaller than the wavelength of light.

FIG. 2B shows a conventional SEM-type electron beam inspection method. In the SEM method, an ultra-micro pattern defect 22 or the like can be detected by condensing the electron beam to reduce the pixel size. For example, a pixel size smaller than the size of an object foreign material can be used, and therefore the foreign material 10 can be inspected for at a high resolution. However, since the pixel size is small, the inspection requires an immense amount of time and is difficult to carry out within a realistic time frame, so the SEM method is not practical.

As seen above, there has been conventionally no foreign material inspection method and foreign material inspection device that realizes high sensitivity, high speed, and high throughput in the inspection for foreign materials of an ultra-micro size between 50 and 100 nm or less.

FIGS. 3A and 3B show an example of a magnified image 80 of the foreign material 10 to be acquired by the foreign material inspection method and a cross-sectional gray level of the magnified image. Here the gray level means the brightness of an image, and the difference in gray level is the difference in brightness. The higher the gray level is, the higher the brightness is. FIG. 3A is an example of the magnified image 80; more particularly, the white area in the center is a magnified image 81 of the foreign material 10, and the black area shows a surface image 82 of the specimen 20. Here the size (diameter) of the foreign material is 40 nm and the optical magnification is 300 times. In this case, the size of an image of the foreign material 10 would be 40 nm×the optical magnification 300=12 μm according to the conventional foreign material inspection method. In the embodiment in FIG. 3A, the size of the magnified image 81 of the foreign material 10 is 190 μm. The pixel size of the detector is 15 μm.

FIG. 3B shows the cross-sectional gray level versus pixel position. The horizontal axis represents the pixel position coordinate, and the vertical axis represents the cross-sectional gray level. In FIG. 3B, the triangular mark (Δ) indicates the mountain shape (protrusion shape) part. This part is an area in which the gray level is high, and corresponds to the white magnified image part 81 in FIG. 3A. That means that the horizontal width (the triangular mark Δ) of the magnified image 81 on the image 80 is 190 μm.

Here the pixel size of the detector 170 is 15 μm. The size of the foreign material would be displayed as 12 μm on the image 80 by the conventional method, and therefore an image of the foreign material 10 would be a signal corresponding to one pixel or less. One pixel would not be able to accurately represent the foreign material 10.

On the other hand, the magnified image 81 of the foreign material 10 can be detected as an image whose number of pixels is 12.7 by the foreign material inspection method according to the embodiment. The imaging can therefore be carried out with a larger pixel size at a lower magnification. If the imaging can be carried out with a large pixel size, the whole specimen surface 21 can be inspected quickly. Accordingly, the foreign material inspection can be carried out at high speed and high throughput. For example, the pixel size may be 100 to 1000 nm if the size of the foreign material is 10 to 30 nm. A pixel size larger than the size of the foreign material can thus be used, and a quick foreign material inspection can be carried out.

An electron beam inspection device applied to the electron beam inspection method according to the embodiment has an electron beam column (a primary optical system) of a projection type. In the SEM method, the electron beam is condensed. The spot size of the electron beam is the pixel size corresponding to one pixel. In the projection method, on the other hand, the electron beam has a predetermined area including a plurality of pixels. The specimen 20 is irradiated with such an electron beam. A detector simultaneously detects electrons corresponding to the plurality of pixels. An image corresponding to the plurality of pixels is formed, and is acquired as an image signal. As seen above, the projection optical system has: the electron irradiation system which irradiates the specimen surface 21 with electrons; the optical system for forming an image of electrons reflected from the specimen surface 21 in a magnified manner; the detector 70; and the image processing device system for processing the signal from the detector 70.

FIG. 4A shows a relation between the landing energy of the electron beam with which the specimen is irradiated and electrons emitted from the specimen. More specifically, FIG. 4A shows the yield of secondary emission electrons observed when the specimen 20 is irradiated with the electron beam with the landing energy being varied.

In FIG. 4A, the horizontal axis represents the landing energy LE (keV), and the vertical axis represents the ratio of the yield of secondary emission electrons to the amount of incident electrons.

In FIG. 4A, when the yield of secondary emission electrons is larger than 1, the amount of emitted electrons is larger than the amount of incident electrons. The specimen therefore becomes positively charged. In FIG. 4A, the positive charge region is a region in which the landing energy LE is 10 eV or more but not exceeding 1.5 keV.

In contrast, when the amount of secondary electron emissions is smaller than 1, the amount of electrons incident on the specimen 20 is larger than the amount of electrons emitted from the specimen 20. The specimen 20 therefore becomes negatively charged. In FIG. 4A, the negative charge region is a region in which the landing energy LE is 10 eV or less and a region in which the landing energy LE is 1.5 keV or more.

FIG. 4B shows mirror electrons. In FIG. 4B, the foreign material 10 is present on the specimen surface 21, and the foreign material 10 is negatively charged. If the specimen 20 is irradiated with an electron beam under certain conditions, electrons in the electron beam do not collide with the foreign material 10, but turn and are reflected immediately in front of it. Electrons that do not collide with an object to be irradiated but bounce back immediately in front of it like this are called mirror electrons. Whether electrons with which an object is irradiated become mirror electrons or not depends on the potential distribution (the state of charge) of the foreign material 10 and on the landing energy of the electron beam with which the foreign material 10 is irradiated. For example, if the foreign material 10 is negatively charged up and the landing energy is not very high, the electron beam is bounced back by the negative electric field of the foreign material 10, is reflected without colliding with the foreign material 10, and becomes mirror electrons.

FIG. 4C shows secondary emission electrons. In FIG. 4C, the specimen 20 is irradiated with an electron beam, which collides with the specimen surface 21, and consequently secondary emission electrons are emitted from the specimen. This is similar on the foreign material 10, where the electron beam collides with the foreign material 10 and secondary emission electrons are emitted from the foreign material 10.

In the electron beam inspection method according to the embodiment, the foreign material 10 present of the specimen surface 21 is detected by using mirror electrons and secondary emission electrons.

FIGS. 5A and 5B show examples of a relation between the landing energy LE of the electron beam with which the specimen 20 and the foreign material 10 are irradiated and "signal intensity/average gray level" of electrons reflected from the specimen 20. Here "to be reflected" means that electrons oriented approximately opposite to the electron beam return from the specimen 20 or foreign material 10 by the electron beam irradiation. Accordingly, "to be reflected" includes both of electrons that are reflected without colliding with the specimen 20 or foreign material 10 and secondary emission electrons that are reflected by colliding with the specimen 20 or foreign material 10 and then being emitted therefrom.

FIG. 5A is an example of a relation between the landing energy LE of the electron beam for the irradiation and "signal intensity/average gray level" of reflected electrons. In FIG. 5A, the horizontal axis represents the landing energy LE of the electron beam, and the vertical axis represents the "signal intensity/average gray level." The average gray level represents the brightness of an image and corresponds to the signal intensity. FIG. 5 is the characteristic around the landing energy LE being near 0 eV, showing the characteristic in an energy range which is far lower than that in FIG. 4. In FIG. 5A, the region in which the landing energy LE is 10 eV or less is a region in which a mirror-electron-based signal (white) is acquired. On the other hand, the region in which the landing energy LE is 10 eV or more is a region in which a secondary-emission-electron-based signal (black) is acquired. It can be seen that, in the mirror electron region, the lower the landing energy LE is, the more the signal intensity increases.

FIG. 5B shows an example different from that in FIG. 5A, and FIG. 5B also shows a relation between the landing energy of the electron beam for the irradiation and "signal intensity/average gray level" of reflected electrons. In FIG. 5B, the region in which the landing energy LE is 5 eV or less is a region in which a mirror-electron-based signal (white) is acquired, and the region in which the landing energy LE is 5 eV or more is a region in which a secondary-emission-electron-based signal (black) is acquired.

The characteristic line in FIG. 5B is different from that in FIG. 5A in that the landing energy LE at the boundary between the mirror-electron-based signal and the secondary-emission-electron-based signal is 5 eV. The boundary of the landing energy LE between mirror electrons and secondary emission electrons varies depending on the properties of the specimen 20, the profile of the electron beam, and the like, and can take on various values. The electron beam inspection method and electron beam inspection device according to the embodiment will hereinafter be described based on the example in FIG. 5A (the example in which the landing energy LE at the boundary is 10 eV). The invention is not limited to this, however. As shown in FIG. 5B, the invention may be applied when the landing energy at the boundary is 10 eV or less and, for example, the landing energy at the boundary may be 5 eV.

In FIGS. 5A and 5B, the region in which the landing energy is the boundary or less corresponds to the transition region of the invention, where mirror electrons and secondary emission electrons are mixed. The region in which the landing energy is the boundary or more corresponds to the secondary emission electron region of the invention. As described above, the boundary landing energy is 10 eV in the example in FIG. 5A, and 5 eV in the example in FIG. 5B.

FIG. 6 shows a state where the foreign material 10 is present on the specimen surface 21 of the specimen 20. As illustrated, electrons are generated by irradiation with an electron beam. When the landing energy LE≤10 eV, the foreign material 10 is negatively charged up. If an electron beam enters the foreign material 10, an electron of the electron beam becomes a mirror electron me. The electron is therefore reflected from the foreign material 10 without colliding therewith, and reaches the detector 70. Meanwhile, in the normal part where the foreign material 10 is not present (the specimen surface 21), a secondary emission electron se is generated by the irradiation with the primary electron beam.

Here the "secondary emission electron se" means a secondary electron, a reflected electron, or a backscattered electron. A mixture of them also corresponds to the "secondary emission electron se."

The emission coefficient η of such secondary emission electrons is generally low. In particular, when the landing energy LE is approximately 50 eV or less, the emission coefficient η<1.0. The closer the landing energy LE comes to zero, the lower the emission coefficient becomes; and the emission coefficient is almost zero when the landing energy LE=0.

There is also a distribution in the emission angle of electrons. For example, secondary electrons are distributed according to the cosine law. The transmissivity of electrons that reach the detector 70 is therefore several percent or less in the projection optical system.

On the other hand, the mirror electron me is generated by an incident electron reflecting just before colliding with the foreign material 10. The mirror electron me is reflected from the foreign material 10 and enters a lens system of a secondary system at an angle approximately symmetrical to the angle of the incident primary electron beam. The scattering and emission distribution are therefore small, and the mirror electron me reaches the detector 70 at a transmissivity of approximately 100 percent.

FIG. 7A shows the image 80 of the foreign material 10 on the specimen surface 21 to be acquired when the landing energy LE is 10 eV or less, and FIG. 7B shows the gray-level value of the image 80.

Referring to FIG. 7A, in the image of the specimen surface 21 and foreign material 10, the magnified image 81 of the foreign material 10 is shown as a white area, and the surface image 82 of the specimen surface 21 is shown as a black area. In this case, the brightness (the gray level) is very high in a part where the mirror electron me is obtained.

FIG. 7B is an example of a relation between the y-direction cross-sectional position on the image 80 in the detector 70 and the gray-level value. The range in the y direction includes the magnified image 81 of the foreign material 10. As shown in FIG. 7B, for example, the gray level of the mirror electron part is about three times as high as the part where the mirror electron me is not obtained. As a result, high brightness and a high S/N ratio can be achieved.

In the example in FIG. 7B, the part where the mirror electron me is obtained exhibits about three times as high gray-level value DN as the part where the mirror electron me is not obtained. The relation of the gray-level value, however, varies depending on conditions or the like. The gray-level value of the mirror electron part may take on an about two to ten times higher value.

FIG. 8 shows a state where the mirror electron me is generated from the foreign material 10 by the irradiation of the foreign material 10 with the electron beam. The shape of the foreign material 10 causes a shift in the reflection point of the mirror electron me and the nonuniformity of the charge-up voltage. For this reason, the path and energy of the mirror electron me are slightly shifted. Consequently, when the mirror electron me goes through a lens, beam filter, and the like of the secondary system, the size of the signal area becomes large.

In FIG. 8, the reflection direction of the mirror electron me radially spreads out from the effect of the surface potential of the foreign material 10. Consequently, in a signal from the foreign material 10 that has reached the detector 70, the signal size is magnified more than the optical magnification of the electron optical system. The magnification is, for example, 5 to 50 times.

For example, suppose that there is a secondary system with 100 times optical magnification. The signal size in the detector 70 for secondary electrons from the foreign material 10 is 100 times×0.1 µm=10 µm, according to a theoretical calculation.

On the other hand, the signal size of the mirror electron me from the foreign material 10 is magnified, for example, 30 times. Accordingly, the size of a signal entering the detector 70 is 300 µm. This phenomenon is equivalent to a magnification optical system that simply magnifies 100 nm (0.1 µm) to 300 µm. That is, a 3000 times magnification optical system is achieved. This means that a pixel size larger than the foreign material 10 can be used. If the foreign material 10 is 100 nm, the pixel size may be larger than 100 nm. A pixel size of 300 to 1000 nm can be used.

By using a pixel size larger than an object foreign material, a large area on the specimen surface 21 of the specimen 20 can be inspected at a time. This is therefore very effective in terms of quick inspection. For example, the inspection rate for a pixel size of 300 nm can be nine times faster than for a pixel size of 100 nm. The inspection rate can be 25 times faster for a pixel size of 500 nm. That is, if one inspection would conventionally take 25 hours, the embodiment requires one hour for the inspection. In contrast to this, imaging by the SEM method has to be performed with a pixel size smaller than the size of the foreign material, since the SEM method comprises forming a precise shape image, comparing it with an image of a normal part, and thereby detecting the foreign material.

As described above, the projection optical system not only can enhance the difference in brightness between the mirror electron me and the secondary emission electron se, but also can achieve speedups.

When the landing energy LE≤10 eV, precharge can be used suitably. Precharge is carried out by irradiating with a charging electron beam before imaging.

Precharge may be carried out in order to increase the charge-up voltage of the foreign material 10. Precharge may also be carried out in order to reduce the change in potential of the foreign material 10 during imaging. In the foreign material inspection method, the amount of change in the charge-up voltage is controlled by a landing energy LE1 of a charging beam. For example, there are foreign materials 10 of various sizes and various capacities. In this case, foreign materials 10 that are charged to a certain charge-up voltage or less are detected by using mirror electrons. The path of the mirror electrons is adapted by the difference between the surrounding specimen voltage and the charge-up voltage, and consequently a state can be formed in which the transmissivity of the mirror electrons is high. This will be described in detail later.

Methods for precharge will next be described. There are three methods for precharge.

[Precharge-1]

FIGS. 9A and 9B illustrate a first precharge mode (Precharge-1). Here the landing energy of the charging electron beam is LE1, and the landing energy of the imaging electron beam is LE2. In Precharge-1, the landing energy is set as LE2<LE1, which facilitates generation of mirror electrons.

In FIG. 9A, the foreign material 10 is present on the specimen surface 21, which is irradiated with the charging electron beam with the landing energy LE1, and precharge is thus performed. The landing energy LE1 for the precharge is larger than the landing energy LE2 of the imaging electron beam. This increases the charge-up voltage of the foreign material 10, causing electrons to become mirror electrons easily during imaging. That is, by increasing the absolute value of the negative potential of the foreign material 10, a reflection point in the potential distribution created by the charge up is formed in front of the foreign material 10. Consequently, the incident imaging electron beam is reflected, becoming the mirror electron me, before colliding with the foreign material 10.

FIG. 9B shows a state where the foreign material 10 on the specimen surface 21 is irradiated with the imaging electron beam. In FIG. 9B, the foreign material 10 is negatively charged up and has a negative-voltage potential distribution. The imaging electron beam has the landing energy LE2 as described above. Under the effect of the surface potential of the foreign material 10, an incident electron is reflected, becoming the mirror electron me, in front of the foreign material 10 without colliding therewith. Meanwhile, the secondary emission electron se is reflected from the specimen surface 21 by being emitted therefrom.

As seen above, in the configuration shown in FIGS. 9A and 9B, the landing energy LE1 of the charging electron beam is set larger than the landing energy LE2 of the imaging electron beam. This allows the mirror electron me to be suitably generated from the imaging electron beam with which the foreign material 10 is irradiated, so that the magnified image 81 of the foreign material 10 can be acquired.

[Precharge-2]

FIG. 10 illustrates a second precharge mode (Precharge-2). In Precharge-2, the landing energy LE2 of the imaging electron beam is set larger than the landing energy LE1 of the charging electron beam. In the foreign material inspection method, imaging can be carried out with an appropriate potential variation being made during the imaging.

In FIG. 10, the horizontal axis represents the landing energy of electron beams, and the vertical axis represents the surface potential of the foreign material 10. The landing energy LE1 of the charging electron beam is smaller than the landing energy LE2 of the imaging electron beam. The surface potential of the foreign material 10 varies between LE1 and LE2. The potential difference ΔV is small as illustrated.

Precharge-2 in FIG. 10 is suitable when the landing energy LE2 of the imaging electron beam appropriate to imaging is known in advance. Simply imaging with the imaging electron beam with the appropriate landing energy LE2 would cause variations in the surface potential of the foreign material 10 during imaging and might be incapable of obtaining the accurate magnified image 81. Precharge-2 avoids such a situation. In the configuration of Precharge-2, the surface potential of the foreign material 10 is controlled by the precharge to reach close to the optimum value. This allows the potential change ΔV in the surface potential of the foreign material 10 to be reduced during imaging.

[Precharge-3]

FIG. 11 illustrates a third precharge mode (Precharge-3). In Precharge-3, the landing energy LE1 of the charging electron beam is set equal to the landing energy LE2 of the imaging electron beam. The dose amount is then made to differ between the charging electron beam and the imaging electron beam. In FIG. 11, the horizontal axis represents the dose amount, and the vertical axis represents the surface potential of the foreign material 10.

Precharge-3 is effective for stabilizing the charge-up voltage of the foreign material 10 to achieve stable imaging and sensitivity. In FIG. 11, a change in the dose amount causes variation in the surface potential of the foreign material 10. The precharge is carried out so as to give a dose D1 close to the required dose amount. A dose D2 is then given to perform imaging. Such a configuration is effective, and can reduce the potential variation ΔV of the surface of the foreign material during the imaging with the dose D2. Stable image quality (shape, focus, and the like) can therefore be achieved.

In the three types of precharges in FIGS. 9 to 11, the beam source of the charging electron beam for precharge may be the same as that of the imaging electron beam, and the conditions of the beam source may be controlled so as to carry out the above-described precharges. A precharge unit for precharge may also be provided separately. This can improve the throughput.

The precharge unit may use a cathode comprising, for example, $LaB_6$, a W filament, a hollow cathode, a carbon nanotube, or the like. The precharge unit may also use a Wehnelt for extracting the electron beam, an extraction electrode, a lens for controlling the irradiation area, and the like. The beam size of the precharge unit may be equal to or a little larger than the beam size for regular irradiation by the column system. The landing energy of the electron beam is determined by the voltage difference between the cathode and the specimen. For example, suppose that a negative voltage −3000 V is applied to the specimen 20. Suppose also that the landing energy of the electron beam is set to 10 eV. In this case, a cathode voltage −3010 V is applied to the cathode to generate the electron beam.

"Another Inspection Method (for LE>10 eV)"

FIG. 12 shows an image 80a acquired by the detector 70 when the landing energy LE of the electron beam is larger than 10 eV. In FIG. 12, a magnified image 81a of the foreign material 10 is represented by a black signal, and a surface image 82a of the specimen 20 is represented by a white signal.

FIGS. 13A to 13C show the secondary emission electron se being emitted from the foreign material 10 by irradiation with the imaging electron beam.

FIG. 13A shows a behavior of the secondary emission electron se in a state where the foreign material 10 is charged up and the potential difference between the foreign material 10 and the surrounding specimen surface 21 is large. In FIG. 13A, the foreign material 10 is negatively charged up, and the path of the secondary emission electron se from the foreign material 10 is bent. For this reason, the transmissivity (the ratio of electrons that reach the detector 70) extremely decreases. As a result, the brightness of the foreign material part in the observed image decreases as compared to the surroundings. This means that the foreign material 10 is detected as a black signal.

FIG. 13B shows a behavior of the secondary emission electron se in a state where the potential difference between the foreign material 10 and the surrounding specimen surface 21 is small. In FIG. 13B, since the potential difference between the foreign material 10 and the surroundings is small, electrons are generated from the foreign material 10 and from the specimen surface 21 in almost the same manner. For this reason, it is difficult to distinguish the foreign material 10 from the surroundings. That is, it is difficult to detect the foreign material 10 from an acquired image. It is desired to avoid such a situation. So, even when the secondary emission electron se is to be detected from the foreign material 10, it is suitable to charge up the foreign material 10 by irradiation with the charging electron beam. Applying the imaging electron beam after the charge up facilitates detection of the foreign material 10 as described above.

FIG. 13C shows a behavior of the secondary emission electron se in the positive charge region. In the positive charge region, the secondary emission electron se follows a path through which it is drawn by the foreign material 10 for a moment and then rises. As illustrated, the path of the secondary emission electron se is bent by the effect of the potential distribution of the foreign material 10, and the number of electrons that reach the detector 70 decreases. This phenomenon is the same as FIG. 13A. Consequently, the same phenomenon is observed and the magnified image 81a of the foreign material 10 is obtained as an image of a black signal also in the positive charge.

In a foreign material inspection method and foreign material inspection device according to the embodiment, an electron beam projection method is used in order to further enhance the throughput. The use of a projection system allows the secondary emission electron se or mirror electron me from the specimen surface 21 to be used to detect foreign materials such as wafers and masks at high speed and high throughput, so that, for example, foreign material inspection after specimen cleaning is suitably carried out. As described above, since a detection signal from the foreign material 10 is magnified more than the optical magnification, a signal of the foreign material 10 of an ultra-micro size can be obtained with a large pixel size, so that high speed and high throughput is achieved.

For example, the size of the foreign material signal can be magnified 5 to 50 times the actual size. A pixel size which is three times or more the size of a foreign material to be detected can be applied. This is particularly effective for the foreign material 10 of a size of 50 to 100 nm or less. The optical method has difficulty detecting the foreign material 10 of such size. The SEM method is required to use a pixel size smaller than the foreign material size. The throughput therefore significantly decreases if a small foreign material is to be detected. In the electron beam inspection method according to the embodiment, the foreign material 10 on a wafer in process can be quickly detected by using the projection method. The acquisition of the magnified images 81 and 81a allows the foreign material 80 to be detected reliably.

"Electron Inspection Device"

FIG. 14 shows a configuration of an electron beam inspection device to which the invention is applied. The above description has been mainly given of the principles of the foreign material inspection methods. A foreign material inspection device applied to carry out the above-described foreign material inspection methods will be described here. Accordingly, all the foreign material inspection methods described above can be applied to the foreign material inspection device described below.

The electron beam inspection device is to inspect the specimen 20. The specimen 20 is a silicon wafer, a glass mask, a semiconductor substrate, a semiconductor pattern substrate, a substrate having a metal film, or the like. The electron beam inspection device according to the embodiment detects the presence of the foreign material 10 on a surface of the specimen 20 comprising such a substrate. The foreign material 10 is an insulating material, a conductive material, a semiconductor material, a composite thereof, or the like. The type of the foreign material is particle, non-cleaned residue (organic matter), reaction product on the surface, or the like. The electron beam inspection device may be an SEM-type device or a projection-type device. In this example, the invention is applied to a projection-type inspection device.

The projection-type electron beam inspection device comprises: a primary optical system 40 for generating an electron beam; the specimen 20; a stage 30 for placing the specimen thereon; a secondary optical system 60 for forming a magnified image of secondary emission electrons or mirror electrons from the specimen; the detector 70 for detecting those electrons; an image processing device 90 (an image processing system) for processing a signal from the detector 70; an optical microscope 110 for positioning; and an SEM 120 for reviewing. In the invention, the detector 70 may be included in the secondary optical system 60. The image processing device 90 may be included in the image processor of the invention.

The primary optical system 40 is configured to generate an electron beam and emit it toward the specimen 20. The primary optical system 40 has: an electron gun 41; lenses 42 and 45; apertures 43 and 44; an ExB filter 46; lenses 47, 49, and 50; and an aperture 48. The electron gun 41 generates the electron beam. The lenses 42 and 45 and the apertures 43 and 44 shape the electron beam and control the direction thereof. The electron beam is then affected by a Lorentz force caused by the magnetic and electric fields in the ExB filter 46. The electron beam obliquely enters the ExB filter 46, and is deflected vertically downward toward the specimen 20. The lenses 47, 49, and 50 control the direction of the electron beam and appropriately reduce the speed thereof to adjust the landing energy LE.

The primary optical system 40 irradiates the specimen 20 with the electron beam. As described before, the primary optical system 40 carries out both the charging electron beam irradiation for precharge and the imaging electron beam irradiation. According to an experimental result, the difference between the landing energy LE1 for the precharge and the landing energy LE2 of the imaging electron beam is preferably 5 to 20 eV.

Suppose in this regard that the irradiation for the precharge is carried out with the landing energy LE1 in the negative charge region when there is a potential difference between the foreign material 10 and the surroundings. The charge-up voltage varies depending on the value of LE1, since the relative ratio between LE1 and LE2 varies (LE2 is the landing energy of the imaging electron beam as described above). A large LE1 increases the charge-up voltage, causing a reflection point to be formed at a position above the foreign material 10 (a position closer to the detector 70). The path and transmissivity of mirror electrons vary depending on the position of this reflection point. An optimum charge-up voltage condition is therefore determined according to the reflection point. A too low LE1 decreases the efficiency of the mirror electron formation. In the invention, it has been found that this difference between LE1 and LE2 is desirably 5 to 20 eV. The value of LE1 is preferably 0 to 40 eV, and more preferably 5 to 20 eV.

The ExB filter 46 is especially important in the primary optical system 40 which is a projection optical system. The angle of the primary electron beam can be determined by adjusting electric and magnetic field conditions of the ExB filter 46. For example, conditions of the ExB filter 46 can be set so that the irradiation electron beam of the primary system and the electron beam of the secondary system make approximately a right angle with the specimen 20. It is effective for further increasing the sensitivity, for example, to tilt the incident angle of the electron beam of the primary system upon the specimen 20. An appropriate tilt angle is 0.05 to 10 degrees, and preferably about 0.1 to 3 degrees.

In FIG. 15, the foreign material 10 present on the specimen surface 21 is irradiated with the primary electron beam. The tilt angle of the electron beam is θ. The angle θ may be, for example, within a range of ±0.05 to ±10 degrees, and preferably within a range of ±0.1 to ±3 degrees.

As seen above, irradiating the foreign material 10 with an electron beam tilted at a certain angle θ can enhance the signal from the foreign material 10. This can create a condition in which the path of mirror electrons does not deviate from the center of the optical axis of the secondary system, and can therefore increase the transmissivity of the mirror electrons. The tilted electron beam is thus very advantageously used when the foreign material 10 is charged up and the mirror electrons are guided.

Returning to FIG. 14, the stage 30 is a means of placing the specimen 20 thereon, and can move in the x-y horizontal directions and in the θ direction. The stage 30 may also be movable in the z direction as required. On the surface of the stage 30 may be provided a specimen fixing mechanism such as an electrostatic chuck.

On the stage 30 is present the specimen 20, on which the foreign material 10 is present. The primary optical system 40 irradiates the specimen surface 21 with an electron beam with a landing energy LE of −5 to −10 eV. The foreign material 10 is charged up, and incident electrons from the primary optical system 40 are bounced back without coming into contact with the foreign material 10. This allows the mirror electrons to be guided through the secondary optical system 60 to the detector 70. At the same time, secondary emission electrons are emitted in spreading directions from the specimen surface 21. The transmissivity of the secondary emission electrons therefore takes on a low value, for example, of about 0.5% to 4.0%. In contrast to this, since the mirror electrons are not scattered in directions, a high transmissivity of approximately 100% can be achieved for the mirror electrons. The mirror electrons are formed by the foreign material 10. Only the signal from the foreign material 10 can therefore cause a high brightness (a state where the number of electrons is large). The difference in brightness from and the brightness ratio to the surrounding secondary emission electrons increase, allowing a high contrast to be obtained.

As described above, an image of the mirror electrons is magnified at a magnification larger than the optical magnification. The magnification reaches 5 to 50 times. Under typical conditions, the magnification is often 20 to 30 times. In such a case, a foreign material can be detected even if the pixel size is three times or more larger than the size of the foreign material. High speed and high throughput can therefore be achieved.

For example, when the size of the foreign material 10 is 20 nm in diameter, the pixel size may be 60 nm, 100 nm, 500 nm, or the like. Like this example, a foreign material can be imaged and inspected for by using a pixel size three times or more larger than the foreign material. This is a characteristic significantly superior to the SEM method and the like in achieving high throughput.

The secondary optical system 60 is a means of guiding electrons reflected from the specimen 20 to the detector 70. The secondary optical system 60 has: lenses 61 and 63; an NA aperture 62; an aligner 64; and the detector 70. Electrons are reflected from the specimen 20 and go through the objective lens 50, lens 49, aperture 48, lens 47, and E×B filter 46 again. The electrons are then guided to the secondary optical system 60. In the secondary optical system 60, the electrons go through the lens 61, NA aperture 62, and lens 63 to be collected. The electrons are aligned by the aligner 64, and are detected by the detector 70.

The NA aperture 62 has a function of defining the transmissivity and aberration of the secondary system. The size and position of the NA aperture 62 are selected so as to widen the difference between the signal (mirror electrons etc.) from the foreign material 10 and the signal from the surroundings (the normal part). Alternatively, the size and position of the NA aperture 62 are selected so as to increase the ratio of the signal from the foreign material 10 to the signal from the surroundings. Consequently, the S/N ratio can be increased.

For example, suppose that the NA aperture 62 can be selected in a range from φ50 to φ3000 µm. Suppose also that mirror electrons and secondary emission electrons are mixed in detected electrons. In order to improve the S/N ratio of a mirror electron image under such conditions, the selection of the aperture size is advantageous. In this case, the size of the NA aperture 62 is preferably selected so that the transmissivity of the secondary emission electrons can be reduced to maintain the transmissivity of the mirror electrons.

For example, when the incident angle of the primary electron beam is 3 degrees, the angle of reflection of the mirror electrons is almost 3 degrees. In this case, it is preferable to select a size of the NA aperture 62 large enough to be able to let the path of the mirror electrons through. An appropriate size is φ250 µm, for example. The transmissivity of the secondary emission electrons decreases since they are limited by the NA aperture (φ250 µm in diameter). Consequently, the S/N ratio of a mirror electron image can be improved. For example, if the aperture diameter is changed from φ2000 to φ250 µm, the background gray level (noise level) can be reduced to ½ or less.

The foreign material 10 may be formed of a material of any type, and may be, for example, a semiconductor, an insulating material, a metal, or the like. FIGS. 16A and 16B show a foreign material 10a made of a metallic material, present on the specimen surface 21. FIG. 16B is an enlarged view of the foreign material 10a made of a metallic material. In FIG. 16B, the foreign material 10a may be a metal, a semiconductor, or the like, or a mixture thereof. As illustrated, a natural oxide film 11 or the like is formed on the surface of the foreign material, and therefore the foreign material 10 is covered by an insulating material. Accordingly, even if the material of the foreign material 10 is a metal, the charge up occurs on the oxide film 11. This charge up is suitably used in the invention.

Returning to FIG. 14, the detector 70 is a means of detecting the electrons guided by the secondary optical system 60. The detector 70 has a plurality of pixels on its surface. Various two-dimensional sensors can be applied to the detector 70. For example, a CCD (charge coupled device) and a TDI (time delay integration)-CCD may be applied to the detector 70. These are sensors for detecting a signal after converting electrons to light, and therefore require a means of photoelectric conversion or the like. Photoelectric conversion or a scintillator is therefore used to convert the electrons to light. Image information of the light is transmitted to the TDI that detects light. The electrons are thus detected.

An example where an EB-TDI is applied to the detector 70 will be described here. An EB-TDI does not require a photoelectric conversion mechanism and a light transmission mechanism. Electrons directly enter the sensor surface of an EB-TDI. Consequently, the resolution does not deteriorate, so that a high MTF (modulation transfer function) and high contrast can be obtained. Conventionally, detection of the foreign material 10 of a small size would be unstable. In contrast to this, the use of an EB-TDI can increase the S/N ratio of a weak signal of the small foreign material 10. A higher sensitivity can therefore be obtained. The S/N ratio improves up to 1.2 to 2 times.

An EB-CCD may also be provided in addition to the EB-TDI. The EB-TDI and the EB-CCD may be interchangeable, and may be arbitrarily interchanged. It is also effective to use such a configuration. For example, a method of use shown in FIG. 17 is applied.

FIG. 17 shows the detector 70 in which an EB-TDI 72 and an EB-CCD 71 can be interchanged. The two sensors can be interchanged depending on the intended use, and both sensors can be used.

In FIG. 17, the detector 70 comprises the EB-CCD 71 and the EB-TDI 72. The EB-CCD 71 and the EB-TDI 72 are electron sensors for receiving an electron beam. The electron beam e is made to enter the detection surface directly. In this configuration, the EB-CCD 71 is used to adjust the optical axis of the electron beam, and is also used to adjust and optimize imaging conditions. On the other hand, when the EB-TDI 72 is to be used, the EB-CCD 71 is moved by a moving mechanism M to a position away from the optical axis. A condition determined by using the EB-CCD 71 is then used or referred to, to image using the EB-TDI 72. The image is used to carry out evaluation or measurement.

With the detector 70, an electron optical condition determined by using the EB-CCD 71 can be used or referred to, to detect foreign materials on a semiconductor wafer using the EB-TDI 72.

After the foreign material inspection using the EB-TDI 72, the EB-CCD 71 may be used to carry out review imaging and make a defect evaluation of the type and size of foreign materials or the like. The EB-CCD 71 can integrate images. The integration can reduce noise. Consequently, review imaging of an area where a defect has been detected can be carried out with a high S/N ratio. In addition, it is effective for pixels of the EB-CCD 71 to be smaller than those of the EB-TDI 72. This means that the number of pixels of the imaging device can be large relative to the size of a signal magnified by the projection optical system. As a result, an image with a higher resolution can be obtained. This image is used for inspection, and for classification and determination of the type of defect or the like.

The EB-TDI 72 has a configuration in which pixels are arranged two-dimensionally, and has, for example, a rectangular shape. This allows the EB-TDI 72 to directly receive the electron beam e to form an electron image. The pixel size is, for example, 12 to 16 µm. On the other hand, the pixel size of the EB-CCD 71 is, for example, 6 to 8 µm.

The EB-TDI 72 is formed into a package 75. The package 75 itself functions as a feedthrough. Pins 73 of the package are connected to a camera 74 on the atmosphere side.

The configuration shown in FIG. 17 can eliminate various faults. Faults to be eliminated are: optical conversion loss caused by an FOP, a hermetic optical glass, an optical lens, and the like; aberration and distortion during light transmission; and the resulting deterioration in image resolution, detection errors, high cost, growth in size, and the like.

FIGS. 18A and 18B illustrate a method of efficiently determining electron beam path conditions, the method being effective when a mirror electron image is to be obtained. The electron beam path conditions are: lens conditions of the lenses 42, 45, 47, 49, 50, 61, and 63 of the primary optical system 40 and secondary optical system 60; and an aligner condition of the aligner 64.

FIG. 18A shows a configuration in which a layered structure of a polysilicon layer 23 and a silicon dioxide film 24 is provided on the specimen surface 21 of the specimen 20 of a silicon substrate. A hollow groove 25 is formed in a cut in the layered structure. In FIG. 18B, a silicon dioxide layer 24a is formed on the specimen surface 21 of the specimen 20 of a silicon substrate. A hollow groove 25a is formed in a cut in the layer.

FIG. 18A shows a signal intensity distribution diagram mes of the mirror electron me. A landing energy set in an area where the mirror electron me is generated causes the path of incident electrons to bend easily, causes the mirror electron me to be generated easily at edge parts 26 of the pattern, and causes the signal intensity at the edge parts 26 of the hollow groove 25 to increase.

FIG. 18B shows a path through which an electron beam EB enters and the mirror electron me is reflected. Electrons enter the specimen 20, are reflected from an edge part 26a on one side to travel approximately horizontally, move to the opposite side of the hollow groove 25a, and are reflected from an edge part 26a on the opposite side to rise. In this way, mirror electrons are easily generated at the edge parts of the hollow groove 25a.

Such a phenomenon is particularly noticeable in a hollow symmetrical structure. The symmetrical structure is, for example, a Faraday cup, a cross-shaped groove structure, or the like. Here the symmetry of mirror electrons generated at the edge parts 26 and 26a has an effect on the resolution of the image. It is desired to achieve the symmetry of the gray level so that the difference in gray level between both edges in the image is ±5% or less. The gray level is the brightness of the image, and the difference in gray level is the difference in the brightness. Adjusting the lens conditions and the aligner condition so as to be able to obtain such symmetry allows the lens and aligner conditions to be optimized for mirror electrons. A mirror electron image with a high resolution can thus be achieved. The S/N ratio can be improved by 10 to 30% and the adjustment time can be reduced by about 10 to 50%, as compared to when this adjustment method is not used.

FIG. 19 is a cross-sectional side view showing a Faraday cup 31. The Faraday cup 31 comprises an opening 32 in a conductor, and a cupped metal electrode 33. The Faraday cup 31 measures the amount of electrons that have gone through the opening 32 by means of an ammeter 34. The opening 32 may be, for example, about 30 μm in diameter. Since the Faraday cup 31 has a hollow groove shape, mirror electrons are easily generated at the edge parts as described above. The Faraday cup 31 can therefore be used for adjustment.

An example where the foreign material inspection method according to the invention is applied to the foreign material inspection device in FIG. 14 will next be described.

The aforementioned FIG. 4A shows a correlation between the "secondary electron yield" and the "landing energy LE." This correlation suggests a mechanism for detecting the foreign material 10 using an electron beam with LE>10 eV. The secondary electron emission coefficient varies depending on the landing energy LE with which the foreign material 10 is irradiated. For this reason, a negative charge state and a positive charge state are formed. For example, when the insulating material is $SiO_2$, the following charge states can be seen:

50 eV≥LE: negative charge;
50<LE≤1500 eV: positive charge; and
1500 eV<LE: negative charge.

In each case, the foreign material 10 is charged up, causing the foreign material and the surroundings to be different from each other in the value of the potential, so that the potential distribution around the foreign material is distorted. This distorted electric field significantly bends the path of secondary electrons emitted from the foreign material 10 and reduces the transmissivity thereof. Accordingly, electrons that reach the detector from the foreign material are extremely small in number as compared to those from the surroundings of the foreign material. As a result, the brightness for the foreign material becomes lower (black signal) than that for the surroundings, and the foreign material 10 can be detected with a high contrast. The black signal of the foreign material is magnified in size more than the optical magnification. A signal of the foreign material magnified 5 to 20 times can be captured. These phenomenon and detection can be similarly achieved in the above-described three energy regions.

An example of a projection-type electron beam column using an electron beam will next be given. The specimen 20 may be a wafer, a mask for exposure, a recording medium, or the like. If it is a wafer, a circuit pattern in process of LSI manufacture may be formed on a silicon wafer of 8 to 12 inches. The wafer may also have no pattern. The wafer may be in a state where it has no pattern after film formation. The wafer may be in a state where it has been subjected to a planarization process, such as grinding and CMP, after film formation. The wafer may be an Si substrate or the like before film formation or other process.

This specimen 20 is placed on the x-y-θ control stage 30. The electron beam is emitted from the electron gun 41. The beam irradiation area and the irradiation energy are controlled by the lens 42, the apertures 43 and 44, the quadrupole lens 45, the E×B filter 46, and the like, and the specimen surface is irradiated with the electron beam. For example, the beam diameter is φ300 μm (or an ellipse of about 270 μm×80 μm). The projection optical system forms on the detector 70 an image of emission electrons emitted from the specimen surface 21 at a magnification of 50 to 500 times. A negative voltage is applied to the specimen 20. The potential of the principal plane of the first lens 50 of the primary optical system 40 is positive. Accordingly, a positive electric field is formed near the specimen 20. For example, the positive electric field may be 1 to 3 kV/mm. The detector 70 comprises an MCP (micro channel plate), a fluorescent plate, an FOP (fiber optical plate), and a TDI (the internal configuration is not illustrated). The MCP multiplies the amount of electrons to be detected, and the fluorescent plate converts the electrons to an optical signal. This two-dimensional optical signal is transmitted by the FOP, and the TDI sensor forms the image and detects the signal. When the TDI is used, the two-dimensional image signal is acquired with the specimen being continuously moved. Consequently, the image signal acquisition can be carried out quickly. The image processing mechanism processes the signal transmitted from the TDI to carry out electron image formation, foreign material detection, and foreign material classification and distinction.

An example where the foreign material 10 on the specimen 20 is inspected for by using such an electron beam column will be described. The landing energy LE of the primary electron beam with which the specimen 20 is irradiated is set to 2 eV. The landing energy LE is the difference between the cathode voltage of the electron gun 41 of the primary optical system 40 and the voltage (applied voltage) of the specimen. Irradiation with this electron beam causes the foreign material 10 to be charged up. Then, only the beam with which the foreign material 10 is irradiated becomes mirror electrons. The mirror electrons are guided by the secondary optical system 60 to the detector 70. From the normal part where the foreign material 10 is not present, secondary emission electrons caused by the beam irradiation are guided to the detector 70. The secondary emission electrons are secondary electrons, reflected electrons, or backscattered electrons. These electrons may be mixed.

Here the closer LE is to zero, the lower the emission coefficient η of the secondary emission electrons becomes. In addition, directions of the emission from the surface show a divergent distribution (for example, the distribution of secondary electrons follows the cosine law). For this reason, a design calculation of the secondary emission electrons that reach the detector 70 in the secondary optical system 60 indicates that the arrival rate of the secondary emission electrons is about several percent. As seen above, the arrival rate of the mirror electrons is high, and the arrival rate and emission coefficient of the electrons from the surrounding part are low. Accordingly, there occurs a relatively large ratio between the numbers of electrons, that is, a difference in brightness. Consequently, a large contrast and S/N ratio can be obtained. For example, if the pixel size is 100 nm and the diameter of the foreign material is φ20 nm, the S/N ratio is between 5 and 10. Generally, S/N≥3 is sufficient to carry out the detection and inspection. The invention therefore allows inspection for the extremely small foreign material 10 like the above example to be achieved with a pixel size larger than the size of the foreign material.

An example where the charging electron beam for precharge is used in the above-described device system will be described.

LE1 is the landing energy of the charging electron beam for precharge, and LE2 is the landing energy of the electron beam for the imaging and inspection. The insulating foreign material 10 can be efficiently inspected for under conditions LE1=14 eV and LE2=1 eV. The foreign material 10 on the surface of Si, an $SiO_2$ film, a metal film, an SOI, a glass mask, or the like can be inspected for. In this process, the whole surface of the inspection area is irradiated with the charging electron beam with LE1=14 eV. Irradiation with the imaging electron beam is then performed with LE2=1 eV to carry out the imaging and inspection for the foreign material 10. The execution of this process depends on how long the effect of the precharge can be maintained. Under normal conditions, the effect of the precharge can be maintained for about 10 to 30 hours, and for 150 hours or more in some cases, if no charge removal process or the like is applied.

As compared to when no precharge is performed, performing such precharge can enhance the effect of the mirror electron formation, and can improve the S/N ratio about three to ten times.

If the landing energy is LE≤10 eV, and particularly if it is in a region LE≤0 eV, mirror electrons can be formed in the normal part. Even if this condition is set, the invention can create the conditions in which the mirror electrons from the foreign material 10 reach the detector 70 and the mirror electrons from the normal part do not reach the detector 70, and can carry out the inspection for the foreign material 10 with a high S/N ratio. More specifically, the specimen surface 21 is flat, and the electron beam enters almost perpendicularly. The incident beam on the normal part is slowed down on the specimen surface 21. For this reason, the path of the electrons is bent, and deviates from the center of the secondary optical system 60. As a result, this phenomenon reduces the number of electrons guided from the normal part to the detector 70. On the other hand, the mirror electrons from the foreign material 10 rise from a curved surface or an inclined surface of the foreign material 10, and is guided through a path near the center of the secondary optical system 60 to the detector 70. Consequently, the mirror electron signal from the foreign material 10 is guided to the detector with a high transmissivity. A high S/N ratio can thus be achieved. This will be described in detail with reference to FIG. 20.

FIG. 20 illustrates filtering for when mirror electrons are emitted from the foreign material 10 and the surrounding normal part. In FIG. 20, the specimen 20 with the foreign material 10 being present thereon is irradiated with an electron beam, and mirror electrons are reflected from both the foreign material 10 and the specimen surface 21. In such a case, the invention causes a phenomenon in which the mirror electrons reflected from the foreign material 10 reach the detector 70 and the mirror electrons from the specimen surface 21 of the normal part do not reach the detector 70. That is, the foreign material 10 is charged up, causing a potential difference between the foreign material and the surrounding normal part (the specimen surface 21), and this allows for separation of the mirror electrons from the foreign material 10 and the mirror electrons from the specimen surface 21 of the surrounding normal part.

For example, as described with reference to FIG. 15, the angle of incidence of the primary electron beam is slightly tilted to the vertical and is caused to deviate from the center. This can create a condition where the path of the mirror electrons goes near the center of the secondary optical system 60. The path of the mirror electrons deviates on the flat normal part. The path of the mirror electrons from the normal part deviates from the central part of the secondary optical system 60, thereby reducing the amount and probability of electrons reaching the detector 70. The mirror electrons from the normal part also become stray electrons or the like due to their collision with the column of the secondary optical system 60. Consequently, there occurs a difference in the amount or density of electrons that reach the detector 70 between the foreign material 10 and the surrounding specimen surface 21. This allows a large gray-level difference, i.e. contrast, to be created.

Here the factors that have an effect on the deviation of the path are the intensity and focus of the lenses 47, 49, 50, 61, and 63, the E×B filter 46, and the NA aperture 62. The focus and intensity of the lenses 47, 49, 50, 61, and 63 are adjusted so as to obtain a condition in which the path of the mirror electrons from the foreign material 10 goes through the center of the secondary optical system 60. The angle of incidence and focus of the lenses are different between the mirror electrons from the surrounding normal part (the specimen surface 21) and those from the foreign material 10. The mirror electrons from the normal part therefore go through paths that are off the center of the secondary optical system 60. The NA aperture 62 blocks the mirror electrons going through paths that are off the center, and reduces the amount and probability of them reaching the detector 70. Additionally, the E×B filter 46 is adjusted so that when the mirror electrons go through the E×B filter 46, the mirror electrons from the foreign material 10 go through the path that reaches the subsequent NA aperture 62 and detector 70. This allows the mirror electrons to be appropriately adjusted when they go through the E×B filter 46. The angle of incidence on the E×B filter 46 and the energy in the axial direction (the z-axis direction) are different between the mirror electrons from the foreign material 10 and those from the surrounding normal part (the specimen surface 21). Accordingly, the mirror electrons reflected from the specimen surface 21 of the normal part deviate from the center of the subsequent NA aperture 62 and lenses 61 and 63. As a result, their probability of incidence on the detector 70 decreases.

Generally, the LE region that can be used effectively is between −30 and 0 eV. However, when the optical axis of the secondary optical system 60 is not perpendicular to the specimen surface, mirror electrons are sometimes formed even if LE is 0 eV or more. Also in a specimen with microscopic unevenness on the surface such as a wafer with a pattern, mirror electrons are sometimes formed even if LE is 0 eV or more. For example, such a condition may be created in an LE region from −30 to 10 eV.

The electron beam inspection method according to the invention can also be applied to the SEM by using the precharge effectively. For example, the foreign material inspection can be carried out with the SEM by imaging and inspecting after the precharge under the following condition:
Precharge LE1: 0 to 30 eV; and
Imaging LE2: −5 to 20 eV.

For example, imaging is performed under conditions Precharge LE1=25 eV and Imaging LE2=5 eV. In this case, the foreign material (an insulating material or an object including an insulating material) is charged up, and the surface potential becomes negatively charged (e.g. −7 V). Irradiation is then performed with the imaging electron beam (LE2=5 eV). Consequently, mirror electrons are formed only in the charged-up foreign material part, and the mirror electrons are acquired by the detector 70. The normal part without the foreign material 10 generates secondary emission electrons (the secondary emission electrons are secondary electrons, reflected electrons, or backscattered electrons, or these may be mixed). Since the emission coefficient of the secondary emission electrons is low, the brightness of the normal part is low. The brightness difference (the contrast) between the mirror electrons from the foreign material 10 and the secondary emission electrons from the normal part is large, and therefore the foreign material 10 can be detected with high sensitivity.

A precharge device may be provided in front of the imaging unit for an efficient precharge.

If no precharge is performed in the SEM method, there may be the following faults. Generally in the SEM method, the spot size of the electron beam is set smaller than the size of the object such as a pattern defect and foreign material to be detected in order to appropriately perform image formation and shape recognition of the pattern or foreign material 10. Consequently, the difference between the beam spot size and the foreign material size causes a local and temporal change in the charge-up potential of the foreign material 10. As a result, no stable signal can be obtained, or it is difficult to obtain stable mirror electrons. It is thus important to perform imaging after stabilizing the surface potential condition of the foreign material 10 or stabilizing the charge-up condition and potential of the foreign material 10 using the precharge.

In conventional SEM methods, since beam scanning is performed, the angle of incidence of the beam relative to the specimen 20 considerably varies depending on the scan position. When a beam of mirror electrons is formed, the angle of reflection of the beam varies depending on the angle of incidence. Consequently, the probability of the electrons entering the detector 70 considerably varies depending on the scan position, and this is a fault. For this reason, it is difficult to acquire a uniform and precise image. In order to overcome this fault, the aligner and the lens voltage are suitably adjusted in conjunction with each other so that the angle of incidence of the electron beam relative to the specimen will be almost a right angle.

As seen above, the electron beam inspection method according to the invention can also be applied to the SEM method by establishing appropriate conditions.

FIG. 21 shows an electron beam inspection device to which the invention is applied. Here an example of a general system configuration will be described.

In FIG. 21, the foreign material inspection device has a specimen carrier 190, a minienvironment 180, a load lock 162, a transfer chamber 161, a main chamber 160, an electron beam column system 100, and an image processing device 90. The minienvironment 180 is provided with an atmospheric transfer robot, a specimen alignment device, a clean air supply mechanism, and the like. The transfer chamber 161 is provided with a vacuum transfer robot. Since the robot is placed in the transfer chamber 161 which is always in a vacuum state, the generation of particles or the like caused by pressure fluctuations can be suppressed to a minimum.

The main chamber 160 is provided with a stage 30 that moves in the x direction, y direction, and θ (rotation) direction, and an electrostatic chuck is installed on the stage 30. On the electrostatic chuck is placed the specimen 20 itself. Alternatively, the specimen 20 set in a pallet or jig is held by the electrostatic chuck.

The main chamber 160 is controlled by a vacuum control system 150 so as to maintain a vacuum in the chamber. The main chamber 160, the transfer chamber 161, and the load lock 162 are mounted on a vibration isolation table 170, and they are configured so that no vibration is transmitted from the floor.

The electron column 100 is installed on the main chamber 160. The electron column 100 comprises columns of the primary optical system 40 and secondary optical system 60, and the detector 70 for detecting secondary emission electrons, mirror electrons, or the like transmitted from the specimen 20. A signal from the detector 70 is transmitted to and processed by the image processing device 90. Real-time signal processing and delayed signal processing can both be performed. The real-time signal processing is performed during inspection. When the delayed signal processing is performed, simply an image is acquired, and the signal processing is performed later. Data processed by the image processing device 90 is saved to a hard disk, memory, or other recording medium. The data can be displayed on a monitor on a console as required. The data to be displayed is, for example, an inspection area, a map of the number of foreign materials, the distribution and a map of the foreign material size, foreign material classification, a patch image, or the like. System software 140 is provided to perform such signal processing. An electron optical system control power supply 130 is provided to supply the electron column system with power. The main chamber 160 may be provided with the optical microscope 110 and the SEM-type inspection device 120.

FIG. 22 shows an example of a configuration in which the electron column 100 which is a projection-type optical inspection device and the SEM-type inspection device 120 are installed in the one and the same main chamber 160. As shown in FIG. 22, it is very advantageous if the projection-type optical inspection device and the SEM-type inspection device 120 are installed in the one and the same chamber 160. The specimen 20 is placed on the one and the same stage 30, and the specimen 20 can be observed or inspected by both the projection method and the SEM method. A method of use and advantages of this configuration are as follows.

First, since the specimen 20 is placed on the one and the same stage 30, the coordinates are uniquely determined when the specimen 20 moves between the projection-type electron column 100 and the SEM-type inspection device 120. Accordingly, when a detection point of the foreign material or the like is to be located, the two inspection devices can precisely and easily locate one and the same part.

Suppose that the above-described configuration is not applied. For example, the projection-type optical inspection device and the SEM-type inspection device 120 are separately configured as different devices. The specimen 20 is moved between the separate different devices. In this case, since it is required to place the specimen 20 on different stages 30, the two devices are required to align the specimen 20 separately. The separately performed alignment of the specimen 20 would cause a location error of 5 to 10 μm for one and the same position. In particular, the error further increases if the specimen 20 does not have any pattern, since the positional reference cannot be located.

In the embodiment, on the other hand, the specimen 20 is placed on the stage 30 in the one and the same chamber 160 for the two types of inspection as shown in FIG. 22. One and the same position can be precisely located even if the stage 30 moves between the projection-type electron column 100 and the SEM-type inspection device 120. Consequently, a position can be precisely located even if the specimen 20 does not have any pattern. For example, a position can be located with a precision of 1 μm or less.

Such precise location is significantly advantageous in the following case. The foreign material inspection of the specimen 20 having no pattern is first performed by the projection method. After that, location and detailed observation (reviewing) of the detected foreign material 10 is performed by the SEM-type inspection device 120. Since the position can be located accurately, not only the presence or absence of the foreign material 10 (false detection if absent) can be determined, but also detailed observation of the size and shape of the foreign material 10 can be performed quickly.

As mentioned above, the separate installation of the electron column 100 for foreign material detection and the SEM-type inspection device 120 for reviewing would require a great deal of time to locate the foreign material 10. The specimen having no pattern would increase the difficulty. Such problems are solved by the embodiment.

In the embodiment, as described above, the foreign material 10 of an ultra-micro size can be inspected for with high sensitivity by using conditions for imaging the foreign material 10 with the projection-type optical method. In addition, the projection-type optical electron column 100 and the SEM-type inspection device 120 are mounted in the one and the same chamber 160. Consequently, in particular, inspection for the foreign material 10 of an ultra-micro size of 30 nm or less and determination and classification of the foreign material 10 can be carried out with great efficiency and speed.

Another example of the inspection using both projection-type inspection device and SEM will next be described.

In the above description, the projection-type inspection device detects the foreign material, and the SEM performs review inspection. However, the invention is not limited to this. The two inspection devices may be applied to another inspection method. Effective inspection can be carried out by combining the characteristics of each inspection device. Another inspection method, for example, is as follows.

In this inspection method, the projection-type inspection device and the SEM inspect different areas. In addition, "cell to cell" inspection is applied to the projection-type inspection device, and "die to die" inspection is applied to the SEM, so that precise inspection is achieved with great overall efficiency.

More specifically, the projection-type inspection device performs the "cell to cell" inspection on an area in a die where there are many repetitive patterns. The SEM then performs the "die to die" inspection on an area where there are not many repetitive patterns. Both inspection results are combined and one inspection result is obtained. The "die to die" is an inspection for comparing successively obtained images of two dies. The "cell to cell" is an inspection for comparing successively obtained images of two cells. A cell is a part of a die.

In the above-described inspection method, the repetitive pattern part is quickly inspected by using the projection method and, on the other hand, the area where there are not many repetitive patterns is inspected by the SEM with precision and less faults. The SEM is not suited to quick inspection. However, since the area where there are not many repetitive patterns is relatively small, the SEM does not require too much time for inspection. Consequently, overall inspection time can be reduced. This inspection method can thus maximize the merits of the two inspection methods to carry out precise inspection in a short inspection time.

Returning now to FIG. 21, a transfer mechanism for the specimen 20 will be described.

The specimen 20 such as a wafer and mask is transferred from the load port into the minienvironment 180, where alignment work is performed. The specimen 20 is transferred to the load lock 162 by the atmospheric transfer robot. The load lock 162 is evacuated from atmospheric pressure to a vacuum by a vacuum pump. When the pressure becomes a certain value (about 1 Pa) or less, the specimen 20 is transferred from the load lock 162 to the main chamber 160 by the vacuum transfer robot placed in the transfer chamber 161. The specimen 20 is then placed on the electrostatic chuck mechanism on the stage 30.

FIG. 23 shows the inside of the main chamber 160, and the electron column system 100 placed in an upper part of the main chamber 160. The same components as those in FIG. 14 are given the same reference symbols as those in FIG. 14, and will not be described.

The specimen 20 is placed on the stage 30 that can move in the x, y, z, and θ directions. The stage 30 and the optical microscope 110 perform precise alignment. The projection optical system then uses the electron beam to perform the foreign material inspection and pattern defect inspection of the specimen 20. Here the potential of the specimen surface 21 is important. A surface potential measurement device that can measure in vacuum is installed in the main chamber 160 in order to measure the surface potential. This surface potential measurement device measures the two-dimensional surface potential distribution on the specimen 20. Based on the measurement result, focus control is performed in a secondary optical system 60*a* that forms an electron image. A focus map of two-dimensional positions in the specimen 20 is created based on the potential distribution. By using this map, the inspection is carried out with the focus being changed and controlled during the inspection. This can reduce the defocus and distortion of the image caused by a change in the surface potential according to location, so that a precise and stable image acquisition and inspection can be carried out.

Here the secondary optical system 60*a* is configured to be able to measure the detection current of electrons entering the NA aperture 62 and the detector 70, and further to be able to place an EB-CCD in the position of the NA aperture 62. Such a configuration is significantly advantageous and efficient. In FIG. 23, the NA aperture 62 and the EB-CCD 65 are mounted on a one-body holding member 66 having openings 67 and 68. The secondary optical system 60*a* has a mechanism that can separately and independently perform current absorption with the NA aperture 62 and image acquisition with the EB-CCD 65. In order to realize this mechanism, the NA aperture 62 and the EB-CCD 65 are mounted on the x-y stage 66 that operates in vacuum. Accordingly, position control and positioning of the NA aperture 62 and the EB-CCD 65 can be performed. Since the stage 66 is provided with the openings 67 and 68, the mirror electrons and the secondary electrons can go through the NA aperture 62 or the EB-CCD 65.

An operation of the secondary optical system 60*a* with such a configuration will be described. First, the EB-CCD 65 detects the spot shape of the secondary electron beam and the center position of the spot shape. Voltage adjustment is then performed on a stigmator, the lenses 61 and 63, and the aligner 64 so that the spot shape becomes circular and minimum. In terms of this point, conventionally the spot shape and astigmatism at the position of the NA aperture 62 could not be directly adjusted. The embodiment allows such a direct adjustment to be made, allowing the astigmatism to be corrected precisely.

The center position of the beam spot can also be detected easily. Accordingly, the position of the NA aperture 62 can be adjusted so that the center of the opening in the NA aperture 62 is placed in the beam spot position. In terms of this, conventionally the position of the NA aperture 62 could not be directly adjusted. In the embodiment, the position of the NA aperture 62 can be directly adjusted. Consequently, the NA aperture can be precisely positioned, the aberration in the electron image decreases, and the uniformity improves. The uniformity of the transmissivity improves, and an electron image can be acquired with a high resolution and uniform gray level.

In the inspection for the foreign material 10, it is important to efficiently acquire a mirror signal from the foreign material 10. The position of the NA aperture 62 is very important since it defines the transmissivity and aberration of the signal. Secondary electrons are emitted from the specimen surface in a wide angle range following the cosine law, and reach the NA position uniformly with a wide area (e.g. φ3 mm). For this reason, the secondary electrons are insensitive to the position of the NA aperture 62. In contrast, the reflection angle of mirror electrons on the specimen surface is about the same as the incident angle of the primary electron beam. The mirror electrons therefore exhibit a small spread, and reach the NA aperture 62 with a small beam diameter. For example, the spread area of the mirror electrons is ½₀ or less of the spread area of the secondary electrons. For this reason, the mirror electrons are very sensitive to the position of the NA aperture 62. The spread area of the mirror electrons at the NA position is generally an area of φ10 to φ100 μm. Because of this, it is very advantageous and important to determine a position where the intensity of the mirror electrons is the highest and place the center position of the NA aperture 62 in the determined position.

In order to achieve such placement of the NA aperture 62 in an appropriate position, the NA aperture 62 in a preferred embodiment is moved in the x and y directions in the vacuum electron column 100 with a precision of about 1 μm. The signal intensity is measured with the NA aperture 62 being moved. A position where the signal intensity is the highest is then determined, and the center of the NA aperture 62 is placed in the position of the determined coordinates.

The EB-CCD 65 is very advantageously used for the measurement of the signal intensity. This is because it can get two-dimensional information on the beam and determine the number of electrons that enter the detector 70, thereby allowing the signal intensity to be evaluated quantitatively.

Alternatively, the placement of the aperture may be determined and a condition of the lens 63 existing between the aperture and the detector may be established so that a conjugate relation between the position of the NA aperture 62 and the position of the detection surface of the detector 70 is achieved. This configuration is also very advantageous. This allows an image of the beam at the position of the NA aperture 62 to be formed on the detection surface of the detector 70. The beam profile at the position of the NA aperture 62 can thus be observed by using the detector 70.

The NA size (aperture diameter) of the NA aperture 62 is also important. Since the signal area of the mirror electrons is small as described above, an effective NA size is about 10 to 200 μm. In addition, the NA size is preferably a size 10% to 100% larger than the beam diameter.

Discussing in relation to this, the image of the electrons is formed from the mirror electrons and the secondary emission electrons. The above-mentioned setting of the aperture size can increase the ratio of the mirror electrons more. This can increase the contrast of the mirror electrons, that is, increase the contrast of the foreign material 10.

Describing in more detail, when the opening in the aperture is small, the secondary emission electrons decrease inversely with the area of the aperture. This reduces the gray level of the normal part. However, the mirror signal does not change, and the gray level of the foreign material 10 does not change. Consequently, the contrast of the foreign material 10 can be increased by the amount of decrease in the gray level of the surroundings, and a higher S/N ratio can be obtained.

The aperture and the like may be configured so that the position of the aperture can be adjusted in the z-axis directions as well as in the x and y directions. This configuration is also advantageous. The aperture is suitably placed in a position where the mirror electrons are most condensed. This very effectively reduces the aberration of the mirror electrons and cuts down the secondary emission electrons. Consequently, a higher S/N ratio can be obtained.

As described above, the mirror electrons are very sensitive to the NA size and shape. It is therefore very important to appropriately select the NA size and shape in order to obtain a high S/N ratio. An example of a configuration for such appropriate selection of the NA size and shape will next be described. The shape of the aperture (opening) of the NA aperture 62 will also be mentioned in the description.

Here the NA aperture 62 is a member (component) having an opening. Generally, the member is sometimes called an aperture, or the opening is sometimes called an aperture. In the following aperture-related description, the member is called an NA aperture in order to distinguish the member (component) from its opening, when FIGS. 24 to 28 are referred to. An opening in the member is called an aperture. In the following description, symbols 62 and 62a to 62d denote NA apertures. Symbols 169, 69, 69a, and 69b denote apertures (openings). The aperture shape generally means the shape of an opening.

FIG. 24 is a reference example, showing a conventional aperture 169. As shown in FIG. 24, the circular aperture 169 would conventionally be placed in a fixed position. Consequently, the above-described appropriate selection of the NA size and shape could not be made.

On the other hand, the specimen inspection apparatus according to the embodiment is configured to be able to move the position of the NA aperture 62 two-dimensionally or three-dimensionally to set the position. The movement of the NA aperture 62 may be performed by using the x-y stage 66 described in FIG. 23. A suitable aperture may be selected as appropriate from a plurality of apertures and the positioning may be performed. The one NA aperture 62 may be provided with a plurality of aperture openings 69, and the NA aperture 62 may be moved in order to select one of those (this configuration also corresponds to the selection from a plurality of apertures). Another moving mechanism may be used. For example, the NA aperture 62 may be moved by a linear motor instead of by the x-y stage 66. A rotation support member may support the NA aperture 62, and a common rotary motor may move the position of the NA aperture 62. A specific example of the shape of the opening in the NA aperture 62 will next be described.

FIG. 25 shows an example of the shape of the aperture 69. In FIG. 25, the aperture 69 has an elliptical opening shape. This opening shape is created so as to match the intensity distribution of the mirror electron signal. In this example, the intensity distribution has an elliptical shape elongated in the y direction according to a measurement result of the intensity distribution of the mirror electrons in the aperture. Here the y direction is the direction in which the deflection is made by the E×B filter 46. The y direction corresponds to the direction of the optical axis of the primary electron beam. This means that the elliptical shape elongated in the y direction is considered to be caused by a deflection component of the E×B filter 46. The aperture shape having the major axis in the y direction is therefore very advantageous in order to capture the mirror electrons efficiently. This can increase the yield of the mirror electrons more than ever before and obtain a higher S/N ratio (e.g. two times or more). For example, suppose that the intensity distribution of the secondary electron beam extends 100 µm in the y direction and 50 µm in the x direction (these values are full widths at half maximum). The elliptical aperture 69 is selected in a range from 10% to 100% more than the secondary electron beam diameter. For example, the aperture may be selected so that the aperture size is 150 µm in the y direction and 75 µm in the x direction.

Configurations of the NA aperture 62 having a plurality of apertures 69 will next be described with reference to FIGS. 26 to 29. Here NA apertures 62a to 62c are the aperture members, and apertures 69a are the openings provided in the aperture members.

FIG. 26 shows an example of a configuration of an NA aperture 62a having a plurality of apertures 69a. In FIG. 26, the NA aperture 62a has two circular apertures 69a. In this example, the two openings are placed in positions displaced in ±y directions with respect to the center of the intensity of the mirror electrons. The amount of displacement is, for example, about 50 µm. This configuration can capture both mirror electrons scattered on the +y and −y sides from the foreign material 10. This configuration can therefore increase the difference in the amount of the signal between the scattered mirror electrons and the background secondary emission electrons, allowing a high S/N ratio to be obtained. The reason of this is that the amount of the secondary emission electrons flying in the scattering direction is limited to a small amount. The background therefore decreases, and the S/N ratio can be improved relatively.

FIG. 27 shows an example of a configuration of an NA aperture 62b having four apertures 69a. In FIG. 27, the four circular apertures 69a are placed symmetrically with respect to the x and y axes. That is, two of the apertures 69a are placed on the x axis; two of the apertures 69a are placed on the y axis; and the four apertures 69a are positioned at the same distance from the center (the origin). In other words, the four apertures 69a are placed at regular intervals around the origin. More simply put, the four apertures 69a are placed in a rhombus shape. Consequently, even when there are mirror electrons scattered in both x and y directions from the foreign material 10, the electrons can be acquired with a high S/N ratio.

FIG. 28 shows an NA aperture 62c having four apertures 69a. The configuration in FIG. 28 is an example different from the configuration in FIG. 27. In FIG. 28, the four circular apertures 69a are separately placed in the first to fourth quadrants in the xy plane. Also in this example, the four apertures 69a are placed symmetrically with respect to the x and y axes, and are placed at the same distance from the center (the origin). In other words, the four apertures 69a are placed at regular intervals around the origin. Even in the NA aperture 62c of such a shape, the apertures 69a can be provided in a position where the signal intensity of the mirror electrons is high, and a signal with a high S/N ratio can be acquired.

As shown in FIGS. 27 and 28, there may be configurations which are the same in the number of the apertures 69a but are different in their arrangement. This allows the appropriate NA aperture 62b or 62c to be used depending on the intended use. Consequently, a high S/N ratio can be acquired in each use.

FIG. 29 shows an example of a configuration of an NA aperture 62d having eight apertures 69b. As shown in FIG. 29, the number of the apertures 69b may be more than four. In the NA aperture 62d shown in FIG. 29, the plurality of apertures 69b are placed at regular intervals on a circumference around the center of the intensity of the mirror electrons. This configuration is advantageous when there are mirror electrons scattering specifically and significantly on the position of one of the apertures 69b on the circumference. Such mirror electrons can be captured appropriately.

In FIGS. 26 to 29, in terms of the relation between the center of the intensity of the mirror electron signal and the apertures 69a and 69b, the positions of the apertures are off the center of the intensity. However, the invention is not limited to this, and the positions of the apertures may coincide with the center of the intensity. That is, one of the apertures 69a or 69b may be placed so as to coincide with the center of the intensity of the mirror electrons. In this case, the other apertures 69a or 69b capture scattered mirror electrons. They will be included in an electron image together with the mirror electrons in the center of the intensity. Such a composite image is obtained by the detector 70. In this way, a composite image of the intense mirror electrons and the specifically scattered mirror electrons can be acquired. Consequently, a high S/N ratio can be obtained, and the foreign material 10 distinctive in the scattering direction can be detected effectively. Additionally, the characteristic in the scattering direction can be used to classify the foreign material 10.

Furthermore, in the embodiment, the apertures 69, 69a, and 69b of an appropriate shape can also be selected for the landing energy LE to be used. This selection also provides a very advantageous effect. The intensity distribution of the mirror electrons varies depending on the landing energy LE. Accordingly, the inspection device of the embodiment may be configured to use the apertures 69, 69a, and 69b having a size and shape according to the landing energy LE to be used. This allows the aperture to be adjusted in accordance with the intensity distribution, which is very advantageous. For example, suppose that the mirror electrons have an intensity distribution of an elliptical shape elongated in the y direction, and then the imaging or inspection is carried out under two different conditions. For example, suppose that the landing energy is a first value, i.e. LE=3 eV, in a first imaging or inspection condition. Suppose that the landing energy is a second value, i.e. LE=2 eV, in a second imaging or inspection condition. Here the smaller the landing energy LE is, the larger the intensity distribution of the mirror electrons becomes at the position of the NA apertures 62 and 62a to 62d. The NA apertures 62 and 62a to 62d are suitably selected so as to match such a change in the distribution. For example, when the first landing energy is used, the aperture 69 of an ellipse extending 100 µm in the y direction and 50 µm in the x direction may be selected. When the second landing energy is used, the intensity distribution of the mirror electrons is about two times larger. Accordingly, the aperture 69 of an elliptical shape extending 200 µm in the y direction and 100 µm in the x direction may be used. Selecting the apertures in this way allows the mirror electrons to be detected very effectively.

The Faraday cup and other components described in FIG. 18 will be described again. These components may be installed in the electron beam inspection device in FIG. 23.

FIG. 30 shows the stage 30 in FIG. 23. On the stage 30 are mounted the Faraday cup 31, a reference specimen chip 27 having the hollow grooves 25 and 25a, and an EB-CCD 37. Consequently, the uniformity and irradiation position of the primary electron beam can be precisely monitored, and a temporal variation of the primary electron beam can be precisely monitored.

In terms of this, there has been conventionally no means to directly monitor the primary electron beam. For that reason, conventionally the Faraday cup 31 would be placed in a plurality of points on one and the same specimen 20 and an image of the electron beam irradiation would be acquired by means of the Faraday cup 31, on a regular basis. This image has been used for an evaluation and adjustment of the beam. Conventional techniques, however, could obtain only an image onto which variations of the primary optical system 40 and secondary optical system 60a are superimposed. It would be complicated to separate, evaluate, and adjust the factors of those two optical systems, and the precision would be low. The embodiment can solve these problems.

In the embodiment, the distribution of the current density of the primary electron beam can also be measured precisely.

A precise feedback can be performed on the electron emission control system comprising the lenses 42 and 45, aligner, and electron gun 41 of the primary optical system. Consequently, a more uniform beam profile can be formed. In a conventional measurement of the distribution of the current density, for example, a Faraday cup of about φ30 µm in diameter would be used. The measurement would then be performed on about five points at 30 µm intervals. In such measurement, the resolution would be limited by the size of the opening in the Faraday cup 31. The measurement would take time since the measurement would be performed on a point-by-point basis. As a result, the distribution at the moment of irradiation with the electron beam could not be measured.

The foreign material inspection device according to the embodiment can directly measure the beam profile of the primary electron beam and, based on the measurement result, can appropriately adjust the primary electron beam.

In such adjustment of the primary electron beam in the embodiment, a standardized sample may be manufactured and used in order to determine the relation between the size of the foreign material 10 and the signal intensity or S/N ratio. The use of such a sample provides a great advantage. For example, standardized microspheres of a known size are scattered on a single film of a specimen. Such a specimen is preferably used to calibrate the sensitivity.

FIG. 31 shows the specimen 20 on which samples 15 are scattered. The samples 15 typically substitute for the foreign material 10. It is therefore preferred to use a sample of a size close to that of the foreign material 10 and of a material close to that of the foreign material 10. For example, the samples 15 are standardized microspheres, whose material is PSL (polystyrene latex). Ultra-fine particles may also be used. The specimen 20 may be a semiconductor wafer of Si or the like. A film may be formed on the semiconductor wafer. The specimen 20 may also be a glass substrate on which a film is formed. The film on the specimen 20 may be either of a conductive film or an insulating film. For example, the film on the semiconductor wafer may be a film of $SiO_2$, Ta, Cu, Al, W, or the like. The film on the glass substrate may be, for example, a film of Cr, CrN, Ta, TaN, TaBN, TaBO, Si, Al, Mo, or the like.

In FIG. 31, the size of the samples 15 is known. The relation between the size of the samples 15 and the signal intensity or S/N ratio can therefore be determined by acquiring an image of the samples 15.

FIG. 32 shows a measurement result to be obtained when an image of the samples 15 shown in FIG. 31 is acquired. FIG. 32 is an example of the relation between the samples 15 and the signal intensity. In FIG. 32, the horizontal axis represents the size of the samples 15, and the vertical axis represents the signal intensity. The vertical axis may also represent the S/N ratio. The signal intensity corresponding to the sample size is determined by varying the size of the samples 15 in various ways. A graph is created from the signal intensity as shown in FIG. 32. Consequently, the relation between the size of the foreign material 10 and the signal intensity or S/N ratio can be grasped.

In the above description, microspheres are used as the samples 15. An appropriate size of the spheres is particularly 100 nm or less. That is, microspheres of φ1 to φ100 nm are used advantageously.

As described up to this point, the electron beam inspection device and electron beam inspection method according to the embodiment are sensitive even to the ultra-micro foreign material 10 of the order of nanometers. The above-described microscopic samples 15 are advantageously used particularly for the inspection for the microscopic foreign material 10.

In terms of this, conventional optical-type foreign material inspection methods would have a difficulty in detecting the foreign material 10 of a size smaller than 100 nm since the resolution would be limited by the wavelength of light. The electron beam inspection device and electron beam inspection method according to the embodiment can provide an adequate sensitivity and can detect the microscopic foreign material 10.

Referring now to FIG. 33, an embodiment that achieves an appropriate setting of the landing energy will be described further.

FIG. 33 shows a gray-level characteristic versus beam landing energy in the electron beam inspection method according to the embodiment. This foreign material inspection method may be applied to the specimen 20 having a solid surface or patterned surface (the solid surface means a surface without a pattern; hereinafter the same shall apply). The embodiment is characterized in that the characteristic shown in FIG. 33 is acquired and the characteristic in FIG. 33 is used to select a region of the landing energy LE. The gray-level characteristic (the change in the gray-level value versus the landing energy LE) relates to the types of electrons to be detected. The types of electrons are shown below:
LE<LEA: mirror electrons;
LEA≤LE≤LEB: a mixture of secondary emission electrons and mirror electrons; and
LEB≤LE: secondary emission electrons.

Here, setting LE in a region LEA≤LE≤LEB+5 eV allows an image of a high S/N ratio to be acquired, so that a high-sensitivity defect inspection and foreign material inspection can be carried out. The reason of this setting will be described. Suppose, for example, that the foreign material 10 is present on a solid surface such as Si, W, or the like. In the embodiment, the foreign material 10 is charged up and forms mirror electrons. At this time, it is desired that a background solid surface (a surface without a pattern) has a low gray level, because this increases the S/N ratio. In order to reduce the gray level of the solid surface, the energy conditions for the secondary electron emission region and for the mixture region are appropriate. The mixture region is a region in which the mirror electrons and the secondary emission electrons are mixed. The mixture region is between the secondary emission electron region and the mirror electron region, and corresponds to the transition region.

The mixture region is LEA≤LE≤LEB in FIG. 33. It is considered that the foreign material 10 generates mirror electrons and the background specimen 20 generates secondary emission electrons in this region. In the mirror electron region LE<LEA, the background also generates mirror electrons. The gray level of the background therefore increases, so that the difference in gray level between the foreign material 10 and the background decreases. That is, the S/N ratio decreases. In an energy region in which LE is much larger than LEB, the foreign material 10 also generates secondary emission electrons. The S/N ratio also decreases in this case.

In order to facilitate the detection of the foreign material 10, it is preferable to maximize the difference in gray level between the magnified image 81 of the foreign material 10 and the surface image 82 of the background specimen surface 21. The difference in gray level depends on the gray-level characteristic versus the landing energy LE shown in FIG. 33. One characteristic curve is shown in FIG. 33. In contrast, for example, two characteristic curves, a characteristic curve of the foreign material 10 and a characteristic curve of the specimen 20 in a pure state, are suitably used in the embodiment. In the embodiment, the two characteristics may be compared, and a landing energy LE in a range in which the difference in gray level is the largest may be used. This allows the landing energy to be determined appropriately.

Discussing in relation to the above description, the energy range in which the difference in gray level is large varies depending on the combination of the characteristic curve of the foreign material 10 and that of the specimen surface 21. Accordingly, the landing energy is suitably set by using the characteristic curves of an object to be detected.

According to past experimental experiences, LE in the region LEA≤LE≤LEB+5 eV is very advantageously used and provides a great advantage. The method and configuration that employs this energy region may be applied to any method and configuration described up to this point to the extent possible. Consequently, a high S/N ratio can be acquired, and high sensitivity and high speed defect inspection and foreign material inspection can be carried out.

Referring now to FIG. 34, the landing energy LE of the primary electron beam efficient in detection of or inspection for the foreign material 10 will be described in further detail. FIG. 34 shows a relation between the landing energy LE of the electron beam of the primary system and the gray level of an image. In FIG. 34, the gray-level characteristic of the specimen 20 and that of the foreign material 10 are shown as the relation between the specimen 20 and the foreign material 10.

As referred to in the description of FIG. 33, the region in which the landing energy LE is smaller than LEA indicates the mirror electron region. The mirror electron region is an energy region in which almost only mirror electrons are detected from the normal part where the foreign material 10 is not present on the specimen 20.

The region in which the landing energy LE is larger than LEB indicates the secondary electron region. The secondary electron region is a region in which almost only secondary electrons are detected from the normal part of the specimen 20. Here, for the sake of simplicity, secondary electrons are given attention and the term secondary electron region is used. More specifically, the region is the secondary emission electron region, and secondary emission electrons are generated. As previously described, the secondary emission electrons may include secondary electrons, reflected electrons, and backscattered electrons.

The region in which the landing energy LE is LEA or more but not exceeding LEB is the mixture region. The mixture region means a mixture region in which both mirror electrons and secondary electrons are detected from the normal part of the specimen 20. The mixture region is the transition region between the mirror electron region and the secondary electron region.

As described above, the landing energy LE of the electron beam of the primary system with which irradiation is performed is preferably set in the energy region LEA≤LE≤LEB or LEA≤LE≤LEB+5 eV. This will be described in more detail with reference to FIG. 34.

FIG. 34 shows a change in the gray-level DN versus the landing energy LE of the primary electron beam, for each of the foreign material 10 and the normal part on the specimen 20. The gray-level DN (digital number) corresponds to the number of electrons to be detected by the detector 70. If the contact resistance between the foreign material 10 and the specimen 20 is high or if the foreign material 10 is charged, the foreign material 10 exhibits a change in gray level different from that of the surrounding normal part. This is because a potential change occurs in the foreign material 10, allowing mirror electrons to be generated easily. According to the findings made by the inventors, the range from LEA to LEB has often been seen to be from −5 eV to +5 eV. As described above, the foreign material 10 generates mirror electrons even when the landing energy LE of the primary electron beam is high, as compared to the normal part (here the mirror electrons may be mixed with the secondary electrons). The range from LEA to LEB+5 eV is therefore suitable as the region of the landing energy LE to be used when the imaging of or inspection for the foreign material 10 is carried out. For example, suppose that LEA to LEB is −5 eV to +5 eV. In this case, the region of the landing energy LE is very preferably from −5 eV to +10 (=5+5) eV.

The landing energy range "from LEA to LEB+5 eV" is effective for substrates of all types, regardless of the material of the substrate. For example, the landing energy range "from LEA to LEB+5 eV" is effective for a substrate on which a pattern or the like is formed, and also for a substrate or the like on the surface of which a foreign material is present. Moreover, this LE range is effective regardless of the material of the substrate and foreign material. For example, the landing energy range "from LEA to LEB+5 eV" is also suitably applied to observation of a glass substrate. This allows a good image to be obtained.

Here the reason why the foreign material 10 can be imaged with a high contrast is clear from FIG. 34. As shown in FIG. 34, the change in brightness is different between the foreign material 10 and the surrounding normal part. The foreign material 10 generates mirror electrons at a higher landing energy LE (=LEB+5 eV) than the normal part. For this reason, the difference in gray level between the foreign material 10 and the normal part, ΔDN, can be secured large as illustrated. For example, suppose that the gray-level DN of the normal part is 50 DN and the variation in brightness (the noise) of the normal part is 3 DN. Suppose also that the gray-level DN of the foreign material 10 is 100 DN. In this case, the difference in gray level is ΔDN=50 DN (=100 DN−50 DN). The S/N ratio is therefore 50/3=16.7. In this way, a high S/N ratio can be obtained. This is exactly the above-described phenomenon that occurs in the region of the landing energy LE, from LEA to LEB+5 eV. The use of this phenomenon allows the imaging and inspection to be carried out with a high contrast. Other regions of the landing energy LE cannot achieve the state where only the foreign material 10 generates mirror electrons, and therefore also cannot achieve a high contrast between the foreign material 10 and the surrounding normal part as described above. The foreign material 10 is therefore preferably detected in the range LEA≤LE≤LEB+5 eV.

While there have been described what are at present considered to be preferred embodiments of the invention, it will be understood that various modifications and variations may be made thereto, and it is intended that appended claims cover all such modifications and variations as fall within the true spirit and scope of the invention.

Industrial Applicability

The invention can be used for an electron beam inspection device that uses an electron beam to inspect for foreign materials on a specimen, such as a semiconductor wafer, and for defects or the like.

[Second Point of View]

The second point of view relates to observation of insulating and conductive areas.

A purpose of the invention is to provide a technique capable of observing with a high contrast a specimen surface on which insulating and conductive areas are formed.

A specimen observation device of the invention comprises: an electron beam source for irradiating a specimen surface on which an insulating area and a conductive area are formed with an imaging electron beam; an E×B filter for directing electrons which have obtained structural information on the specimen surface by the irradiation with the imaging electron beam, wherein the E×B filter directs the electrons according to the speed of the electrons which move in a direction opposite to an incident direction of the imaging electron beam and using electric and magnetic fields; a detector for detecting the electrons directed by the E×B filter and acquiring an image of the specimen surface from the detected electrons; and an irradiation energy setting unit (a charging electron beam irradiation means) for setting the irradiation energy of the imaging electron beam in a transition region in which the electrons include both mirror electrons and secondary electrons.

This allows an image of the specimen surface to be acquired by using an energy range in the transition region in which the material contrast of an image is high. Consequently, an image in which the insulating and conductive areas can be distinguished from each other by the high contrast can be obtained.

In the invention, the electron beam source may irradiate with a charging electron beam in advance of the irradiation with the imaging electron beam in order to charge the insulating area on the specimen surface, and the E×B filter may selectively guide electrons which have obtained structural information on the conductive area or electrons which have obtained structural information on the insulating area to the detector.

This allows the insulating area to be negatively charged by the advance irradiation with the electron beam before imaging. The potential difference between the insulating area and the conductive area being at ground potential can be increased. Accordingly, the material contrast between the insulating and conductive areas can be further increased.

The device of the invention may further have a charging electron beam irradiation unit (a charging electron beam irradiation means) for irradiating with a charging electron beam in advance of the irradiation with the imaging electron beam in order to charge the insulating area on the specimen surface, and the E×B filter may selectively guide electrons which have obtained structural information on the conductive area or electrons which have obtained structural information on the insulating area to the detector.

This allows the insulating area to be negatively charged. The potential difference between the insulating area and the conductive area being at ground potential can be increased. Accordingly, the material contrast between the insulating and conductive areas can be further increased. The use of the exclusive electron beam irradiation unit for charging allows for quick switching between the charging and imaging electron beams, allowing observation time to be reduced.

The device of the invention may have: an NA adjustment aperture having a plurality of types of NA apertures different in aperture diameter; and an NA adjustment aperture moving mechanism for moving the NA adjustment aperture, where a contrast of the image may be optimized by adjusting the position of the NA aperture and the aperture diameter so that the electrons having structural information on the conductive area go through the NA aperture.

Here the NA adjustment aperture is an aperture according to the invention at least one of the position and diameter of which can be adjusted. The above-described configuration allows the electrons from the conductive area to be distinguished and separated from the electrons from the insulating area even near the detector. Consequently, the electrons from the conductive area can be reliably detected, and the material contrast between the conductive and insulating areas can be further increased.

In the invention, the detector may be an EB-CCD or EB-TDI for directly detecting the electrons.

This allows a high-resolution image to be acquired by using a detector of a high-resolution type that can directly detect the electrons with low signal loss.

In the invention, the specimen surface may include a contact plug formed on a semiconductor wafer or a contact structure of a reticle where the square measure of the insulating area is larger than that of the conductive area.

A contact plug on a semiconductor wafer and a contact structure of a reticle have a conductive area of a very small square measure as compared to the square measure of the insulating area. That is, the area ratio of the conductive area is very small. In such a case, the invention can increase the material contrast, and can acquire an image in which the conductive area is isolated in some way. Observation or inspection of a specimen having a high insulating-material area ratio can thus be carried out easily.

A semiconductor manufacturing method of the invention comprises the steps of: processing a semiconductor wafer; and using the above-described specimen observation device to observe a specimen surface of the processed semiconductor wafer.

Consequently, whether the semiconductor wafer is good or bad can be observed or inspected for by an image with a high material contrast in a semiconductor manufacturing process. Defects and the like can therefore be found easily.

The invention is a specimen observation method comprising: irradiating a specimen surface on which an insulating area and a conductive area are formed with an imaging electron beam; and detecting electrons which have obtained structural information on the specimen surface and acquiring an image of the specimen surface, where the imaging electron beam with which the specimen surface is irradiated has an irradiation energy in a transition region in which the electrons include both mirror electrons and secondary electrons.

This allows an image to be acquired by using an energy range in which the material contrast in the image between a conductive material and an insulating material is large. Consequently, an image that can be easily observed can be acquired.

The method of the invention may comprise irradiating with a charging electron beam that charges the insulating area on the specimen surface, before the irradiation with the imaging electron beam.

This allows the insulating area to be negatively charged. The potential difference between the insulating area and the conductive area being at ground potential can be increased. Accordingly, the speed of the electrons generated by the irradiation with the electron beam can be made to differ depending on the material. The material contrast can be further increased.

A semiconductor manufacturing method of the invention comprises the steps of: processing a semiconductor wafer; and using the above-described specimen observation method to observe a specimen surface of the processed semiconductor wafer.

Consequently, the surface of the semiconductor wafer during a semiconductor manufacturing process can be observed or inspected by using an image with a high material contrast. Defects and the like can therefore be found easily.

Advantages of the Invention

The invention allows an image with a high material contrast between insulating and conductive areas on a specimen surface to be acquired.

Embodiment of the Invention

Now, the invention will be described in detail. The following detailed description and appended drawings are not intended to limit the invention. Rather, the scope of the invention is defined by the appended claims.

FIG. 35 shows an example of a configuration of a specimen observation device according to an embodiment of the invention. In FIG. 35, the specimen observation device comprises an electron beam source 1010, a primary lens 1020, a condenser lens 1030, an ExB 1040, a transfer lens 1050, an NA (numerical aperture) adjustment aperture 1060, a projection lens 1070, a detector 1080, an image processing device 1090, a stage 1100, an irradiation energy setting unit 1110, and a power supply 1115. The specimen observation device may comprise a charging electron beam irradiation unit 1120 as required. Moreover, as shown in FIG. 35, a specimen 1200 is placed on the stage 1100 as a component related to the specimen observation device. The specimen 1200 has a specimen surface 1201 on its surface.

In the above-described configuration, the primary lens 1020 and the like comprise the primary optical system of the invention. In the invention, the electron beam source may also be included in the primary optical system. The transfer lens 1050, the NA adjustment aperture 1060, the projection lens 1070, and the like comprise the secondary optical system of the invention. In the invention, the detector 1080 may also be included in the secondary optical system. The image processing device 1090 is included in the image processor of the invention.

The electron beam source 1010 is a means of irradiating the specimen surface 1201 of the specimen 1200 with an electron beam. The electron beam source 1010 comprises, for example, an electron source 1011, a Wehnelt electrode 1012, and an anode 1013. The electron beam source 1010 generates electrons by means of the electron source 1011, extracts the electrons by means of the Wehnelt electrode 1012, accelerates the electrons by means of the anode 1013, and emits the electron beam toward the specimen surface 1201.

The electron beam source 1010 may generate an electron beam having a predetermined area capable of including a plurality of pixels so that the plurality of pixels can be imaged simultaneously. Such an electron beam of a large diameter can be called a planar electron beam. This allows a plurality of pixels to be simultaneously imaged by single irradiation of the specimen surface 1201 with the electron beam. A two-dimensional image of a large area can therefore be acquired quickly.

The irradiation energy setting unit 1110 is a means of setting the irradiation energy of the electron beam. The irradiation energy setting unit 1110 includes the power supply 1115. The power supply 1115 supplies the electron beam source 1010 with power, causing the electron source 1011 to generate electrons. The negative electrode of the power supply 1115 is connected to the electron source 1011 in order to cause the electron source 1011 to generate electrons. The irradiation energy of the electron beam is determined by the potential difference between the specimen 1200 and an electron source cathode. The electron source cathode is a cathode provided on the electron source 1011 of the electron beam source 1010. The irradiation energy setting unit 1110 can thus adjust and set the irradiation energy by adjusting the voltage of the power supply 1115. The voltage of the power supply 1115 is hereinafter referred to as the "acceleration voltage." In the embodiment, the material contrast of the acquired image is increased by the irradiation energy setting unit 1110 setting the irradiation energy of the electron beam to an appropriate value. A specific method of setting the irradiation energy will be described later.

The primary lens 1020 is an optical means for applying an electric field or a magnetic field to the electron beam emitted from the electron beam source 1010, thereby deflecting the electron beam and guiding it to a desired irradiation area on the specimen surface 1201. As shown in FIG. 35, a plurality of primary lenses 1020 may be used. A quadrupole lens, for example, may be applied to the primary lens 1020.

The E×B 1040 is a means for applying electric and magnetic fields to the electron beam or electrons and setting a direction for the electron beam or electrons with the Lorentz force, thereby directing the electron beam or electrons in a predetermined direction. The electric and magnetic fields of the E×B 1040 are set so as to generate the Lorentz force that directs the electron beam emitted from the electron beam source 1010 in the direction of the specimen surface 1201. As for electrons which have obtained structural information on the specimen surface 1201 by the irradiation of the specimen surface 1201 with the electron beam, the electric and magnetic fields of the E×B 1040 are set so as to allow the electron beam to go straight upward in the direction of the detector 1080. This can separate the electron beam entering the specimen surface 1201 and the electrons being generated from the specimen surface 1201 and moving in a direction opposite to the incident direction. The E×B is called a Wien filter. The term E×B filter is therefore used in the invention.

The condenser lens 1030 is a lens for forming an image of the electron beam on the specimen surface 1201 as well as causing the electrons which have obtained structural information on the specimen surface 1201 to converge. The condenser lens 1030 is therefore placed in the closest vicinity of the specimen 1200.

The transfer lens 1050 is an optical means for guiding the electrons that have gone through the E×B 1040 in the direction of the detector 1080 as well as causing a crossover to occur near an NA aperture 1061 of the NA adjustment aperture 1060.

The NA adjustment aperture 1060 is a means for adjusting the number of passing electrons. The NA adjustment aperture 1060 has the NA aperture 1061 in the center (that is, the NA adjustment aperture 1060 is the aperture member, and the NA aperture 1061 is the opening). The NA adjustment aperture 1060 functions as a path to the detector 1080 that allows the electrons having risen from the specimen surface 1201 and guided by the transfer lens 1050 to go through. The NA adjustment aperture 1060 blocks electrons that will be noise in the imaging so that they will not go toward the detector 1080, thereby adjusting the number of passing electrons. In the embodiment, the NA adjustment aperture 1060 selectively allows one of electrons which have obtained structural information on a conductive area on the specimen surface 1201 and electrons which have obtained information on an insulating area on the specimen surface 1201 to go through, and blocks the other electrons. The detail will be described later.

The projection lens 1070 is a final focusing means, and acts on the electrons having gone through the NA adjustment aperture 1060 to form the image on a detection surface 1081 of the detector 1080.

The detector 1080 is a means for detecting the electrons which have obtained structural information on the specimen surface 1201 by the irradiation of the specimen surface 1201 with the electron beam, and acquiring an image of the specimen surface 1201. Various types of detectors may be applied to the detector 1080. The detector 1080 may be, for example, a CCD (charge coupled device) detector allowing for parallel image acquisition, or a TDI (time delay integration)-CCD detector. The detector 1080 is of a two-dimensional imaging type such as a CCD and TDI-CCD, and the electron beam source 1010 irradiates a predetermined area including a plurality of pixels with the planar beam. Consequently, beam irradiation of one place allows parallel imaging to be performed, allowing an image of a large area to be acquired. Quick observation of the specimen surface 1201 can thus be carried out. A CCD and TDI-CCD are detection elements that detect light and output an electrical signal. For this reason, application of a CCD or TDI-CCD to the detector 1080 requires a fluorescent plate for converting electrons to light and an MCP (micro channel plate) for multiplying electrons. These components may be included in the detector 1080.

The detector 1080 may be an EB-CCD or EB-TDI. An EB-CCD and EB-TDI are similar to a CCD and TDI-CCD in that these are detectors of a two-dimensional imaging type. However, an EB-CCD and EB-TDI directly detect electrons, and output an electrical signal without the conversion between light and electrons. The above-mentioned fluorescent plate and MCP are therefore not required. Since intermediate signal loss decreases, a high-resolution image can be acquired. An EB-CCD or EB-TDI of such a high-resolution type may be applied to the detector 1080.

The image processing device 1090 is a device for generating an image of the specimen surface 1201 based on the electrical signal outputted from the detector 1080. Specifically, a two-dimensional image is generated based on coordinate information and brightness information outputted from the detector 1080. In the embodiment, the specimen 1200 with an insulating material and a conductive material included in the specimen surface 1201 is observed. Preferably, a difference in brightness occurs between the insulating and conductive areas, and an image with a high material contrast is acquired. The image processing device 1090 performs required image processing and image generation so that such requirements can be satisfied and a good image can be acquired.

The stage 1100 is a means for supporting the specimen 1200 with the specimen 1200 being placed on the top surface. The stage 1100 may be movable in a horizontal direction, such as the x-y directions, and rotatable in a horizontal direction so that the whole area to be observed on the specimen surface 1201 can be irradiated with the electron beam. The stage 1100 may also be movable in a vertical direction, i.e. the z direction, as required. A motor, air, or other moving means may be provided in order to configure the stage 1100 to be movable.

The charging electron beam irradiation unit 1120 is a beam irradiation means provided to charge the specimen surface 1201. The charging of the specimen surface 1201 is performed before the electron beam source 1010 irradiates with the imaging electron beam for imaging. The charging electron beam irradiation unit 1120 may be provided as required. The advance irradiation of the insulating area on the specimen surface 1201 with the electron beam before imaging the specimen surface 1201 negatively charges the insulating area. On the other hand, the conductive area is always at ground potential. Consequently, a potential difference can be made on the specimen surface 1201 according to the material. This potential difference can increase the material contrast between the conductive and insulating areas. As seen above, the charging electron beam irradiation unit 1120 is suitably provided when the specimen surface 1201 is to be irradiated with the charging electron beam before the imaging electron beam.

The charging electron beam irradiation unit 1120 need not be used in another configuration. The electron beam source 1010 may irradiate with the charging electron beam, and then the identical electron beam source 1010 may irradiate the specimen surface 1201 with the imaging electron beam. The same charging electron beam irradiation can also be performed in this configuration. The charging electron beam irradiation unit 1120 may therefore be provided, for example, when the specimen surface 1201 is to be irradiated with the charging electron beam and, particularly, the imaging electron beam irradiation is to be performed immediately after the charging electron beam irradiation. Generally, the irradiation energy is different between the imaging electron beam and the charging electron beam. The provision of the charging electron beam irradiation unit 1120 can eliminate the need for the adjustment of the irradiation energy between the charging electron beam irradiation and the imaging electron beam irradiation. Consequently, the imaging can be quickly carried out. The charging electron beam irradiation unit 1120 is suitably provided when reduction of the observation time or the like is strongly demanded. This can respond to the demand for reduction of the observation time.

The specimen 1200 includes, in the specimen surface 1201 of its surface, the insulating area formed of the insulating material and the conductive area formed of the conductive material. The specimen 1200 may be applied in various types of shapes. The specimen 1200 may be, for example, a substrate such as a semiconductor wafer and a reticle. The specimen observation device according to the embodiment can suitably observe the specimen surface 1201 when the area ratio of the insulating area is larger than that of the conductive area. For example, the area ratio of the conductive area is small when the specimen 1200 is a contact plug on a semiconductor wafer or contact structure of a reticle. In such a case, an image of the specimen surface 1201 can be satisfactorily acquired and the observation can be satisfactorily carried out. Various types of materials may be applied to the conductive material and the insulating material. For example, the conductive material may be W (tungsten) or other plug materials. The insulating material may be $SiO_2$ (silicon dioxide film) used as an insulating layer of a semiconductor wafer, or the like.

Now, details of specimen observation to be carried out by using the specimen observation device according to FIG. 35 will be specifically described.

FIGS. 36A and 36B show an example of a relation between the irradiation energy of the imaging electron beam and the material contrast. FIG. 36A shows an example of images varying depending on the irradiation energy range. FIG. 36B shows a correlation between the irradiation energy of the imaging electron beam and the detector current.

In FIG. 36B, the horizontal axis represents the irradiation energy (the landing energy LE) of the imaging electron beam, and the vertical axis represents the magnitude of the detector current in the detector 1080. In FIG. 36B, the characteristic curve indicated by a solid line represents a tendency of the NA adjustment aperture 1060 having an aperture diameter of 10 to 300 μm. The characteristic curve indicated by a chain line represents a tendency of the NA adjustment aperture 1060 having an aperture diameter of 1000 to 3000 μm. When the aperture diameter is 10 to 300 μm, the secondary electron region is LE=2 to 10 eV, the transition region is LE=−2 to 2 eV, and the mirror electron region is a region in which LE is −2 eV or less.

Here secondary electrons are included in the secondary emission electrons of the invention, and the secondary electron region in FIG. 36B is an example of the secondary emission electron region of the invention. The secondary emission electrons refer to electrons that are emitted from the specimen 1200 by the electron beam colliding with the specimen surface 1201. The secondary emission electrons may include reflected electrons, backscattered electrons, and the like in addition to so-called secondary electrons. Reflected electrons are electrons having a reflected energy approximately equal to the incident energy. Backscattered electrons are electrons scattered back. However, secondary electrons are mainly detected among the secondary emission electrons. Secondary electrons may thus be described as major secondary emission electrons in the following description of the invention. Secondary electrons have the property of the behavior of their emission from the specimen 1200 following the cosine law.

Mirror electrons refer to electrons that are reflected without colliding with the specimen surface 1201. More specifically, the electron beam goes toward the specimen surface 1201, does not collide therewith, turns around in the opposite direction in the vicinity thereof, and consequently becomes mirror electrons. For example, suppose that the potential of the specimen surface 1201 is at a negative potential and the landing energy of the electron beam is small. In this case, the electron beam, under the effect of the electric field in the vicinity of the specimen surface 1201, does not collide therewith and turns around in the opposite direction, and this phenomenon causes mirror electrons to be generated. In the specimen observation device and specimen observation method according to the embodiment, mirror electrons are "electrons that are reflected turning around in the opposite direction without colliding with the specimen surface 1201," as described above.

In FIG. 36B, the secondary electron region is a region of the landing energy LE=2 to 10 eV. In the secondary electron region, the detection current considerably varies depending on the difference in the aperture diameter of the NA adjustment aperture 1060. This is because the secondary electrons' angle of emission from the specimen surface is determined by the cosine law and the spread of the electrons becomes large at the position of the NA adjustment aperture 1060.

If the landing energy LE decreases to 2 eV or less, mirror electrons gradually increase. This energy region is the transition region in which mirror electrons and secondary electrons are mixed. In the transition region, the difference in the detector current depending on the difference in the size of the aperture diameter of the NA adjustment aperture 1060 is small.

When the landing energy LE is −2 eV or less, the emission of secondary electrons cannot be seen, and the amount of emission of mirror electrons becomes constant. This region is the mirror electron region. In the mirror electron region, the difference in the detector current depending on the size of the aperture diameter of the NA adjustment aperture 1060 cannot be seen. From this, mirror electrons are considered to converge at the position of the NA adjustment aperture 1060. The range of convergence is considered to be about φ300 μm or less but not less than φ10 μm. Being reflected without colliding with the substrate surface, mirror electrons have a high directivity, a high straight-advancing characteristic, and a narrow range of convergence.

In FIG. 36B, the aperture diameter is 10 to 300 μm and 1000 to 3000 μm. These were used as two appropriate aperture diameter ranges for obtaining the two tendency indicated by the solid and dashed lines. The characteristic curves are considered to represent the same tendency when the aperture diameter is less than 10 μm or more than 3000 μm. Here the aperture diameter was determined to be 10 μm or more but not exceeding 3000 μm because of a measurement limit due to an increase in noise.

FIG. 37 schematically shows the phenomenon of generation of mirror electrons and secondary electrons depending on the landing energy LE of an irradiation electron beam. Both mirror electrons and secondary electrons obtain structural information on the specimen surface 1201. There is a difference in angle between the mirror electrons and the secondary electrons, as described with reference to FIGS. 36A and 36B.

FIG. 37 shows a relation between the effective landing energy and the behavior of electrons for the mirror electron region and transition region.

In the example in FIG. 37, the mirror electron region is a region in which the effective landing energy LE is 0 eV or less. In the mirror electron region, the irradiation electron beam does not collide with the specimen surface 1201 but is reflected in the air to become mirror electrons. As shown in FIG. 37, when the irradiation beam perpendicularly enters the specimen surface 1201, the mirror electrons are also perpendicularly reflected, and the direction of movement of the electrons is constant.

In the transition region, on the other hand, mirror electrons do not collide with the specimen surface 1201 but turn around in the air to be reflected. This phenomenon is the same as that of the mirror electrons in the mirror electron region. However, the irradiation electron beam partly collides with the specimen surface 1201, and consequently secondary electrons are emitted from the inside of the specimen 1200 into the air. Here, since the irradiation electron beam perpendicularly enters the specimen surface 1201, the mirror electrons are reflected in a vertical direction. The secondary electrons, however, are diffused in various directions following the cosine law. The cosine law distribution has a cosine relation in a vertical direction. The higher the landing energy is, the larger the ratio of secondary electrons becomes as compared to that of mirror electrons.

As shown in FIG. 37, mirror electrons have a constant direction of movement and a good directivity, but secondary electrons have a direction of movement dispersed in accordance with the cosine law, and do not have a good directivity.

In the above-described example, the transition region is between −2 eV and 2 eV. The transition region is a region in which mirror electrons and secondary electrons are mixed. The inventors and others have found from various experimental experiences that such a phenomenon of transition (phenomenon of mixture) occurs in an energy range described below, and that the use of that region is very effective in pattern imaging.

In an electron beam of the primary system for irradiation, it is preferable that the landing energy LE is in a range LEA≤LE≤LEB or LEA≤LE≤LEB+5 eV.

Details of this will next be described specifically. FIG. 38 shows a change in the gray level of the specimen surface 1201 versus the landing energy LE. Here the gray level corresponds to the brightness of an image, and is in proportion to the number of electrons to be obtained by the detector 1080.

In FIG. 38, the region in which the landing energy LE is LEA or less is the mirror electron region. The region in which the landing energy LE is LEB or more is the secondary electron region. The region in which the landing energy LE is LEA or more but not exceeding LEB is the transition region. In many confirmatory results related to the invention, the preferable range from LEA to LEB was from −5 eV to +5 eV. That is, LEA and LEB preferably satisfy a relation −5 eV≤LEA≤LEB≤+5 eV.

How mirror electrons are generated is different between the insulating and conductive areas. This causes a difference in the characteristic line, i.e. causes a difference in gray level, forming a contrast with a large gray-level difference. That is, the difference in material and structure causes a difference of the characteristic line between the insulating and conductive areas, forming a difference in gray level. Actually, the above-described range of the landing energy LE has been found to be important. It is very effective to use the landing energy LE in the region −5 eV≤LEA≤LEB≤+5 eV, or in the region LEA≤LE≤LEB+5 eV (e.g. from −5 eV to +10 (=5+5) eV).

Returning to FIG. 36A, the contrast between the insulating and conductive materials in each electron generation region will be described. The conductive and insulating materials may be various materials formed of a conductor and an insulator. For example, the conductive material may be W (tungsten), and the insulating material may be SiO$_2$ (silicon dioxide film) or the like.

FIG. 36A is an example of the material contrast in each electron generation region, showing the material contrast in the secondary electron region, transition region, and mirror electron region. Focusing attention on the material contrast in the mirror electron region first, there is no difference between the conductive and insulating materials. This is because, in the mirror electron region, electrons are reflected in front of the specimen surface 1201, and therefore the difference in contrast between the conductive and insulating materials disappears. In both transition region and secondary electron region, there is a difference between the conductive and insulating materials. The difference in contrast between the conductive and insulating materials is larger in the transition region. This is considered to be because electrons to be detected include mirror electrons. It is considered that the amount of signals increases and the contrast increases since mirror electrons have a good directivity.

As seen above, the contrast between the conductive and insulating materials can be increased by acquiring an image of the specimen surface 1201 in the transition region in which secondary electrons and mirror electrons are mixed.

The insulating area on the specimen surface 1201 may be irradiated with an electron beam in the transition region in advance of the imaging. This causes the insulating material to be charged, changing the potential to be about several electron volts below zero. On the other hand, the potential of the conductive material is constant ground potential. Because of the difference in energy, the path of electrons which have obtained structural information on the insulating material is deflected in the E×B 1040 as compared to electrons which have obtained structural information on the conductive material. Electrons that reach the detector 1080 can thus be limited to the electrons which have obtained structural information on the conductive material, by performing an appropriate adjustment. The transition region is an energy region in which secondary electrons and mirror electrons are mixed. When secondary electrons and mirror electrons are mixed, the path of electrons from the insulating area is shifted for both electrons. Here the force in the direction of an electric field is F=e·E (where e is the charge of an electron 1.602×10$^{-19}$ C, and E is the electric field, V/m), and the force acting on electrons is independent of the velocity v m/s. On the other hand, the force in the direction of a magnetic field is F=e·(v×B), which depends on the velocity of electrons v m/s. The E×B condition (Wien condition) is usually set so that electrons emitted from a conductive substrate go straight. However, a change in the velocity of electrons v m/s causes a change in the force in the direction of the magnetic field. For this reason, the path of electrons is shifted downstream from the E×B 1040 (on the detector 1080 side).

FIGS. 39A and 39B are schematic drawings showing an example of the path of electrons which have obtained structural information of the specimen surface 1201. FIG. 39A is a side view of the electron path, and FIG. 39B is a partially enlarged view showing the electron path.

In FIG. 39A, the specimen 1200 is placed below. A negative potential is applied to the specimen 1200 by a specimen power supply 1101. In the specimen 1200, a conductive material 1202 is covered with an insulating material 1203. A hole 1204 is a cut in the insulating material 1203. The conductive material 1202 is exposed through the hole 1204 and forms a part of the specimen surface 1201. In a contact structure of a reticle, for example, the bottom of the hole 1204 is often formed of the conductive material 1202 as in the specimen 1200 shown in FIG. 39A. Only the E×B 1040, the NA adjustment aperture 1060, and the detector 1080 are shown as components of the specimen observation device.

In FIG. 39A, an electron beam EB is emitted from upper right. The electron beam is deflected by the E×B 1040 and perpendicularly enters the specimen surface 1201. Among electrons which have obtained structural information on the specimen surface 1201, electrons ec have obtained structural information on the conductive area 1202. These electrons ec go straight through the NA aperture 1061 of the NA adjustment aperture 1060. On the other hand, electrons ei are electrons which have obtained structural information on the insulating area 1203. The electrons ei change their path, go to places surrounding the NA aperture 1061, and collide with a member part of the NA adjustment aperture 1060. That is, the electrons ec which have obtained structural information on the conductive area 1202 reach the detector 1080, but the electrons ei which have obtained structural information on the insulating area 1203 do not reach the detector 1080.

In this example, the insulating material 1203 makes up most of the specimen surface 1201, and a part thereof (the bottom of the hole 1204) is made up by the conductive material 1202. Such structure is often seen in a contact structure of a reticle. In such a structure, the embodiment guides only the electrons ec which have obtained surface structural information on the conductive material 1202 to the detector 1080, and prevents the electrons ei which have obtained surface structural information on the insulating material 1203 from reaching the detector 1080. This allows a specifically high-contrast image to be acquired. Here the electrons ec and ei include both mirror electrons and secondary electrons.

Such classification and detection of electrons according to the type of material may be applied to another specimen than a reticle and, for example, can be applied as well to detection of a line/space pattern on a semiconductor wafer or the like.

FIG. 39B shows an enlarged view of the NA adjustment aperture 1060 seen from below. The NA aperture 1061 is formed in a part of the rectangular NA adjustment aperture 1060. The electrons ec have obtained structural information on the conductive area 1202. These electrons ec are included within the NA aperture 1061, and can therefore go through the NA aperture 1061. On the other hand, the electrons ei are electrons which have obtained structural information on the insulating area 1203. Most of the electrons ei are blocked by the NA adjustment aperture 1060 and cannot go through the NA aperture 1061.

The electron paths of mirror electrons from the conductive material 1202 and insulating material 1203 have a crossover point at the position of the NA adjustment aperture 1060, where they form a minimum spot of 100 μm. The NA adjustment aperture 1060 can therefore easily and selectively separate the electrons ec which have obtained structural information on the conductive material 1202, using the path shift performed by the E×B 1040. This separation can be carried out without a loss in optical resolution. When there is a large difference in charge potential between the materials, the path shift at the position of the NA adjustment aperture 1060 is also large. Accordingly, the NA adjustment aperture 1060 having a larger aperture diameter can be used, the number of electrons to be detected can be increased, and an image can be formed suitably.

When the insulating area 1203 on the specimen surface 1201 is irradiated with the charging electron beam before the irradiation with the imaging electron beam, the electron beam source 1010 may be used. The charging electron beam irradiation unit 1120 may also be used if installed. The specimen surface 1201 of the specimen 1200 may be irradiated with the charging electron beam in a state where the imaging is not performed by the detector 1080. Then, only the insulating area 1203 requires to be irradiated with the charging electron beam. However, even if the conductive area 1202 is irradiated with the charging electron beam, the surface potential will be zero potential. The conductive area 1202 and the insulating area 1203 therefore do not require to be particularly distinguished from each other, and the imaging area on the specimen surface 1201 may be irradiated with the charging electron beam with predetermined irradiation energy.

FIGS. 40A and 40B illustrate an optimum position of the NA aperture 1061 and, more specifically, show a relation between: the spreads of the paths of mirror electrons and secondary electrons at the position of the NA adjustment aperture 1060; and an optimum position of the NA aperture 1061. FIG. 40A shows an optimum position of the NA aperture 1061 of the NA adjustment aperture 1060 for mirror electrons. FIG. 40B shows an optimum position of the NA aperture 1061 for secondary electrons. In FIGS. 40A and 40B, the black circle indicates the electrons ec which have obtained structural information on the conductive area 1202. The gray circle indicates the electrons ei which have obtained structural information on the insulating area 1203.

As shown in FIG. 40B, when electrons which have obtained structural information on the specimen surface 1201 are secondary electrons, the electrons ec emitted from the conductive area 1202 and the electrons ei emitted from the insulating area 1203 overlap in most of the area. In this case, the center of the NA aperture 1061 of the NA adjustment aperture 1060 is positioned approximately in the center of the path of the electrons emitted from the conductive area 1202. This position is considered to be an optimum position of the NA aperture 1061 of the NA adjustment aperture 1060. This allows the electrons ec emitted from the conductive area 1202 on the specimen surface 1201 to be detected with the highest part of the electron density of the electrons ec being the center. However, as shown in FIG. 40B, the electron path of the electrons ei emitted from the insulating area 1203 also almost completely overlaps the path of the electrons ec emitted from the conductive area 1202. For this reason, both electrons cannot be separately detected. Accordingly, in the secondary electron region, the conductive area 1202 and the insulating area 1203 will be distinguished from each other based on the difference in the signal between the secondary electrons ec emitted from the conductive area 1202 and the secondary electrons ei emitted from the insulating area 1203.

In FIG. 40A, on the other hand, there occurs a difference in the electron path between the mirror electrons ec which have obtained structural information on the conductive area 1202 and the mirror electrons ei which have obtained structural information on the insulating area 1203, and the centers of the two electron paths are positioned apart from each other. In such a case, for example, the NA aperture 1061 of the NA adjustment aperture 1060 is placed so that all the electrons ec which have obtained structural information on the conductive area 1202 go through but the electrons ei which have obtained structural information on the insulating area 1203 cannot easily go through the NA aperture 1061. This allows only the many electrons ec which have obtained structural information on the conductive area to be separated and be guided to the detector 1080. Accordingly, the material contrast between the conductive area 1202 and the insulating area 1203 can be increased. Conventionally, such separation would generally require a chromatic aberration corrector (a monochromator) comprising a plurality of magnetic and electric fields. However, the specimen observation device and specimen observation method according to the embodiment eliminate the requirement for the installation of a chromatic aberration corrector. The same effect can be obtained and a suitable image can be acquired with just the positional adjustment of the NA adjustment aperture 1060.

The examples in FIGS. 39A to 40B are configured so as to selectively guide the electrons ec which have obtained structural information on the conductive area 1202 to the detector 1080 and so as not to guide the electrons ei which have obtained structural information on the insulating area 1203 to the detector 1080. However, there can be an opposite configuration, which is achieved by setting the E×B 1040, positioning the NA adjustment aperture 1060, and adjusting the aperture diameter. That is, the variation is configured so as to selectively guide the electrons ei which have obtained structural information on the insulating area 1203 to the detector 1080 and so as not to guide the electrons ec which have obtained structural information on the conductive area 1202 to the detector 1080. As seen above, the embodiment selectively guide either the electrons ec which have acquired structural information on the conductive area 1202 or the electrons ei which have acquired structural information on the insulating area 1203 to the detector 1080. Which electrons are to be guided and detected may be determined freely as appropriate depending on the intended use.

Now, examples of measurement results will be described. The following experiment examples show measurement results of the material contrast obtained under various conditions by the specimen observation device and method according to the embodiment.

Experiment Example 1

FIGS. 41A and 41B show a structure of the specimen 1200 to be observed in Experiment example 1 and an example of an acquired image. FIG. 41A shows a cross-sectional structure of a contact plug which is the specimen 1200. FIG. 41B shows an example of an acquired image of the specimen surface 1201 having the contact plug structure.

In FIG. 41A, the insulating area 1203 and the conductive area 1202 are formed on a semiconductor substrate, silicone substrate 1205. The insulating area 1203 is formed of $SiO_2$. The conductive area 1202 is formed of a tungsten material and has a contact-plug shape. The planar structure of the specimen surface 1201 is based on the insulating area 1203, and the conductive area 1202 is formed in the base as a spot or circle.

FIG. 41B is an example of an image of the specimen surface 1201 acquired in a specimen observation, where the insulating area 1203 is the black base part of the image. The white circular conductive area 1202 is isolated from the black base. As seen above, the embodiment can acquire an image in which the insulating area 1203 and the conductive area 1202 are easily distinguished from each other and can also easily carry out an observation of and inspection for defects and the like, by increasing the material contrast.

In the example in FIG. 41B, the insulating area 1203 appears black with low illumination, and the conductive area 1202 appears white with high illumination. In order to obtain this image, for example, the position of the NA aperture 1061 of the NA adjustment aperture 1060 is adjusted so that electrons generated from the insulating area 1203 is selectively detected, as described above.

An example of the setting conditions of the specimen observation method for acquiring such a high-contrast image will next be described.

FIGS. 42A and 42B show a measurement result of the specimen observation method. The setting conditions of the specimen observation are as follows. The cathode voltage of the electron source 1011 of the electron beam source 1010 is between −3995 and −4005 eV. The voltage of the specimen surface 1201 is −4000 eV. The landing energy LE is −1 eV, and the landing energy was thus optimized in the transition region. The irradiation current density of the electron beam is 0.1 mA/cm$^2$. The pixel size of the detector 1080 is 50 nm/pix. The aperture diameter of the NA aperture 1061 of the NA adjustment aperture 1060 is (φ150 μm. The predose amount of the charging electron beam is 1 mC/cm$^2$.

FIG. 42A is a table showing a result of observing the contact plug having the cross-sectional structure in FIG. 41A with the landing energy of the electron beam being varied under the above-described conditions. FIG. 42B is a graph of the measurement result in FIG. 42A.

In FIG. 42B, the horizontal axis represents the landing energy LE, and the vertical axis represents the average gray level of an acquired image. The characteristic curve of the insulating area is indicated by a curved line connecting points indicated with approximately square-shaped marks. The characteristic curve of the conductive area is indicated by a curved line connecting points indicated with diamond-shaped marks. The contrast was calculated from the average gray levels of the insulating and conductive areas. The contrast is indicated by a curved line connecting points indicated with triangular marks. The contrast is calculated by an equation (1):

$$\text{Contrast} = |\text{Average gray level of conductive material} - \text{Average gray level of Insulating material}| / (\text{Average gray level of conductive material} + \text{Average gray level of Insulating material}) \qquad (1)$$

As seen above, the contrast is the absolute value of the "Average gray level of conductive material−Average gray level of Insulating material" divided by the "Average gray level of conductive material+Average gray level of Insulating material."

In FIGS. 42A and 42B, when the landing energy LE=−1 eV, the contrast is 0.8, which is the maximum. The landing energy LE=−1 eV is in the transition region in which mirror electrons and secondary electrons are mixed, as described with reference to FIG. 36B. It can therefore be seen that the maximum material contrast is obtained in the transition region.

In the above-described embodiment, the conditions of the E×B filter (Wien filter) were set so that mirror electrons or secondary emission electrons go straight in the direction toward the detector. However, the invention is not limited to the above. For example, either the primary beam (the electron beam with which the irradiation is performed) or the secondary beam (mirror electrons and secondary emission electrons) need not go straight. That is, both beams may be deflected by the effect of the E×B filter. For another example, the primary beam may go straight and the secondary beam may have a deflection angle caused by the effect of the E×B filter. These configurations are included in the scope of the invention.

Experiment Example 2

FIGS. 43A and 43B show a measurement result of Experiment example 2. FIG. 43A is a table of a measurement result showing a correlation between the dose amount of the charging electron beam and the contrast. FIG. 43B is a graph of the measurement result in FIG. 43A. Various setting conditions of the specimen observation device and the specimen 1200 to be measured are the same as those of Experiment example 1, and will not be described.

In Experiment example 2, the specimen surface 1201 was irradiated with the charging electron beam, and then the specimen surface 1201 was imaged. As shown in FIGS. 43A and 43B, when the advance irradiation was performed with the charging electron beam with 1 mC/cm$^2$ or more before the imaging, the contrast was 0.8 or more and a stable contrast was obtained. That is, when the dose amount of the charging electron beam was 1 mC/cm$^2$ or more, the charge in the insulating area 1203 on the specimen surface 1201 was saturated to cause a negative potential, providing a stable contrast.

Experiment Example 3

FIGS. 44A and 44B show a measurement result of Experiment example 3. FIG. 44A is a table of a measurement result showing a correlation between the position of the NA adjustment aperture 1060 and the contrast. FIG. 44B is a graph of the measurement result in FIG. 44A. Various setting conditions of the specimen observation device and the specimen 1200 to be measured are the same as those of Experiment example 1, and will not be described.

In FIGS. 44A and 44B, the measurement was made with the position of the NA aperture 1061 of the NA adjustment aperture 1060 being adjusted. As a result, a maximum contrast of 0.8 was obtained when the aperture position was at the center position, 0 μm. This means that the electrons ec which have obtained structural information on the conductive area 1202 can be made to go through most when the center of NA aperture 1061 of the NA adjustment aperture 1060 coincides with the optical axis. In accordance with a movement of the NA adjustment aperture 1060 in the minus direction from the center, the contrast decreases due to interference by the electrons ei generated from the insulating area 1203. When the NA adjustment aperture 1060 moves reversely in the plus direction from the center, the signal of the electrons ec which have obtained structural information on the conductive area 1202 also decreases, and the contrast decreases. This result agrees with the description made with reference to FIG. 40A.

Experiment Example 4

FIGS. 45A and 45B show a measurement result of Experiment example 4. FIG. 45A is a table of a measurement result showing a correlation between the specimen surface 1201 and the contrast. FIG. 45B is a graph of the measurement result in FIG. 45A. Various setting conditions of the specimen observation device and the specimen 1200 to be measured are the same as those of Experiment example 1, and will not be described.

In FIGS. 45A and 45B, the optimum conditions derived from the measurement results in Experiment examples 1 to 3 were applied. The contrast was then measured with the area ratio between the conductive area 1202 and insulating area 1203 on the specimen surface 1201 being varied. In this measurement, the area ratio is a ratio between pattern widths. In FIGS. 45A and 45B, LEEM stands for low-energy electron microscopy, indicating a measurement result of the specimen observation device according to the embodiment. SEM indicates a measurement result of a conventional scanning electron microscope, which is shown for comparison with the invention.

In the embodiment (LEEM), mainly the conductive area 1202 has a high brightness and is bright, as shown in FIG. 41B. For this reason, when the area ratio of the conductive area 1202 decreases, the conductive area 1202 becomes less susceptible to interference from the surroundings, and the contrast increases. In the SEM method (e.g. the landing energy is about 1000 eV), the insulating material 1203 is bright depending on the secondary electron emission coefficient of the material. An increase in the area ratio of the insulating material 1203 would cause the signal of the conductive area 1202 to disappear by the spread of the path of secondary electrons. As a result, the contrast would become extremely low.

As shown in FIGS. 45A and 45B, when the area ratio between the conductive area 1202 and insulating area 1203 is small, the difference in contrast is still relatively small between the embodiment (LEEM) and the conventional SEM. When the conductive area 1202: the insulating area 1203=1:2, the difference in contrast is about 0.3. The contrast in the embodiment (LEEM) increases with an increase in the square measure of the insulating area 1203 in the specimen surface 1201. Meanwhile, the contrast in the conventional SEM decreases. When the conductive area 1202: the insulating area 1203=1:10, the difference in contrast reaches 0.75.

As seen above, the specimen observation device according to the embodiment is particularly effective for the observation of the specimen surface 1201 of the specimen 1200 in which the area ratio of the conductive material 1202 is small. When the specimen surface 1201 has a contact structure in which the ratio of the insulating material 1203 is large, an image with a high material contrast can be acquired, which provides a great advantage. Reversing the object to be detected allows the observation to be effectively performed also on the specimen 1200 having the specimen surface 1201 in which the ratio of the insulating material 1203 is low and the ratio of the conductive material 1202 is high.

[Another Embodiment] (Aperture Moving Mechanism)

FIG. 46 shows an example of a configuration of a specimen observation device according to another embodiment. In FIG. 46, the specimen observation device comprises the electron beam source 1010, the primary lens 1020, the condenser lens 1030, the E×B 1040, the transfer lens 1050, an NA adjustment aperture 1060a, the projection lens 1070, the detector 1080, the image processing device 1090, the stage 1100, the energy setting unit 1110, and the power supply 1115. The charging electron beam irradiation unit 1120 may be provided as required. As a related component, the specimen 1200 is placed on the stage 1100 with the specimen surface 1201 being the top surface. Discussing in relation to the above description, the configuration of the embodiment is the same as that of the aforementioned embodiment in FIG. 35. The same components as those of the embodiment in FIG. 35 are given the same reference symbols, and will not be described.

A difference with the embodiment in FIG. 35 is that, in the specimen observation device in FIG. 46, the NA adjustment aperture 1060a has a movable and multiple-selection-type NA adjustment aperture moving mechanism.

The NA adjustment aperture 1060a has a plurality of NA apertures 1061 and 1062 of different sizes. The NA adjustment aperture 1060a is the aperture member, and the NA apertures 1061 and 1062 are the openings. A movement of the NA adjustment aperture 1060a in a horizontal direction allows the NA apertures 1061 and 1062 to be interchanged.

As seen above, the specimen observation device according to the embodiment has the NA adjustment aperture 1060a having a plurality of types of NA apertures 1061 and 1062 of different aperture diameters, and these are configured to be interchangeable. Consequently, an aperture of an optimum size can be selected and an image with a high material contrast can be acquired according to various conditions such as the type of the specimen 1200 and the structure of the specimen surface 1201.

FIGS. 47A and 47B show examples of the movable NA adjustment aperture of the embodiment. FIG. 47A is a top view showing an example of a configuration of a slidably movable NA adjustment aperture 1060b. FIG. 47B is a top view showing an example of a configuration of a rotatably movable NA adjustment aperture 1060c. The NA adjustment apertures 1060b and 1060c are the aperture members, and NA apertures 1061 to 1064 are the openings.

In FIG. 47A, the NA adjustment aperture 1060b has a plurality of NA apertures 1061, 1062, and 1063 of different aperture diameters. The NA adjustment aperture 1060b also has a sliding-type NA adjustment aperture moving mechanism 1065 on both sides in the longitudinal direction.

In the embodiment, as seen above, the plurality of NA apertures 1061, 1062, and 1063 are formed in the rectangular plate-like NA adjustment aperture 1060b. The sliding-type NA adjustment aperture moving mechanism 1065 allows the NA adjustment aperture 1060b to move in a horizontal direction. Consequently, the aperture diameter and aperture position of the NA adjustment aperture 1060b can be adjusted depending on the intended use. An optimum image of the specimen surface 1201 can be acquired corresponding to the specimen 1200 and intended use of various types.

The sliding-type NA adjustment aperture moving mechanism 1065 is configured, for example, so as to sandwich the NA adjustment aperture 1060b between rail-like members from above and below. The moving mechanism has, for example, a linear motor. The NA adjustment aperture 1060b may also be put between rotary rail members, and may be moved by a rotary motor rotating the rotary rail members. The sliding-type NA adjustment aperture moving mechanism 1065 may be variously configured depending on the intended use.

In FIG. 47B, the NA adjustment aperture 1060c is a disc-like plate, has a plurality of NA apertures 1061 to 1064, and has a rotary NA adjustment aperture moving mechanism 1066 in the center. The aperture diameters of the NA apertures 1061 to 1064 are different from one another. The NA aperture 1061 is the largest. The aperture diameter becomes progressively smaller, and the NA aperture 1064 is the smallest. A rotary motor or the like may be applied to the rotary NA adjustment aperture moving mechanism 1066.

As seen above, the specimen observation device according to the embodiment may be configured, for example, so as to interchange the aperture diameters of the NA adjustment aperture 1060c using rotational movement.

In the embodiment, the plurality of aperture sizes can be selected, and the aperture position can be adjusted. Consequently, the intended use and the type of the specimen 1200 can be handled flexibly, and an image with an optimum contrast can be acquired under various conditions.

In the above description, the aperture position is adjusted in the x and y directions on a horizontal plane. The aperture position may also include a position in a direction of rotation, that is, an aperture angle, within the scope of the invention. The position in a direction of rotation may be adjusted by rotating the aperture on a horizontal plane, and the center of rotation may be the axis of the secondary optical system.

In the above description, the NA adjustment aperture 1060 is moved in the x and y directions on a horizontal plane by the moving mechanism. However, the moving mechanism may be configured, within the scope of the invention, to be able to move the NA adjustment aperture 1060 in a vertical direction (the z direction). This allows the aperture position to be adjusted also in the z direction. The z-axis direction is the axial direction of the secondary optical system. For example, the aperture may also be moved in the z-axis direction, the signal intensity may be measured, and the aperture position may be adjusted to a position where the signal intensity is the highest. The aperture is suitably placed in a position where the mirror electrons are most condensed. This very effectively reduces the aberration of the mirror electrons and cuts down the secondary emission electrons. Consequently, a higher S/N ratio can be obtained.

Moreover, the aperture shape may be adjusted in the embodiment. The aperture shape is suitably adjusted so as to match the spot shape (profile) of the mirror electrons at the aperture height. For example, the aperture shape may be an elliptical shape having the major axis in a direction corresponding to the longitudinal direction of the intensity distribution in the spot shape of the mirror electrons. This allows the number of detection of mirror electrons to be relatively increased. A plurality of aperture openings may be provided so as to function as one aperture. Those plurality of apertures may be arranged around the center of the intensity of the mirror electrons or may be arranged so as to surround the center of the intensity, so that the mirror electrons can be appropriately detected depending on the intended use and the properties. One of the plurality of aperture openings may be placed so as to coincide with the center of the intensity of the mirror electrons, so that an object distinctive in the scattering direction can be appropriately observed.

[Preferred Configuration of the Detector]

As describe before, the detector for electrons may be an EB-CCD or EB-TDI. An EB-CCD or EB-TDI is configured to receive electrons directly. The use of these detectors allows an image with a high contrast to be acquired. The contrast will be about three times as compared to a conventional configuration comprising an MCP, an FOP (fiber optical plate), a fluorescent plate, and a TDI. This is because there is no deterioration caused by the transmission through an MCP and FOP. In particular, when light from the hole bottom 1202 of the contact structure is detected, the spot (dot) would be blurred with a conventional detector. An EB-CCD or EB-TDI is advantageous in terms of this point. Moreover, since there is no deterioration in gain caused by the use of an MCP, there is no unevenness in brightness on the effective imaging area, and the replacement cycle is long. Consequently, the cost and time for maintenance of the detector can be reduced.

As seen above, an EB-CCD and an EB-TDI are preferable in that they can acquire a high-contrast image, and are also preferable in terms of durability or the like. Here a preferable example using an EB-CCD and EB-TDI will be described further.

FIG. 48 shows a configuration of a detector 1080a. The detector 1080a is suitably used as the detector 1080 in FIG. 35 and the like. The detector 1080a has an EB-CCD 1081 and an EB-TDI 1082. The EB-TDI 1082 and the EB-CCD 1081 are interchangeable in the detector 1080a, and the detector 1080a is configured to be able to interchange and use them both depending on the intended use. The EB-CCD 1081 and the EB-TDI 1082 are electron sensors for receiving an electron beam, and let the electrons directly enter the detection surface. In this configuration, the EB-CCD 1081 is used to adjust the optical axis of the electron beam and to adjust and optimize imaging conditions. When the EB-TDI 1082 is to be used, the EB-CCD 1081 is moved by a moving mechanism M to a position away from the optical axis. A condition determined by using the EB-CCD 1081 is then used or referred to, to image using the EB-TDI 1082, and the specimen surface 1201 is observed.

In the embodiment, for example, the specimen is a semiconductor wafer. An electron optical condition is determined by using the EB-CCD 1081. The electron optical condition is then used or referred to, to acquire an image of the semiconductor wafer by means of the EB-TDI 1082. The EB-TDI 1082 may be used to inspect the specimen surface 1201, and then the EB-CCD 1081 may be used to perform review imaging to evaluate a pattern defect. In so doing, the EB-CCD 1081 can integrate images, can thereby reduce noise, and can perform, with a high S/N ratio, the review imaging of an area where a defect has been detected. Here, in a further effective example, pixels of the EB-CCD 1081 are smaller than those of the EB-TDI 1082. In this configuration, the number of pixels can be made large relative to the size of a signal magnified by the projection optical system. Consequently, the imaging can be performed at a higher resolution for inspection, and for classification and determination of the type of defect or the like.

The EB-TDI 1082 has a configuration in which pixels are arranged two-dimensionally so as to directly receive electrons to form an electron image. The EB-TDI 1082 has, for example, a rectangular shape, and the pixel size is, for example, 12 to 16 μm. On the other hand, the pixel size of the EB-CCD 1081 is, for example, 6 to 8 μm.

In FIG. 48, the EB-TDI 1082 is formed into a package 1085. The package 1085 itself functions as a feedthrough. Pins 1083 of the package are connected to a camera 1084 on the atmosphere side.

The configuration in FIG. 48 can reduce optical conversion loss caused by an FOP, a hermetic optical glass, an optical lens, and the like; can reduce aberration and distortion during light transmission; and can further eliminate faults resulting from those factors, such as deterioration in image resolution, detection errors, high cost, and growth in size.

[General Configuration of the Specimen Observation Device]

FIG. 49 shows an example of a general configuration of the specimen observation device according to the embodiment. The configuration in FIG. 49 is suitably provided as a peripheral configuration of the device in FIG. 35 or 46.

In FIG. 49, the specimen observation device comprises a specimen carrier 1190, a minienvironment 1180, a load lock 1162, a transfer chamber 1161, a main chamber 1160, an electron column 1130, and an image processing device system 1090. The minienvironment 1180 comprises an atmospheric transfer robot, a specimen alignment device, a clean air supply mechanism, and the like. The transfer chamber 1161 has a vacuum transfer robot. Since the robot is provided in the transfer chamber 1161 which is always in a vacuum state, the generation of particles or the like caused by pressure fluctuations can be minimally suppressed.

The main chamber 1160 is provided with a stage 1100 that moves in the x, y, and θ (rotation) directions, and an electrostatic chuck is installed on the stage 1100. The specimen 1200 itself or the specimen 1200 set in a pallet or jig is placed on the electrostatic chuck.

The main chamber 1160 is controlled by a vacuum control system 1150 so as to maintain a vacuum in the chamber. The main chamber 1160, the transfer chamber 1161, and the load lock 1162 are mounted on a vibration isolation table 1170, and they are configured so that no vibration is transmitted from the floor.

The electron column 1130 is installed on the main chamber 1160. This column comprises a primary optical system, a secondary optical system, and the detector 1080, which is included in the secondary optical system. The primary optical system includes the electron beam source 1010 and the primary lens 1020. The secondary optical system includes the condenser lens 1030, the E×B 1040, the transfer lens 1050, the NA adjustment apertures 1060 and 1060a to 1060c, and the projection lens 1070. The detector 1080 detects secondary electrons and mirror electrons transmitted from the specimen 1200. An optical microscope 1140 and an SEM 1145 are provided as components related to the electron column 1130. The optical microscope 1140 is used for positioning of the specimen 1200. The SEM 1145 is used for review observation.

A signal from the detector 1080 is transmitted to and processed by the image processing device system 1090. Real-time signal processing and delayed signal processing can both be performed. The real-time signal processing is performed during observation. When the delayed signal processing is performed, simply an image is acquired, and the signal processing is performed later. Data processed by the image processing device 1090 is saved to a hard disk, memory, or other recording medium. The data can be displayed on a monitor on a console as required. The data to be displayed is, for example, an observation area, a defect map, defect classification, a patch image, or the like. System software 1095 is provided to perform such signal processing. An electron optical system control power supply 1118 is provided to supply the electron column system 1130 with power. The electron optical system control power supply 1118 includes the power supply 1115 for supplying the electron source 1011 of the electron beam source 1010 with power, and the irradiation energy controller 1110 for controlling the power supply 1115.

Now, a transfer mechanism for the specimen 1200 will be described.

The specimen 1200 such as a wafer and mask is transferred from the load port into the minienvironment 1180, where alignment work is performed. The specimen 1200 is transferred to the load lock 1162 by the atmospheric transfer robot. The load lock 1162 is evacuated from atmospheric pressure to a vacuum by a vacuum pump. When the pressure becomes a certain value (about 1 Pa) or less, the specimen 1200 is transferred from the load lock 1162 to the main chamber 1160 by the vacuum transfer robot placed in the transfer chamber 1161. The specimen 1200 is then placed on the electrostatic chuck mechanism on the stage 1100.

"Configuration Comprising Both Projection-Type Inspection Device and SEM"

In FIG. 49, the main chamber 1160 is provided with the electron column 1130 and the SEM 1145. The electron column 1130, together with the main chamber 1160, constitutes the projection-type specimen observation device according to the embodiment. The specimen inspection device of the embodiment therefore constitutes a composite observation device comprising both projection-type and SEM-type observation devices.

In the embodiment, the stage 1100 is configured to be movable and, in particular, can be moved between the observation position of the electron column 1130 (the projection-type observation device) and the observation position of the SEM 1145. Such a configuration allows the observation and inspection to be quickly and precisely carried out when both two types of devices, the projection-type device and the SEM device, are used. For example, the projection-type observation device detects a defect, and then the SEM reviews the defect in detail. This characteristic will be described in more detail below.

In the above configuration, the electron column 1130 and the SEM 1145 are both used with the specimen 1200 being placed on the same stage 1100. The coordinates are thus uniquely determined when the specimen 1200 (the stage 1100) moves between the electron column 1130 and the SEM 1145. This is advantageous when a predetermined position on the specimen 1200 is to be located or when a defect position is to be located. The two inspection devices can precisely and easily locate one and the same part. For example, the electron column 1130 locates a defect position. This defect position is quickly positioned by means of the SEM 1145.

Suppose that the above-described composite configuration is not applied. For example, suppose that the projection-type optical inspection device and the SEM are separately placed in different vacuum chambers. The specimen requires to be moved between the separate different devices, and to be placed on different stages. For that purpose, the two devices are required to align the specimen separately, which takes time. The separately performed alignment of the specimen would cause a location error of 5 to 10 µm for one and the same position.

In the embodiment, on the other hand, the specimen 1200 is placed on the one and the same stage 1100 in the one and the same chamber 1160 for the two types of inspection. One and the same position can be precisely located even if the stage 1100 moves between the projection-type electron column 1130 and the SEM 1145. For example, a position can be located with a precision of 1 µm or less.

Such precise location is significantly advantageous in the following case. The inspection of the specimen 1200 is first performed by the projection method to inspect for a defect. After that, location and detailed observation (reviewing) of the detected defect is performed by the SEM 1145. Since the position can be located accurately, not only the presence or absence of a defect (false detection if absent) can be determined, but also detailed observation of the size and shape of the defect can be performed quickly.

"Another Example of the Inspection Using Both Projection-Type Inspection Device and SEM"

In the above description, the projection-type inspection device detects a defect, and the SEM performs review inspection. However, the invention is not limited to this. The two inspection devices may be applied to another inspection method. Effective inspection can be carried out by combining the characteristics of each inspection device. Another inspection method, for example, is as follows.

In this inspection method, the projection-type inspection device and the SEM inspect different areas. In addition, "cell to cell" inspection is applied to the projection-type inspection device, and "die to die" inspection is applied to the SEM, so that precise inspection is achieved with great overall efficiency.

More specifically, the projection-type inspection device performs the "cell to cell" inspection on an area in a die where there are many repetitive patterns. The SEM then performs the "die to die" inspection on an area where there are not many repetitive patterns. Both inspection results are combined and one inspection result is obtained. The "die to die" is an inspection for comparing successively obtained images of two dies. The "cell to cell" is an inspection for comparing successively obtained images of two cells. A cell is a part of a die.

In the above-described inspection method, the repetitive pattern part is quickly inspected by using the projection method and, on the other hand, the area where there are not many repetitive patterns is inspected by the SEM with precision and less faults. The SEM is not suited to quick inspection. However, since the area where there are not many repetitive patterns is relatively small, the SEM does not require too much time for inspection. Consequently, overall inspection time can be reduced. This inspection method can thus maximize the merits of the two inspection methods to carry out precise inspection in a short inspection time.

There have been described a specimen observation device and method according to the embodiment. The embodiment is suitably applied to semiconductor manufacturing processes. The embodiment is suitably applied to observation and inspection of the specimen surface 1201 after processing of a semiconductor wafer. In the embodiment, a semiconductor wafer having the insulating area 1203 and the conductive area 1202 on the specimen surface 1201 can be observed and a high-contrast image can be acquired, so that whether the semiconductor wafer is good or bad can be inspected. This allows a defect-less semiconductor wafer to be manufactured. The embodiment is thus suitably applied to semiconductor manufacturing methods.

The above-described various configurations may be appropriately combined depending on the intended use. For example, the configuration in FIG. 35 is suitably combined with the configurations in FIGS. 48 and 49. The configuration in FIG. 46 is suitably combined with the configurations in FIGS. 48 and 49.

While there have been described what are at present considered to be preferred embodiments of the invention, it will be understood that various modifications and variations may be made thereto, and it is intended that appended claims cover all such modifications and variations as fall within the true spirit and scope of the invention.

Industrial Applicability

The invention can be used for a specimen observation device for observing a surface of a substrate such as a semiconductor wafer and reticle, and can be used for a specimen defect detection device for detecting a defect.

[Third Point of View]

The third point of view relates to observation of patterns.

A purpose of the invention is to provide a technique capable of observing fine patterns.

The invention is a specimen observation method for observing a pattern of a specimen using an electron beam, and the specimen observation method comprises the steps of: irradiating the specimen with an electron beam; detecting mirror electrons generated by the electron beam irradiation; and generating an image of the specimen from the detected mirror electrons, where the electron beam irradiation step comprises irradiating the specimen with the electron beam with a landing energy adjusted so that when a hollow pattern with edges on both sides is irradiated with the electron beam, irradiation electrons turn around at the hollow pattern to become mirror electrons.

In the above configuration, the invention focuses attention on a property of the mirror electron generation phenomenon in which mirror electrons are easily generated at a hollow pattern since it has edges on both sides. The amount of mirror electrons generated at a hollow pattern depends on the landing energy of the electron beam. The landing energy is therefore set so that the irradiation electrons efficiently become mirror electrons at a hollow pattern. The landing energy will be set to a considerably low value as described later. This can increase the resolution and contrast at a hollow pattern, allowing fine patterns to be observed.

A projection-type observation device is suitably used in the invention. This allows fine patterns to be observed in a short time.

The landing energy may be set in a region in which the mirror electrons and secondary emission electrons are mixed.

This allows the landing energy to be set appropriately so that the mirror electrons are generated at a pattern, allowing the contrast of the pattern to be increased.

The landing energy may be set as LEA≤LE≤LEB+5 eV, where LE is the landing energy of the electron beam, and LEA and LEB are the minimum landing energy and maximum landing energy of the region in which the mirror electrons and secondary emission electrons are mixed.

This allows the landing energy to be set appropriately so that the mirror electrons are generated at a pattern, allowing the contrast of the pattern to be increased.

The irradiation electrons may enter toward one edge of the hollow pattern, turn near the one edge toward the other edge, and turn near the other edge to become mirror electrons.

This allows mirror electrons to be detected appropriately by taking advantage of the phenomenon in which mirror electrons are generated at a pattern, allowing the contrast of the pattern to be increased.

The irradiation electrons may enter toward one edge of the hollow pattern, go inside the hollow pattern along a curved path near the one edge, turn around without colliding with the bottom of the hollow pattern, and go near the other edge of the hollow pattern to become mirror electrons.

This allows mirror electrons to be detected appropriately by taking advantage of the phenomenon in which mirror electrons are generated at a pattern, allowing the contrast of the pattern to be increased.

In the invention, an aperture may be placed in a secondary optical system between the specimen and a detector for the mirror electrons to adjust at least one of the size, position, and shape of the aperture according to the mirror electrons going through the aperture.

This allows the contrast of the pattern to be increased. More specifically, electrons detected from the specimen include mirror electrons and secondary emission electrons. Secondary emission electrons spread extensively, while mirror electrons do not spread much. For this reason, secondary emission electrons going through the aperture can be reduced and the amount of detection of mirror electrons can be relatively increased by appropriately adjusting the aperture according to the mirror electrons. Consequently, the contrast of the pattern can be further increased.

In the invention, an image of the mirror electrons at the aperture may be generated to adjust the size of the aperture according to the size of the image. In the invention, an image of the mirror electrons at the aperture may be generated to adjust the position of the aperture according to the position of the image. In the invention, an image of the mirror electrons at the aperture may be generated to adjust the shape of the aperture according to the shape of the image.

The invention may be a specimen inspection method, where an image of the specimen may be generated from the mirror electrons by the above-described specimen observation method and the image of the specimen may be used to inspect a pattern of the specimen.

This allows the specimen observation method of the invention to be used to suitably inspect fine patterns.

A specimen observation device of the invention comprises: a stage for placing a specimen thereon; a primary optical system for irradiating the specimen with an electron beam; a secondary optical system for detecting mirror electrons generated by the electron beam irradiation; and an image processor for generating an image of the specimen from the detected mirror electrons, where the primary optical system irradiates the specimen with the electron beam with a landing energy adjusted so that when a hollow pattern with edges on both sides is irradiated with the electron beam, irradiation electrons turn around at the hollow pattern to become mirror electrons.

Also in this configuration, as described above, the landing energy is adjusted so that mirror electrons are easily generated, with attention focused on the phenomenon in which mirror electrons are easily generated at a hollow pattern. This allows the resolution and contrast of a pattern image to be increased, allowing fine patterns to be observed.

The primary optical system may irradiate with the electron beam with the landing energy set in a region in which the mirror electrons and secondary emission electrons are mixed.

This allows the landing energy to be set appropriately as described above, allowing the contrast of the pattern to be increased.

The landing energy may be set as LEA≤LE≤LEB+5 eV, where LE is the landing energy of the electron beam, and LEA and LEB are the minimum landing energy and maximum landing energy of the region in which the mirror electrons and secondary emission electrons are mixed.

This allows the landing energy to be set appropriately as described above, allowing the contrast of the pattern to be increased.

The secondary optical system may comprises: an aperture placed between the specimen and a detector for the mirror electrons; and an aperture adjustment mechanism for adjusting at least one of the size, position, and shape of the aperture according to the mirror electrons going through the aperture.

This allows the aperture to be appropriately adjusted according to the mirror electrons as described above. Secondary emission electrons going through the aperture can be reduced and the amount of detection of mirror electrons can be relatively increased, so that the contrast of the pattern can be further increased.

In the invention, the secondary optical system may have an aperture, and the position of the aperture may be adjusted so that the center of the intensity distribution of the mirror electrons coincides with the center of the aperture.

This allows mirror electrons to be satisfactorily detected, and allows the amount of detection of secondary emission electrons to be relatively reduced. Consequently, a high-contrast image can be acquired.

The secondary optical system may have an aperture, and the shape of the aperture may be an elliptical shape having the major axis in a direction corresponding to the longitudinal direction of the intensity distribution of the mirror electrons.

In this configuration, the aperture of an elliptical shape is used according to the intensity distribution of the mirror electrons. This allows a high-contrast image to be acquired.

The secondary optical system may have an aperture, and the aperture may have a plurality of openings, where the plurality of openings may be arranged so as to surround the center of the intensity of the mirror electrons.

In this configuration, the plurality of openings are appropriately arranged according to the scattering direction of the mirror electrons. This allows the mirror electrons to be appropriately detected depending on the intended use and property. The plurality of openings may be arranged around the center of the intensity.

The secondary optical system may have an aperture, and the aperture may have a plurality of openings, where one of the plurality of openings may be placed so as to coincide with the center of the intensity of the mirror electrons.

Consequently, an object to be observed distinctive in the scattering direction can be appropriately observed. In addition, information useful for classifying objects to be observed can be obtained.

The invention may be a specimen observation device of a composite type, and may comprise a projection-type observation device and an SEM-type observation device which is separate from the projection-type observation device. The projection-type observation device may be the above-described specimen observation device. The projection-type observation device and the SEM-type observation device may be provided in a chamber for containing a stage, and the stage may be movable between the observation position of the projection-type observation device and that of the SEM-type observation device.

Consequently, the projection-type observation device and the SEM-type observation device are installed in the common chamber. Observation using the two devices can thus be carried out quickly and precisely. For example, the projection-type observation device detects a pattern defect. The SEM then reviews the pattern defect in detail. Such defect inspection can be quickly and precisely carried out.

The invention may be a specimen inspection device comprising the above-described specimen observation device, and the inspection device inspects a pattern of the specimen using the image of the specimen generated from the mirror electrons by the image processor. This allows the specimen observation device of the invention to be used to suitably inspect fine patterns.

Advantages of the Invention

As described above, the invention can provide a technique capable of observing fine patterns by appropriately setting the landing energy.

Embodiment of the Invention

Now, the invention will be described in detail. The following detailed description and appended drawings are not intended to limit the invention. Rather, the scope of the invention is defined by the appended claims.

In the embodiment, a projection-type observation device (an electron beam observation device having a projection optical system) is used to observe a specimen. An electron beam observation device of this type comprises a primary optical system and a secondary optical system. The primary optical system irradiates a specimen with an electron beam emitted from an electron gun to generate electrons which have obtained information on the structure or the like of the specimen. The secondary optical system has a detector, and generates an image of the electrons generated by the electron beam irradiation. A projection-type observation device uses an electron beam of a large diameter and provides an image over a wide area.

When a specimen is irradiated with an electron beam, electrons of a plurality of types are detected by the secondary optical system. The electrons of a plurality of types are mirror electrons, secondary electrons, reflected electrons, and backscattered electrons. In the embodiment, a specimen is observed by using mainly the characteristics of mirror electrons. Mirror electrons refer to electrons that do not collide with a specimen but bounce back immediately in front of the specimen. The mirror electron phenomenon is caused by the effect of an electric field on the surface of a specimen.

In the embodiment, secondary electrons, reflected electrons, and backscattered electrons are referred to as secondary emission electrons. The term secondary emission electron is also used when these three types of electrons are mixed. Secondary electrons are typical among the secondary emission electrons. Secondary electrons are thus sometimes described as typical secondary emission electrons. Expressions such as "be emitted from a specimen," "be reflected from a specimen," and "be generated by an electron beam irradiation" may be used for both mirror electrons and secondary emission electrons.

FIG. 50 shows a relation between the landing energy LE and gray level DN of a specimen irradiated with an electron beam. The landing energy LE is energy given to the electron beam with which the specimen is irradiated. Suppose that an acceleration voltage Vacc is applied to an electron gun and a retarding voltage Vrtd is applied to the specimen. In this case, the landing energy LE is expressed by the difference between the acceleration voltage and the retarding voltage.

In FIG. 50, the gray level DN on the vertical axis represents the brightness of an image generated from electrons detected by the detector of the secondary optical system. That is, the gray level DN represents the number of detected electrons. The more electrons are detected, the larger the gray level DN becomes.

FIG. 50 shows a gray-level characteristic in an energy region of small energy near 0 eV. As illustrated, in a region in which LE is larger than LEB (LEB<LE), the gray level DN stands at a relatively small constant value. In a region in which LE is LEB or less but not less than LEA (LEA≤LE-≤LEB), the gray level DN increases as LE decreases. In a region in which LE is less than LEA (LE<LEA), the gray level DN stands at a relatively large constant value.

The above-described gray-level characteristic is related to the type of electrons to be detected. In the region LEB<LE, almost all electrons to be detected are secondary emission electrons. This region can be referred to as the secondary emission electron region. On the other hand, in the region LE<LEA, almost all electrons to be detected are mirror electrons. This region can be referred to as the mirror electron region. As illustrated, the gray level in the mirror electron region is larger than that in the secondary emission electron region. This is because the distribution area of mirror electrons is smaller than that of secondary emission electrons. Since the distribution area is small, more electrons can reach the detector and the gray level increases.

The region LEA≤LE≤LEB is a transition region from the secondary emission electron region to the mirror electron region (or vice versa). This region is a region in which mirror electrons and secondary emission electrons are mixed, and can also be referred to as the mixture region. In the transition region (mixture region), the yield of mirror electrons increases and the gray level increases as LE decreases.

LEA and LEB denote minimum and maximum landing energy of the transition region. Specific values of LEA and LEB will be described. Study results of the inventors show that LEA is −5 eV or more and LEB is 5 eV or less (that is, −5 eV≤LEA≤LEB≤5 eV).

The merits of the transition region are as follows. In the mirror electron region (LE≤LEA), all electrons generated by the beam irradiation become mirror electrons. For this reason, all detected electrons would be mirror electrons regardless of the shape of the specimen; the difference in gray level both at hollows and at bumps of the specimen would be small; and the S/N ratio and contrast of patterns and defects would be small. It is therefore sometimes difficult to use the mirror electron region for inspection. In the transition region, on the other hand, mirror electrons are characteristically and specifically generated at edge-shaped parts, and secondary emission electrons are generated at the other parts. The S/N ratio and contrast of edges can therefore be increased. The transition region is thus very effective for inspection. This will be described in detail below.

FIG. 51 shows the above-described phenomenon in the transition region. In FIG. 51, all electrons become mirror electrons without colliding with the specimen in the mirror electron region (LE<LEA). In the transition region, on the other hand, some electrons collide with the specimen, which emits secondary electrons. The ratio of the secondary electros becomes high as LE becomes larger. Though not shown in the figure, only secondary electrons are detected if LE exceeds LEB.

Now, FIG. 52 shows a relation between the landing energy LE and the gray level DN at an edge part of an uneven structure on a specimen surface. The edge part refers to a part which is located at both edges of a hollow and in which the height of the specimen changes. In FIG. 52, the dotted line represents the gray-level characteristic of the edge part, and the solid line represents that of the other part. The characteristic of the other part corresponds to that in FIG. 50.

As shown in FIG. 52, the characteristic line is different between the edge part and the other part. The characteristic line of the edge part is shifted in a direction in which the landing energy increases. That is, at the edge part, the upper and lower limits of the transition region are large, and the upper limit of the transition region is LEB+5 eV, where LEB is the upper limit of the transition region for the part other than the edge part. Such a shift in the characteristic line occurs because the shape, structure, material, or the like is different between the edge part and the other part. The shift in the characteristic line causes a gray-level difference ΔDN between the edge part and the other part.

The reason why the characteristic of the edge part is different from that of the other part as shown in FIG. 52 and the reason why the gray-level difference ΔDN occurs will next be discussed.

FIG. 53 is an example of the uneven structure of a specimen, showing a cross section of a fine line/space shape. For example, the bump is a line and the hollow is a space. The line width and the space width are 100 μm or less. In the shape in FIG. 53, a conductor (Si) has the uneven structure. An oxide film ($SiO_2$ or the like) is formed on top of the bumps.

FIG. 54 shows a phenomenon in which mirror electrons are generated at the edge part of the uneven structure when the structure in FIG. 53 is irradiated with an electron beam. A vertically-striped pattern is formed in FIG. 54. When irradiation is made with an electron beam, irradiation electrons change their path near one edge of a hollow (groove), turn sideways, and move toward the opposite edge of the groove. The irradiation electrons then change their path again near the opposite edge and return upward. Irradiation electrons thus become mirror electrons without colliding with the specimen. The mirror electrons generated at edges in this way can be referred to as edge mirror electrons. Edge mirror electrons are generated symmetrically from both edges. FIG. 55, like FIG. 54, also shows edge mirror electrons generated in the structure in FIG. 53. A horizontally-striped pattern is formed in FIG. 55.

FIG. 56 is another example of the electron path along which the irradiation electrons change into edge mirror electrons. In this example, the irradiation electrons enter toward one edge of a hollow, go inside the hollow along a curved path near the one edge, turn around without colliding with the bottom of the hollow, and go near the other edge of the hollow to become mirror electrons. Such mirror electrons are also edge mirror electrons. In the edge structure, each irradiation electron is considered to go through the path in FIG. 54 or 56, or go through a path intermediate between the paths in FIGS. 54 and 56, to become an edge mirror electron.

The reason why the path of electrons easily bends near an edge will next be described. In the structure in FIG. 54, the oxide film is formed on the surface of the bumps of the conductor. In this structure, the oxide film on the specimen surface is negatively charged. The potential of the conductor within the hollow is relatively higher than that of the oxide film. Since the potential changes near an edge, the path of electrons easily bends as described above, and consequently edge mirror electrons are generated.

Precharge is also preferable in the embodiment. Precharge is electron beam irradiation to be made before specimen observation. An insulating area on a specimen is negatively charged by precharge (the oxide film on the specimen surface is negatively charged in the example in FIG. 54 and the like). Precharge stabilizes the potential of the insulating area. Consequently, edge mirror electrons are stably generated, and the characteristic in FIG. 52 is stably obtained. Specimen observation can thus be satisfactorily carried out, and the precision of inspection using the specimen observation result can also be improved.

Irradiation with the electron beam for precharge may be made by using the electron optical system for specimen observation. Alternatively, another electron gun may be provided for precharge.

FIG. 57 shows another example related to the uneven structure of a specimen. FIG. 57 is also a cross section of a line/space shape. In FIG. 57, a bump of an oxide film ($SiO_2$ or the like) is formed on an Si surface. In such structure, an equipotential surface bends at both edges of a hollow. The path of irradiation electrons bends due to the bend of the equipotential surface. As a result, irradiation electrons go through the paths shown in FIGS. 54 to 56 to become edge mirror electrons also in the structure in FIG. 57. Precharge is also suitably performed in the structure in FIG. 57, thereby allowing the potential of the oxide film on the bump to be stabilized.

Sometimes the uneven structure is formed only of a conductive material. In this case also, an equipotential surface is formed along the bumps and hollows. The equipotential surface bends at both edges of a hollow. The path of irradiation electrons bends due to the bend of the equipotential surface. As a result, irradiation electrons go through the above-described paths to become edge mirror electrons.

There is a natural oxide film on the surface of the conductive film also when the uneven surface is formed only of a conductive material. Precharge is therefore preferable and can stabilize the potential.

As described in detail above, electrons at a hollow of a specimen go near both edges and turn around to become edge mirror electrons. Edge mirror electrons are therefore more easily generated than mirror electrons generated by a normal part. As a result, the transition region for the edge part, compared to that for the part other than the edge part, extends more in a direction in which the energy increases, as shown in FIG. 52.

Mirror electrons and secondary emission electrons are mixed in the above-mentioned region. Secondary emission electrons are secondary electrons, reflected electrons, or backscattered electrons (or a mixture thereof), as described before. Secondary emission electrons are emitted in an isotropically-spread manner. For this reason, at most only several percent of the electrons reach the detector. On the other hand, edge mirror electrons are generated by irradiation electrons being reflected as-is. The transmissivity (the rate of reaching the detector) of edge mirror electrons is therefore almost 100%. Consequently, a high brightness (gray level) is obtained, and the gray-level difference $\Delta DN$ with the surroundings increases.

At the edge part, as described above, mirror electrons are easily generated and the transmissivity of mirror electrons is high. Consequently, as shown in FIG. 52, the gray-level characteristic line of the edge part is shifted in a direction in which the landing energy LE increases, and a gray-level difference $\Delta DN$ occurs between the edge part and the other part.

Using the above-described phenomenon, the embodiment generates a high-resolution and high-contrast pattern image. The hollow structure described above corresponds to the hollow pattern of the invention. In the embodiment, the landing energy is set so that edge mirror electrons are efficiently generated at the hollow pattern. The landing energy LE will be set to a very low value as compared to conventional common observation techniques, as illustrated. Such an energy setting increases the gray-level difference $\Delta DN$ between a pattern and the surroundings, allowing a high-resolution and high-contrast image to be obtained.

Specifically, the landing energy LE is set so that LEA≤LE≤LEB or LEA≤LE≤LEB+5 eV is achieved. This allows the landing energy LE to be set in a region in which mirror electrons and secondary electrons are mixed.

As described before, study results of the invention show −5 eV≤LEA≤LEB≤5 eV. For example, suppose that LEA=−5 eV and LEB=5 eV. In this case, the landing energy LE is set as −5 eV≤LE≤5 eV+5 eV=10 eV. More specifically, the state of mixture of mirror electrons and secondary emission electrons varies depending on the landing energy LE, and the gray-level difference also varies. A great advantage may be obtained by setting the landing energy LE in a region in which the yield of mirror electrons is relatively small.

A specimen observation device for achieving the above-described specimen observation method will next be described. In the following description, the specimen observation device is incorporated in a specimen inspection device, and is used for inspection for pattern defects in a specimen. FIG. 58 shows a general configuration of the specimen inspection device, and FIG. 59 shows a main part of the specimen inspection device.

Referring to FIG. 58, the specimen inspection device 2010 has a specimen carrier 2012, a minienvironment 2014, a load lock 2016, a transfer chamber 2018, a main chamber 2022, an electron column 2024, and an image processing device 2090. The minienvironment 2014 is provided with an atmospheric transfer robot, a specimen alignment device, a clean air supply mechanism, and the like. The transfer chamber 2018 is provided with a vacuum transfer robot.

The main chamber 2022 is provided with a stage 2030 so that it moves in the x direction, y direction, and θ (rotation) direction. An electrostatic chuck is installed on the stage 2030. On the electrostatic chuck is placed a specimen itself. Alternatively, the specimen set in a pallet or jig is held by the electrostatic chuck.

The main chamber 2022 is controlled by a vacuum control system 2026 so as to maintain a vacuum in the chamber. The main chamber 2022, the transfer chamber 2018, and the load lock 2016 are mounted on a vibration isolation table 2028, and they are configured so that no vibration is transmitted from the floor.

The electron column 2024 is installed on the main chamber 2022. This electron column 2024 comprises an electron gun, a lens, wiring, and a feedthrough, and further comprises a detector 2070 as illustrated. These components constitute primary and secondary optical systems for electron beam projection.

An output signal from the detector 2070 is transmitted to and processed by the image processing device 2090. Real-time signal processing and delayed signal processing can both be performed. The real-time signal processing is performed during inspection. When the delayed signal processing is performed, simply an image is acquired, and the signal processing is performed later. Data processed by the image processing device is saved to a hard disk, memory, or other recording medium. The data can be displayed on a monitor on a console as required. System software 2140 is provided to perform such signal processing. The system software 2140 is implemented by a computer executing a program. An electron optical system control power supply 2130 is provided to supply the electron column system with power.

The main chamber 2022 is provided with an optical microscope 2110 and an SEM-type inspection device (SEM) 2120.

In the specimen inspection device 2010 in FIG. 58, the specimen such as a wafer and mask is transferred from the specimen carrier 2012 (the load port) to the minienvironment 2014. Alignment work is performed in the minienvironment 2014.

The specimen is then transferred to the load lock 2016 by the atmospheric transfer robot. The load lock 2016 is evacuated from atmospheric pressure to a vacuum by a vacuum pump. When the pressure becomes a certain value (e.g. about 1 Pa) or less, the specimen is transferred from the load lock 2016 to the main chamber 2022 by the vacuum transfer robot placed in the transfer chamber 2018. The specimen is held on the electrostatic chuck mechanism on the stage 2030.

The specimen is inspected in the main chamber 2022. Here a pattern of the specimen is inspected by using the above-described specimen observation method of the invention. Inspection is also performed by using the SEM 2120 as described later. When the inspection is complete, the specimen returns to the specimen carrier 2012 through the reverse route.

A main part of the specimen inspection device 2010 will next be described with reference to FIG. 59. The configuration in FIG. 59 corresponds to the main chamber 2022, the electron column 2024, and the like in FIG. 58.

In FIG. 59, the specimen inspection device 2010 comprises: a primary optical system 2040 for generating an electron beam; the stage 2030 for placing a specimen 2020 thereon; a secondary optical system 2060 for generating an image of secondary emission electrons and mirror electrons from the specimen; the detector 2070 for detecting those electrons; and the image processing device 2090 for processing a signal from the detector 2070. In the invention, the detector 2070 may be included in the secondary optical system 2060. The image processing device 2090 may be included in the image processor of the invention. The specimen inspection device 2010 also comprises a controller 2100 to control the whole device. The controller 2100 corresponds to the system software 2140 in FIG. 58. The specimen inspection device 2010 is further provided with the optical microscope 2110 for positioning and with the SEM 2120 for reviewing.

The primary optical system 2040 is configured to generate an electron beam and emit it toward the specimen 2020. The primary optical system 2040 has: an electron gun 2041; lenses 2042 and 2045; apertures 2043 and 2044; an ExB filter 2046; lenses 2047, 2049, and 2050; and an aperture 2048. The electron gun 2041 generates the electron beam. The lenses 2042 and 2045 and the apertures 2043 and 2044 shape the electron beam and control the direction thereof. The electron beam is then affected by a Lorentz force caused by the magnetic and electric fields in the ExB filter 2046. The electron beam obliquely enters the ExB filter 2046, and is deflected vertically downward toward the specimen 2020. The lenses 2047, 2049, and 2050 control the direction of the electron beam and appropriately reduce the speed thereof to adjust the landing energy LE.

The ExB filter 2046 is especially important in the primary optical system 2040 which is a projection optical system. The angle of the primary electron beam can be determined by adjusting electric and magnetic field conditions of the ExB filter 2046. For example, conditions of the ExB filter 2046 are set so that the irradiation electron beam of the primary system and the electron beam of the secondary system make approximately a right angle with the specimen 2020. That is, the ExB filter 2046 is used as a Wien filter. The conditions of the Wien filter are not limited to the above. For example, either the primary beam (the electron beam with which the irradiation is performed) or the secondary beam (mirror electrons and secondary emission electrons) need not go straight, that is, may be deflected by the effect of the ExB filter. For another example, the primary beam may go straight and the secondary beam may be deflected by the effect of the ExB filter. These configurations are included in the scope of the invention.

The primary optical system 2040 may irradiate not only with an electron beam for imaging, but also with an electron beam for precharge. Alternatively, an electron gun or the like for precharge may be provided.

The stage 2030 is configured to place the specimen 2020 thereon as described above. The stage 2030 can move in the xy directions (horizontal directions) and in the θ direction (rotational direction on a horizontal plane). The stage 2030 may also be movable in the z direction (vertical direction) as required. On the surface of the stage 2030 is provided a specimen fixing mechanism such as an electrostatic chuck.

The secondary optical system 2060 is configured to guide electrons reflected from the specimen 2020 to the detector 2070. As previously described, mirror electrons and secondary emission electrons are guided to the detector 2070. The secondary optical system 2060 has: lenses 2061 and 2063; an aperture 2062; an aligner 2064; and the detector 2070. Electrons are reflected from the specimen 2020 and go through the objective lens 2050, lens 2049, aperture 2048, lens 2047, and ExB filter 2046 again. The electrons are then guided to the secondary optical system 2060. In the secondary optical system 2060, the electrons go through the lens 2061, aperture 2062, and lens 2063, are aligned by the aligner 2064, and are detected by the detector 2070.

The aperture 2062 has a function of defining the transmissivity and aberration of the secondary system. The size, position, and shape of the aperture 2062 are adjustable in the embodiment. An aperture adjustment mechanism 2200 is provided to make the adjustment. Aperture adjustment is performed in order to increase the contrast of a specimen pattern in an observation image. Aperture adjustment will be described later.

The detector 2070 is configured to detect the electrons guided by the secondary optical system 2060. The detector 2070 has a plurality of pixels on the detection surface. Various two-dimensional sensors can be applied to the detector 2070. For example, a CCD (charge coupled device) and a TDI (time delay integration)-CCD may be applied to the detector 2070. These are sensors for detecting a signal after converting electrons to light, and therefore require a means of photoelectric conversion or the like. Photoelectric conversion or a scintillator is therefore used to convert the electrons to light.

An EB-TDI may be applied to the detector 2070. An EB-TDI does not require a photoelectric conversion mechanism and a light transmission mechanism. Electrons directly enter the sensor surface of an EB-TDI. Consequently, the resolution does not deteriorate, so that a high MTF (modulation transfer function) and high contrast can be obtained. An EB-CCD may also be applied to the detector 2070.

The controller 2100 comprises a computer, and controls the whole specimen inspection device 2010. The controller 2100 corresponds to the system software 2140 in FIG. 58.

The controller 2100 controls the primary optical system 2040 including the electron gun 2041 to adjust the landing energy LE. In the embodiment, as described before, the landing energy LE is set so that edge mirror electrons are efficiently generated at a pattern on the specimen 2020. The controller 2100 controls the primary optical system 2040 and secondary optical system 2060 to control and adjust the path of electrons from the electron gun 2041 to the detector 2070. More specifically, the electron path is controlled so that an electron beam goes through a predetermined appropriate path from the electron gun 2041 to the specimen 2020 and electrons from the specimen 2020 go through a predetermined appropriate path to the detector 2070. The controller 2100 controls the aperture adjustment mechanism 2200 to cause it to make an aperture adjustment, as described in detail later.

The controller 2100 controls the image processing device 2090 to cause it to process a signal from the detector 2070 and generate an image of a pattern on the specimen 2020. In addition, the controller 2100 is configured to process the image generated by the image processing device 2090 and make a determination about a pattern defect.

Configurations of the parts of the specimen inspection device 2010 have been described above. An operation of the specimen inspection device 2010 will next be described.

The specimen inspection device 2010, irradiating the specimen 2020 with an electron beam, moves the stage 2030 in horizontal directions, detects electrons from the specimen 2020 by means of the detector 2070, and generates an image of the specimen 2020 from the detection signal. The electron beam is emitted from the electron gun 2041, is guided by the primary optical system 2040, and is applied to the specimen 2020. In the process of entering, the direction of the electron beam is changed by the E×B filter 2046. Inspection is performed by the projection method in the embodiment. An electron beam of a large diameter is therefore used so that a relatively wide area on the specimen is irradiated. For example, a circular beam of 30 to 1000 µm in diameter is used. An elliptical beam with a major axis of 30 to 1000 µm may be used. The miner axis of the elliptical beam may be ½ to ¼ of the major axis.

The landing energy LE of the electron beam is set so that edge mirror electrons are easily generated at edges of a pattern, as described in the above description of the specimen observation method. Specifically, the landing energy LE is set as LEA≤LE≤LEB+5 eV. LEA and LEB are the lower and upper limits of the transition region in FIG. 50 and, for example, are −5 eV and 5 eV.

Edge mirror electrons are therefore generated when a pattern on the specimen 2020 is irradiated with the electron beam. More specifically, some electrons in the electron beam are applied near an edge of a pattern. Such electrons applied near an edge go through the paths illustrated in FIGS. 54 to 56 to become edge mirror electrons.

Electrons generated on the specimen 2020 are guided by the secondary optical system 2060 to the detector 2070. An image of the electrons is then generated on the detection surface of the detector 2070. The electron beam irradiation can cause normal mirror electrons to be generated on the specimen 2020, in addition to the edge mirror electrons. Secondary emission electrons are also generated in addition to the mirror electrons. Consequently, an image of the electrons of these types is formed on the detector 2070.

The detector 2070 detects electrons and transmits the detection signal to the image processing device 2090. The image processing device 2090 processes the detection signal and generates an image of the specimen 2020. Here, in the embodiment, the landing energy LE is appropriately set, and many edge mirror electrons reach the detector 2070. That is, the number of detection of edge mirror electrons is larger than that of the other types of electrons. Edge mirror electrons are generated at an edge of a pattern on the specimen 2020. The gray level (brightness) of a pattern therefore becomes large in the image of the specimen 2020. The gray-level difference with the other parts thus becomes large. Consequently, the contrast of a pattern becomes large.

Using such an image of the specimen 2020, the controller 2100 makes a determination of a pattern defect. The controller 2100 may determine the presence or absence of a defect in a pattern, may detect the position of a defect, and may further determine the type of a defect. The specimen inspection device 2010 of the embodiment may inspect for not only a pattern defect but also a foreign material. In this case, the controller 2100 may process the image of the specimen 2020 to determine the presence or absence of a foreign material. Moreover, another inspection may also be performed.

The defect determination process may be "die to die." This process compares images of two dies of the specimen 2020. More specifically, successively obtained images of two dies are compared. The controller 2100 determines that there is a defect if patterns of the two dies are different from each other.

The defect determination process may be "die to any die." In this case, an image of a specific die is obtained from the specimen 2020 and is held as a criterion. The criterion die image is then compared with images of many other dies in sequence. Also in this case, the controller 2100 determines that there is a defect if patterns of the dies are different.

Moreover, the defect determination process may be "die to database." In this case, images of dies are compared with registration data such as design data. Design data is, for example, CAD data. The controller 2100 then determines that there is a defect if an image of a die is different from the registration data.

The defect determination process may determine a defect in a cell. In this case, images of cells are processed instead of images of dies described above. The defect determination process may be "cell to cell," "cell to any cell," or "cell to database."

The controller 2100 carries out the defect determination in this way. The result of the defect determination may be displayed on a monitor and may be recorded on a recording medium. The result of the defect determination may be used by the SEM 2120 in the next step as described below.

"Configuration Comprising Both Projection-Type Inspection Device and SEM"

FIG. 60 is a part of the specimen inspection device 2010, and particularly shows the main chamber 2022, the electron column 2024, and the SEM 2120. The electron column 2024, together with the main chamber 2022, constitutes the projection-type observation device. The specimen inspection device of the embodiment therefore constitutes a composite observation device comprising both projection-type and SEM-type observation devices.

In the embodiment, as shown in FIG. 60, the stage 2030 is movable and, in particular, can be moved between the observation position of the electron column 2024 (the projection-type observation device) and the observation position of the SEM 2120. Such a configuration allows the observation and inspection to be quickly and precisely carried out when both two types of devices, the projection-type device and the SEM device, are used. For example, the projection-type observation device detects a pattern defect, and then the SEM reviews the pattern defect in detail. This characteristic will be described in more detail below.

In the configuration in FIG. 60, the electron column 2024 and the SEM 2120 are both used with the specimen 2020 being placed on the same stage 2030. The coordinates are thus uniquely determined when the specimen 2020 (the stage 2030) moves between the electron column 2024 and the SEM 2120. This is advantageous when a predetermined position in a pattern is to be located or when a pattern defect position is to be located. The two inspection devices can precisely and easily locate one and the same part. For example, the electron column 2024 locates a defect position. This defect position is quickly positioned by means of the SEM 2120.

Suppose that the above-described composite configuration is not applied. For example, suppose that the projection-type optical inspection device and the SEM are separately placed in different vacuum chambers. The specimen requires to be moved between the separate different devices, and to be placed on different stages. For that purpose, the two devices are required to align the specimen separately, which takes time. The separately performed alignment of the specimen would cause a location error of 5 to 10 µm for one and the same position.

In the embodiment, on the other hand, the specimen 2020 is placed on the one and the same stage 2030 in the one and the same chamber 2022 for the two types of inspection, as shown in FIG. 60. One and the same position can be precisely located even if the stage 2030 moves between the projection-type electron column 2024 and the SEM 2120. For example, a position can be located with a precision of 1 µm or less.

Such precise location is significantly advantageous in the following case. The inspection of the specimen 2020 is first performed by the projection method to inspect a pattern and pattern defect. After that, location and detailed observation (reviewing) of the detected defect is performed by the SEM 2120. Since the position can be located accurately, not only the presence or absence of a defect (false detection if absent) can be determined, but also detailed observation of the size and shape of the defect can be performed quickly.

As mentioned above, the separate installation of the electron column 2024 for defect detection and the SEM-type inspection device 2120 for reviewing would require a great deal of time to locate a defect position. Such a problem is solved by the embodiment.

In the embodiment, as described above, a pattern of an ultra-micro size can be inspected with high sensitivity by using conditions for imaging a pattern and with the projection-type optical method. In addition, the projection-type optical electron column 2024 and the SEM-type inspection device 2120 are mounted in the one and the same chamber 2022. Consequently, in particular, inspection of a pattern of an ultra-micro size of 100 nm or less and determination and classification of a pattern can be carried out with great efficiency and speed.

"Another Example of the Inspection Using Both Projection-Type Inspection Device and SEM"

In the above description, the projection-type inspection device detects a defect, and the SEM performs review inspection. However, the invention is not limited to this. The two inspection devices may be applied to another inspection method. Effective inspection can be carried out by combining the characteristics of each inspection device. Another inspection method, for example, is as follows.

In this inspection method, the projection-type inspection device and the SEM inspect different areas. In addition, "cell to cell" inspection is applied to the projection-type inspection device, and "die to die" inspection is applied to the SEM, so that precise inspection is achieved with great overall efficiency.

More specifically, the projection-type inspection device performs the "cell to cell" inspection on an area in a die where there are many repetitive patterns. The SEM then performs the "die to die" inspection on an area where there are not many repetitive patterns. Both inspection results are combined and one inspection result is obtained. The "die to die" is an inspection for comparing successively obtained images of two dies, as described before. The "cell to cell" is an inspection for comparing successively obtained images of two cells. A cell is a part of a die.

In the above-described inspection method, the repetitive pattern part is quickly inspected by using the projection method and, on the other hand, the area where there are not many repetitive patterns is inspected by the SEM with precision and less faults. The SEM is not suited to quick inspection. However, since the area where there are not many repetitive patterns is relatively small, the SEM does not require too much time for inspection. Consequently, overall inspection time can be reduced. This inspection method can thus maximize the merits of the two inspection methods to carry out precise inspection in a short inspection time.

"Aperture Adjustment"

Another characteristic of the embodiment, aperture adjustment, will next be described.

An outline of aperture adjustment will be described first. In aperture adjustment, the size, position, and shape of the aperture 2062 of the secondary optical system 2060 are adjusted to match mirror electrons that go through the aperture 2062. In terms of this, the aperture 2062 of the embodiment can be called a variable aperture (or an adjustment aperture or the like). The object of the adjustment is to make the spot (profile) of mirror electrons at the height of the aperture 2062 and an opening in the aperture 2062 coincide with each other as much as possible. However, it is actually difficult to make the mirror electron spot and the aperture 2062 completely coincide with each other. The aperture 2062 may therefore in practice be adjusted to be larger to some extent than the mirror electron spot.

Adjusting the aperture 2062 in this way can increase the contrast of a pattern in an image. More specifically, electrons detected from a specimen include mirror electrons and secondary emission electrons. As already described, secondary emission electrons spread extensively, while mirror electrons do not spread much. For this reason, secondary emission electrons going through the aperture 2062 can be reduced and the amount of detection of mirror electrons can be relatively increased by appropriately adjusting the aperture 2062 according to the mirror electrons. Consequently, the contrast of the pattern can be further increased.

The aperture 2062 is adjusted by the aperture adjustment mechanism 2200. Specifically, a plurality of types of apertures 2062 may be provided. The plurality of types of apertures 2062 are different in size and shape from one another. The plurality of types of apertures 2062 may be integrally configured, or may be separate members. The aperture adjustment mechanism 2200 can interchange the apertures 2062 to be used for observation on the optical axis. The aperture adjustment mechanism 2200, under control of the controller 2100, selects one aperture 2062 appropriate for the mirror electrons from the plurality of types of apertures 2062 and places it on the optical axis. In addition, the aperture adjustment mechanism 2200 adjusts the position of the aperture 2062 according to the mirror electrons. The size, shape, and position of the aperture 2062 are thus suitably adjusted.

The position of the aperture 2062 may include a position in a direction along the axis of the secondary optical system 2060, within the scope of the invention. The aperture adjustment mechanism 2200 may therefore optimize the aperture position by moving the aperture 2062 not only in a horizontal direction (the xy directions) but also in the direction of the optical axis (the z direction). The position of the aperture 2062 may also include a position in a direction of rotation, that is, an aperture angle. The aperture adjustment mechanism 2200 may rotate the aperture 2062 on a horizontal plane, and the center of rotation may be the axis of the secondary optical system 2060.

Measuring an image of mirror electrons at the aperture is effective for the above-described aperture adjustment. This mirror electron image represents the above-described mirror electron spot. The aperture 2062 is therefore adjusted to match a mirror electron image at the aperture.

In order to measure a mirror electron image at the aperture, a detector such as an EB-CCD is suitably added at the height of the aperture. Alternatively, it is suitable to arrange the aperture 2062 and the detector 2070 (FIG. 59) in optically conjugate positions. This allows the detector 2070 to obtain a mirror electron image at the aperture 2062.

An outline of aperture adjustment has been described above. Aperture adjustment will be described in further detail below with reference to specific examples.

(Adjustment of the Aperture Position)

In pattern observation, it is important to efficiently acquire a mirror signal from a pattern. The position of the aperture 2062 is very important since it defines the transmissivity and aberration of the signal. Secondary electrons are emitted from the specimen surface in a wide angle range following the cosine law, and reach the aperture uniformly with a wide area. For this reason, the secondary electrons are insensitive to the position of the aperture 2062. In contrast, the reflection angle of mirror electrons on the specimen surface is about the same as the incident angle of the primary electron beam. The mirror electrons therefore exhibit a small spread, and reach the aperture 2062 with a small beam diameter. For example, the spread area of the mirror electrons is 1/20 or less of the spread area of the secondary electrons. For this reason, the mirror electrons are very sensitive to the position of the aperture 2062. The spread area of the mirror electrons at the aperture is generally an area of $\varphi 10$ to $\varphi 100$ μm. Because of this, it is very advantageous and important to determine a position where the intensity of the mirror electrons is the highest and place the center position of the aperture 2062 in the determined position.

In order to achieve such placement of the aperture 2062 in an appropriate position, the aperture adjustment mechanism 2200 moves the aperture 2062 in the x and y directions in the vacuum electron column 2024 with a precision of about 1 μm. The signal intensity is measured with the aperture 2062 being moved. The brightness of an image may be determined as the signal intensity. The evaluation value is, for example, a total brightness. A position where the signal intensity is the highest is then determined, and the center of the aperture 2062 is placed in the position of the determined coordinates.

In the above description, the aperture 2062 is moved in the xy directions. The aperture 2062 may be rotated by the aperture adjustment mechanism 2200 so that the angle of the aperture 2062 may be adjusted, within the scope of the invention. The angle may then be set based on a measurement result of the signal intensity. The angle is a position in a direction of rotation and therefore, in the invention, the angle of the aperture is included in the aperture position. The axis of rotation of the aperture 2062 may be the axis of the secondary optical system 2060. The above-described adjustment in the xy directions may first be performed so that the aperture center may be adjusted to a position where the signal intensity is the highest. The aperture 2062 may then be rotated by predetermined small angles so that the aperture 2062 may be adjusted to an angle where the signal intensity is the highest.

The aperture and the like may be configured so that the position of the aperture 2062 can be adjusted not only in the x and y directions but also in the z-axis direction. The z-axis direction is the axial direction of the secondary optical system 2060. In this case, the aperture 2062 may also be moved in the z-axis direction, the signal intensity may be measured, and the aperture 2062 may be adjusted to a position where the signal intensity is the highest. This configuration is also advantageous. The aperture 2062 is suitably placed in a position where the mirror electrons are most condensed. This very effectively reduces the aberration of the mirror electrons and cuts down the secondary emission electrons. Consequently, a higher S/N ratio can be obtained.

(Configuration for Measuring the Signal Intensity)

A more suitable configuration for signal intensity measurement will be described here.

FIG. 61 is a variation of the specimen inspection device in FIG. 59. In FIG. 61, a secondary optical system 2060a is configured differently from the secondary optical system 2060 in FIG. 59 and, specifically, is provided with an EB-CCD 2065 at the height of the aperture. The aperture 2062 and the EB-CCD 2065 are mounted on an XY stage 2066, which is a one-body holding member having openings 2067 and 2068. Since the XY stage 2066 is provided with the openings 2067 and 2068, the mirror electrons and the secondary emission electrons can reach the aperture 2062 or the EB-CCD 2065.

The XY stage 2066 moves the aperture 2062 and the EB-CCD 2065 to perform position control and positioning of them. This allows the aperture 2062 and the EB-CCD 2065 to be interchanged, and current absorption by the aperture 2062 and image acquisition by the EB-CCD 2065 are independently performed. The XY stage 2066 is driven by the aperture adjustment mechanism 2200 (the XY stage 2066 may be a part of the aperture adjustment mechanism 2200).

When the secondary optical system 2060a with such a configuration is used, the EB-CCD 2065 is first used to detect the spot shape of the electron beam and the center position thereof. The image processing device 2090 or other component may process the detection signal of the EB-CCD 2065 to generate an image. The controller 2100 may determine the spot shape and center position of the mirror electrons from the image of the detection signal. As described before, the brightness of the mirror electrons is higher than that of the secondary emission electrons. The spot of the mirror electrons is therefore brighter than the surrounding secondary emission electron area. Therefore, an area in which the brightness is a predetermined value or higher, for example, is identified as the spot (profile) of the mirror electrons. For another example, an area surrounded by an edge in the image is detected as the spot of the mirror electrons. The controller 2100 then controls the XY stage 2066 to place the center of the opening in the aperture 2062 in the center position of the detected spot.

As described above, the EB-CCD 2065 is very advantageously used in the embodiment. Since two-dimensional information on the beam can be obtained and the number of electrons that enters the detector 2070 can be determined, the signal intensity can be quantitatively evaluated. The position of the aperture 2062 can thus be directly adjusted by using such measurement results. Consequently, the aperture can be precisely positioned, the aberration in the electron image decreases, and the uniformity improves. The uniformity of the transmissivity improves, and an electron image can be acquired with a high resolution and uniform gray level.

The configuration in FIG. 61 can eliminate the need for a work such as measuring the signal intensity while moving the aperture 2062 step by step, and is therefore also effective for reducing measurement time.

The configuration in FIG. 61 is suitably used not only for the aperture adjustment but also for the adjustment of the spot shape. The controller 2100 performs voltage adjustment on a stigmator, the lenses 2061 and 2063, and the aligner 2064 so that the spot shape becomes as circular and minimum as possible. In terms of this point, conventionally the spot shape and astigmatism at the aperture 2062 could not be directly adjusted. The embodiment allows such a direct adjustment to be made, allowing the astigmatism to be corrected precisely.

The EB-CCD 2065 is provided as a detector in the configuration in FIG. 61. However, another type of detector may also be provided.

In FIG. 61, the addition of the EB-CCD 2065 allows a beam image at the aperture 2062 to be obtained. However, a similar beam image can also be obtained by another configuration. Specifically, the aperture 2062 is placed or alternatively a condition of the lens 2063 existing between the aperture 2062 and the detector 2070 is established so that an optically conjugate positional relationship is achieved between the aperture 2062 and the detection surface of the detector 2070 in the z direction. This configuration is also very advantageous. This allows an image of the beam at the position of the aperture 2062 to be formed on the detection surface of the detector 2070. The beam profile at the aperture 2062 can thus be observed by using the detector 2070, and a mirror electron image at the aperture 2062 can be obtained. Moreover, the EB-CCD 2065 need not be provided.

In the above description, the measurement result is used for the adjustment of the aperture position. The controller 2100 may also suitably use the measurement result for the adjustment of the aperture size and aperture shape described below.

(Adjustment of the Aperture Size and Aperture Shape)

The size (aperture diameter) of the aperture 2062 is also important in the embodiment. Since the signal area of the mirror electrons is small as described above, an effective size is about 10 to 200 μm. In addition, the aperture size is preferably a size 10% to 100% larger than the beam diameter.

Discussing in relation to this, the image of the electrons is formed from the mirror electrons and the secondary emission electrons. The setting of the aperture size can increase the ratio of the mirror electrons more. This can increase the contrast of the mirror electrons, that is, increase the contrast of a pattern.

Describing in more detail, when the opening in the aperture is small, the secondary emission electrons decrease inversely with the area of the aperture. This reduces the gray level of the normal part. However, the mirror electron signal does not change, and the gray level of a pattern does not change. Consequently, the contrast of a pattern can be increased by the amount of decrease in the gray level of the surroundings, and a higher S/N ratio can be obtained.

The same principle also applies to the aperture shape. It is preferable to match the aperture shape to the spot shape (profile) of the mirror electrons at the aperture 2062. Consequently, the secondary emission electrons that go through the aperture 2062 can be reduced without changing the mirror electron signal. As a result, the contrast of a pattern can be increased, and a higher S/N ratio can be obtained.

The aforementioned signal measurement may also be performed in the above-described adjustment of the aperture size and shape. The signal measurement may be repeated with the aperture size and shape being changed little by little. Preferably the spot of the mirror electrons at the aperture 2062 is measured by using the configuration in FIG. 61. Alternatively, an image of the spot is acquired by means of the detector 2070 by establishing a conjugate positional relationship between the detector 2070 and the aperture 2062. This allows the aperture size and shape to be adjusted easily and quickly.

As described above, the mirror electrons are very sensitive to the aperture size and shape. It is therefore very important to appropriately select the aperture size and shape in order to obtain a high S/N ratio.

(Variations of the Aperture)

Variations of the aperture to be suitably applied to the embodiment will next be described with reference to FIGS. 62 to 67.

The aperture 2062 is expressed by a simple line in FIG. 59 and the like. However, the aperture 2062 is actually a member (component) having an opening. Generally, the member is sometimes called an aperture, or the opening is sometimes called an aperture. In the following description of variations of the aperture, the member is called an aperture member in order to distinguish the member (component) from its opening. An opening in the member is referred to as an aperture opening. In another way of distinction, an aperture member can also be called an NA aperture or the like.

In FIGS. 62 to 67, symbols 2062a to 2062d denote aperture members. Symbols 2169, 2069, 2069a, and 2069b denote aperture openings. The aperture shape generally means the shape of an aperture opening. The aperture size and position also specifically means the size and position of an aperture opening. Though an aperture member is distinguished from an aperture opening here, an aperture member and an aperture opening may simply be called an aperture throughout the present application in accordance with a general expression.

FIG. 62 is a reference example, showing a conventional aperture opening 2169. As shown in FIG. 62, the circular aperture opening 2169 would conventionally be placed in a fixed position. Consequently, the above-described appropriate selection of the aperture size and shape could not be made. On the other hand, the specimen inspection apparatus 2010 according to the embodiment is configured to be able to move the aperture two-dimensionally or three-dimensionally to perform aperture adjustment.

FIG. 63 shows an example of the aperture shape. In FIG. 63, the aperture opening 2069 is elliptical. This opening shape is created so as to match the intensity distribution of the mirror electron signal. In this example, the intensity distribution has an elliptical shape elongated in the y direction according to a measurement result of the intensity distribution of the mirror electrons in the aperture member 2062. Here the y direction is the direction in which the deflection is made by the E×B filter 2046. The y direction corresponds to the direction of the optical axis of the primary electron beam. The elliptical shape elongated in the y direction is considered to be caused by a deflection component of the E×B filter 2046. The aperture shape having the major axis in the y direction is therefore very advantageous in order to capture the mirror electrons efficiently. This can increase the yield of the mirror electrons more than ever before and obtain a higher S/N ratio (e.g. two times or more). For example, suppose that the intensity distribution of the secondary electron beam extends 100 µm in the y direction and 50 µm in the x direction (these values are full widths at half maximum). The elliptical aperture opening 2069 is selected in a range from 10% to 100% more than the secondary electron beam diameter. For example, the aperture opening 2069 may be selected so that the aperture size is 150 µm in the y direction and 75 µm in the x direction.

Configurations of an aperture member having a plurality of aperture openings will next be described with reference to FIGS. 64 to 67. Here a plurality of aperture openings function as one aperture.

FIG. 64 shows an example of a configuration of an aperture member 2062a having a plurality of aperture openings 2069a. In FIG. 64, the aperture member 2062a has two circular aperture openings 2069a. In this example, the two openings are placed in positions displaced in ±y directions with respect to the center of the intensity of the mirror electrons. The amount of displacement is, for example, about 50 µm. This configuration can capture both mirror electrons scattered on the +y and −y sides. This configuration can therefore increase the difference in the amount of the signal between the scattered mirror electrons and the background secondary emission electrons, allowing a high S/N ratio to be obtained. The reason of this is that the amount of the secondary emission electrons flying in the scattering direction is limited to a small amount. The background therefore decreases, and the S/N ratio can be improved relatively.

FIG. 65 shows an example of a configuration of an aperture member 2062b having four aperture openings 2069a. In FIG. 65, the four circular aperture openings 2069a are placed symmetrically with respect to the x and y axes. That is, two of the aperture openings 2069a are placed on the x axis; two of the aperture openings 2069a are placed on the y axis; and the four aperture openings 2069a are positioned at the same distance from the center (the origin). In other words, the four aperture openings 2069a are placed at regular intervals around the origin. More simply put, the four aperture openings 2069a are placed in a rhombus shape. Consequently, even when there are mirror electrons scattered in both x and y directions, the electrons can be acquired with a high S/N ratio.

FIG. 66 shows an aperture member 2062c having four aperture openings 2069a. The configuration in FIG. 66 is an example different from the configuration in FIG. 65. In FIG. 66, the four circular aperture openings 2069a are separately placed in the first to fourth quadrants in the xy plane. Also in this example, the four aperture openings 2069a are placed symmetrically with respect to the x and y axes, and are placed at the same distance from the center (the origin). In other words, the four aperture openings 2069a are placed at regular intervals around the origin. Even in the aperture member 2062c of such a shape, the aperture openings 2069a can be provided in a position where the signal intensity of the mirror electrons is high, and a signal with a high S/N ratio can be acquired.

As shown in FIGS. 65 and 66, there may be configurations which are the same in the number of the aperture openings 2069a but are different in their arrangement. This allows the appropriate aperture member 2062b or 2062c to be used depending on the intended use. A high S/N ratio can thus be acquired in each use.

FIG. 67 shows an example of a configuration of an aperture member 2062d having eight aperture openings 2069b. As shown in FIG. 67, the number of the aperture openings 2069b may be more than four. In the aperture member 2062d shown in FIG. 67, the plurality of aperture openings 2069b are placed at regular intervals on a circumference around the center of the intensity of the mirror electrons. This configuration is advantageous when there are mirror electrons scattering specifically and significantly on the position of one of the aperture openings 2069b on the circumference. Such mirror electrons can be captured appropriately.

In FIGS. 64 to 67, in terms of the relation between the center of the intensity of the mirror electron signal and the aperture openings 2069a and 2069b, the positions of the apertures are off the center of the intensity. However, the invention is not limited to this, and the positions of the apertures may coincide with the center of the intensity. That is, one of the aperture openings may be placed so as to coincide with the center of the intensity of the mirror electrons. In this case, the other aperture openings capture scattered mirror electrons. Those electrons will be included in an electron image together with the mirror electrons in the center of the intensity. Such a composite image is obtained by the detector 2070. In this way, a composite image of the intense mirror electrons and the specifically scattered mirror electrons can be acquired. Consequently, a high S/N ratio can be obtained, and an object to be observed distinctive in the scattering direction can be detected effectively. Additionally, the characteristic in the scattering direction can be used to classify objects to be observed.

(Aperture Adjustment According to the Landing Energy)

Furthermore, in the embodiment, the appropriate aperture opening shape and size can also be selected for the landing energy LE to be used. This selection also provides a very advantageous effect. The intensity distribution of the mirror electrons varies depending on the landing energy LE. Accordingly, the inspection device of the embodiment may be configured to select the aperture size and shape according to the landing energy LE to be used. This allows the aperture adjustment to be performed in accordance with the intensity distribution, which is very advantageous. For example, suppose that the mirror electrons have an intensity distribution of an elliptical shape elongated in the y direction, and the imaging or inspection is carried out under two different conditions. For example, suppose that the landing energy is a first value, i.e. LE=3 eV, in a first imaging or inspection condition. Suppose that the landing energy is a second value, i.e. LE=2 eV, in a second imaging or inspection condition. Here the smaller the landing energy LE is, the larger the intensity distribution of the mirror electrons becomes at the aperture height. The aperture size and shape are suitably selected so as to match such a change in the distribution. For example, when the first landing energy is used, the aperture opening 2069 of an ellipse extending 100 µm in the y direction and 50 µm in the x direction may be selected. When the second landing energy is used, the intensity distribution of the mirror electrons is about two times larger. Accordingly, the aperture opening 2069 of an elliptical shape extending 200 µm in the y direction and 100 µm in the x direction may be used. In this way, the mirror electrons can be detected very effectively.

(Aperture Adjustment Mechanism)

Finally, a complementary description of the aperture adjustment mechanism will be made. A plurality of apertures (aperture members) may be integrated in the embodiment. That is, a plurality of aperture openings may be provided in one aperture member. The shape and size may be different among the plurality of aperture openings. In this case, the aperture adjustment mechanism moves the aperture member, thereby interchanging the aperture openings and adjusting the aperture shape and aperture size.

Another example is a configuration in which the apertures are not integrated. That is, a plurality of aperture members are provided, and each aperture member has an aperture opening. At least one of the opening size and opening shape is different among the plurality of aperture members. In this case, the aperture adjustment mechanism selects and interchanges the aperture members, thereby adjusting the aperture shape and aperture size.

The above-described two configurations may be combined. For example, one aperture member is prepared for each type of aperture shape. Each aperture member has a plurality of aperture openings with the same shape but different sizes. Conversely, one aperture member is prepared for each aperture size. In this case, each aperture member may have a plurality of aperture openings with the same size but different shapes.

The aperture adjustment mechanism 2200 may have any configuration for moving and interchanging the apertures. The XY stage shown in the example in FIG. 61 may be used to move and interchange the apertures. A linear motor may move and interchange the apertures. A rotation support member may support the apertures, and a common rotary motor may move and interchange the apertures.

Aperture adjustment in the embodiment has been described in detail above. The size, position, and shape are all alterable in the above-described apertures. The invention is not limited to such a configuration. At least one of the size, position, and shape may be adjusted within the scope of the invention.

The aperture settings can be changed any time in the above description. However, the aperture settings may be fixed after adjustment within the scope of the invention. In this case, the aperture size, position, and shape may first be adjusted and determined according to the above-described principle. The determined aperture specifications may then be used fixedly. For example, the above-described elliptical aperture may be used continuously.

There have been described embodiments of the invention above. In the invention, the appropriate adjustment of the landing energy allows the contrast of fine patterns on a specimen to be increased, therefore allowing fine patterns to be observed.

The invention particularly focuses attention on a property of the mirror electron generation phenomenon in which mirror electrons are easily generated at a hollow pattern since it has edges on both sides. Such a property has not been conventionally used for pattern observation. The amount of mirror electrons generated at a hollow pattern depends on the landing energy of the electron beam. The landing energy is therefore set so that the irradiation electrons efficiently become mirror electrons at a hollow pattern. This can increase the resolution and contrast at a hollow pattern, allowing fine patterns to be observed.

In the technique of the invention, the landing energy is set to a considerably low value. The observation technique of the invention may thus be called a low landing energy technique.

In the invention, the above-described low landing energy technique is applied to the projection-type observation device. This allows fine patterns to be observed in a short time.

Specifically, the low landing energy may be set in the transition region in which mirror electrons and secondary emission electrons are mixed. The landing energy LE may be set as $LEA \leq LE \leq LEB+5$ eV. Such a setting causes mirror electrons to be easily generated at a pattern part, allowing the contrast of a pattern in an image to be increased.

In the invention, as described in detail above, the size, position, and shape of the aperture are suitably adjusted, which can further increase the contrast of a pattern in an image.

In the invention, the projection-type observation device and the SEM are provided in one and the same chamber, use one and the same stage, and constitute a composite observation device. Consequently, positioning time decreases and positioning accuracy significantly increases when the inspections of two types are carried out in sequence. Quick and precise observation can thus be achieved.

While there have been described what are at present considered to be preferred embodiments of the invention, it will be understood that various modifications and variations may be made thereto, and it is intended that appended claims cover all such modifications and variations as fall within the true spirit and scope of the invention.

Industrial Applicability

As stated above, the specimen observation technique according to the invention is useful in inspection of a semiconductor wafer, mask, or the like.

[Fourth Point of View]

The fourth point of view relates to observation of a specimen in which a plurality of films are formed, and in particular to inspection of a film-coated substrate described below.

A purpose of the invention is to provide a technique capable of detecting the shape of a substrate and the shape of a lower layer film or the like which are present under the surface of the film-coated substrate. Another purpose of the invention is to provide a technique capable of detecting a foreign material or the like present in a lower layer film or the like.

The invention relates to an inspection method for a film-coated substrate. The film-coated substrate has a substrate on which a three-dimensional shape is formed and a plurality of films comprising different materials layered and formed on the substrate, and the film-coated substrate further includes a structure in which a lower layer film is exposed due to a top layer film being removed. The film-coated substrate inspection method comprises the steps of: irradiating a surface of the film-coated substrate with a charged particle beam with a landing energy set so as to cause the surface potential to vary among the top layer film located immediately above an area where the three-dimensional shape is formed on the substrate, the top layer film located immediately above an area where no three-dimensional shape is formed on the substrate, and the lower layer film; detecting electrons which have acquired information on the surface potential of the film-coated substrate, and acquiring a potential contrast of the surface of the film-coated substrate; and simultaneously detecting the shape of the top layer film and the three-dimensional shape formed on the substrate, based on the potential contrast.

With use of the capacitance of the surface of the film-coated substrate, this allows for inspection of not only the shape of the top layer film on the surface of the film-coated substrate but also an area invisible from the surface. Consequently, the shape in the thickness direction of the film-coated substrate can also be inspected.

In the method of the invention, a foreign material may further be detected based on the potential contrast.

This allows for detection of the presence of a foreign material present on or included in the film-coated substrate based on the potential contrast.

In the method of the invention, the surface of the film-coated substrate may be irradiated a plurality of times with the charged particle beam with the landing energy being varied.

This allows the inspection to be carried out in a state where the potential contrast of the surface of the film-coated substrate is easily acquired.

In the invention, the landing energy of the charged particle beam may be reduced at each irradiation.

This causes the surface of the film-coated substrate to be in a state where mirror electrons are easily generated. Mirror electrons are electrons which are reflected before colliding with the film-coated substrate. The above configuration allows mirror electrons to be generated easily, allowing the shape of a film to be detected appropriately.

The invention is also an inspection method for a film-coated substrate for detecting the shapes of a plurality of films comprising different materials layered and formed on the substrate. This method has the steps of: irradiating a surface of the film-coated substrate with a charged particle beam with a landing energy set so as to cause the surface potential of the film-coated substrate to vary depending on differences in type and thickness among the materials of the films; detecting electrons which have acquired information on the surface potential of the film-coated substrate, and acquiring a potential contrast of the surface of the film-coated substrate; and detecting the shapes of the plurality of films based on the potential contrast.

With use of the difference in capacitance of the surface of the film-coated substrate, this allows the shapes of the plurality of layers of films formed on the substrate to be detected from the surface of the film-coated substrate. Consequently, a shape defect in a film that cannot be detected by simply acquiring an image of the surface of the film-coated substrate can be detected. The shape of each film may suitably be detected in the invention.

In the invention, the shapes of the plurality of films may be of the thickness varying partly or locally.

This allows partly developed thickness unevenness to be detected as a defect in a film.

In the invention, a foreign material may further be detected based on the potential contrast.

This allows a foreign material to be detected based on a large change in potential contrast when there is a foreign material in a film. Consequently, a foreign material in a film can be detected from the surface of the film-coated substrate.

In the invention, the surface of the film-coated substrate may be irradiated a plurality of times with the charged particle beam with the landing energy being varied.

Conditions of the surface of the film-coated substrate can thus be adjusted to cause a difference in the potential contrast of the surface of the film-coated substrate to be easily generated depending on thickness variations of the material. Consequently, the film-coated substrate can be inspected under appropriate conditions.

In the invention, the landing energy of the charged particle beam may be reduced at each irradiation.

This causes the surface of the film-coated substrate to be in a state where mirror electrons are easily generated. Mirror electrons are electrons which are reflected before colliding with the film-coated substrate. The above configuration allows mirror electrons to be generated easily, allowing the shape of a film to be detected appropriately.

In the invention, the plurality of films may include a film comprising an insulating material.

Consequently, even when a film including an insulating material is inspected, the shape of the film can be appropriately detected, and a shape defect can be found.

In the invention, the landing energy of the charged particle beam may be within a range of −10 eV to 50 eV inclusive. More preferably, the landing energy may be within a range of −5 eV to 5 eV inclusive.

Consequently, mirror electrons, which exhibit a large change in potential contrast, can be suitably used, and the shape of a multilayer film can be detected.

The invention is also an inspection device for a film-coated substrate, the film-coated substrate having a substrate on which a three-dimensional shape is formed and a plurality of films comprising different materials layered and formed on the substrate, the film-coated substrate including a structure in which a lower layer film is exposed due to a top layer film being removed. The film-coated substrate inspection device comprises: a charged particle irradiation unit (a charged particle irradiation means) for irradiating a surface of the film-coated substrate with a charged particle beam with a landing energy set so as to cause the surface potential to vary among the top layer film located immediately above an area where the three-dimensional shape is formed on the substrate, the top layer film located immediately above an area where no three-dimensional shape is formed on the substrate, and the lower layer film; a detector for detecting electrons which have acquired information on the surface potential of the film-coated substrate, and acquiring a potential contrast of the surface of the film-coated substrate; and an arithmetic unit (an arithmetic means) for simultaneously detecting the shape of the top layer film and the three-dimensional shape formed on the substrate, based on the potential contrast.

This allows for detection of not only the shape of the top layer film on the surface of the film-coated substrate but also the three-dimensional shape on the substrate invisible from the surface. Shape defects including a defect of the substrate under the layers can be inspected for.

The invention is also an inspection device for a film-coated substrate for detecting the shapes of a plurality of films comprising different materials layered and formed on the substrate. This device has: a charged particle irradiation unit (a charged particle irradiation means) for irradiating a surface of the film-coated substrate with a charged particle beam with a landing energy set so as to cause the surface potential of the film-coated substrate to vary depending on differences in type and thickness among the materials of the films; an imaging device for detecting electrons which have acquired information on the surface potential of the film-coated substrate, and acquiring a potential contrast of the film-coated substrate; and an arithmetic unit (an arithmetic means) for detecting the shapes of the plurality of films based on the potential contrast.

This allows a shape defect such as the thickness unevenness in a multilayer film to be detected from the surface of the film-coated substrate. Shape defects of the whole multilayer film can be detected by one inspection, and therefore the inspection efficiency can be improved. The shape of each film may suitably be detected in the invention.

Advantages of the Invention

In the invention, as described above, the shape of not only a surface layer on a film-coated substrate but also a film and the substrate existing below can be detected from the surface.

Embodiment of the Invention

Now, the invention will be described in detail. The following detailed description and appended drawings are not intended to limit the invention. Rather, the scope of the invention is defined by the appended claims.

FIG. 68 shows a schematic configuration of an inspection device for carrying out a film-coated substrate inspection method according to an embodiment.

In FIG. 68, a film-coated substrate 3040 is placed, and the surface of the film-coated substrate 3040 is being irradiated with an electron beam by an electron gun 3060a. The electron beam is an example of the charged particle beam of the invention. The charged particle beam may also be a beam using ions or the like. The electron beam is used in the embodiment described below. The film-coated substrate 3040 has a substrate 3010 and a multilayer film 3020 formed on the substrate 3010. The multilayer film 3020 comprises a plurality of layers 3021 to 3024. The embodiment may be applied to the film-coated substrate 3040 of various uses. The film-coated substrate 3040 may be, for example, a substrate for use in a reticle (photomask). The film-coated substrate 3040 is applied to a reticle also in the example described below.

The substrate 3010 is a base used as a main material of the film-coated substrate 3040 and is, for example, a glass substrate such as a mask blank. The multilayer film 3020 comprises the plurality of films 3021 to 3024 made of different materials. The films 3021 to 3024 include two types or more of films made of different materials. Two types of materials, for example, may thus be alternately layered as the films 3021 to 3024.

In FIG. 68, an acceleration voltage Vacc is applied to the electron gun 3060. A retarding voltage RTD is applied to the film-coated substrate 3040. The acceleration voltage (Vacc) is applied in order to accelerate electrons generated from the electron gun toward the ground. The acceleration voltage (Vacc) is, for example, an arbitrary voltage between −4000 V and −7000 V.

A voltage of −4000 V, for example, is applied to the surface of the reticle, which is the film-coated substrate 3040. Electrons are accelerated by the acceleration voltage toward the ground. The voltage of the reticle viewed from the electrons is 0 V when the acceleration voltage is −4000 V. The voltage of the reticle viewed from the electrons is −3000 V when the acceleration voltage is −7000 V.

In the above description, the voltage applied to the reticle (the film-coated substrate 3040) is the retarding voltage (RTD). A value obtained by subtracting the retarding voltage from the acceleration voltage is the landing energy LE. That is, the landing energy LE is the voltage of the reticle viewed from the electrons accelerated toward the ground.

A method of adjusting the landing energy LE will be described. When the adjustment is performed in steps of about 100 V, the adjustment is performed by using the acceleration voltage Vacc. A fine adjustment in steps of about 10 V is sometimes performed by changing the retarding voltage RTD. Suppose that a voltage other than the retarding voltage RTD is superimposed on the voltage of the top surface of the reticle. Such a case is caused, for example, due to charging up or the like. In this case, the correction of the surface voltage ΔV is performed by adjusting the retarding voltage RTD.

In the example in FIG. 68, the acceleration voltage Vacc is −4005 V, and the retarding voltage RTD is −4002 V. When an electron emitted from the electron gun 3060 enters the surface of the film-coated substrate 3040, the landing energy LE is 3 eV.

$$LE = (RTD - Vacc) \times e = \{-4002 - (-4005)\} \times e = 3 \text{ eV}$$

As seen above, the landing energy LE of the charged particle beam with which the film-coated substrate 3040 is irradiated can be set by adjusting the acceleration voltage Vacc on the side of the electron gun 3060 and the retarding voltage RTD applied to the surface of the film-coated substrate 3040.

Here in the embodiment, an SEM-type electron microscope, a projection-type electron microscope, or the like uses the charged particle beam to image the surface of the film-coated substrate 3040. The amount of electrons returning from the surface of the film-coated substrate 3040 varies depending on the difference in the material and shape of the surface of the film-coated substrate 3040 and on the landing energy LE. The difference in material is, for example, a combination of an insulating material and a conductor, a combination of insulators different in dielectric constant, and every combination of them. The difference in shape is the unevenness of the surface, or the like. The difference in the amount of electrons appears in an image of the surface of the film-coated substrate as a difference in brightness caused by the difference in material, or as a difference in brightness caused by the difference in surface shape. The difference in brightness caused by the difference in material is called the "material contrast." The difference in brightness caused by the difference in surface shape is called the "shape contrast."

These contrasts and the like are phenomena caused by a difference in surface potential. The difference in the material constituting the film-coated substrate 3040 or the difference in shape causes a difference in the potential of the substrate surface. This difference in surface potential causes a difference in the amount of electrons returning from the surface.

This difference in potential is caused by the properties of the material. The material properties are, for example, the sheet resistance value of a conductor, and the relative permittivity of an insulating material. In a layered structure of a conductor and an insulating material, a difference in capacitance caused by a difference in thickness causes a difference in potential. A difference in the electric field distribution depending on the difference in shape also causes a difference in potential.

The difference in surface potential can also be made more noticeable by irradiation with an electron beam. A difference in potential caused by spontaneous charging can also be used.

Suppose that a multilayer film (a film in which at least two types of materials are layered) is formed on a substrate and a foreign material exists within the multilayer film (a case where no foreign material exists on the top surface of the multilayer film). If irradiation with an electron beam causes the presence of the foreign material within the multilayer film to appear clearly as a difference in the potential of the top surface, the foreign material within the multilayer film can be detected from the difference in potential. That is, the foreign material can be detected by irradiating with an electron beam so as to cause the surface potential to vary depending on the presence or absence of the foreign material within the multilayer film.

FIG. 69 shows the difference in brightness according to the difference in the landing energy LE. More specifically, FIG. 69 shows the difference in the brightness of an image based on the difference in the amount of secondary emission electrons returning from the substrate when the substrate is irradiated with an electron beam with the landing energy LE being varied. In FIG. 69, the surface potential of the film-coated substrate 3040 is 0 (the surface potential $\Delta V=0$).

Actually, there is a surface potential distribution on the surface of the film-coated substrate 3040 due to charging by electron beam irradiation and spontaneous charging and also due to the permittivity and secondary electron emission efficiency of the surface material, and the like.

FIGS. 70A and 70B are an example of the potential difference caused by electron beam irradiation, showing a potential difference between a shape formed on the substrate 3010 and a shape formed on the film 3020 on the substrate 3010. FIG. 70A shows the surface potential of the film-coated substrate 3040. FIG. 70B shows a cross-sectional configuration of the film-coated substrate 3040. The principle of the potential difference is that the potential difference is caused by a difference in capacitance and a difference in the material exposed on the top surface.

In FIG. 70B, a hollow pattern 3011 is formed on the substrate 3010. The multilayer film 3020 is formed on the substrate 3010. The multilayer film 3020 comprises a lower layer film 3021 and a top layer film 3022. The lower layer film 3021 and the top layer film 3022 are made of different materials. The lower layer film 3021 constitutes a layer on the substrate, and the hollow pattern 3011 on the substrate 3010 is filled with the lower layer film 3021. The top layer film 3022 is layered on the lower layer film 3021, and constitutes the surface of the film-coated substrate 3040. The top layer film 3022 has a groove shape 3030 constituting a cut. The lower layer film 3021 is exposed at the bottom of the groove pattern 3030.

The lower layer film 3021 and the top layer film 3022 have even thicknesses over most of the area of the film-coated substrate 3040. In the area in which the hollow pattern 3011 is formed on the substrate 3010, the lower layer film 3021 is thicker than the surroundings. In the area in which the groove pattern 3030 is formed in the top layer film 3022, the top layer film 3022 is lost, the total thickness is small, and the surface is constituted by the lower layer film 3021.

Under the effects of the difference in material and thickness shown in FIG. 70B, there is a distribution in the surface potential in FIG. 70A. This surface potential causes a potential difference $\Delta V$ between the set value of the landing energy, LE, and its effective value LEe. More specifically, suppose that the film-coated substrate 3040 is irradiated with an electron beam with one and the same landing energy LE. LE is a set value, and is the difference between the acceleration voltage Vacc and the retarding voltage RTD. The actual value of the landing energy at the surface of the film-coated substrate 3040 is referred to as the effective landing energy LEe. The effective value LEe differs from the set value LE by the potential difference $\Delta V$. The potential difference $\Delta V$ corresponds to the surface potential. The effective landing energy LEe is expressed by LEe=LE+$\Delta V$.

Suppose that there is a surface potential distribution in the film-coated substrate 3040 and there is an area in which $\Delta V$ is different, as described above. The whole film-coated substrate 3040 is irradiated with an electron beam with one and the same landing energy LE. As a result, a difference occurs in the effective landing energy LEe. This difference in LEe is captured as a difference in brightness in an image, and is detected as a potential contrast.

The difference in brightness in an image indicates, for example, a pattern, a particle, or a foreign material in a film. In the example in FIGS. 70A and 70B, the three-dimensional pattern shape causes the difference in brightness in an image. In FIG. 70B, the lower layer film 3021 is formed thicker than the surroundings, in the area of the hollow pattern 3011 on the substrate 3010. The potential of the surface located immediately above this area is significantly reduced. On the other hand, the groove pattern 3030 is where the top layer film 3022 is removed, where the lower layer film 3021 is exposed. The potential of the surface located immediately above this area exhibits a value slightly higher than the surroundings. This reveals the difference in properties between the lower layer film 3021 and the top layer film 3022. The material of the lower layer film 3021 significantly reduces the surface potential. The extent to which the material of the top layer film 3022 reduces the surface potential is small as compared to the material of the lower layer film 3021.

In the inspection method according to the embodiment, as seen above, irradiation is made with an electron beam with a landing energy LE set so as to cause the surface potential to vary depending on the shape and material of the substrate and films. More specifically, the landing energy LE is set so as to cause the surface potential to vary among "the surface located immediately above the area in which a three-dimensional pattern such as the hollow pattern 3011 is formed on the substrate 3010," "the surface located immediately above the area in which a three-dimensional pattern such as the hollow pattern 3011 is not formed on the substrate 3010," and "the area in which a three-dimensional pattern such as the groove 3030 is formed in the top layer film 3022 and the lower layer film 3021 is exposed." In the method of the embodiment, the surface of the film-coated substrate 3040 is irradiated with such an electron beam, and the potential contrast based on the surface potential distribution is acquired. This allows the pattern of the film-coated substrate 3040 to be detected.

FIG. 71 is a perspective view showing an example of a pattern and shape defect formed on the film-coated substrate 3040. In the example in FIG. 71, the film-coated substrate 3040 corresponds to the cross-sectional shape shown in FIG. 70B, and further has pattern defects 3031 and 3032.

More specifically, in FIG. 71 just as in FIG. 70A, the film-coated substrate 3040 has the substrate 3010 and the multilayer film 3020. The hollow pattern 3011 is formed on the substrate 3010 as a three-dimensional pattern. On the substrate 3010 is formed the lower layer film 3021, on which the top layer film 3022 is layered. The top layer film 3022 constitutes the surface of the film-coated substrate 3040. Part of the top layer film 3022 corresponding to the groove pattern 3030 is removed. The lower layer film 3021 is exposed at the groove pattern 3030 and constitutes the surface of the film-coated substrate 3040. The pattern defects 3031 and 3032 are formed in the area of the groove pattern 3030. The area of the groove pattern 3030 has a rectangular shape in the designed pattern, that is, a rectangular area is to be removed from the top layer film 3022. In FIG. 71, however, the pattern defect 3031 is formed to protrude laterally. The pattern defect 3032 is formed with the groove pattern 3030 dented laterally. In FIG. 71, as described above, pattern defects are formed in the three-dimensional structure of the film-coated substrate 3040 in a lateral direction, that is, a direction along the plane.

In the embodiment, the pattern shape of the above-described pattern defect area is also detected by acquiring the potential contrast of the surface of the film-coated substrate 3040. A pattern defect can be found and detected by comparing a detected pattern with the designed pattern. In this way, in the embodiment, the pattern of the film-coated substrate 3040 can be inspected and a pattern defect can be detected over a wide scope including the shape of the surface, the shape of the lower layer film, and the shape of the substrate.

FIG. 72 is a schematic drawing of the potential contrast of a potential distribution caused by a pattern and a foreign material on the surface. The bottom (Symbol (c)) is a cross-sectional configuration, and corresponds to the configuration in FIG. 70B. The middle (Symbol (b)) shows a surface potential distribution observed when the cross-sectional configuration is irradiated with an electron beam. The top (Symbol (a)) shows a brightness distribution in an image caused by the surface potential.

The configuration of the film-coated substrate 3040 (Symbol (c)) in FIG. 72 is the same as that in FIG. 70B. Unlike in FIG. 70B, however, a foreign material 3050 exists on the surface of the top layer film 3022 in FIG. 72. Even if the pattern shape of the film-coated substrate 3040 is formed as designed, the foreign material 3050 sometimes exists like this. The embodiment also allows such a foreign material 3050 to be detected. A specific inspection method will be described below.

In FIG. 72, the middle drawing (Symbol (b)) is a surface potential distribution of the film-coated substrate 3040, and further shows a relation between the surface potential distribution and the brightness (the gray level) of a potential contrast image. It can be seen that the brightness varies according to the surface potential. As already described with reference to FIG. 70A, the surface potential distribution corresponds to the cross-sectional shape of the film-coated substrate 3040. The potential of the surface located immediately above the area of the hollow pattern 3011 on the substrate 3010 decreases. The lower layer film 3021 is exposed on the surface at the groove pattern 3030 in the top layer film 3022, and the surface potential is increased in this area. On the other hand, the surface potential is reduced where the foreign material 3050 exists. The surface potential in the area of the foreign material 3050 is reduced further more than that in the area of the hollow pattern 3011. In this way, the area in which the foreign material 3050 exists exhibits a surface potential different from that of the pattern shape of the substrate 3010 and top layer film 3022. In the example in FIG. 72, the change in the potential of the foreign material is larger than that of the pattern shape. The potential change caused by the foreign material 3050 can thus be recognized.

Generally, as in the example described above, the surface potential change caused by the foreign material 3050 is considered to be often larger than that caused by the pattern shape of the film-coated substrate 3040. A contamination by the foreign material 3050 can be detected based on this characteristic. The diagram in the middle of FIG. 72 is provided with a graph of a relation between the surface potential and the brightness. This graph shows that the difference in the surface potential of the film-coated substrate 3040 is reflected in the brightness of the potential contrast.

In FIG. 72, the top drawing (Symbol (a)) shows the brightness according to the surface potential, DN, in the form of a potential contrast. As illustrated, the brightness (the gray level) varies according to location, and also varies depending on the presence or absence of the foreign material. More specifically, differences in brightness can be seen between "the area located immediately above the area in which the three-dimensional shape, the hollow pattern 3011, is formed on the substrate 3010," "the area located immediately above the area in which the groove pattern 3030 is formed in the top layer film 3022," "the area located immediately above the area in which the lower layer film 3021 and the top layer film 3022 are formed on the substrate 3010," and "the area located immediately above the area in which the foreign material 3050 exists." The inspection method according to the embodiment can thus detect not only a pattern defect in the film-coated substrate 3040 but also a contamination by the foreign material.

Now, the set value of the landing energy of the electron beam will be described. The landing energy to be used here is a low energy around 0 eV. In such a low-energy region, the type of electrons to be detected varies depending on the landing energy. Electrons to be detected are mirror electrons and secondary emission electrons. The secondary emission electrons include secondary electrons, reflected electrons, and backscattered electrons, and these may be mixed. Since secondary electrons are typical secondary emission electrons, secondary electrons may be used as an example in the description below. The mirror electrons refer to electrons that are reflected from the film-coated substrate 3040 without colliding with the surface thereof. The electron beam turns immediately in front of the film-coated substrate 3040, and the mirror electrons are therefore generated.

A large landing energy causes secondary emission electrons to be mainly detected. This region is referred to as the secondary emission electron region. A small landing energy causes mirror electrons to be mainly detected. This region is referred to as the mirror electron region. Mirror electrons and secondary emission electrons are mixed in a region between the secondary emission electron region and the mirror electron region. This region is referred to as the transition region or the mixture region. The transition region is a region between the lower limit of the secondary emission electron region (LEB) and the upper limit of the mirror electron region (LEA). The secondary emission electron region may be referred to as the secondary electron mode; the mirror electron region may be referred to as the mirror electron mode; and the transition region may be referred to as the mirror/secondary electron mixture mode.

Among the above-described energy regions, the transition region (the mixture region) is suitably applied in the embodiment. This allows for appropriate acquisition of the potential contrast of the surface potential of the film-coated substrate 3040 described above.

The mirror electrons and secondary electrons go through different paths in a secondary electron optical system. So, even in an inspection using the transition region (mirror/secondary electron mixture mode), only mirror electrons or only secondary electrons can be selectively extracted by changing the size and position of an aperture and desired image information can be acquired.

The irradiation of the film-coated substrate 3040 with the electron beam may be performed a plurality of times. This method is effective to generate mirror electrons. This will be described in detail.

It is known that precharge is performed to make it easy to generate mirror electrons. Irradiation is made in advance with an electron beam for charging in precharge. The landing energy of this charging electron beam is set higher than that of the imaging electron beam with which the irradiation is made to acquire the potential contrast. It is known that this causes the surface of the film-coated substrate 3040 to be charged to some extent in advance, allowing mirror electrons to be generated easily.

In the embodiment, beam irradiation is made a plurality of times in order to use the above-described phenomenon. For example, the surface of the film-coated substrate 3040 is irradiated first with the charging electron beam with a high landing energy to charge the substrate surface. After that, irradiation is made with an electron beam with a low landing energy, and the potential contrast of the surface of the film-coated substrate 3040 is acquired.

The surface of the film-coated substrate 3040 may be irradiated with the charging electron beam not only once but also a plurality of times. In this case, the landing energy may be reduced at each irradiation. For example, suppose that the landing energy for the previous time (this time) is LEp, and the landing energy for the next time is LEn. In this case, LEn is made to be smaller than LEp. The landing energy of the electron beam may thus be reduced gradually. Such an irradiation method allows mirror electrons to be generated easily, so that a potential contrast with a large brightness difference can be acquired.

There has been described an inspection method of a film-coated substrate according to the embodiment. In the inspection method of the embodiment, the surface of the film-coated substrate 3040 is irradiated with a charged particle beam and a potential contrast is acquired from a surface potential distribution caused by a difference in capacitance of the film-coated substrate 3040 and the like, so that the shape of the substrate 3010 and top layer film 3022 of the film-coated substrate 3040 can be simultaneously detected. Moreover, the acquired potential contrast is compared with a predetermined potential contrast corresponding to the designed pattern shape, and the presence of the foreign material 3050 can thus be detected.

The embodiment has been described with an example in which the three-dimensional shape of the substrate 3010 is the hollow pattern 3011. However, even the three-dimensional shape being e.g. a protrusion shape would affect the capacitance and change the potential of the surface located immediately above the shape. The three-dimensional shape may therefore be a projection shape.

Another Embodiment (FIGS. 73 to 76)

Another embodiment of the invention will be described below with reference to FIG. 73. FIG. 73 illustrates an inspection method of the embodiment. Here the object to be inspected is a film-coated substrate 3040*a*. The detailed configuration of this object to be inspected is different from that of the above-described embodiment. The inspection method is almost the same as that of the above-described embodiment. The description of FIGS. 68 and 69 may therefore be applied also to the inspection of the film-coated substrate 3040*a* described below.

FIG. 73 shows a cross-sectional configuration different from that of the above-described embodiment, and further shows a relation between the cross-sectional configuration, the surface potential, and the brightness. The bottom (Symbol (c)) shows the cross-sectional configuration of the film-coated substrate 3040*a* in the embodiment. The middle (Symbol (b)) shows an example of the surface potential corresponding to the cross-sectional shape of the film-coated substrate 3040*a*. Moreover, the top (Symbol (a)) shows an example of the potential contrast of the brightness corresponding to the surface potential.

In the substrate configuration in FIG. 73, a multilayer film 3020*a* is layered on a substrate 3010*a*. The multilayer film 3020*a* comprises a first lower layer film 3021*a* formed on the substrate 3010*a*, a second lower layer film 3022*a* layered and formed on the first lower layer film 3021*a*, a third lower layer film 3023*a* layered and formed on the second lower layer film 3022*a*, and a top layer film 3024*a* formed on the third lower layer film 3023*a*. The top layer film 3024*a* is the surface of the film-coated substrate 3040*a*.

The substrate 3010*a* may be a reticle use substrate comprising, for example, a glass substrate such as a mask blank. Unlike the configuration in FIG. 70B and the like according to the above-described embodiment, no three-dimensional shape is provided on the surface of the substrate 3010*a* in FIG. 73. For example, the hollow pattern in FIG. 70B is not provided on the substrate 3010*a*. The top face of the substrate 3010*a* is a flat surface. The inspection method according to the embodiment can also be applied to such a case.

The multilayer film 3020*a* comprises a plurality of films including at least two types of materials. The multilayer film 3020*a* being four-layer is applied in FIG. 73. All the films 3021*a* to 3024*a* may be different in material. There may be films of the same material, that is, the materials may be partly the same.

No three-dimensional shape is intended for each of the plurality of films 3021*a* to 3024*a* of the multilayer film 3020*a*. Each of the films 3021*a* to 3024*a* is configured to be a film of a uniform thickness. That is, the designed film thickness of each of the films 3021*a* to 3024*a* is uniform and constant. In the actually manufactured film-coated substrate 3040*a*, however, sometimes the films 3021*a* to 3024*a* are not uniformly formed due to a defect or the like. In FIG. 73, there are defects 3033 and 3034 in the third lower layer film 3023*a* and top layer film 3024*a*. The defects 3033 and 3034 are where the thickness is locally or partly different from the surroundings. The inspection method according to the embodiment can detect such a defect, that is, the pattern defect of the thickness unevenness in the films 3021*a* to 3024*a* which should have uniform thicknesses.

In FIG. 73, the foreign material 3050 exists within the multilayer film 3020*a* and in particular within the lower layer film 3023*a*. Such foreign material 3050 present within the lower layer films 3021*a* to 3023*a* in the multilayer film 3020*a* is also detected in the inspection method according to the embodiment.

The middle drawing (Symbol (b)) in FIG. 73 shows the surface potential ΔV of the film-coated substrate 3040*a*. The electron beam with which the substrate surface is irradiated has a constant landing energy LE. The effective landing energy LEe is therefore LE+ΔV. FIG. 69 mentioned above shows how the brightness changes when the landing energy LE is changed with the surface potential ΔV being a constant value 0. However, the brightness changes according to LEe also when the landing energy LE is constant and ΔV changes, and the brightness characteristic can be said equivalent.

In FIG. 73, the defect area 3033 is an area of a pattern defect in which the third lower layer film 3023*a* is thin and the top layer film 3024*a* is thick. The potential of the surface located immediately above this defect area 3033 is reduced. The defect area 3034 is a pattern defect area in which the third lower layer film 3023*a* is thick and the top layer film 3024*a* is thin. The potential of the surface located immediately above this defect area 3034 is also reduced. However, the amount of reduction in the defect area 3033 is larger than that in the defect area 3034. That is, the surface potential is reduced more where the top layer film is thicker. The potential of the surface located immediately above the foreign material 3050 is also reduced. The amount of reduction in the foreign material part is even larger than that in the defect area 3033. The amount of reduction in the foreign material part is thus the largest. As seen above, the unevenness of the films 3023a and 3024a in the multilayer film 3020a appears as a change in the surface potential, and the presence of the foreign material 3050 also appears as a change in the surface potential.

In FIG. 73, the top drawing (Symbol (a)) shows the brightness difference in an image according to the above-described difference in surface potential, and the change in brightness corresponds to the potential contrast. This potential contrast is observed in an image obtained by acquiring the above-described surface potential of the film-coated substrate 3040a. Though the brightness difference is slightly smaller than the difference in surface potential, the surface potential distribution is reflected in the brightness difference. The pattern defects 3033 and 3034 and the foreign material 3050 can therefore be detected based on the brightness difference.

FIG. 74 is an enlarged view of the cross-sectional configuration in FIG. 73 and is a schematic diagram for illustrating a difference in surface potential caused by a difference in capacitance. In FIG. 74, $\Delta V0$ is the surface potential of the normal part, $\Delta V1$ and $\Delta V2$ are the potentials of the surface located immediately above the pattern defects 3033 and 3034, and the $\Delta V3$ is the potential of the surface located immediately above the foreign material 3050. The surface potential $\Delta V$ is expressed by $\Delta V=Q/C$, where $C=(d/\epsilon_0 \cdot \epsilon_r)$. The surface potentials $\Delta V0$ to $\Delta V3$ in FIG. 74 are therefore expressed by the following equations, respectively:

$$\Delta V0 = \epsilon_0 \cdot Q(2(\epsilon_{r1}+\epsilon_{r2})/d_0)$$

$$\Delta V1 = \epsilon_0 \cdot Q((\epsilon_{r1}/d_1)+(\epsilon_{r2}/(2d_0-d_1))+((\epsilon_{r1}+\epsilon_{r2})/d_0))$$

$$\Delta V2 = \epsilon_0 \cdot Q((\epsilon_{r1}/d_2)+(\epsilon_{r2}/(2d_0-d_2))+((\epsilon_{r1}+\epsilon_{r2})/d_0))$$

$$\Delta V3 = \epsilon_0 \cdot Q(((2\epsilon_{r1}+\epsilon_{r2})/d_0)+(\epsilon_{r3}/d_3))$$

where, as shown in FIG. 74, $d_0$ to $d_2$ are the thicknesses of the films, $d_3$ is the thickness of the foreign material, $\epsilon_{r1}$ and $\epsilon_{r2}$ are the permittivity of each film, and $\epsilon_{r3}$ is the permittivity of the foreign material.

When the film-coated substrate 3040a is irradiated with one and the same landing energy LE, the effective landing energy LEe in the four areas in FIG. 74 will be as follows.
Effective LE0=LE+$\Delta V0$
Effective LE1=LE+$\Delta V1$
Effective LE2=LE+$\Delta V2$
Effective LE3=LE+$\Delta V3$
The effective landing energy LEe can thus be captured as a difference in brightness.

The difference in film thickness can therefore also be observed and measured from the difference in brightness if the permittivities of the materials of the films, foreign material, and the like are known in advance. Such a concept regarding capacitance has not been referred to in the description of the embodiment described above with reference to FIGS. 70A, 70B, and the like. However, the same principle can also be applied to the above-described embodiment. The surface potential $\Delta V$ causes a change in the effective landing energy LEe, and a change in brightness accordingly occurs. Consequently, as shown in FIGS. 72 and 73, the surface potential distribution can be converted to a brightness distribution, based on the relation between the brightness (the luminance) and the landing energy LE (FIG. 69).

Now, the cross-sectional structure of a multilayer film to be inspected will further be described with reference to FIGS. 75 and 76. FIGS. 75 and 76 show more specific examples of the cross-sectional structure of a multilayer film. This structure may be applied to the film-coated substrate in FIG. 74 described above.

In FIG. 75, a multilayer film 3021b is formed on a glass substrate 3010b. The multilayer film 3021b comprises molybdenum (Mo) and silicon (Si) in order to reflect soft X rays (EUV: extreme ultraviolet), and is covered with a capping 3022b. On the multilayer film 3021b is formed a buffer layer 3023b, which comprises chromium nitride (CrN), ruthenium (Ru), and a ruthenium alloy. On the buffer layer 3023b is formed a tantalum boron nitride (TaBN) layer 3024b that forms a pattern. Further on the layer 3024b is formed a tantalum boron oxide (TaBO) layer 3025b for preventing light reflection during an optical inspection. These films as a whole comprise a multilayer film 3020b.

In FIG. 75, dust or other foreign materials 3050 exist as defects on the top surface of the reticle and in and on the multilayer film 3020b. In the multilayer film 3020b, the foreign material 3050 exists between the laminated layers. The foreign material 3050 would be a fatal defect during the transfer of a pattern 3028. Any foreign material on and in the films must therefore be found at stages where each of the films 3021b to 3025b has been formed and at a stage where the plurality of films have been formed to some extent.

FIG. 76 is a cross-sectional structure of a multilayer film 3020c, showing an example different from that in FIG. 75. The multilayer film 3020c in FIG. 76 is different from the multilayer film 3020b in FIG. 75 only in that the multilayer film 3020c does not have the TaBO layer 3025b for preventing light reflection during an optical inspection. Components similar to those in FIG. 75 are given the same reference symbols and will not be described.

In FIG. 76 also, the top surface of the multilayer film 3020c, the pattern 3028, and the inside of the films 3021b to 3024b are contaminated by the foreign material 3050. The foreign material 3050 present on and in the films must therefore be found at stages where each of the films 3021b to 3024b is formed, as in FIG. 75.

The multilayer films 3020b and 3020c in FIGS. 75 and 76 may also be applied to the film-coated substrate 3040 of the embodiment previously described with reference to FIG. 70 and the like. The substrate 3010b in FIGS. 75 and 76 is provided with a pattern shape; furthermore the top layer 3025b (TaBO) or the top layer 3024b (TaBN) is provided with a pattern shape; and consequently the configurations in FIGS. 75 and 76 correspond to the film-coated substrate 3040 in FIG. 70. The inspection method of the embodiment in FIG. 70 and the like can suitably be applied to such a film-coated substrate 3040.

Irradiation with an electron beam may be performed a plurality of times to acquire a potential contrast also in the inspection method according to the embodiment shown in FIGS. 73 to 76, as in the previously described embodiment shown in FIG. 70A and the like. In the embodiment in FIGS. 73 to 76, the foreign material 3050 in the multilayer films 3020a to 3020c is detected and the pattern defect areas 3033 and 3034 (where the thickness is partly or locally different) are detected. A plurality of times of electron beam irradiations enhance and stabilize the potential distribution on foreign materials and defects. A higher potential contrast can thus be obtained according to the difference in material.

Moreover, the film-coated substrate 3040a may be irradiated with an electron beam so that mirror electrons are generated, also in the embodiment in FIGS. 73 to 76 as in the previously described embodiment in FIG. 70A and the like. The range of the landing energy LE may be between −10 eV and 50 eV inclusive or the like, and this range may also be applied to the embodiment in FIG. 70 and the like described before. Consequently, the potential contrast of the surface can be appropriately acquired by using mirror electrons also in the present embodiment.

A reticle is applied to the film-coated substrate 3040a in the examples of the embodiment in FIGS. 73 to 76. However, the embodiment may also be applied to other masks. The embodiment may also be applied when the multilayer films 3020a to 3020c are formed on a semiconductor substrate or the like.

There has been described an inspection method according to an embodiment of the invention. The film-coated substrate 3040 is inspected in the embodiment in FIG. 70 and the like, and the film-coated substrate 3040a is inspected in the embodiment in FIG. 73 and the like. In these embodiments, a difference in surface potential caused by a difference in film thickness or by the presence of a foreign material can be captured as a brightness distribution, and the cross-sectional structure (in the depth direction) of the films and the like can be found out. The present embodiment allows for the detection of a difference in the film thicknesses of the plurality of films 3021, 3022, 3021a to 3024a, and 3021b to 3025b which are present in the multilayer films 3020 and 3020a to 3020c, and allows for the detection of the foreign material 3050. The cross-sectional structure (in the depth direction) of the films and the like can therefore be found out.

In the embodiment, the positions of the pattern defects 3031 to 3034 and the position of the foreign material 3050 can also be found out from a detected brightness difference. Therefore, if a detected defect is positioned on the designed substrate surface, the defect area can also be inspected again precisely by using another inspection device such as an SEM (review inspection). Suppose that the detected pattern defects 3031 to 3034 exist in a place other than the designed surface of the film-coated substrates 3040 and 3040a. Such a defect is handled as a defect in the depth direction. For example, a detected defect can also be identified by cutting the substrate at the defect detection position.

A film-coated substrate inspection device according to the embodiment will be described below. The inspection device of the embodiment can be applied to both the inspection of the film-coated substrates 3040 shown in FIG. 70B described above and the inspection of the film-coated substrates 3040a described with reference to FIGS. 73 to 76.

FIG. 77 shows an example of a general configuration of the inspection device of the embodiment. In the embodiment, the invention is applied to a projection-type electron microscope. That is, a projection-type inspection device inspects the film-coated substrates 3040 and 3040a following the inspection method of the invention.

As shown in FIG. 77, the inspection device comprises an electron beam source 3065, a primary optical system 3070, an imaging device 3090, a secondary optical system 3080, and a stage 3100, and these components are contained in vacuum containers 3075, 3085, and 3105. The electron beam source 3065 generates an electron beam. The primary optical system 3070 guides the generated electron beam to a substrate. The imaging device 3090 captures electrons returning from the substrate due to the electron beam irradiation and generates an image signal. The secondary optical system 3080 guides the electrons returning from the substrate due to the electron beam irradiation to the imaging device 3090. The stage 3100 is configured to place the film-coated substrates 3040 and 3040a thereon, and can move in at least one direction.

The imaging device 3090 is connected via a storage device 3091 to an arithmetic processor 3092. The arithmetic processor 3092 comprises a computer, and corresponds to the arithmetic unit of the invention. The arithmetic processor 3092 is connected to a stage control unit 3095 for controlling the stage 3100. In the above-described configuration, the imaging device 3090 functions as a detector for electrons and, in the invention, may be included in the secondary optical system. In the invention, the imaging device 3090, the storage device 3091, and the arithmetic processor 3092 may comprise the image processor.

The stage 3100 is placed on a vibration isolation table 3102, and is configured so that no vibration is transmitted from the floor. The stage 3100 is contained in the vacuum container (chamber) 3105. A preliminary environmental chamber (minienvironment) 3110 is provided adjacent to the vacuum container 3105. The preliminary environmental chamber 3110 is hermetically sealed, and is maintained clean. A temporary storage place 3111 for placing the film-coated substrates 3040 and 3040a thereon is contained in the preliminary environmental chamber 3110. The preliminary environmental chamber 3110 is also provided with a turbomolecular pump 3120. The turbomolecular pump 3120 is configured to evacuate the preliminary environmental chamber 3110 and the vacuum containers 3075, 3085, and 3105, together with a dry pump 3121. The vacuum container 3105 and the preliminary environmental chamber 3110 are configured to be able to be opened and sealed by using a gate valve 3130.

The electron beam source 3065 uses an electron gun of a thermionic emission type 3060a. This electron gun 3060a mainly uses $LaB_6$. The electron gun 3060a may also comprise a filament formed of tungsten, a tungsten-based material such as Th—W and $W_2C$, an oxide cathode formed of $(Ba, Sr, Ca)CO_3$, and the like. In the invention, the electron beam source 3065 (the electron gun 3060a) may be included in the primary optical system.

The primary optical system 3070 comprises a plurality of electrostatic lenses 3071, 3072, 3073, and 3074.

The imaging device 3090 comprises a TDI (time delay integration). A TDI is a device capable of scanning imaging. The imaging device 3090 has an MCP, a fluorescent screen, and an FOP in front of the TDI. The MCP amplifies the electrons; the fluorescent screen converts the amplified electrons to light; and the FOP (fiber optic plate) guides the light to the TDI. An EB-TDI may be used instead of the TDI. An EB-TDI can directly receive the electrons and convert them to an image. When a still image other than a scan image is to be taken, a CCD may be used instead of the TDI. An EB-CCD may be used instead of the EB-TDI. In addition, an EB-CCD may be provided in front of the TDI, so that the TDI may generate a scan image and the EB-CCD may generate a still image.

The imaging device 3090 acquires a potential contrast image of the surface of the film-coated substrates 3040 and 3040a. The potential contrast image is stored in the storage device 3091. The stored potential contrast image is sent to the arithmetic processor 3092. The arithmetic processor 3092 compares the shape between the potential contrast image and the designed pattern. If the shape in the potential contrast image does not correspond to the designed pattern, the arithmetic processor 3092 determines that the pattern defects 3031 to 3034 exist. The above-described inspection method may be applied, which allows the arithmetic processor 3092 to determine from the potential contrast image what kind of pattern defects exist. When the arithmetic processor 3092 detects a defect that does not correspond to the pattern defects 3031 to 3034, it can determine that the foreign material 3050 exists.

The secondary optical system 3080 comprises a plurality of electrostatic lenses 3081, 3082, and 3083. In the example shown in FIG. 77, the primary optical system 3070 is placed obliquely to the secondary optical system 3080. The electron beam is emitted from the electron gun 3060*a*, and turns in an ExB filter 3076 comprising electric and magnetic fields. The electron beam is applied perpendicularly or almost perpendicularly to the film-coated substrates 3040 and 3040*a*. The electron beam then rises from the film-coated substrates 3040 and 3040*a*, goes straight through the ExB filter 3076, and is guided by the secondary optical system 3080 to the imaging device 3090.

The electron beam is formed into a circle, an ellipse, or a rectangle by the primary optical system 3070, and is guided and applied to the film-coated substrates 3040 and 3040*a*. The size of the electron beam is generally set slightly larger than the imaging device 3090. The imaging device 3090 is a TDI, an EB-TDI, a CCD, an EB-CCD, or the like as described before. The shape and size of the electron beam may be adjusted to each imaging device 3090, and may also be set in accordance with the largest imaging device.

The landing energy LE of the electron beam is adjusted by the combination of the acceleration voltage Vacc and the retarding voltage RTD (the substrate voltage). The acceleration voltage Vacc is applied to electrons in the primary optical system 3070. The acceleration voltage Vacc may be set, for example, by an acceleration voltage setting unit 3061. The retarding voltage RTD is determined by a substrate voltage adjustment mechanism 3101 provided on the stage 3100.

The combination of the acceleration voltage Vacc and the retarding voltage RTD can be changed depending on information to be obtained from the film-coated substrates 3040 and 3040*a*. For example, in order to obtain a secondary electron image of the film-coated substrates 3040 and 3040*a*, the acceleration voltage Vacc is set between 100 eV and several keV, and the retarding voltage RTD is set to a setup voltage for the secondary system (a straight-advancing condition of the ExB for the secondary system). Suppose that a reflected electron image is to be obtained from the film-coated substrates 3040 and 3040*a*. Reflected electrons are electrons generated by a perfectly elastic collision between the irradiation electrons and the material of the substrate surface. In order to obtain a reflected electron image, the retarding voltage RTD is adjusted so as to achieve a landing energy LE that causes a perfectly elastic collision. In order to obtain a mirror electron image, the landing energy LE is suitably set between −10 and tens of electron volts. More preferably, the landing energy LE is set to −5 eV or more but not exceeding 5 eV (the transition region). As already described, mirror electrons are generated by the irradiation electron beam bouncing back near the surface of the film-coated substrates 3040 and 3040*a* due to the surface potential thereof. More specifically, the range of the landing energy LE described in detail in the above description of the inspection method is suitably applied.

Various inspections have been described in the above description of the inspection method. For example, the inspection in FIG. 71 is carried out for the pattern shape defects 3031 and 3032, and the inspection in FIG. 72 detects the foreign material 3050 on the film-coated substrate 3040. The inspection in FIG. 73 detects the foreign material 3050 in the multilayer films 3020*a* to 3020*c* formed on the film-coated substrate 3040*a*, and detects the pattern defect areas 3033 and 3034 in which the thickness is partly or locally different. Moreover, the inspection in FIG. 70B detects the shape of the pattern 3011 formed on the substrate 3010, detects the shape of the pattern 3030 formed in the multilayer film 3020, and compares detected shapes. In the inspection device of the embodiment, the landing energy LE is set to a value suitable for each inspection. The inspection device may perform the beam irradiation a plurality of times. The inspection device may then change the landing energy LE in the plurality of times of beam irradiations. The inspection device may also perform the beam irradiation a plurality of times with one and the same landing energy LE.

When the irradiation is made with an electron beam a plurality of times, the number of irradiations is, for example, two. In this case, the landing energy LE for the first beam irradiation is set large to some extent (e.g. 28 eV). The landing energy LE for the next irradiation is set smaller than that for the first irradiation (e.g. 15 eV). This allows the potential difference of the surface of the film-coated substrates 3040 and 3040*a* to appear clearly, and can thereby increase the detection sensitivity.

When the electron beam irradiation is made a plurality of times, the landing energy LE of the electron beam for the first irradiation is preferably set in consideration of the position where the beam reaches in the depth direction. In this case, the landing energy LE for the first irradiation is suitably adjusted so that the electron beam reaches the depth of the films to be inspected 3021, 3022, 3021*a* to 3024*a*, and 3021*b* to 3025*b*. This allows the potential difference at the depth of a specific film to appear clearly, and the potential distribution at a desired depth can be captured as a potential contrast. In this way, the structures of the films 3021, 3022, 3021*a* to 3024*a*, and 3021*b* to 3025*b* can be suitably obtained as three-dimensional images.

The charged particle beam is an electron beam in the embodiment. The charged particle beam may be a beam other than an electron beam, such as an ion beam, within the scope of the invention. A beam other than a charged particle beam may be applied. However, an applicable beam is a beam that causes a potential difference on the substrate surface and promises to cause electrons to return from the substrate. For example, a fast atom beam may be applied.

In the embodiment, as described above, the inspection device of the invention is applied to a projection-type electron microscope. In the embodiment, the acceleration voltage setting unit 3061 and the substrate voltage adjustment mechanism 3101 adjust the landing energy LE of the electron beam. The landing energy LE is suitably set so as to cause the surface potential to vary depending on the material and thickness of the base substrate and each film thereon. The shape of the film-coated substrate can then be detected based on a potential contrast image of the surface obtained by the electron beam irradiation. In particular, the shape in the height direction can be detected, and the three-dimensional shape can therefore be detected. When the film-coated substrates 3040 and 3040*a* are contaminated by the foreign material 3050, the presence of the foreign material 3050 can also be detected based on the potential contrast image.

FIG. 78 shows a general configuration of a film-coated substrate inspection device according to another embodiment of the invention. In the embodiment, the invention is applied to an SEM-type electron microscope, that is, an SEM inspects the film-coated substrates 3040 and 3040a following the inspection method of the invention. This inspection device can be applied to both the inspection of the film-coated substrate 3040 shown in FIG. 70B and the inspection of the film-coated substrate 3040a shown in FIGS. 73 to 76.

The inspection device in FIG. 78 comprises an electron beam source 3065a, a primary optical system 3070a, an imaging device 3090a, and a stage 3100a, and these components are contained in vacuum containers 3075a, 3085a, and 3105a. The electron beam source 3065a generates an electron beam. The primary optical system 3070a guides the electron beam to the film-coated substrates 3040 and 3040a and scans them. The imaging device 3090a captures electrons returning from the film-coated substrates 3040 and 3040a due to the scanning and irradiation with the electron beam, and generates an image signal from the electrons. The stage 3100a is configured to place the film-coated substrates 3040 and 3040a thereon, and can move in at least one direction.

The electron beam source 3065a uses an electron gun of a thermionic emission type 3060b. This electron gun 3060b mainly uses $LaB_6$. The electron gun 3060b may also comprise a filament formed of tungsten, a tungsten-based material such as Th—W and $W_2C$, an oxide cathode formed of (Ba, Sr, Ca)$CO_3$, and the like.

The primary optical system 3070a comprises lenses 3071a, 3072a, and 3073a. These lenses may be electrostatic lenses, electromagnetic lenses, or both of them. The imaging device 3090a is generally a secondary electron multiplier.

In the inspection device according to the embodiment, an electron beam is condensed into a thin beam by the primary optical system 3070a, and the film-coated substrate is scanned with the beam. The imaging device 3090a then detects electrons emitted from the film-coated substrate and generates an image. Consequently, a potential contrast image is obtained.

The other components may be the same as those of the inspection device in FIG. 77. Similar components are therefore given the same or similar reference symbols and will not be described.

In the embodiment in FIG. 78, as seen above, the invention is applied to an SEM-type electron microscope, and an inspection device is thus constituted. The inspection of the shape of the film-coated substrates 3040 and 3040a and the inspection for the foreign material 3050 can also be carried out in the embodiment. The details of the inspection method to be performed in the embodiment are as described before.

Industrial Applicability

The invention can be used for an inspection device that uses an electron beam to inspect the shape of a film-coated substrate such as a mask and to inspect for a foreign material therein.

There has been described the invention in detail with the help of embodiments. As stated above, four points of view have been described in the application. Two or more points of view may be combined; the whole of one point of view and the whole of another point of view may be combined; a part of the configuration of one point of view may be combined with another point of view; and a part of one point of view may be combined with a part of another point of view, within the scope of the invention.

While there have been described what are at present considered to be preferred embodiments of the invention, it will be understood that various modifications and variations may be made thereto, and it is intended that appended claims cover all such modifications and variations as fall within the true spirit and scope of the invention.

The invention claimed is:

1. An electron beam inspection method, comprising:
   charging a foreign material by irradiation with a charging electron beam and forming a potential distribution around the foreign material which is different from that of a specimen surface on which the foreign material is disposed;
   irradiating the specimen surface with an imaging electron beam having a predetermined irradiation area; and
   detecting electrons which are reflected from the foreign material by the imaging electron beam irradiation and reach a detector through a path bent by the effect of the potential distribution, thereby acquiring an image of the foreign material,
   wherein the charging and the irradiating are both performed by an electron gun of a primary optical system,
   wherein energy of the charging electron beam landing on the foreign material is larger than energy of the imaging electron beam landing on the foreign material, and
   wherein a difference between the energy of the charging electron beam landing on the foreign material and the energy of the imaging electron beam landing on the foreign material is 5 to 20 eV.

2. The electron beam inspection method according to claim 1,
   wherein the step of charging the foreign material comprises negatively charging up the foreign material by the charging electron beam irradiation, and
   wherein the step of acquiring the image comprises setting the landing energy of the imaging electron beam to 10 eV or less, and detecting mirror electrons reflected immediately in front of the foreign material, thereby acquiring the image of the foreign material.

3. The electron beam inspection method according to claim 1,
   wherein the step of acquiring the image comprises setting the landing energy of the imaging electron beam to 10 eV or more, and detecting secondary emission electrons reflected by being emitted from the foreign material, thereby acquiring the image of the foreign material.

4. The electron beam inspection method according to claim 1,
   wherein the landing energy of the imaging electron beam is set to a landing energy which: is in a landing energy range in which electrons reflected from the specimen surface are a mixture of mirror electrons and secondary emission electrons, or only secondary emission electrons; is in a landing energy range in which electrons reflected from the foreign material are a mixture of mirror electrons and secondary emission electrons; and increases the difference in gray level between the image of the specimen surface and the image of the foreign material.

5. The electron beam inspection method according to claim 4,
   wherein the landing energy of the imaging electron beam is set to a landing energy which maximizes the difference in gray level between the image of the specimen surface and the image of the foreign material.

6. The electron beam inspection method according to claim 1,
   wherein the landing energy of the imaging electron beam is set such that the foreign materials on the specimen and edge portions of the specimen generate the mirror electrons and the other portions of the specimen generate the secondary emission electrons.

7. The electron beam inspection method according to claim 1, wherein a surface of the foreign material is spherical.

8. The electron beam inspection method according to claim 1, wherein a size of the foreign material is smaller than a pixel size of the detector.

9. An electron beam inspection device comprising:
a stage for placing a specimen thereon;
a primary optical system including an electron gun for generating an electron beam having a predetermined irradiation area and for emitting the electron beam toward the specimen; and
a secondary optical system, having a detector for detecting electrons reflected from the specimen, for acquiring an image of a predetermined visual field area on the specimen,
wherein the primary optical system charges a foreign material disposed on the specimen by irradiation with a charging electron beam to cause the potential distribution of the foreign material to be different from that of a specimen surface, and then irradiates the specimen with an imaging electron beam, and
wherein the secondary optical system detects electrons which are reflected from the foreign material and reach the detector through a path bent by the effect of the potential distribution, thereby acquiring an image of the foreign material,
wherein energy of the charging electron beam landing on the foreign material is larger than energy of the imaging electron beam landing on the foreign material, and
wherein a difference between the energy of the charging electron beam landing on the foreign material and the energy of the imaging electron beam landing on the foreign material is 5 to 20 eV.

10. The electron beam inspection device according to claim 9,
wherein the primary optical system charges up the foreign material by irradiation with the charging electron beam and then irradiates the specimen with the imaging electron beam with a landing energy of 10 eV or less, and
wherein the secondary optical system detects mirror electrons reflected immediately in front of the foreign material by means of the detector and acquires the image of the foreign material.

11. The electron beam inspection device according to claim 9,
wherein the primary optical system sets the landing energy of the imaging electron beam to 10 eV or more, and
wherein the secondary optical system detects secondary emission electrons which are emitted from the foreign material and reach the detector and acquires the image of the foreign material.

12. The electron beam inspection device according to claim 9,
wherein the landing energy of the imaging electron beam is set to a landing energy which: is in a landing energy range in which electrons reflected from the specimen surface are a mixture of mirror electrons and secondary emission electrons, or only secondary emission electrons; is in a landing energy range in which electrons reflected from the foreign material are a mixture of mirror electrons and secondary emission electrons; and increases the difference in gray level between the image of the specimen surface and the image of the foreign material.

13. The electron beam inspection device according to claim 12,
wherein the landing energy of the imaging electron beam is set to a landing energy which maximizes the difference in gray level between the image of the specimen surface and the image of the foreign material.

14. The electron beam inspection device according to claim 9,
wherein the landing energy of the imaging electron beam is set such that the foreign materials on the specimen and edge portions of the specimen generate the mirror electrons and the other portions of the specimen generate the secondary emission electrons.

15. The electron beam inspection device according to claim 9, wherein a surface of the foreign material is spherical.

16. The electron beam inspection device according to claim 9, wherein a size of the foreign material is smaller than a pixel size of the detector.

* * * * *